US009972789B2

(12) United States Patent
Cho et al.

(10) Patent No.: US 9,972,789 B2
(45) Date of Patent: May 15, 2018

(54) ORGANIC LIGHT-EMITTING DEVICE

(71) Applicant: Samsung Display Co., Ltd., Yongin, Gyeonggi-do (KR)

(72) Inventors: Hwan-Hee Cho, Yongin (KR); Mi-Kyung Kim, Yongin (KR); Jae-Yong Lee, Yongin (KR); Dong-Hyun Kim, Yongin (KR); Se-Hun Kim, Yongin (KR); Chang-Woong Chu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 14/598,181

(22) Filed: Jan. 15, 2015

(65) Prior Publication Data

US 2015/0200373 A1 Jul. 16, 2015

(30) Foreign Application Priority Data

Jan. 16, 2014 (KR) ........................ 10-2014-0005599
Nov. 12, 2014 (KR) ........................ 10-2014-0157338

(51) Int. Cl.
*H01L 51/50* (2006.01)
*H01L 51/00* (2006.01)

(52) U.S. Cl.
CPC ...... *H01L 51/0072* (2013.01); *H01L 51/0054* (2013.01); *H01L 51/0067* (2013.01);
(Continued)

(58) Field of Classification Search
None
See application file for complete search history.

(56) References Cited

U.S. PATENT DOCUMENTS

2010/0237334 A1 9/2010 Ma et al.
2011/0084599 A1 4/2011 Brooks et al.
(Continued)

FOREIGN PATENT DOCUMENTS

JP 2012-156499 A 8/2012
KR 10-2010-0063713 A 6/2010
(Continued)

*Primary Examiner* — Gregory D Clark
(74) *Attorney, Agent, or Firm* — Lewis Roca Rothgerber Christie LLP

(57) ABSTRACT

An organic light-emitting device includes a first electrode; a second electrode; and an organic layer between the first electrode and the second electrode, the organic layer including an emission layer, where the emission layer includes a first host represented by Formula 1 and a second host represented by Formula 2:

Formula 1

(Continued)

-continued

Formula 2

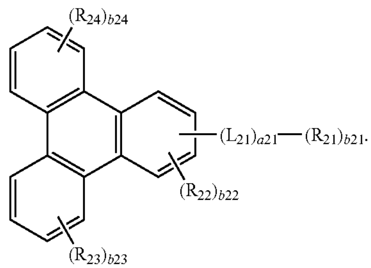

The organic light-emitting device may have high efficiency and long lifespan.

19 Claims, 3 Drawing Sheets

(52) U.S. Cl.
CPC ...... *H01L 51/0073* (2013.01); *H01L 51/0074* (2013.01); *H01L 51/0084* (2013.01); *H01L 51/0085* (2013.01); *H01L 51/0087* (2013.01); *H01L 51/0088* (2013.01); *H01L 51/5016* (2013.01); *H01L 2251/308* (2013.01); *H01L 2251/5384* (2013.01)

(56) References Cited

U.S. PATENT DOCUMENTS

| | | | | |
|---|---|---|---|---|
| 2011/0001130 | A1 | 6/2011 | Nishimura et al. | |
| 2011/0279020 | A1 | 11/2011 | Inoue et al. | |
| 2012/0181518 | A1* | 7/2012 | Ogiwara | H01L 51/5004 257/40 |
| 2012/0235123 | A1 | 9/2012 | Lee et al. | |
| 2013/0207540 | A1* | 8/2013 | Itai | H01L 51/0054 313/504 |
| 2014/0054564 | A1 | 2/2014 | Kim et al. | |
| 2014/0110692 | A1 | 4/2014 | Kato et al. | |
| 2014/0374728 | A1 | 12/2014 | Adamovich et al. | |

FOREIGN PATENT DOCUMENTS

| | | | |
|---|---|---|---|
| KR | 10-2010-0093085 | A | 8/2010 |
| KR | 10-2011-0015836 | A | 2/2011 |
| KR | 10-2011-0077851 | A | 7/2011 |
| KR | 10-2011-0077909 | A | 7/2011 |
| KR | 10-2012-0034648 | A | 4/2012 |
| KR | 10-2012-0057561 | A | 6/2012 |
| KR | 10-2012-0127746 | A | 11/2012 |
| KR | 10-2014-0141951 | | 12/2014 |
| TW | 201302703 | A1 | 1/2013 |
| WO | WO 2012/015274 | A2 | 2/2012 |
| WO | WO 2013/073896 | A1 | 5/2013 |
| WO | WO 2013/112557 | A1 | 8/2013 |

* cited by examiner

ORGANIC LIGHT-EMITTING DEVICE

CROSS-REFERENCE TO RELATED APPLICATION

This application claims priority to and the benefit of Korean Patent Application No. 10-2014-0005599, filed on Jan. 16, 2014 and Korean Patent Application No. 10-2014-0157338, filed on Nov. 12, 2014 in the Korean Intellectual Property Office, the entire disclosure of each of which is incorporated herein by reference.

BACKGROUND

1. Field

One or more embodiments of the present invention relate to an organic light-emitting device.

2. Description of the Related Art

Organic light-emitting devices are self-emission devices that have wide viewing angles, high contrast ratios, short response time, and good brightness, driving voltage, and response speed characteristics. They also produce full-color images.

An organic light-emitting device includes an anode, a cathode, and an organic layer including an emission layer between the anode and the cathode. A hole transport region may be positioned between the anode and the emission layer, and an electron transport region may be positioned between the emission layer and the cathode. Holes from the anode may move toward the emission layer through the hole transport region, and electrons from the cathode may move toward the emission layer through the electron transport region. Carriers (e.g., the holes and the electrons), are recombined in the emission layer to produce excitons. When excitons change from an excited state to a ground state, light is emitted.

SUMMARY

One or more aspects of one or more exemplary embodiments are directed toward an organic light-emitting device.

Additional aspects will be set forth in part in the description which follows and, in part, will be apparent from the description, or may be learned by practice of the presented embodiments.

According to one or more embodiments, an organic light-emitting device includes a first electrode; a second electrode; and an organic layer between the first electrode and the second electrode, the organic layer including an emission layer, where the emission layer includes a first host represented by Formula 1 and a second host represented by Formula 2:

Formula 1

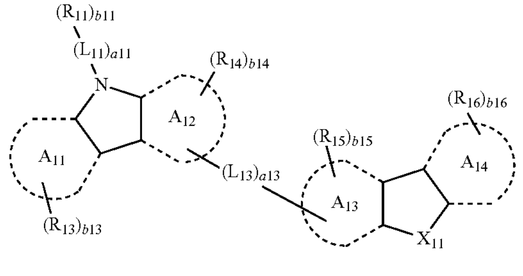

-continued

Formula 2

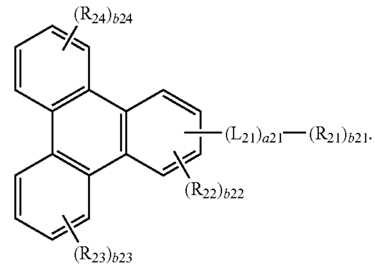

In Formulae 1 and 2, $A_{11}$, $A_{12}$, $A_{13}$, and $A_{14}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;

$L_{11}$ to $L_{13}$ and $L_{21}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

b11, b12, and b21 are each independently selected from 1, 2, 3, and 4;

$R_{13}$ to $R_{18}$ and $R_{22}$ *to* $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_3$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b13 to b16 and b22 to b24 are each independently selected from 1, 2, 3, and 4;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and N($Q_{31}$)($Q_{32}$), —Si($Q_{33}$)($Q_{34}$)($Q_{35}$), and —B($Q_{36}$)($Q_{37}$);

where $Q_1$ to $Q_7$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the present embodiments, taken in conjunction with the accompanying drawings in which.

DETAILED DESCRIPTION

Figure 1:
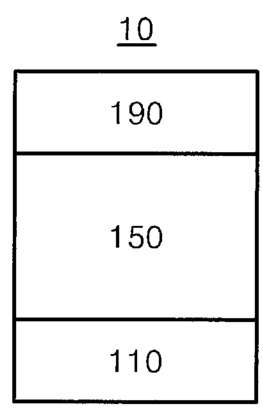
FIG. 1 is a schematic view of a structure of an organic light-emitting device according to an embodiment of the present invention.
Figure 2:
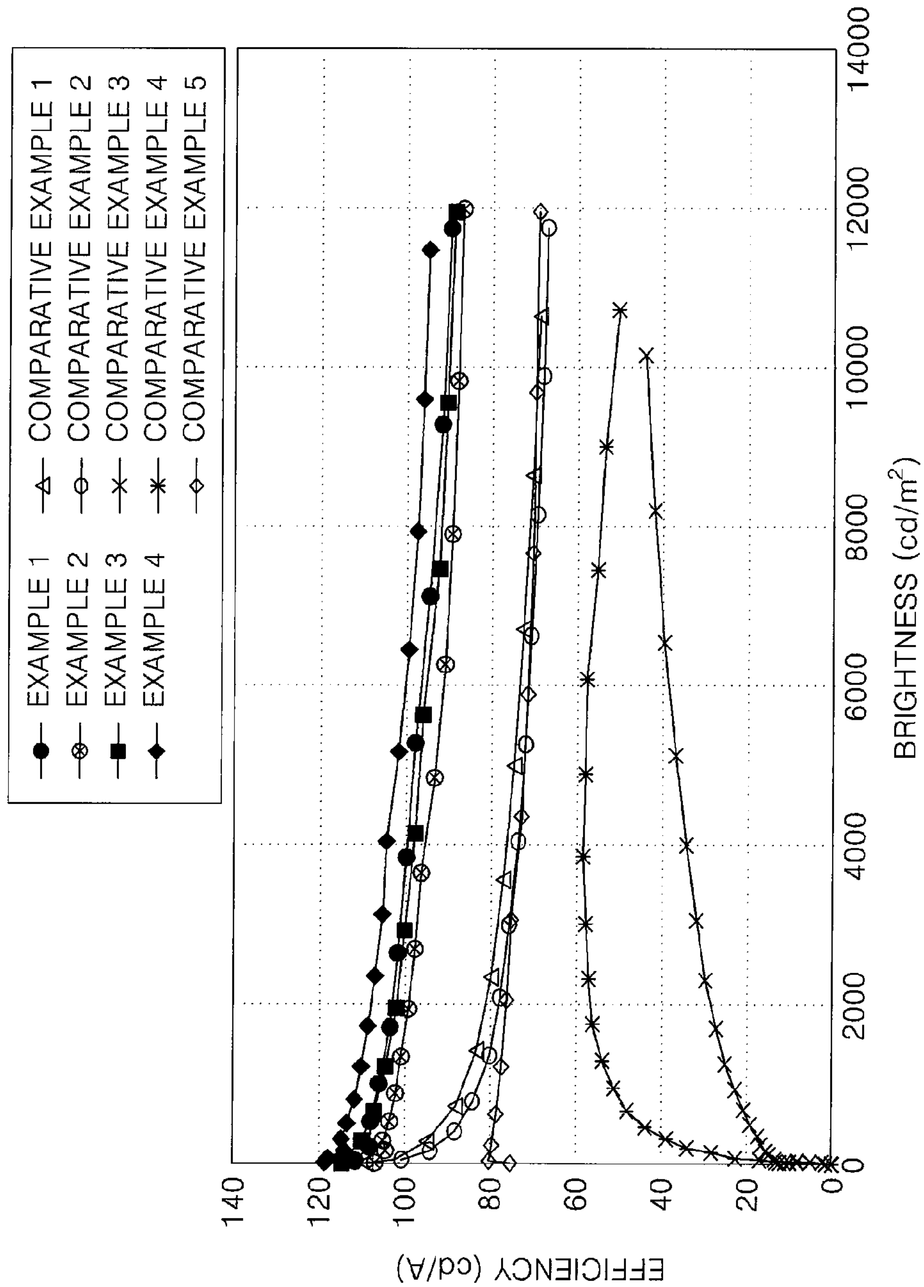
FIG. 2 a graph illustrating a relationship between brightness and efficiency of organic light-emitting devices prepared according to Examples 1 to 4 and Comparative Examples 1 to 5.
Figure 3:
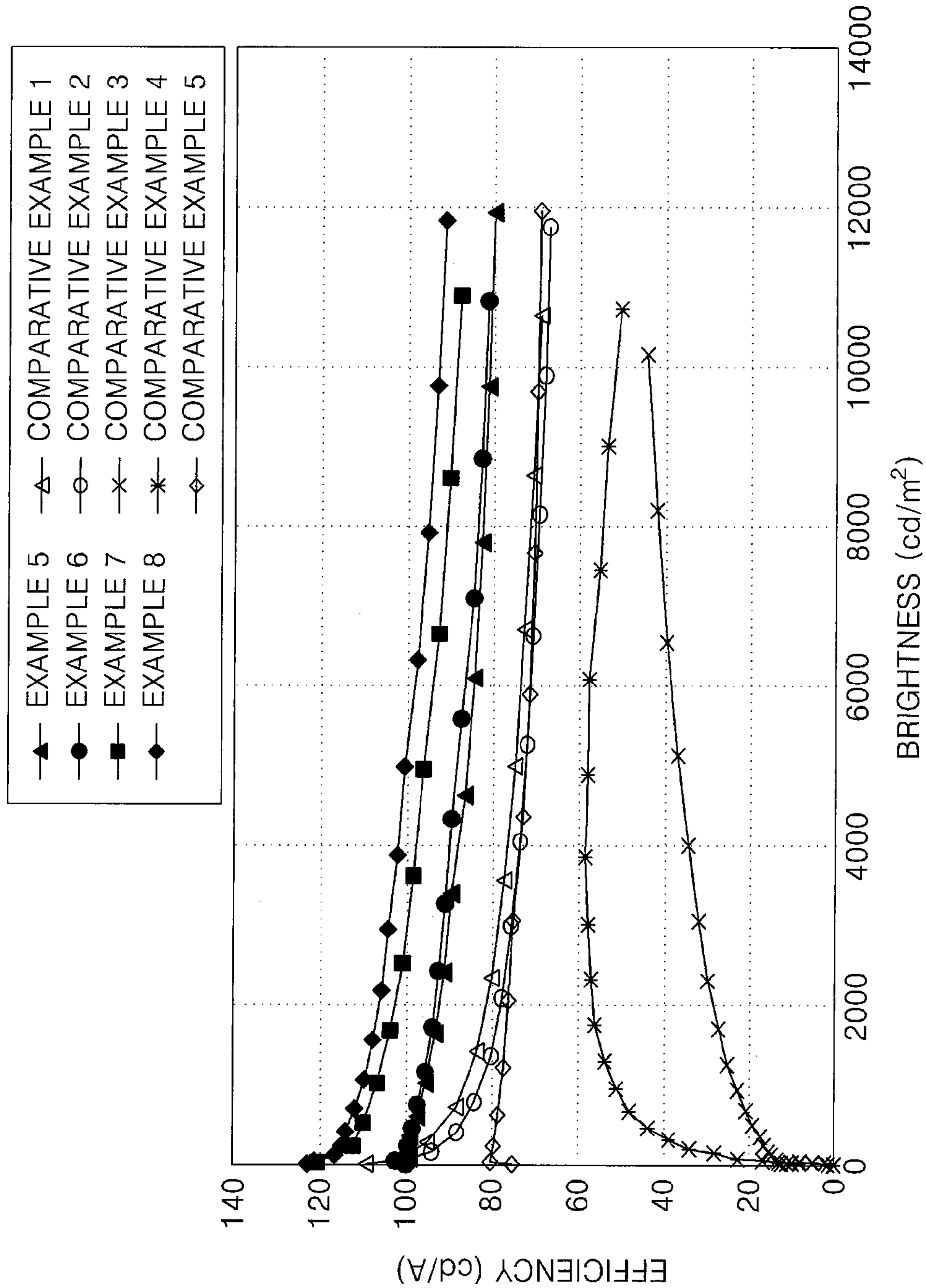
FIG. 3 is a graph illustrating a relationship between brightness and efficiency of organic light-emitting devices prepared according to Examples 5 to 8 and Comparative Examples 1 to 5.

Reference will now be made in detail to the present embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the present invention refers to "one or more embodiments of the present invention."

Like reference numerals in the drawings denote like elements, and thus their repeated descriptions are not provided.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. In addition, as used herein, the terms "use," "using," and "used" may be considered synonymous with the terms "utilize," "utilizing," and "utilized," respectively.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

As used herein, the expression “X includes a first host” may be construed as meaning “X may include one type (kind) of a first host of Formula 1 or two different types (kinds) of first hosts of Formula 1”.

As used herein, the term “organic layer” refers to a single layer and/or a plurality of layers positioned between the first electrode and the second electrode in an organic light-emitting device. A material included in the organic layer is not limited to an organic material.

FIG. 1 is a schematic view of a structure of an organic light-emitting device 10 according to an embodiment of the present invention.

Referring to FIG. 1, a substrate may be additionally positioned under a first electrode 110 or on a second electrode 190. The substrate may be a glass substrate or a transparent plastic substrate, each with good mechanical strength, thermal stability, transparency, surface smoothness, ease of handling, and water resistance.

For example, the first electrode 110 may be formed by depositing or sputtering a first electrode material on the substrate. When the first electrode 110 is an anode, the first electrode material may be selected from materials with a high work function so as to facilitate hole injection. The first electrode 110 may be a reflective electrode, a semi-transmissive electrode, or a transmissive electrode. The first electrode material may be a transparent and highly conductive material, and non-limiting examples of the material for the first electrode may include indium tin oxide (ITO), indium zinc oxide (IZO), tin oxide ($SnO_2$), and zinc oxide (ZnO). When the first electrode 110 is a semi-transmissive electrode or a reflective electrode, the first electrode material may include at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including two or more layers. For example, the first electrode 110 may have a triple-layer structure of ITO/Ag/ITO, but it is not limited thereto.

An organic layer 150 including an emission layer is positioned on the first electrode 110. The organic layer 150 may include a hole transport region between the first electrode 110 and the emission layer and an electron transport region between the emission layer and the second electrode 190.

The hole transport region may include at least one selected from a hole injection layer (HIL), a hole transport layer (HTL), a buffer layer, and an electron blocking layer (EBL), and the electron transport region includes a charge control layer and may additionally include at least one selected from a hole blocking layer (HBL), an electron transport layer (ETL), and an electron injection layer (EIL), but the hole transport region and the electron transport region are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, a structure of hole injection layer/hole transport layer/electron blocking layer, or a structure of hole transport layer/electron blocking layer, where the layers of each of the structures are sequentially stacked from the first electrode 110 in the stated order, but the hole transport region is not limited thereto.

When the hole transport region includes a hole injection layer, the hole injection layer may be formed on the first electrode 110 by using various methods, such as, for example, vacuum deposition, spin coating, casting, a Langmuir-Blodgett (LB) method, ink-jet printing, laser-printing, or laser-induced thermal imaging (LITI).

When the hole injection layer is formed by vacuum deposition, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Å/sec to about 100 Å/sec, depending on a compound for forming the hole injection layer and the desired structure of the hole injection layer.

When a hole injection layer is formed by spin coating, the spin coating may be performed at a coating rate in a range of about 2000 rpm to about 5000 rpm and at a temperature in a range of about 80° C. to about 200° C., depending on a compound for forming the hole injection layer and the desired structure of the hole injection layer.

When the hole transport region includes a hole transport layer, the hole transport layer may be formed on the first electrode 110 or on the hole injection layer by using various methods, such as, for example, vacuum deposition, spin coating, casting, a LB method, ink-jet printing, laser-printing, or LITI. When the hole transport layer is formed by vacuum deposition or by spin coating, the deposition conditions or the coating conditions may be similar to the deposition conditions or the coating conditions for forming the hole injection layer.

The hole transport region may include, for example, at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecyl benzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201, and a compound represented by Formula 202:

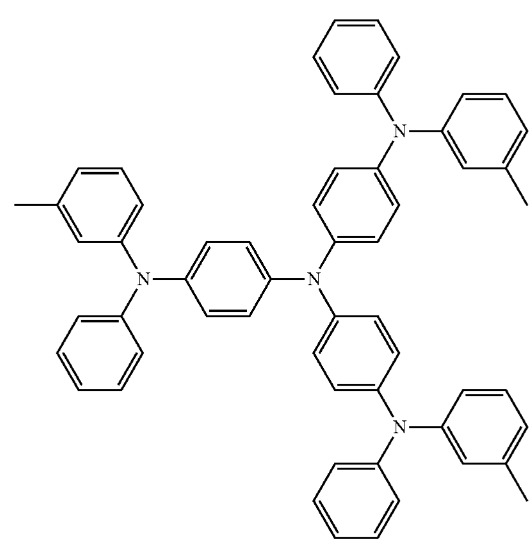

m-MTDATA

-continued
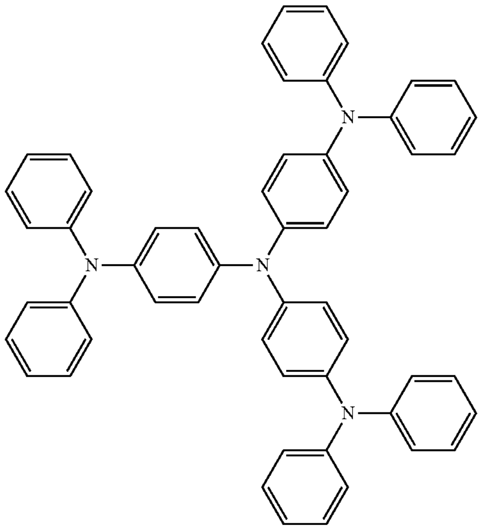
TDATA
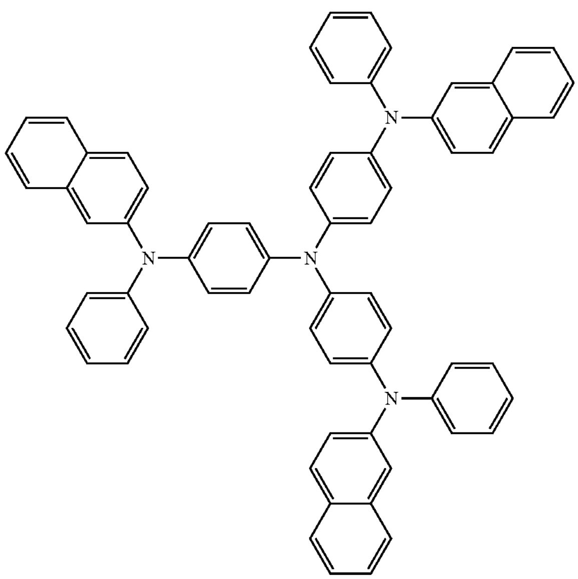
2-TNATA
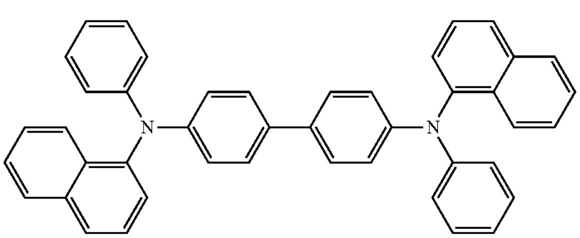
NPB
-continued
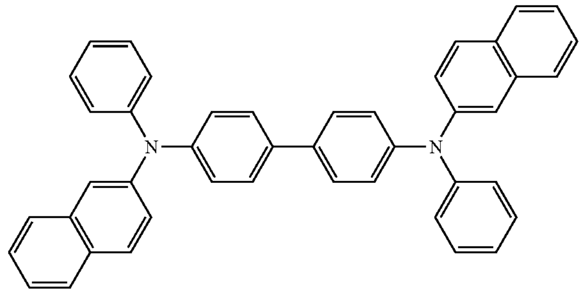
β-NPB
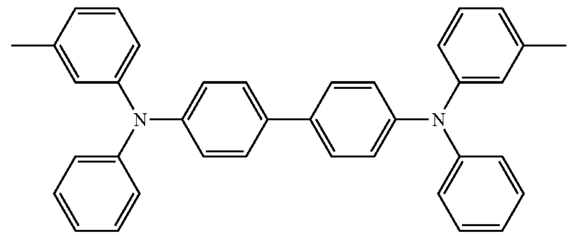
TPD
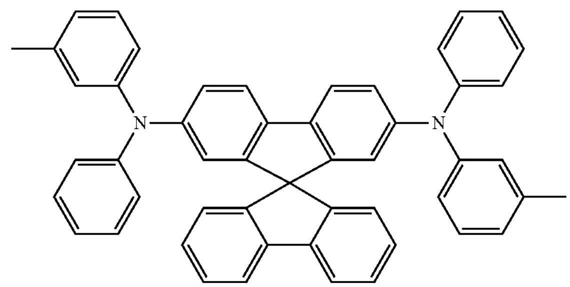
Spiro-TPD
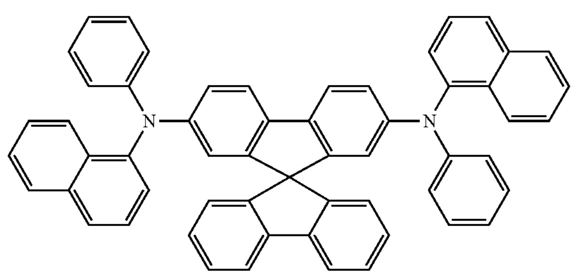
Spiro-NPB
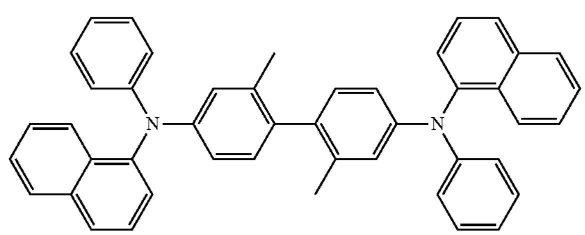
methylated NPB -continued

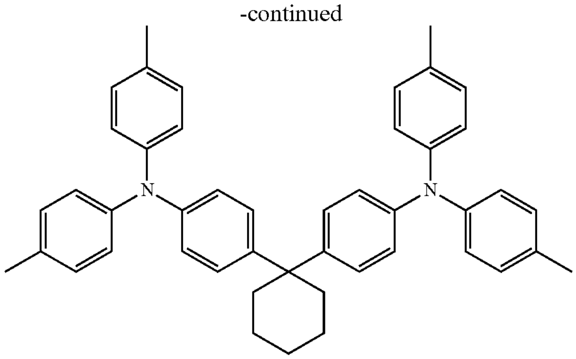

TAPC

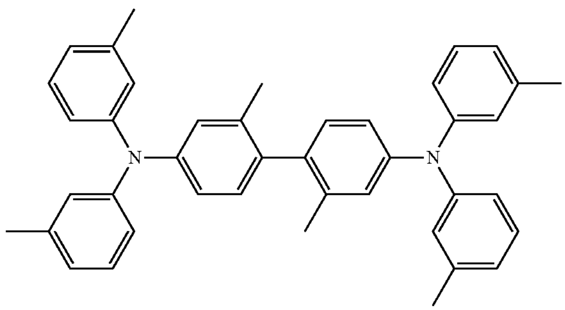

HMTPD

Formula 201

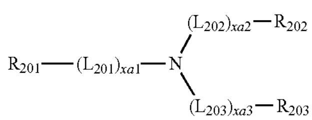

Formula 202

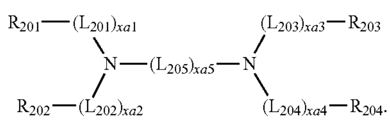

In Formulae 201 and 202, $L_{201}$ to $L_{205}$ are each independently as defined in connection with $L_{11}$;

xa1 to xa4 are each independently selected from 0, 1, 2, and 3;

xa5 is selected from 1, 2, 3, 4, and 5; and $R_{201}$ to $R_{204}$ are each independently as defined in connection with $R_{11}$.

In some embodiments, in Formulae 201 and 202, $L_{201}$ to $L_{205}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyi group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 are each independently 0, 1, or 2;

xa5 is 1, 2, or 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azuienyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments of the present invention are not limited thereto.

A compound represented by Formula 201 may be represented by Formula 201A:

Formula 201A

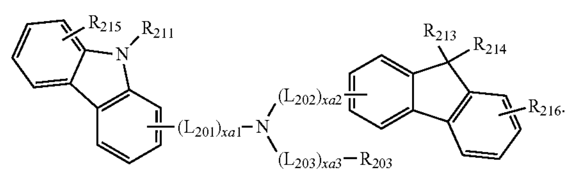

In some embodiments, the compound represented by Formula 201 may be represented by Formula 201A-1, but it is not limited thereto:

Formula 201A-1

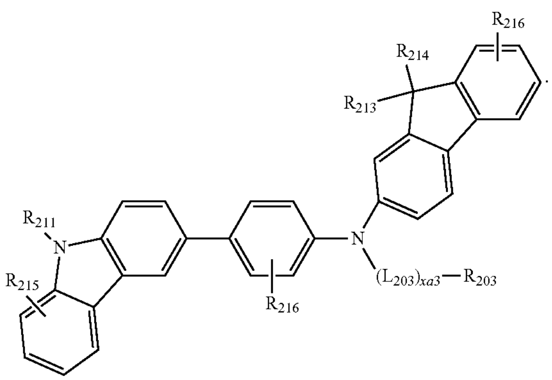

The compound represented by Formula 202 may be represented by Formula 202A, but it is not limited thereto:

Formula 202A

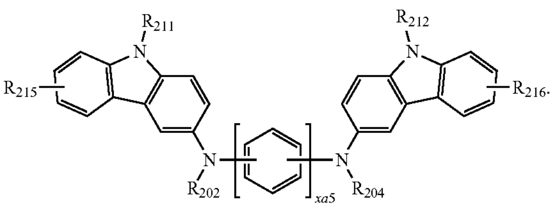

In Formulae 201A, 201A-1, and 202A, $L_{201}$ to $L_{203}$, xa1 to xa3, xa5, and $R_{202}$ to $R_{204}$ are as defined in the present specification, $R_{211}$ is as defined in connection with $R_{203}$, and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In some embodiments, in Formulae 201A, 201A-1, and 202A, $L_{201}$ to $L_{203}$ are each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently 0 or 1;

$R_{203}$, $R_{204}$, and $R_{211}$ and $R_{212}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyraziny group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ are each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa5 is 1 or 2.

In Formulae 201A and 201A-1, $R_{213}$ and $R_{214}$ may be fused to each other and form a saturated or unsaturated ring.

The compound represented by Formula 201 and the compound represented by Formula 202 may each independently include Compounds HT1 to HT20 below, but they are not limited thereto:

HT1

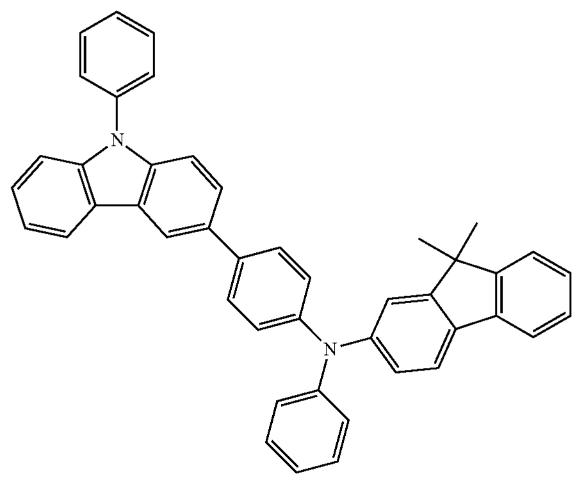

HT2

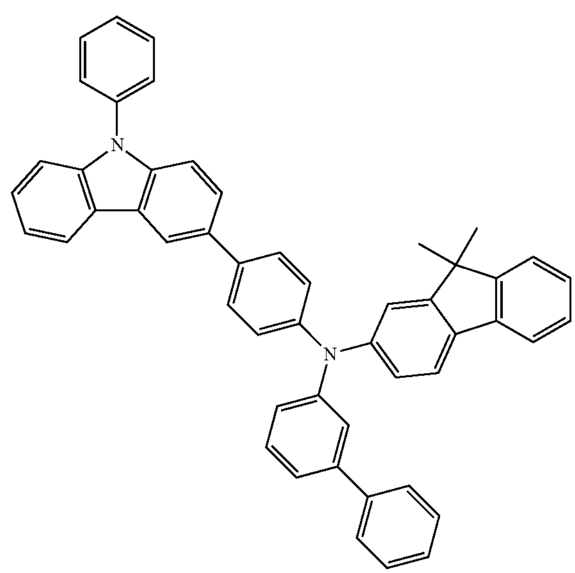

HT3
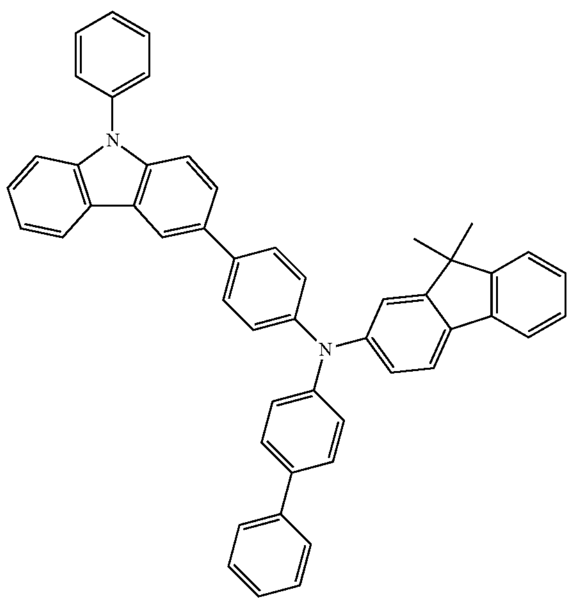
HT4
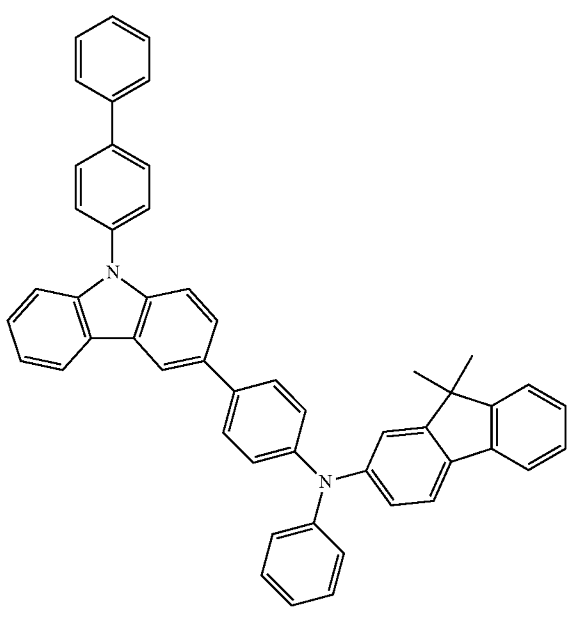
HT5
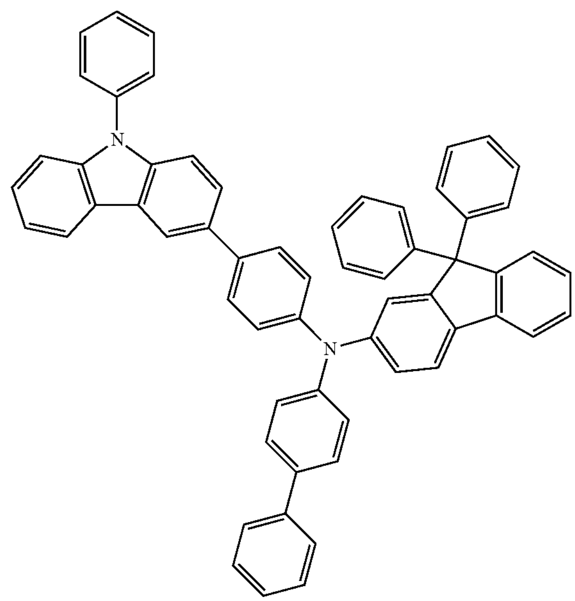
HT6
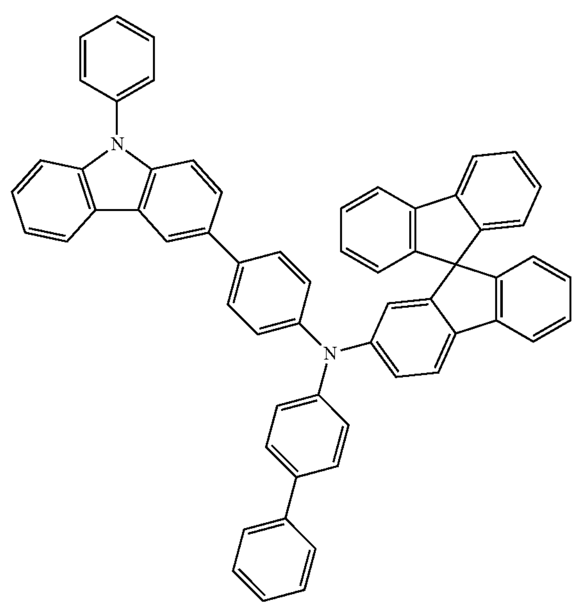

-continued
HT7
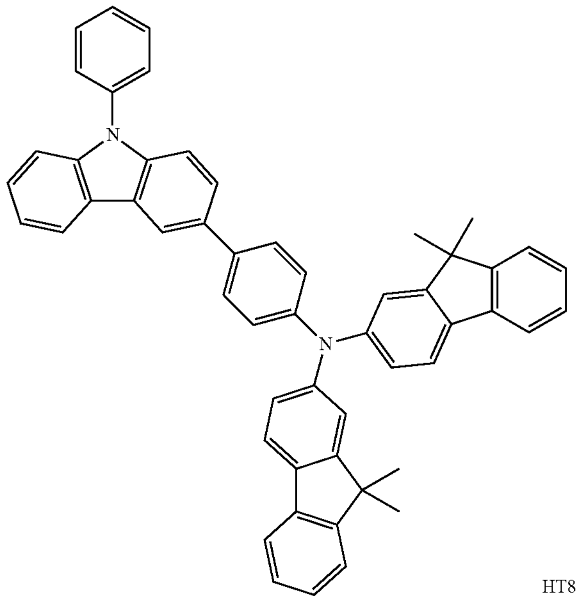
HT8
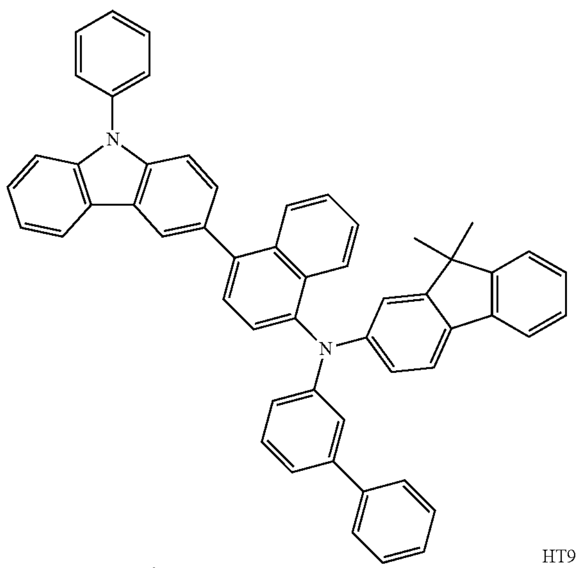
HT9
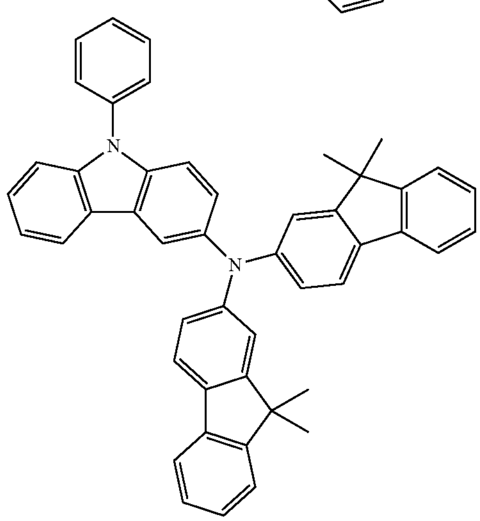
-continued
HT10
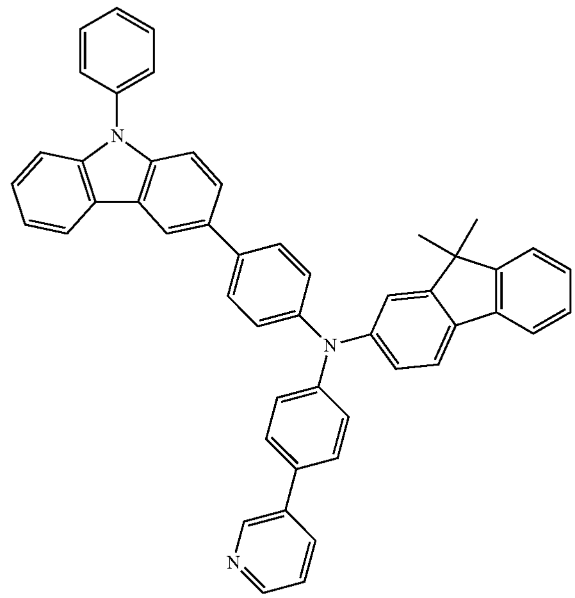
HT11
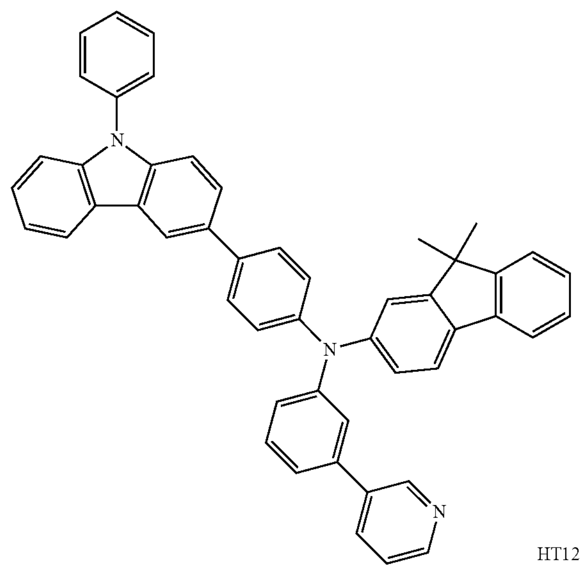
HT12
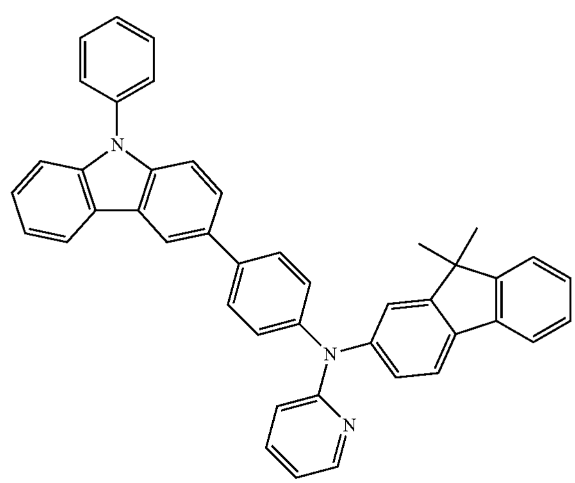

-continued

HT13

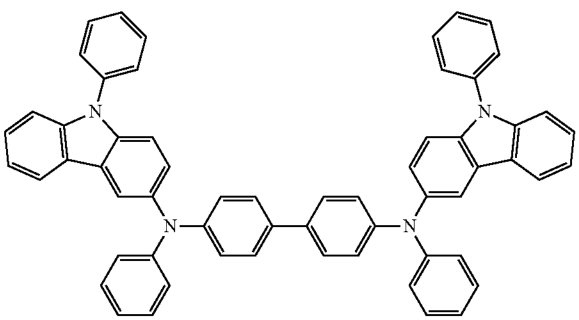

HT14

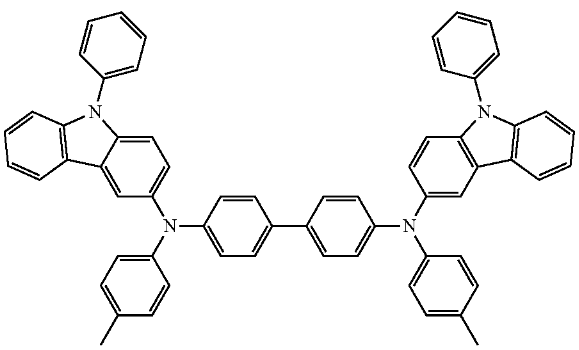

HT15

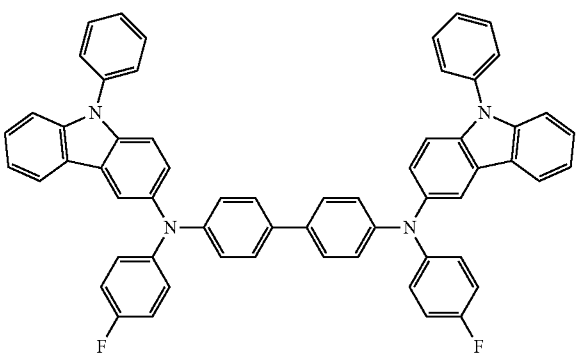

HT16

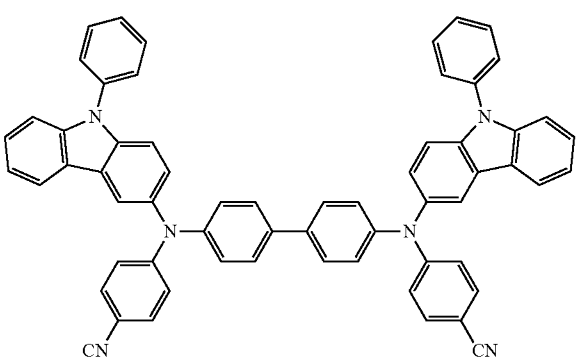

-continued

HT17

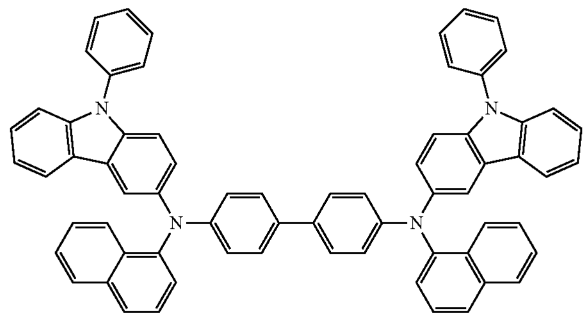

HT18

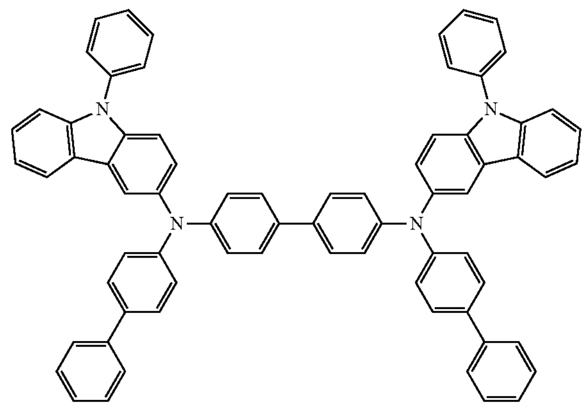

HT19

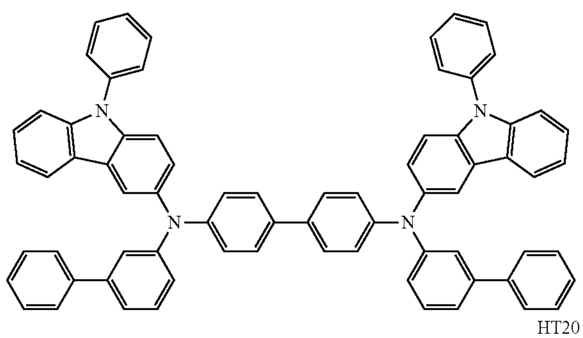

HT20

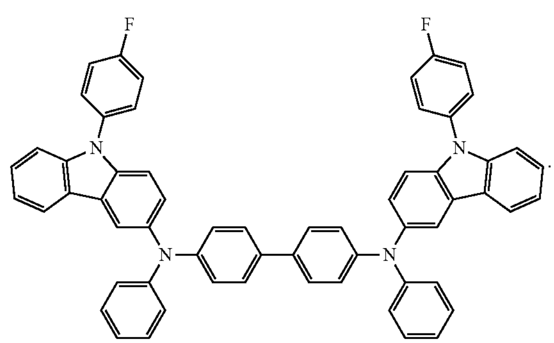

A thickness of the hole transport region may be in a range of about 100 Å to about 10,000 Å, for example, about 100 Å to about 1,000 Å. When the hole transport region includes a hole injection layer and a hole transport layer, a thickness of the hole injection layer may be in a range of about 100 Å to about 10,000 Å (e.g., 9,950 Å or 9,900 Å), for example, about 100 Å to about 1,000 Å, and a thickness of the hole transport layer may be in a range of about 50 Å to about 2,000 Å, for example, about 100 Å to about 1500 Å. When thicknesses of the hole transport region, the hole injection layer, and the hole transport layer are within any of the ranges described above, satisfactory hole transporting properties may be achieved without a substantial increase in a driving voltage.

The hole transport region may further include a charge-generating material to improve conductive properties, in addition to the materials mentioned above. The charge-generating material may be homogeneously or non-homogeneously dispersed throughout the hole transport region.

The charge-generating material may be, for example, a p-dopant. The p-dopant may be one selected from a quinone derivative, a metal oxide, and a cyano group-containing compound, but it is not limited thereto. Non-limiting examples of the p-dopant include quinone derivatives, such as tetracyanoquinonedimethane (TCNQ) or 2,3,5,6-tetrafluoro-tetracyano-1,4-benzoquinonedimethane (F4-TCNQ); metal oxides, such as tungsten oxide or molybdenum oxide, and Compound HT-D1 illustrated below.

Compound HT-D1

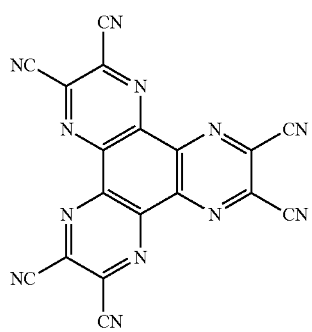

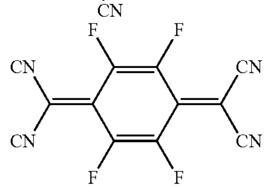

F4-TCNQ

The hole transport region may further include at least one selected from a buffer layer and an electron blocking layer, in addition to the hole injection layer and the hole transport layer. Since the buffer layer may compensate an optical resonance distance according to a wavelength of light emitted from the emission layer, light-emission efficiency of an organic light-emitting device including the buffer layer may be improved. A material included in the buffer layer may be the same (or substantially the same) as the material that may be included in the hole transport region. The electron blocking layer may prevent injection of electrons from the electron transport region.

In some embodiments, an emission layer is formed on the first electrode 110 or on the hole transport region by using various methods, such as, for example, vacuum deposition, spin coating, casting, a LB method, ink-jet printing, laser-printing, or laser-induced thermal imaging. When the emission layer is formed by vacuum deposition or spin coating, deposition and coating conditions for the emission layer may be similar to the deposition and coating conditions for the formation of the hole injection layer.

When the organic light-emitting device 10 is a full color organic light-emitting device, the emission layer may be patterned into a red emission layer, a green emission layer, or a blue emission layer, each of which corresponding to a sub-pixel. Alternatively, the emission layer may emit white light and may have a stacked structure of a red emission layer, a green emission layer, and a blue emission layer, or may include a red-light emission material, a green-light emission material, and a blue-light emission material, which are mixed together in a single layer. Althernatively, the emission layer may be a white emission layer and may further include a color conversion layer or a color filter that converts white light into light of a desired color.

The emission layer may include a host and a dopant.

The host may include a first host represented by Formula 1 and a second host represented by Formula 2:

Formula 1

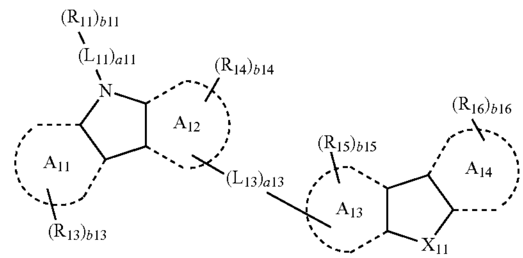

Formula 2

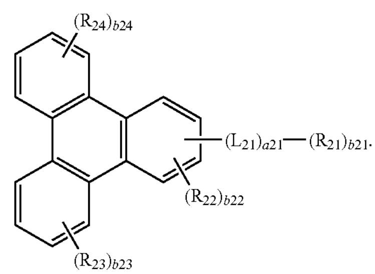

In Formula 1, $A_{11}$, $A_{12}$, $A_{13}$, and $A_{14}$ may be each independently selected from a benzene, a naphthalene, a pyridine, a pyrimidine, a quinoline, an isoquinoline, 2,6-naphthyridine(naphthyridine), 1,8-naphthyridine, 1,5-naphthyridine, 1,6-naphthyridine, 1,7-naphthyridine, 2,7-naphthyridine, a quinoxaline, a phthalazine, a quinazoline, and a cinnoline.

In some embodiments, in Formula 1, $A_{11}$, $A_{12}$, $A_{13}$, and $A_{14}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline, but they are not limited thereto.

In some embodiments, in Formula 1, $A_{11}$ and $A_{14}$ may be each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, and a quinazoline, and $A_{12}$ and $A_{13}$ may each independently be a benzene, but they are not limited thereto.

In some embodiments, in Formula 1, $A_{11}$ and $A_{14}$ may be each independently a benzene or a naphthalene, and $A_{12}$ and $A_{13}$ may be each independently a benzene, but they are not limited thereto.

In some embodiments, in Formula 1, $A_{u}$ to $A_{14}$ may be each independently a benzene, but they are not limited thereto.

In Formula 1, $X_{11}$ may be O, S, $C(R_{17})(R_{18})$, $Si(R_{17})(R_{18})$, $P(R_{17})$, $B(R_{17})$, $P(=O)(R_{17})$, or N—$[(L_{12})_{a12}$-$(R_{12})_{b12}]$, and $R_{17}$, $R_{18}$, $L_{12}$, a12, $R_{12}$, and b12 may be as defined in the present specification.

In some embodiments, in Formula 1, $X_{11}$ may be O, S, $C(R_{17})(R_{18})$, $Si(R_{17})(R_{18})$, $P(R_{17})$, $B(R_{17})$, $P(=O)(R_{17})$ or N-$[(L_{12})_{a12}$-$(R_{12})_{b12}]$; and $R_{17}$ and $R_{18}$ may be optionally fused to each other and form a saturated or unsaturated ring, but they are not limited thereto.

In some embodiments, in Formula 1, $X_{11}$ may be O, S, $C(R_{17})(R_{18})$, or N-$[(L_{12})_{a12}$-$(R_{12})_{b12}]$, but it is not limited thereto.

In Formulae 1 and 2, $L_{11}$ to $L_{13}$ and $L_{21}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, and substituted a divalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_5$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$;

where $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formulae 1 and 2, $L_{11}$ to $L_{13}$ and $L_{21}$ may be each independently selected from:

a phenylene group, a pentalenylene group, an indenylene group, a naphthylene group, an azulenylene group, a heptalenylene group, an indacenylene group, an acenaphthylene group, afluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, ovalenylene group, a pyrrolylene group, a thiophenylene group, a furanyiene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolyiene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic add or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but they are not limited thereto.

In some embodiments, in Formulae 1 and 2, $L_{11}$ to $L_{13}$ and $L_{21}$ may be each independently selected from:

a phenylene group, a naphthylene group, a fluorenylene group, a pyridinylene group, a pyrimidinylene group, a quinolinylene group, an isoquinolinylene group, a quinazolinylene group, a carbazolylene group, a triazinylene group, a dibenzofuranylene group, and a dibenzothiophenylene group; and a phenylene group, a naphthylene group, a fluorenylene group, a pyridinylene group, a pyrimidinylene group, a quinolinylene group, an isoquinolinylene group, a quinazolinylene group, a carbazolylene group, a triazinylene group, a dibenzofuranylene group, and a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but they are not limited thereto.

In another embodiment, in Formulae 1 and 2, $L_{11}$ to $L_{13}$ and $L_{21}$ may be each independently a group selected from Formulae 3-1 to 3-41, but they are not limited thereto:

3-1

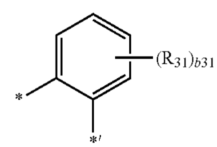

3-2

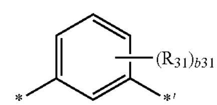

3-3

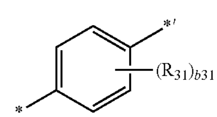

3-4

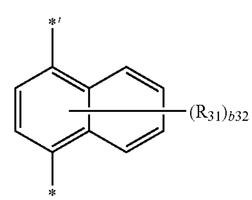

3-5

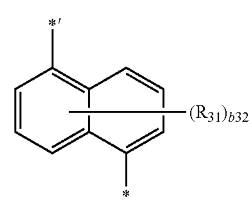

3-6

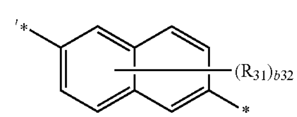

3-7

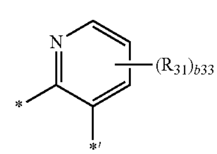

-continued
3-8
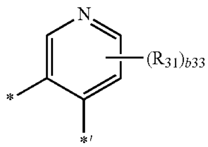
3-9
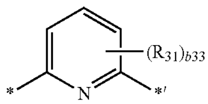
3-10
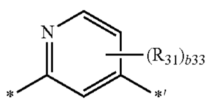
3-11
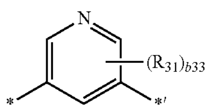
3-12
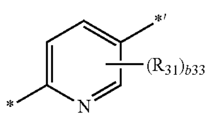
3-13
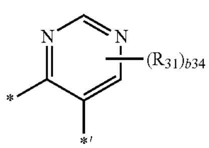
3-14
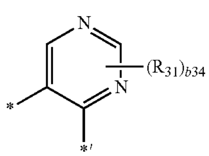
3-15
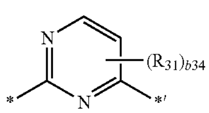
3-16
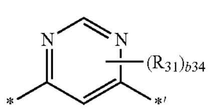
3-17
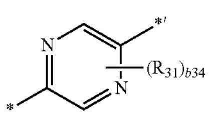
3-18
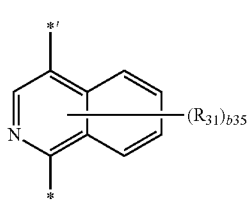
-continued
3-19
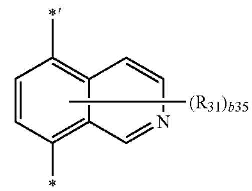
3-20
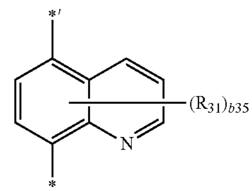
3-21
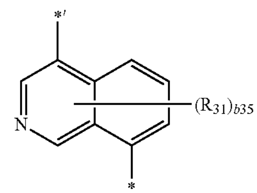
3-22
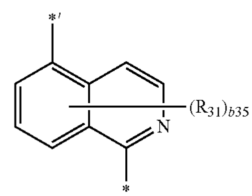
3-23
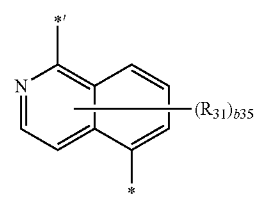
3-24
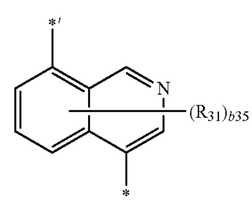
3-25
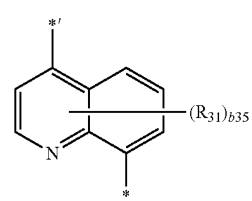
3-26
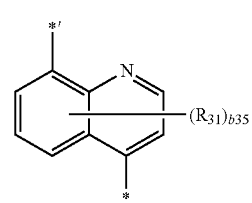

-continued 3-27

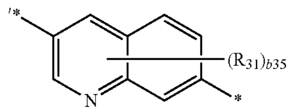

3-28

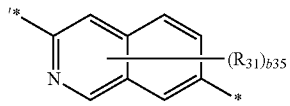

3-29

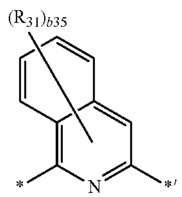

3-30

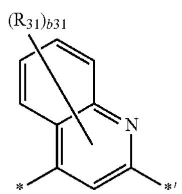

3-31

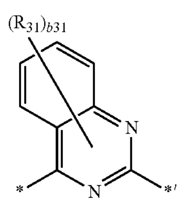

3-32

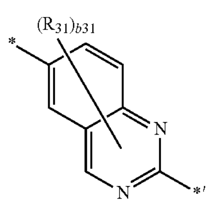

3-33

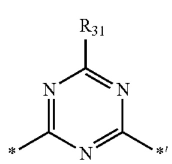

3-34

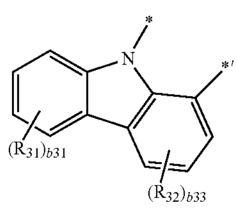

3-35

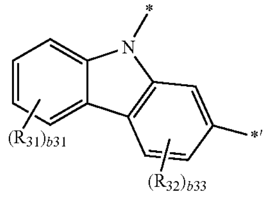

-continued 3-36

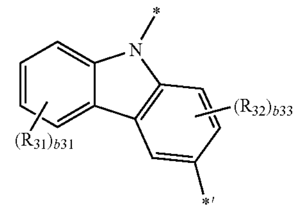

3-37

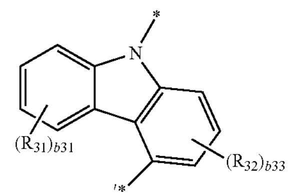

3-38

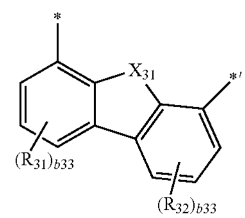

3-39

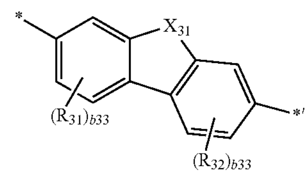

3-40

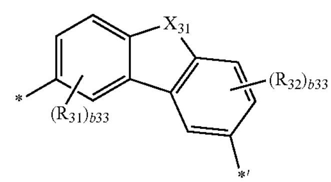

3-41

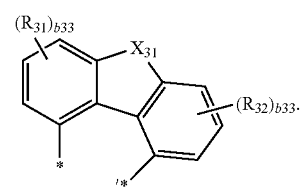

In Formulae 3-1 to 3-41, $X_{31}$ is selected from O, S, $N(R_{33})$, and $C(R_{33})(R_{34})$;

$R_{31}$ to $R_{34}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

b31 is selected from 1, 2, 3, and 4;
b32 is selected from 1, 2, 3, 4, 5, and 6;
b33 is selected from 1, 2, and 3;
b34 is selected from 1 and 2;
b35 is selected from 1, 2, 3, 4, and 5; and
* and *' are each independently a binding site to a neighboring atom.
In another embodiment, in Formulae 1 and 2, $L_{11}$ to $L_{13}$ and $L_{21}$ may be each independently selected from Formulae 4-1 to 4-57, but they are not limited thereto:
4-1
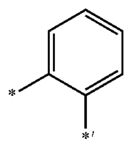
4-2
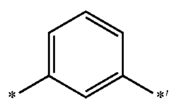
4-3
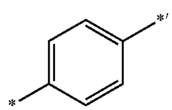
4-4
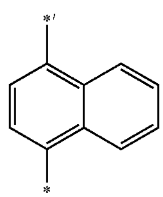
4-5
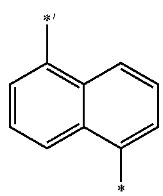
4-6
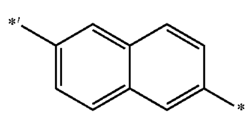
4-7
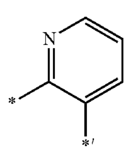
4-8
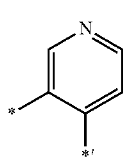
4-9
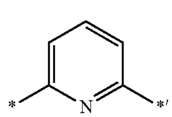
-continued
4-10
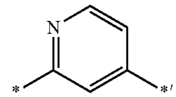
4-11
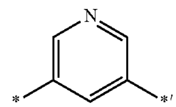
4-12
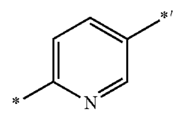
4-13
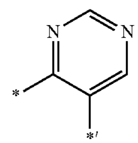
4-14
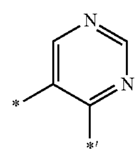
4-15
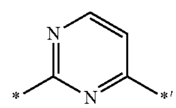
4-16
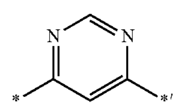
4-17
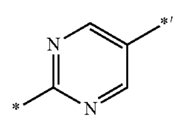
4-18
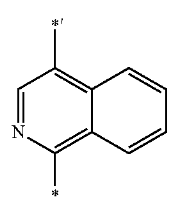
4-19
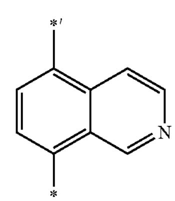
4-20
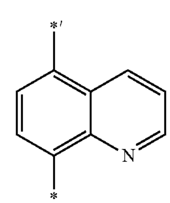

-continued
4-21
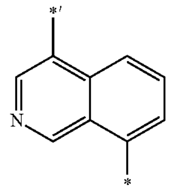
4-22
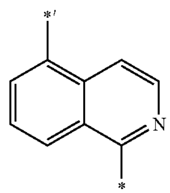
4-23
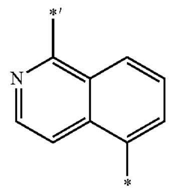
4-24
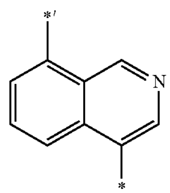
4-25
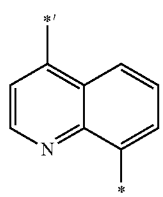
4-26
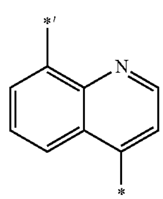
4-27
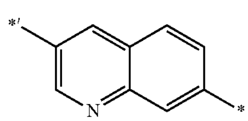
4-28
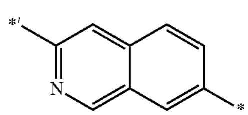
4-29
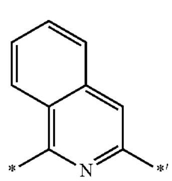
-continued
4-30
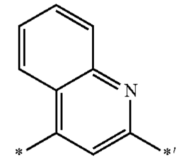
4-31
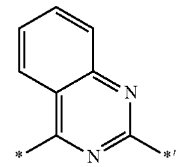
4-32
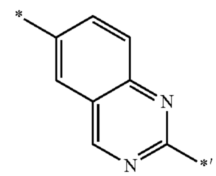
4-33
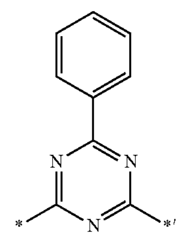
4-34
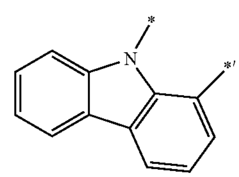
4-35
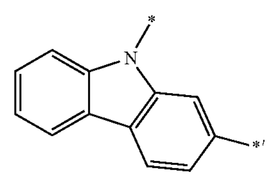
4-36
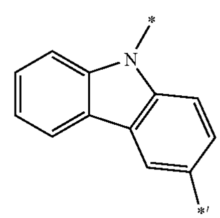
4-37
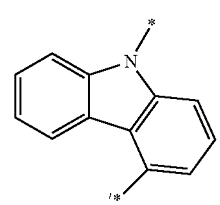

-continued
4-38
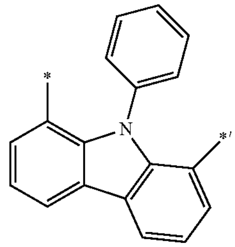
4-39
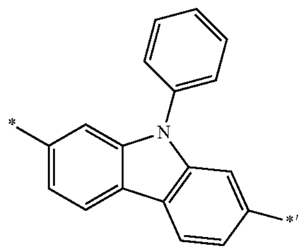
4-40
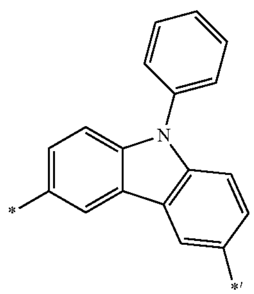
4-41
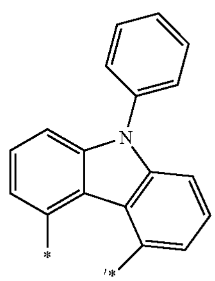
4-42
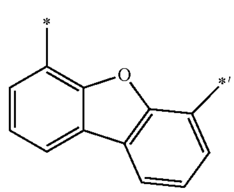
4-43
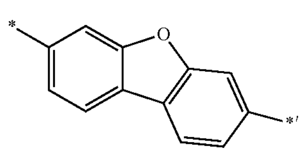
4-44
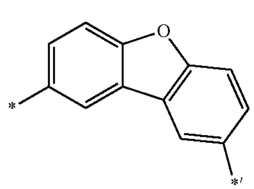
-continued
4-45
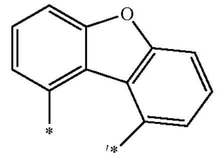
4-46
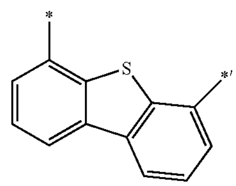
4-47
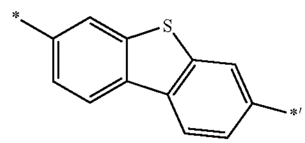
4-48
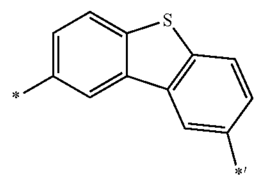
4-49
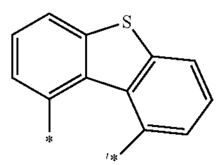
4-50
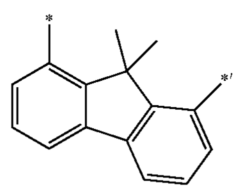
4-51
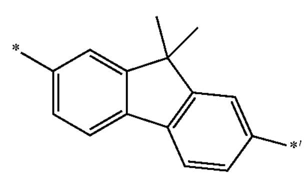
4-52
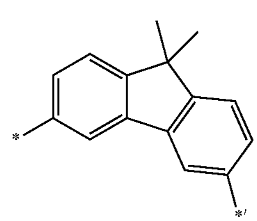
4-53
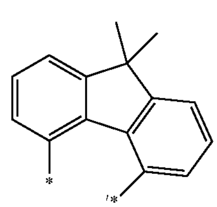

-continued
4-54
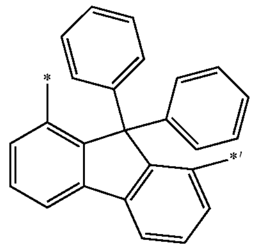
4-55
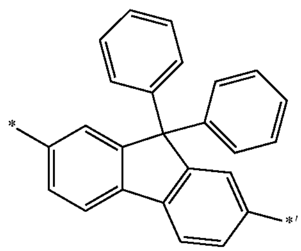
4-56
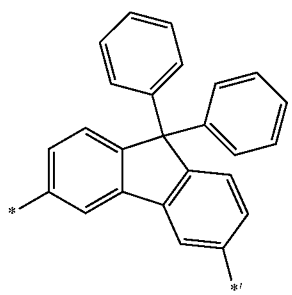
4-57
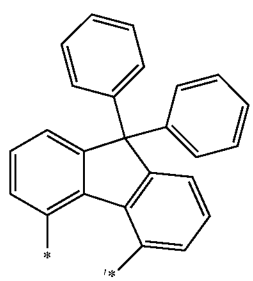
.
In Formulae 4-1 to 4-57,
* and *' are each independently a binding site to a neighboring atom.
In some embodiments, in Formulae 1 and 2, $L_{11}$ to $L_{13}$ and $L_{21}$ may be each independently selected from Formulae 4-1 to 4-6 and 4-50 to 4-57, but they are not limited thereto:
4-1
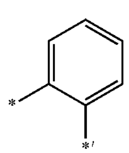
4-2
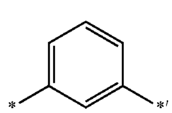
-continued
4-3
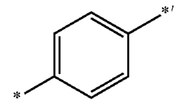
4-4
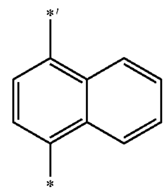
4-5
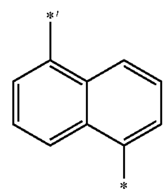
4-6
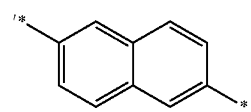
4-50
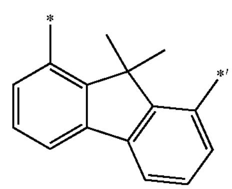
4-51
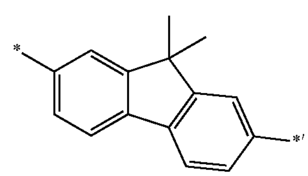
4-52
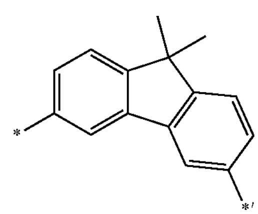
4-53
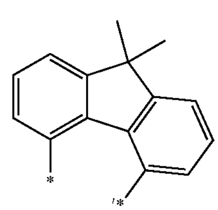

-continued

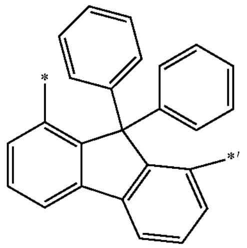

4-54

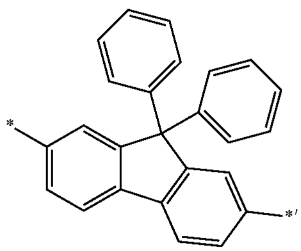

4-55

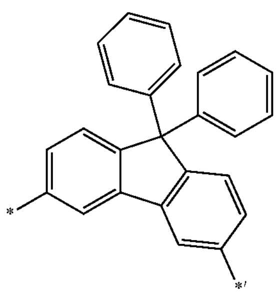

4-56

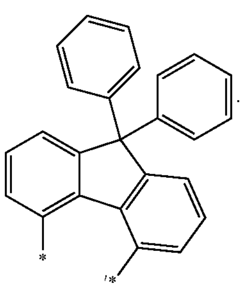

4-57

In Formula 4-1 to 4-6 and 4-50 to 4-57,

* and *' are each independently a binding site to a neighboring atom.

In Formula 1, a11 denotes the number of $L_{11}$s, and a11 may be selected from 0, 1, 2, 3, 4, and 5. When a11 is 0, $(L_{11})_{a11}$ denotes a single bond. When a11 is 2 or greater, a plurality of $L_{11}$s may be identical to or different from each other. In some embodiments, in Formula 1; a11 may be selected from 0 and 1, but it is not limited thereto.

In Formulae 1 and 2, a12, a13, and a21 may be each independently as defined in connection with a11 and Formulae 1 and 2.

In Formulae 1 and 2, a12, a13, and a21 may be each independently selected from 0, 1, 2, 3, 4, and 5. In some embodiments, a12, a13, and a21 may be each independently selected from 0 and 1, but they are not limited thereto. In some embodiments, in Formula 1, a13 may be 0, but it is not limited thereto.

In Formulae 1 and 2, $R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

at least one substituent of the substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Cl_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —N($Q_{31}$)($Q_{32}$), —Si($Q_{33}$)($Q_{34}$)($Q_{35}$), and —B($Q_{36}$)($Q_{37}$), where $Q_1$ to $Q_7$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formulae 1 and 2, at least one of $R_{11}$ and $R_{12}$ may be an electron transporting group, and $R_{21}$ may be a hole transporting group, but they are not limited thereto.

In some embodiments, in Formulae 1 and 2, at least one of $R_{11}$ and $R_{12}$ may be a hole transporting group, and $R_{21}$ may be an electron transporting group, but they are not limited thereto.

In some embodiments, in Formulae 1 and 2, $R_{11}$, $R_{12}$, and $R_{21}$ may be each independently selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, a dibenzodioxinyl group, and —N($Q_1$)($Q_2$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, and a dibenzodioxinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —Si($Q_{33}$)($Q_{34}$)($Q_{35}$), where $Q_1$, $Q_2$ and $Q_{33}$ to $Q_{35}$ may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but they are not limited thereto.

In some embodiments, in Formulae 1 and 2, $R_{11}$, $R_{12}$, and $R_{21}$ may be each independently selected from:

a phenyl group, a naphthyl group, a fluorenyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, a dibenzodioxinyl group, and —N(C)$_1$)(Q$_2$); and a phenyl group, a naphthyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, and a dibenzodioxinyl group, each substituted with at least one selected from a deuterium, —F, —Cl, —Br, —I, a cyano group, a nitro group, a $C_1$-$C_{20}$ alkyl group, a phenyl group, a biphenyl group, a naphthyl group, a fluorenyl group, a carbazolyl group, a dibenzofuranyl group, a dibenzothiophenyl group, and —Si($Q_{33}$)($Q_{34}$)($Q_{35}$), where $Q_1$, $Q_2$ and $Q_{33}$ to $Q_{35}$ may be each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group, but they are not limited thereto.

In some embodiments, in Formulae 1 and 2, $R_{11}$, $R_{12}$, and $R_{21}$ may be each independently a group selected from Formulae 5-1 to 5-58, but they are not limited thereto:

5-1

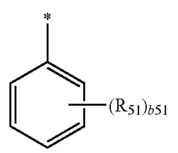

5-2

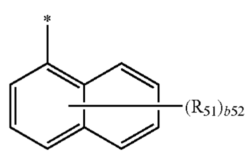

5-3

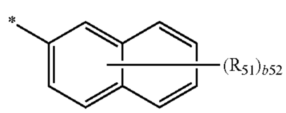

5-4

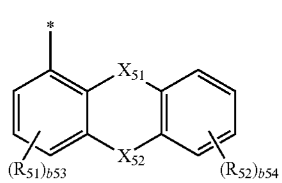

5-5

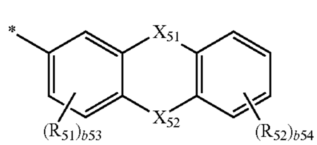

-continued 5-6

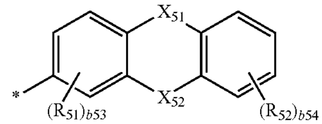

5-7

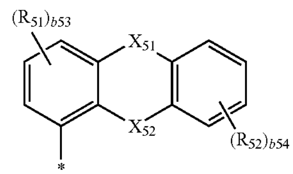

5-8

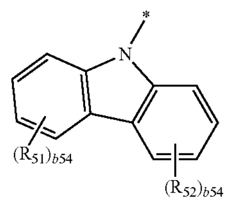

5-9

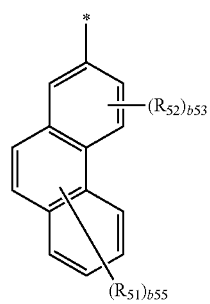

5-10

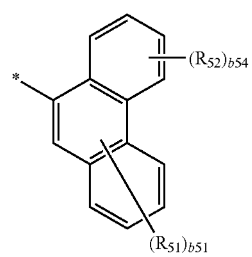

5-11

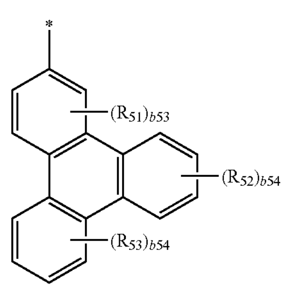

5-12

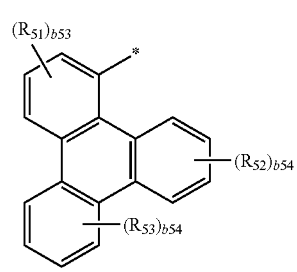

-continued
5-13
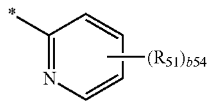
5-14
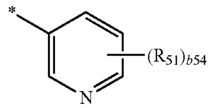
5-15
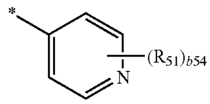
5-16
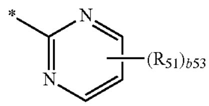
5-17
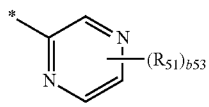
5-18
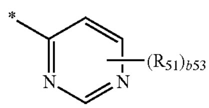
5-19
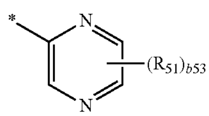
5-20
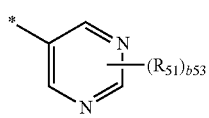
5-21
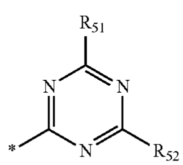
5-22
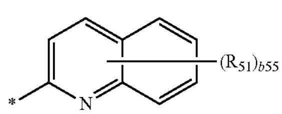
5-23
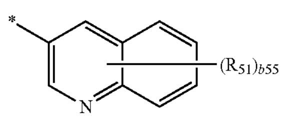
5-24
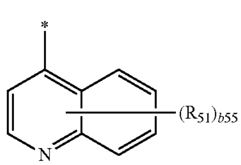
-continued
5-25
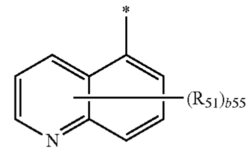
5-26
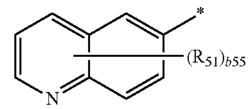
5-27
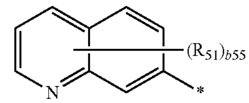
5-28
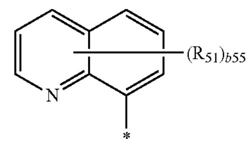
5-29
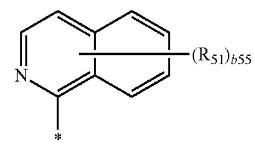
5-30
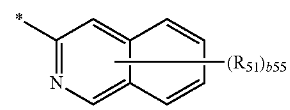
5-31
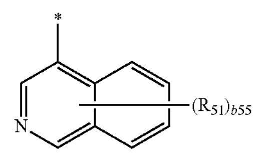
5-32
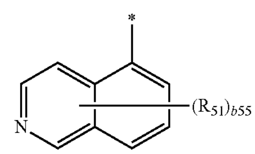
5-33
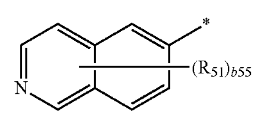
5-34
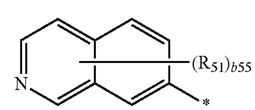
5-35
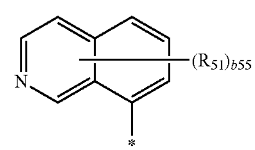
5-36
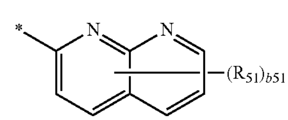

-continued
5-37
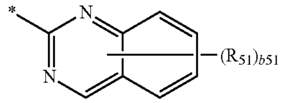
5-38
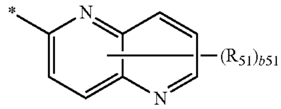
5-39
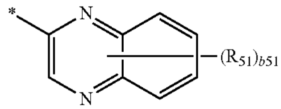
5-40
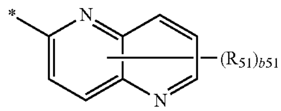
5-41
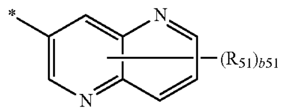
5-42
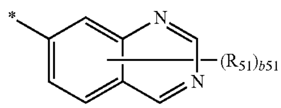
5-43
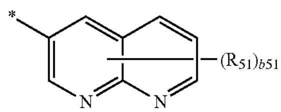
5-44
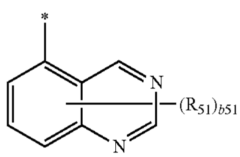
5-45
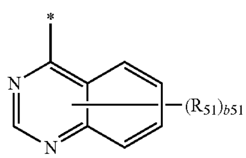
5-46
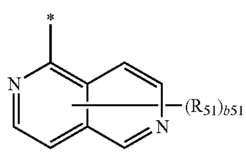
5-47
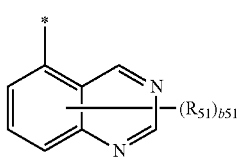
5-48
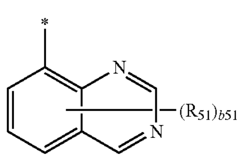
-continued
5-49
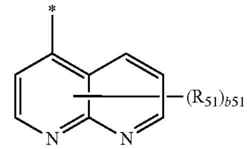
5-50
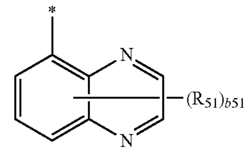
5-51
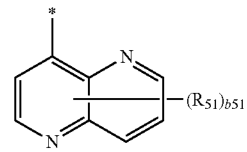
5-52
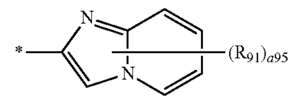
5-53
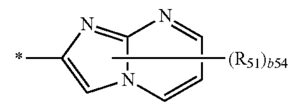
5-54
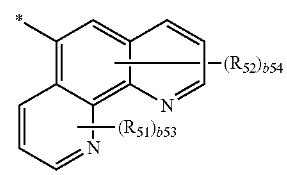
5-55
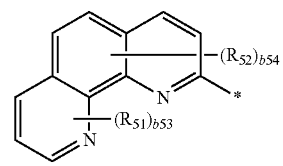
5-56
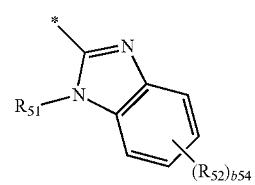
5-57
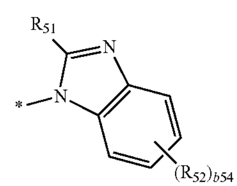
5-58
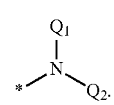
In Formulae 5-1 to 5-58,
$X_{51}$ is selected from a single bond, $N(R_{54})$, $C(R_{54})(R_{55})$, O, and S;
$X_{52}$ is selected from $N(R_{56})$, $C(R_{56})(R_{57})$, O, and S;

$R_{51}$ to $R_{57}$ are each independently selected from a hydrogen, a deuterium, —F, —Cl, —Br, —I, a cyano group, a nitro group, a $C_1$-$C_{20}$ alkyl group, a phenyl group, a biphenyl group, a naphthyl group, a fluorenyl group, a carbazolyl group, a dibenzofuranyl group, a dibenzothiophenyl group, and —Si($Q_{33}$)($Q_{34}$)($Q_{35}$);

where $Q_1$, $Q_2$, and $Q_{33}$ to $Q_{35}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 is selected from 1, 2, 3, 4, and 5;

b52 is selected from 1, 2, 3, 4, 5, 6, and 7;

b53 is selected from 1, 2, and 3;

b54 is selected from 1, 2, 3, and 4;

b55 is selected from 1, 2, 3, 4, 5, and 6;

* is a binding site to a neighboring atom.

In some embodiments, in Formulae 1 and 2, at least one of $R_{11}$ and $R_{12}$ may be selected from Formulae 5-13 to 5-57, and $R_{21}$ may be selected from Formulae 5-1 to 5-12 and 5-58, but they are not limited thereto.

In some embodiments, in Formulae 1 and 2, at least one of $R_{11}$ and $R_{12}$ may be selected from Formulae 5-1 to 5-12 and 5-58, and $R_{21}$ may be selected from Formulae 5-13 to 5-57, but they are not limited thereto.

In some embodiments, in Formulae 1 and 2, $R_{11}$, $R_{12}$, and $R_{21}$ may be each independently selected from Formulae 6-1 to 6-138, but they are not limited thereto:

6-1

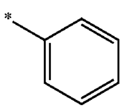

6-2

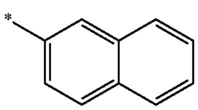

6-3

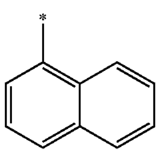

6-4

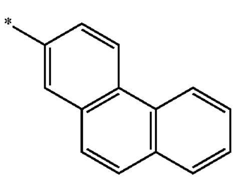

6-5

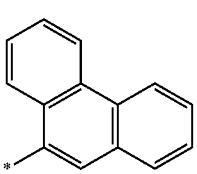

6-6

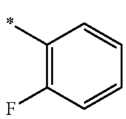

-continued 6-7

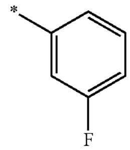

6-8

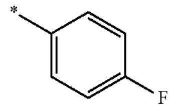

6-9

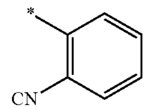

6-10

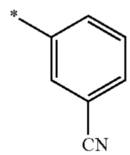

6-11

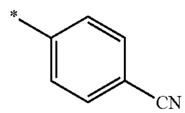

6-12

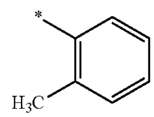

6-13

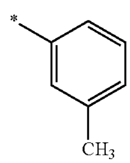

6-14

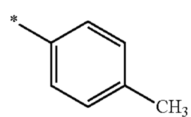

6-15

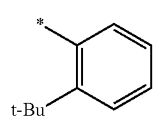

6-16

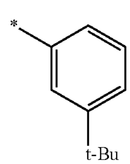

6-17

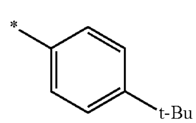

6-18

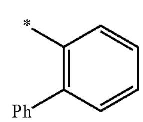

-continued
6-19
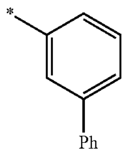
6-20
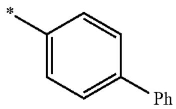
6-21
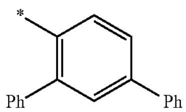
6-22
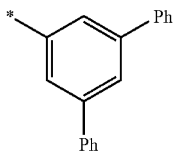
6-23
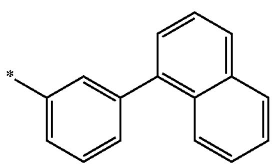
6-24
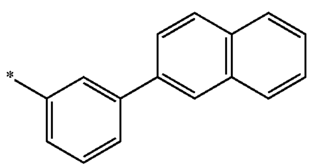
6-25
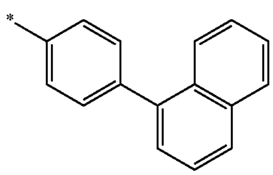
6-26
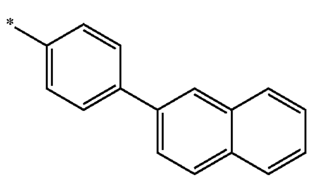
6-27
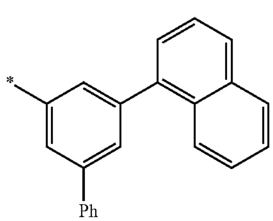
-continued
6-28
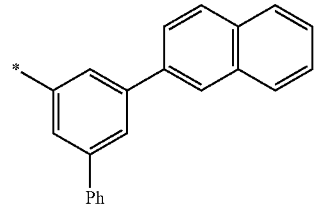
6-29
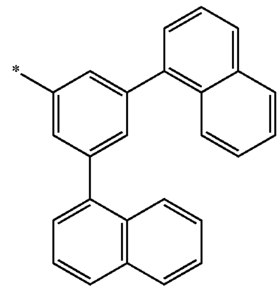
6-30
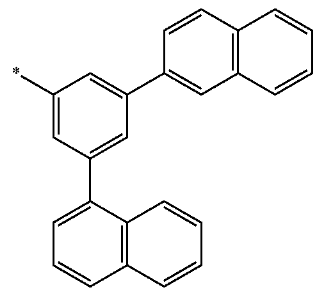
6-31
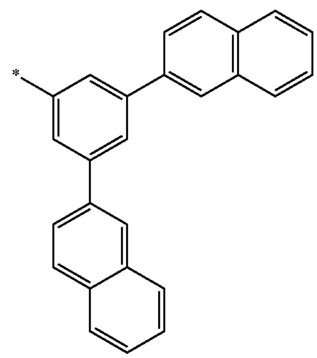
6-32
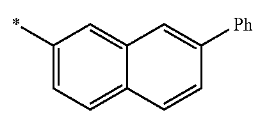
6-33
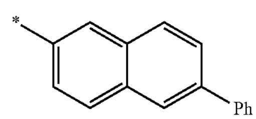
6-34
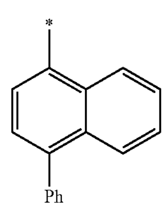

-continued
6-35
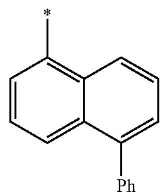
6-36
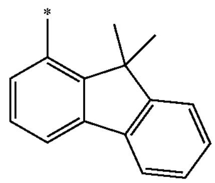
6-37
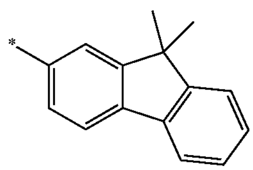
6-38
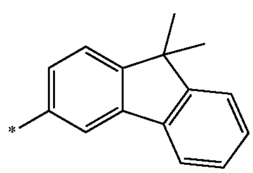
6-39
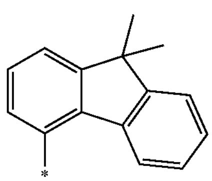
6-40
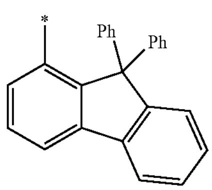
6-41
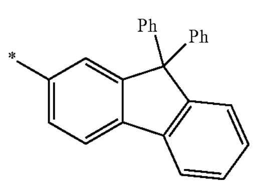
6-42
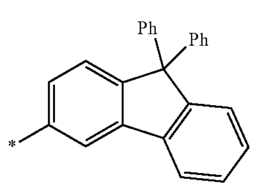
-continued
6-43
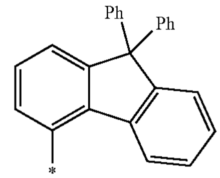
6-44
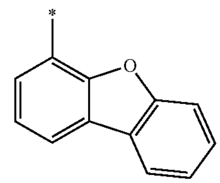
6-45
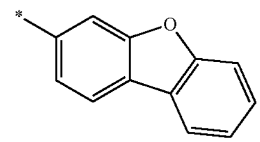
6-46
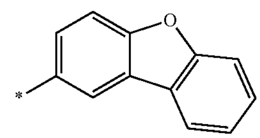
6-47
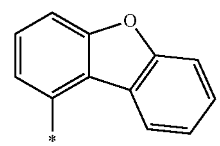
6-48
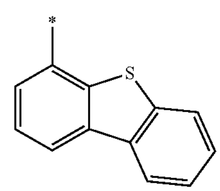
6-49
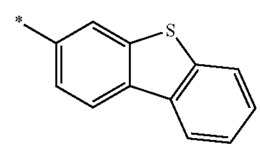
6-50
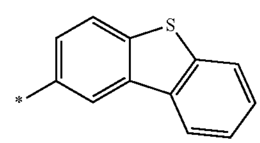
6-51
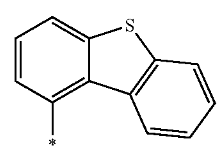
6-52
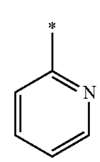

-continued
6-53
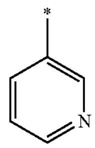
6-54
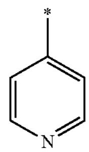
6-55
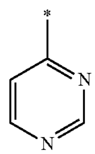
6-56
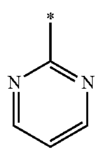
6-57
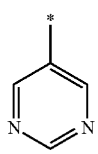
6-58
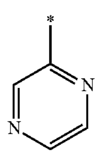
6-59
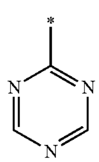
6-60
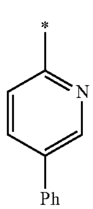
6-61
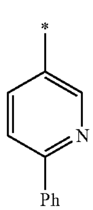
-continued
6-62
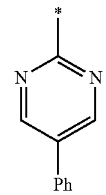
6-63
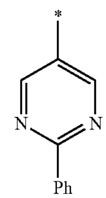
6-64
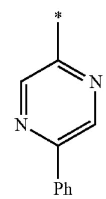
6-65
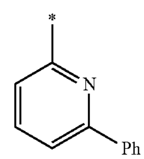
6-66
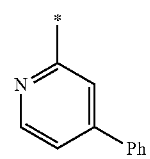
6-67
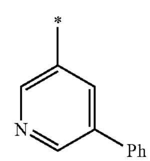
6-68
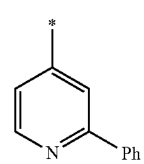
6-69
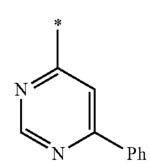
6-70
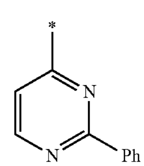

-continued
6-71
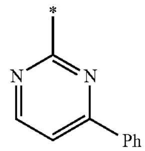
6-72
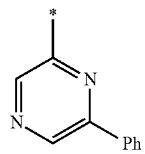
6-73
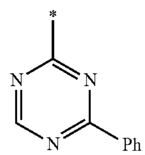
6-74
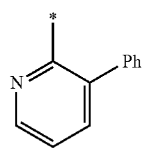
6-75
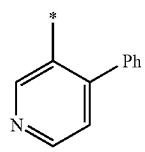
6-76
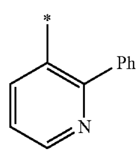
6-77
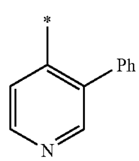
6-78
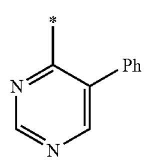
6-79
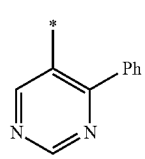
6-80
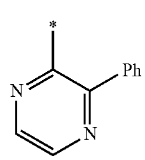
-continued
6-81
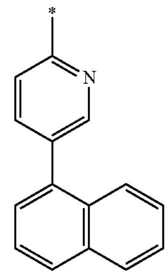
6-82
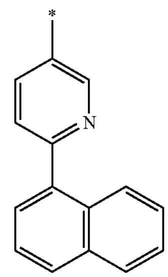
6-83
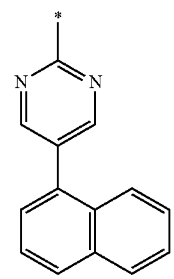
6-84
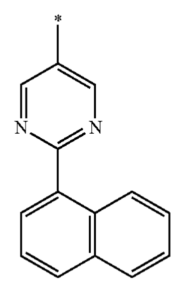
6-85
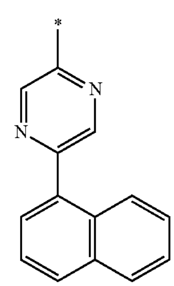
6-86
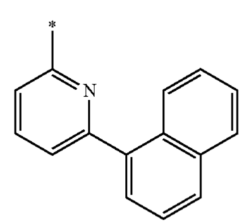

-continued
6-87
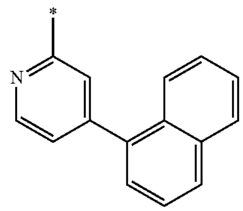
6-88
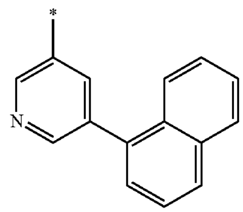
6-89
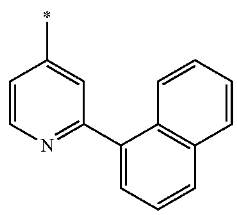
6-90
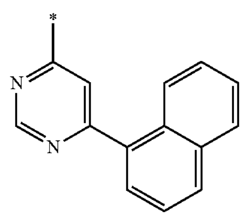
6-91
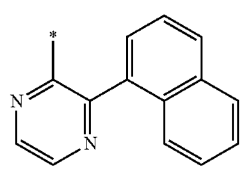
6-92
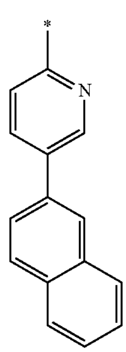
-continued
6-93
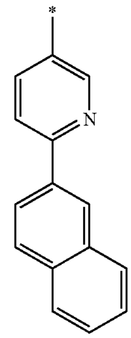
6-94
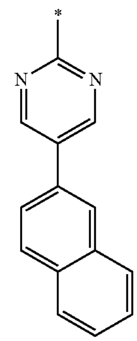
6-95
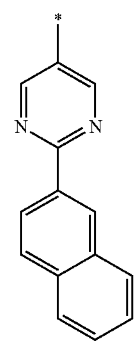
6-96
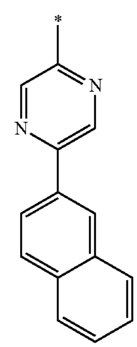
6-97
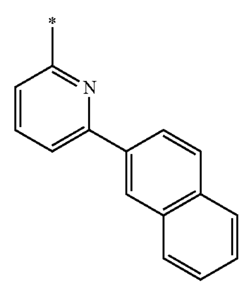

6-98
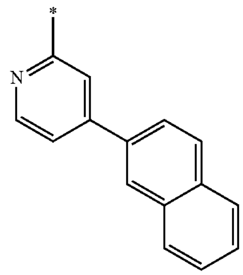
6-99
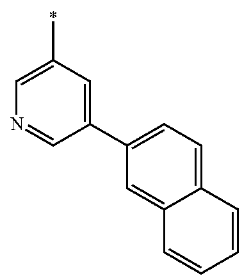
6-100
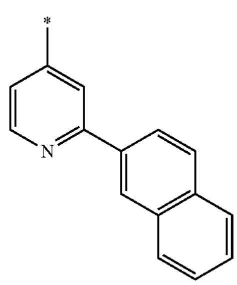
6-101
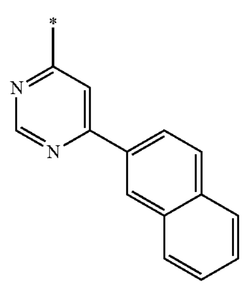
6-102
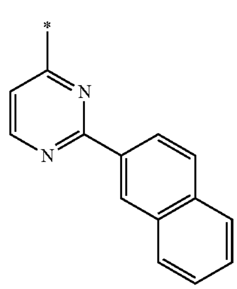
6-103
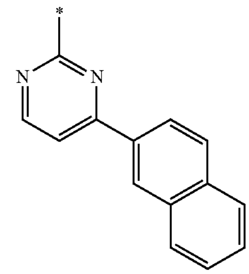
6-104
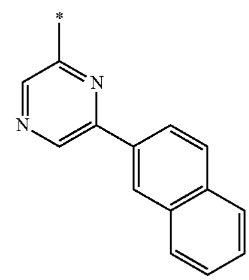
6-105
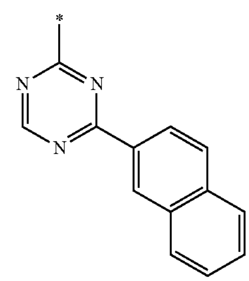
6-106
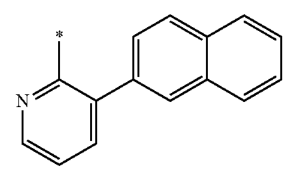
6-107
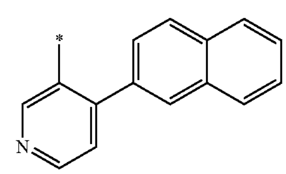
6-108
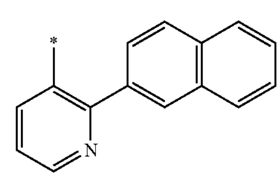
6-109
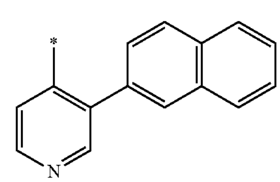

-continued
6-110
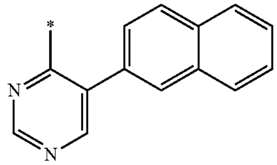
6-111
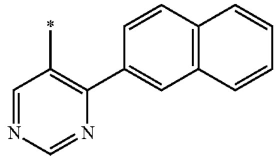
6-112
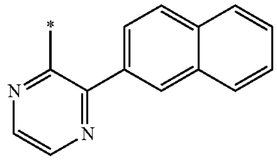
6-113
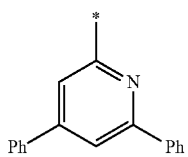
6-114
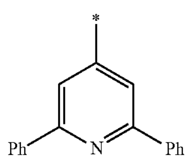
6-115
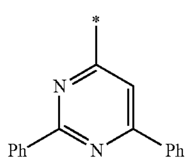
6-116
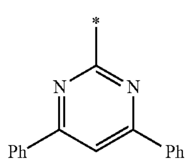
6-117
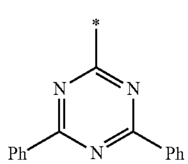
6-118
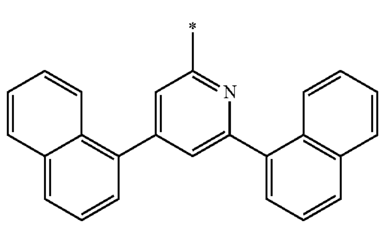
-continued
6-119
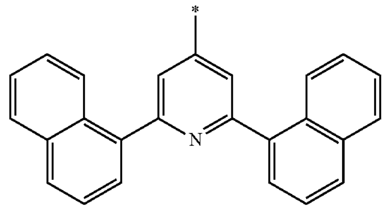
6-120
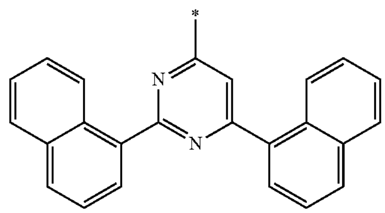
6-121
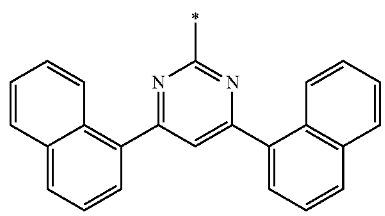
6-122
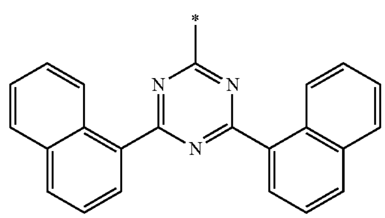
6-123
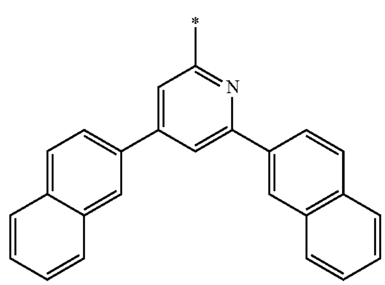
6-124
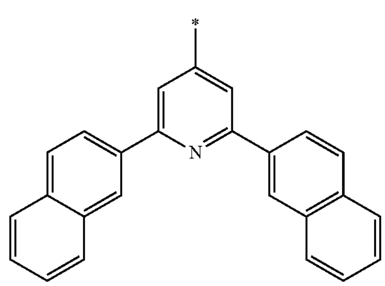

-continued
6-125
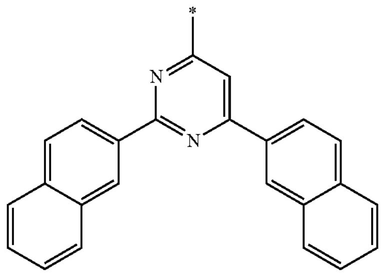
6-126
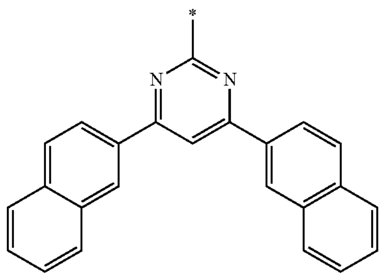
6-127
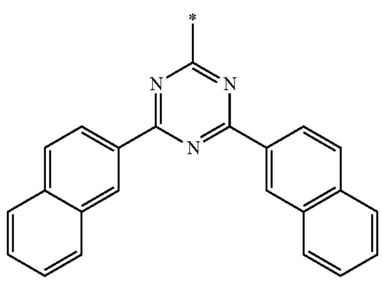
6-128
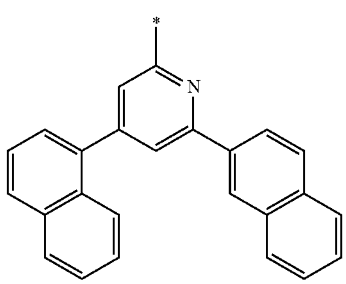
6-129
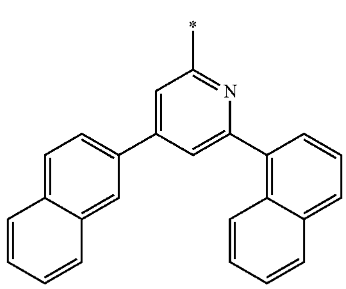
-continued
6-130
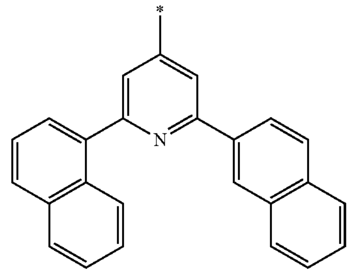
6-131
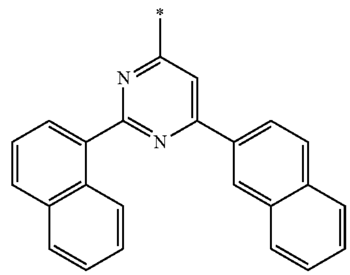
6-132
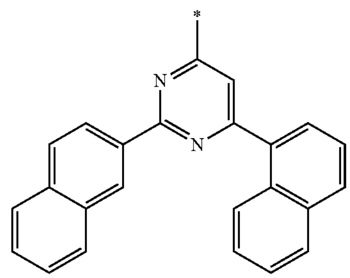
6-133
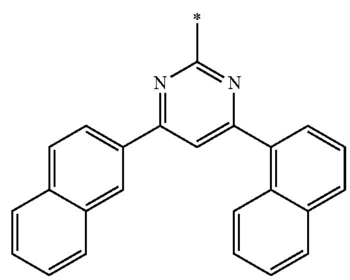
6-134
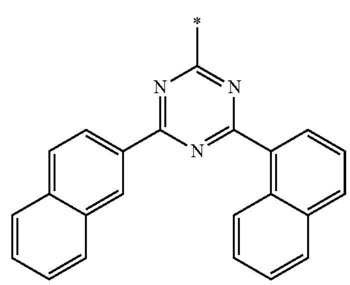
6-135
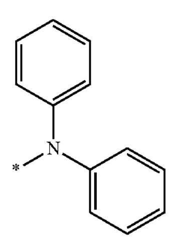

-continued 6-136

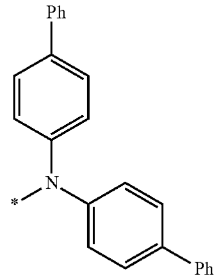

6-137

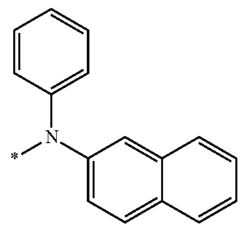

6-138

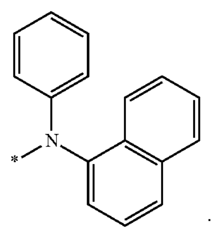

In Formulae 6-1 to 6-138, t-Bu denotes a tert-butyl group;

Ph denotes a phenyl group; and

* is a binding site to a neighboring atom.

In some embodiments, in Formulae 1 and 2, at least one of $R_{11}$ and $R_{12}$ may be selected from Formulae 6-52 to 6-134, and $R_{21}$ may be selected from Formulae 6-1 to 6-51 and 6-135 to 6-138, but they are not limited thereto.

In some embodiments, in Formulae 1 and 2, at least one of $R_{11}$ and $R_{12}$ may be selected from Formulae 6-1 to 6-51 and 6-135 to 6-138, and $R_{21}$ may be selected from Formulae 6-52 to 6-134, but they are not limited thereto.

In Formula 1, b11 denotes the number of $R_{11}$s, and b11 may be selected from 1, 2, 3, and 4. When b11 is 2 or greater, a plurality of $R_{11}$s may be identical to or different from each other. In some embodiments, in Formula 1, b11 may be selected from 1 and 2, but it is not limited thereto.

In Formulae 1 and 2, b12 and b21 may be each independently as defined in connection with b11 and Formulae 1 and 2.

In Formulae 1 and 2, b12 and b21 may be each independently selected from 1, 2, 3, and 4. In some embodiments, in Formulae 1 and 2, b12 and b21 may be each independently selected from 1 and 2, but they are not limited thereto.

In Formulae 1 and 2, $R_{13}$ to $R_{18}$ and $R_{22}$ to $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, where at least one substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_8$-$C_{80}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formulae 1 and 2, $R_{13}$ to $R_{18}$ and $R_{22}$ *to* $R_{24}$ may be each independently selected from:

a hydrogen, a methyl group, an ethyl group, an n-propyl group, an n-butyl group, a phenyl group, a naphthyl group, an anthryl group, a pyrenyl group, a phenanthrenyl group, a fluorenyl group, and a carbazolyl group; and a phenyl group, a naphthyl group, an anthryl group, a pyrenyl group, a phenanthrenyl group, a fluorenyl group, and a carbazolyl group, each substituted with at least one selected from a deuterium, —F, —Cl, —Br, —I, a cyano group, a nitro group, a methyl group, a phenyl group, and a naphthyl group, but they are not limited thereto.

In some embodiments, in Formulae 1 and 2, $R_{13}$ to $R_{18}$ and $R_{22}$ *to* $R_{24}$ may be each independently selected from a hydrogen, a methyl group, a phenyl group, a naphthyl group, and a carbazolyl group, but they are not limited thereto.

In some embodiments, in Formulae 1 and 2, $R_{13}$ to $R_{18}$ and $R_{22}$ *to* $R_{24}$ may be each independently a hydrogen atom, but they are not limited thereto.

In Formula 1, b13 denotes the number of $R_{13}$s, and b13 may be selected from 1, 2, 3, and 4. When b13 is 2 or greater, a plurality of $R_{13}$s may be identical to or different from each other.

In Formulae 1 and 2, b14 to b16 and b22 to b24 may be each independently as defined in connection with b11 and Formulae 1 and 2.

In Formulae 1 and 2, b14 to b16 and b22 to b24 may be each independently selected from 1, 2, 3, and 4.

In some embodiments, the first host may be represented by Formula 1-1, but it is not limited thereto:

Formula 1-1

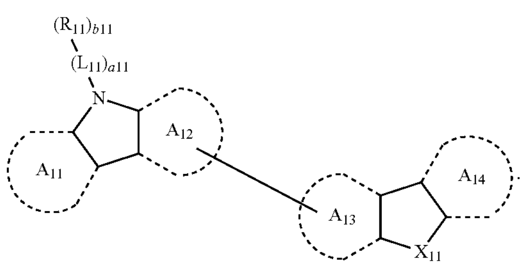

In Formula 1-1, $A_{11}$ to $A_{14}$, $X_{11}$, $L_{11}$, a11, $R_{11}$, and b11 are as defined above in the present specification.

In some embodiments, the first host may be represented by any one selected from Formulae 1-11 to 1-26, but it is not limited thereto:

1-11

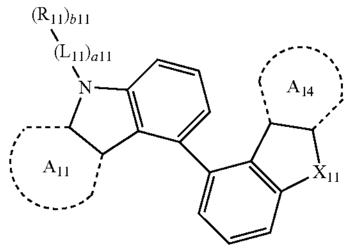

1-12

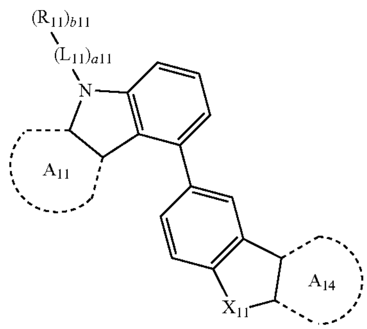

1-13

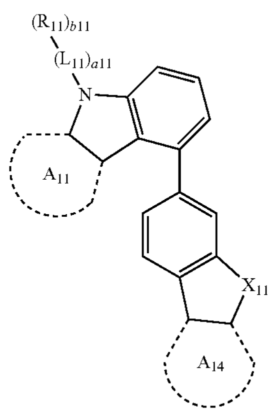

1-14

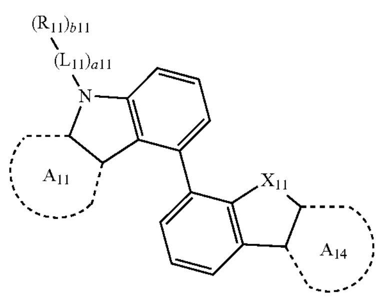

1-15

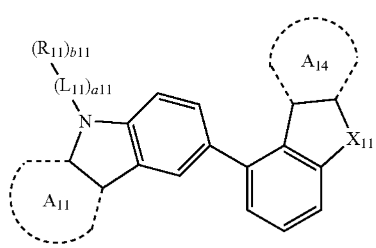

-continued
1-16
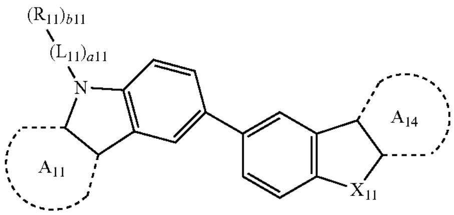
1-17
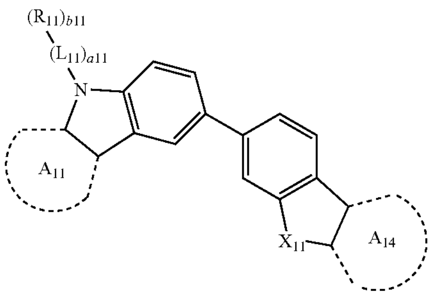
1-18
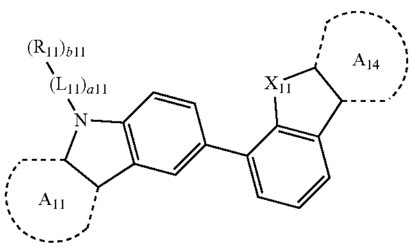
1-19
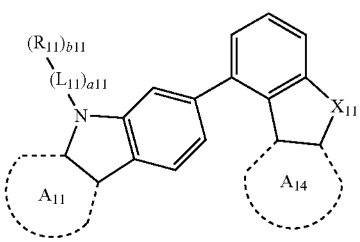
1-20
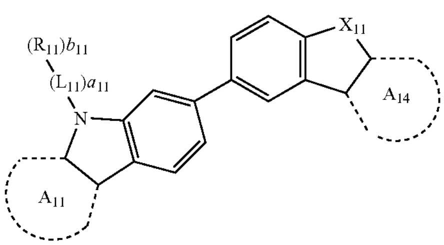
1-21
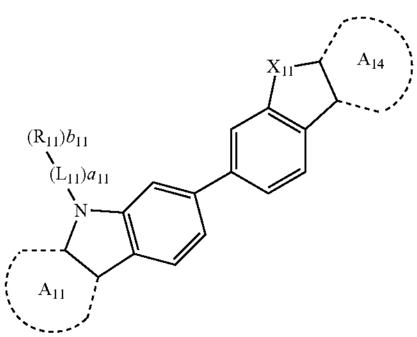
-continued
1-22
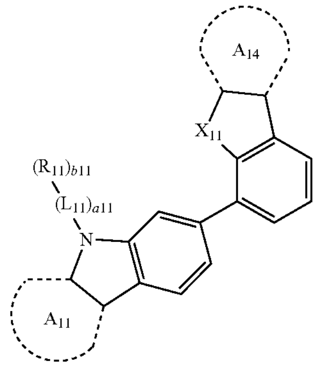
1-23
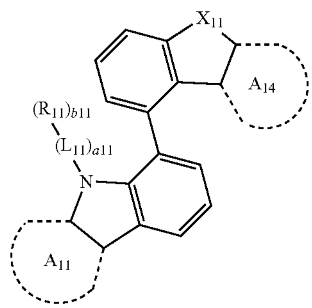
1-24
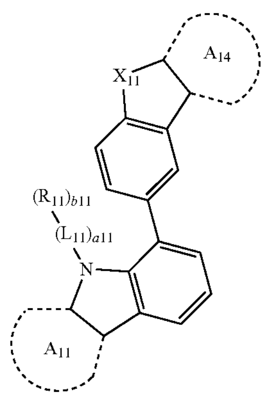
1-25
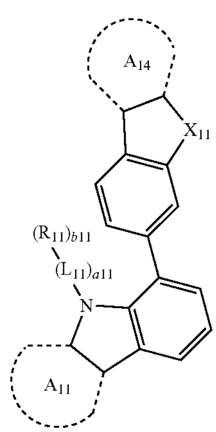

-continued 1-26

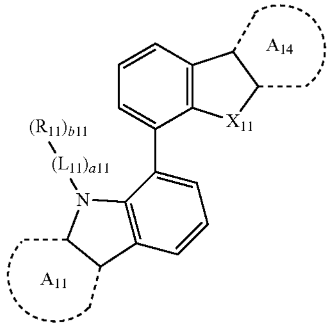

In Formulae 1-11 to 1-26, $A_{11}$ to $A_{14}$, $X_{11}$, $L_{11}$, a11, $R_{11}$, and b11 are as defined above in the present specification.

In some embodiments, the second host may be represented by Formula 2-1, but it is not limited thereto:

Formula 2-1

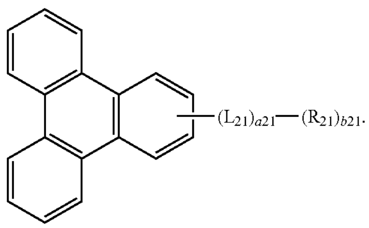

$L_{21}$, a21, $R_{21}$, and b21 are as defined above in the present specification.

In some embodiments, the second host may be represented by any one selected from Formulae 2-11 and 2-12, but it is not limited thereto:

2-11

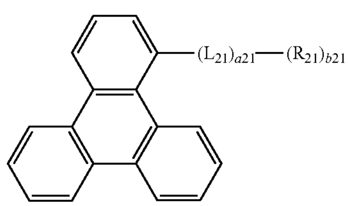

2-12

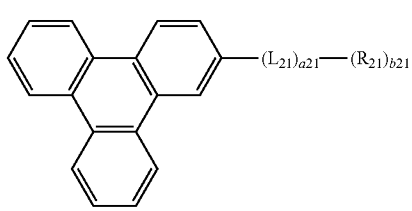

In Formulae 2-11 and 2-12, $L_{21}$, a21, $R_{21}$, and b21 are as defined above in the present specification.

In some embodiments, the first host may be represented by one selected from Formulae 1-11 to 1-26, and the second host may be represented by one selected from Formulae 2-11 and 2-12, but they are not limited thereto:

1-11

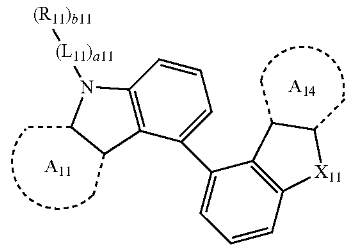

1-12

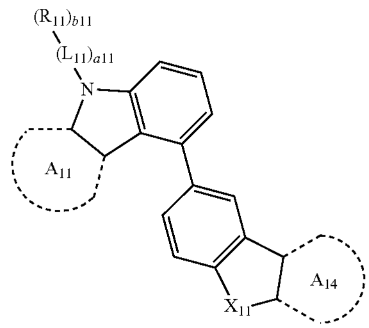

1-13

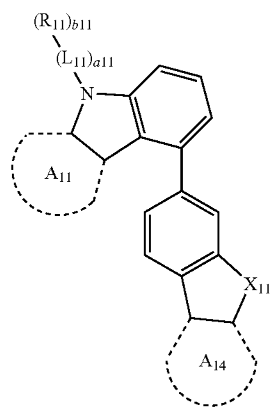

1-14

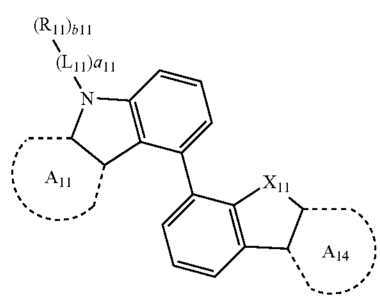

1-15

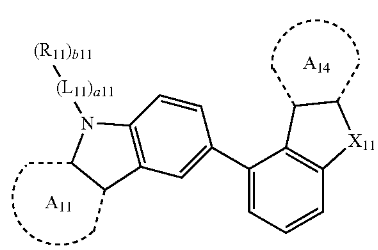

-continued
1-16
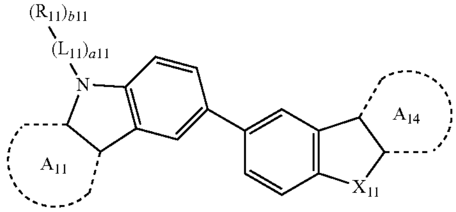
1-17
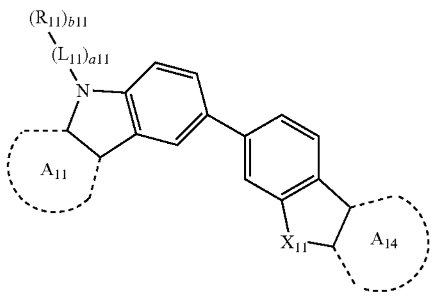
1-18
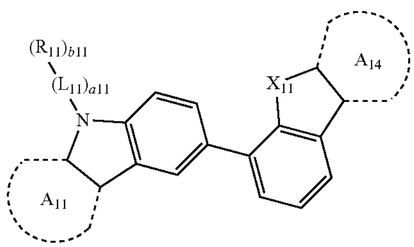
1-19
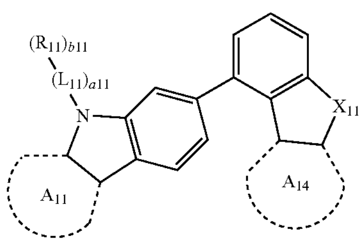
1-20
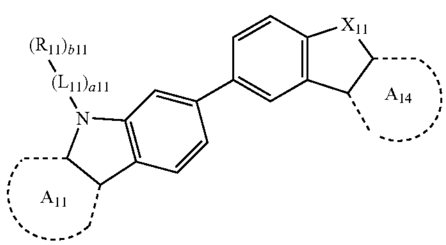
1-21
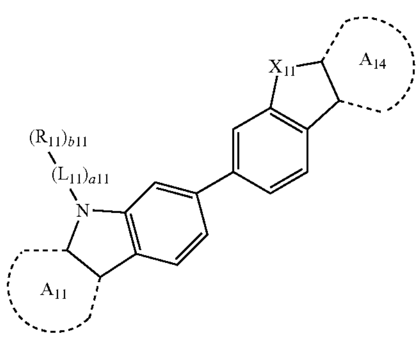
-continued
1-22
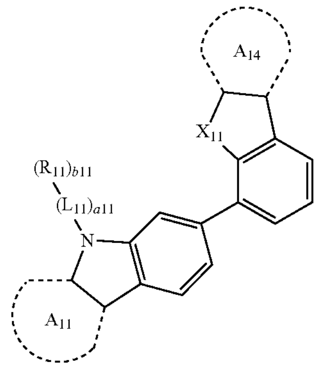
1-23
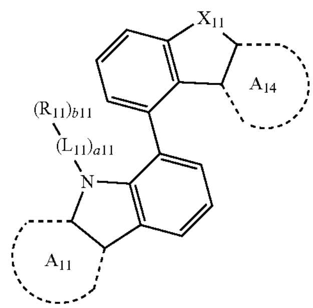
1-24
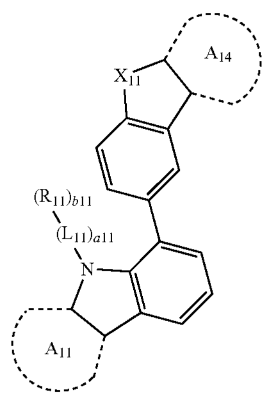
1-25
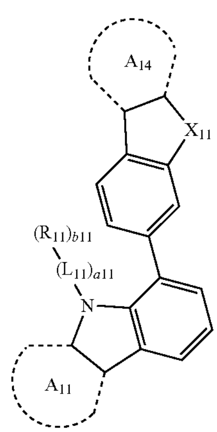

-continued 1-26

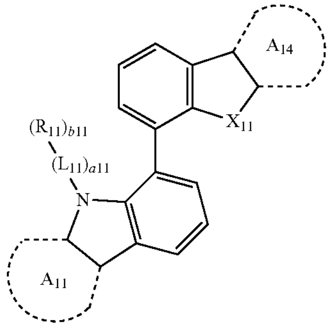

2-11

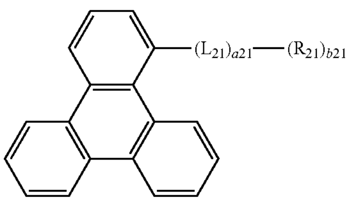

2-12

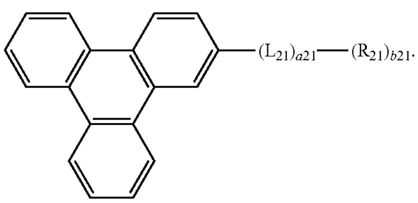

In Formulae 1-11 to 1-26, 2-11, and 2-12, $A_{11}$ and $A_{14}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;

$L_{11}$, $L_{12}$, and $L_{21}$ are each independently selected from Formulae 4-1 to 4-6 and 4-50 to 4-57:

4-1

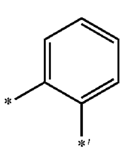

4-2

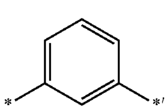

4-3

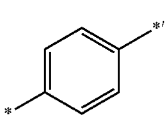

-continued 4-4

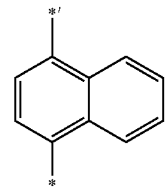

4-5

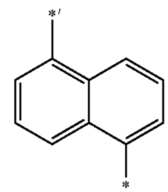

4-6

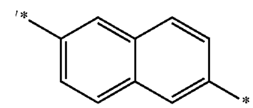

4-50

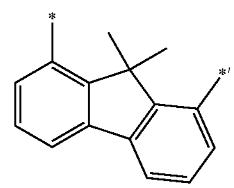

4-51

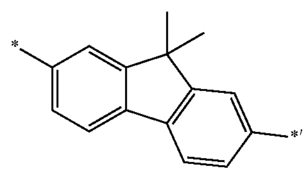

4-52

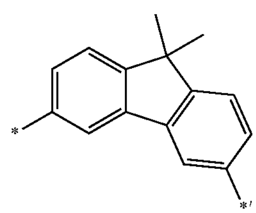

4-53

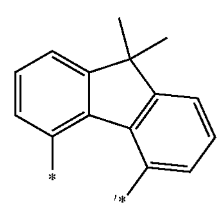

4-54

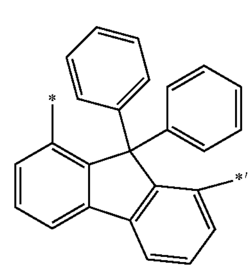

-continued 4-55

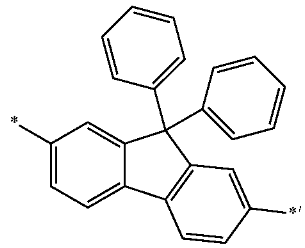

4-56

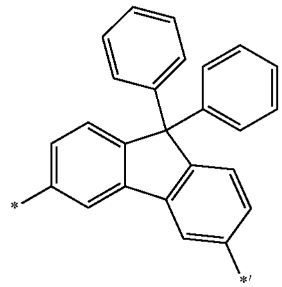

4-57

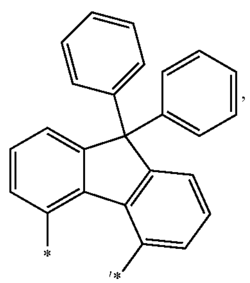

where, in Formulae 4-1 to 4-6 and 4-50 to 4-57,

* and *' are each independently a binding site to a neighboring atom;

a11, a12, and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B(C)$_6$)($Q_7$);

at least one of $R_{11}$ and $R_{12}$ is selected from Formulae 6-52 to 6-134; $R_{21}$ is selected from Formulae 6-1 to 6-51 and 6-135 to 6-138:

6-1

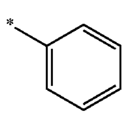

6-2

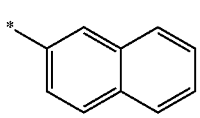

-continued 6-3

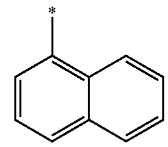

6-4

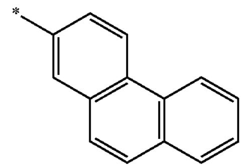

6-5

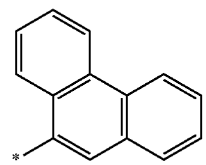

6-6

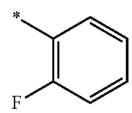

6-7

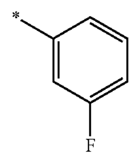

6-8

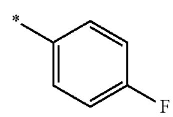

6-9

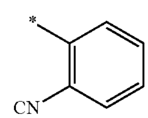

6-10

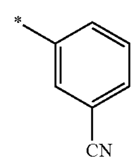

6-11

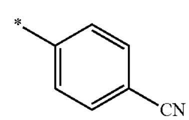

6-12

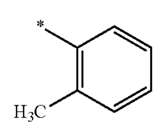

6-13

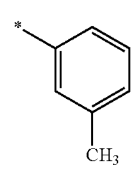

-continued
6-14
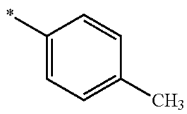
6-15
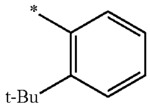
6-16
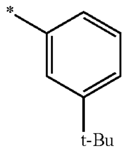
6-17
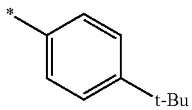
6-18
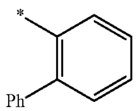
6-19
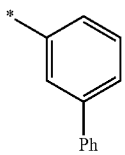
6-20
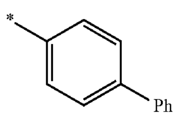
6-21
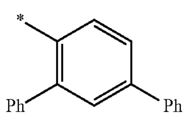
6-22
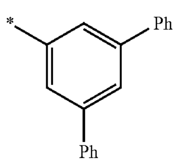
6-23
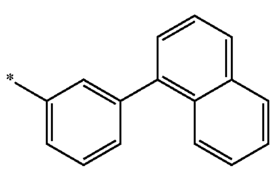
6-24
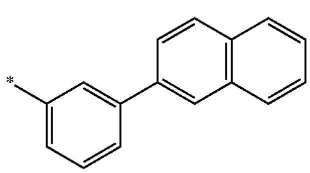
-continued
6-25
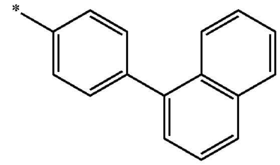
6-26
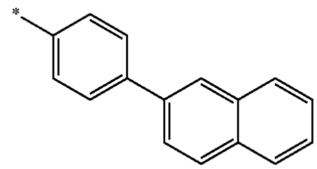
6-27
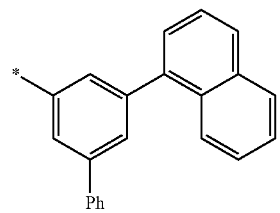
6-28
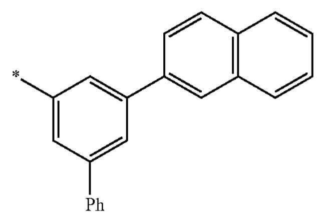
6-29
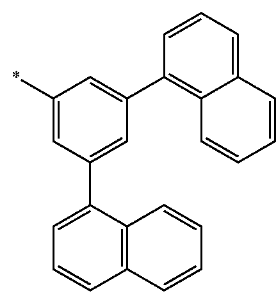
6-30
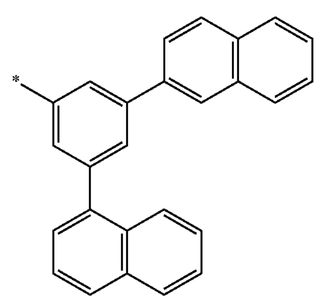

-continued
6-31
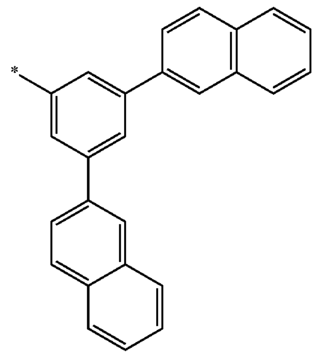
6-32
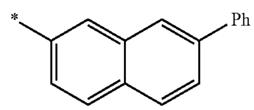
6-33
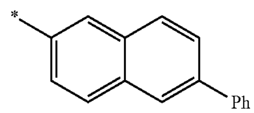
6-34
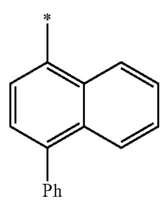
6-35
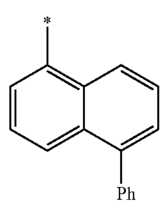
6-36
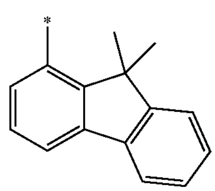
6-37
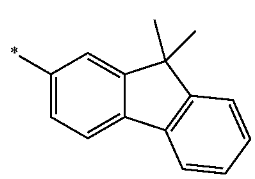
6-38
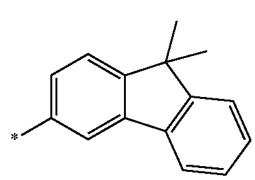
-continued
6-39
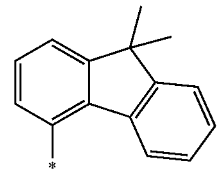
6-40
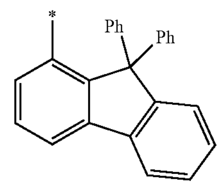
6-41
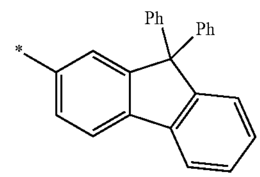
6-42
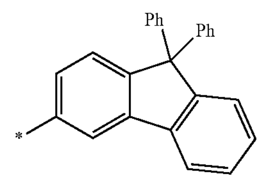
6-43
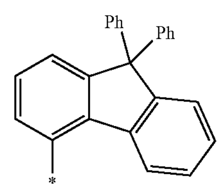
6-44
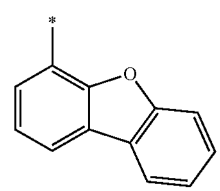
6-45
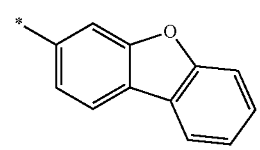
6-46
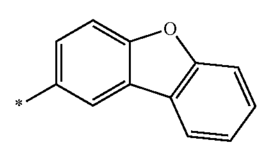
6-47
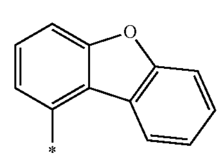

-continued
6-48
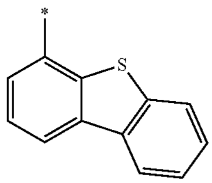
6-49
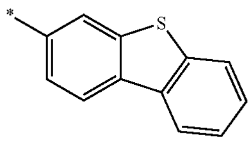
6-50
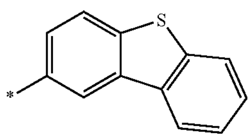
6-51
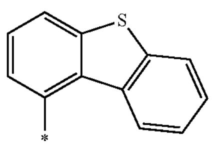
6-52
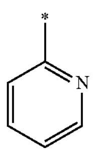
6-53
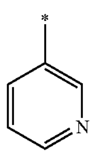
6-54
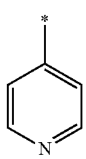
6-55
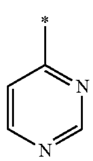
6-56
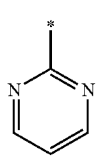
6-57
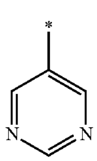
-continued
6-58
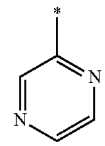
6-59
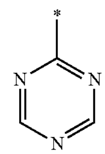
6-60
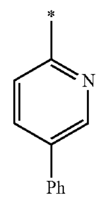
6-61
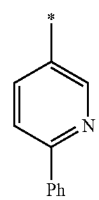
6-62
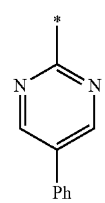
6-63
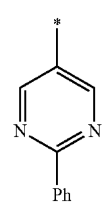
6-64
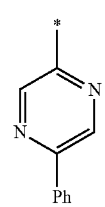
6-65
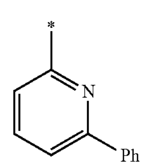

-continued
6-66
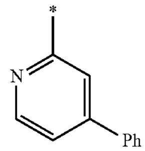
6-67
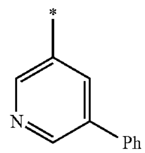
6-68
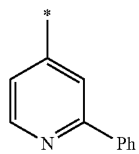
6-69
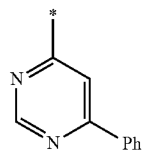
6-70
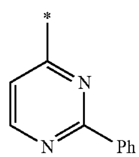
6-71
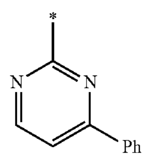
6-72
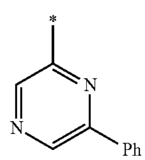
6-73
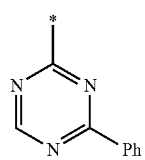
6-74
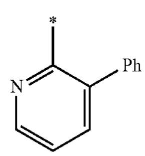
6-75
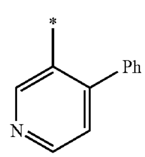
-continued
6-76
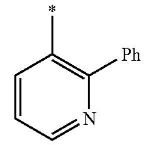
6-77
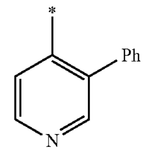
6-78
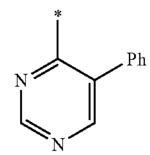
6-79
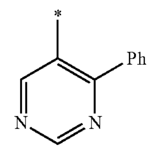
6-80
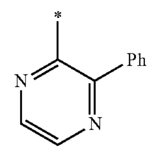
6-81
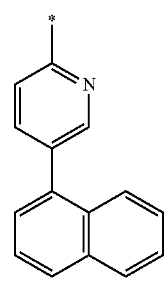
6-82
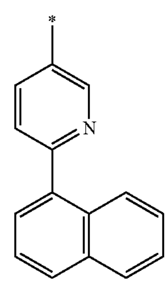
6-83
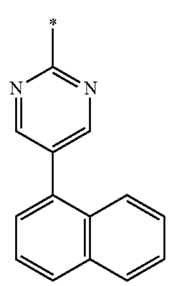

-continued
6-84
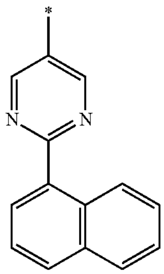
6-85
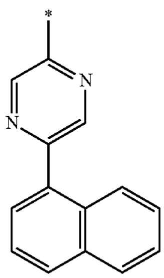
6-86
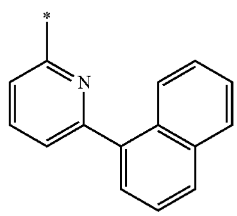
6-87
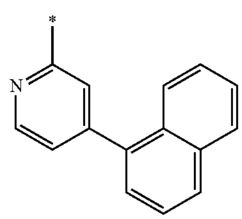
6-88
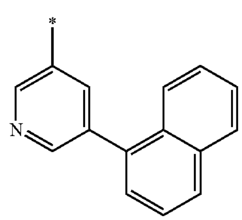
6-89
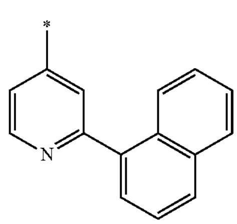
-continued
6-90
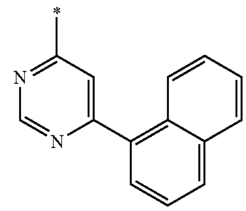
6-91
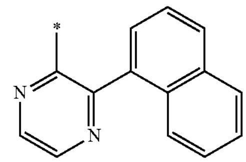
6-92
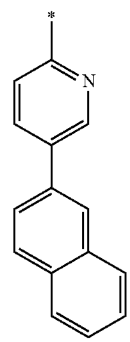
6-93
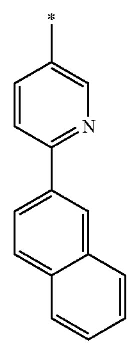
6-94
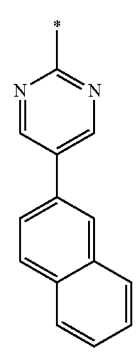

-continued
6-95
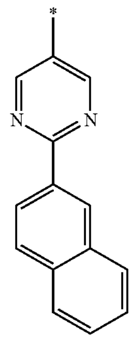
6-96
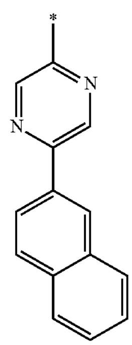
6-97
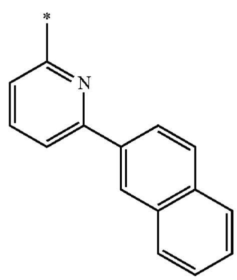
6-98
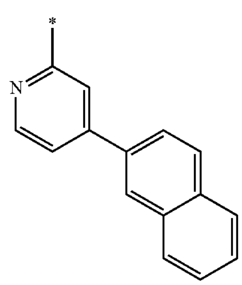
6-99
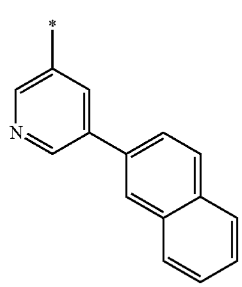
-continued
6-100
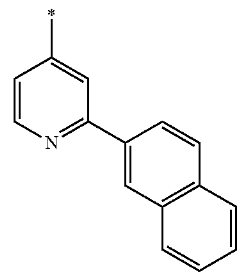
6-101
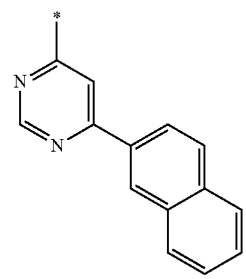
6-102
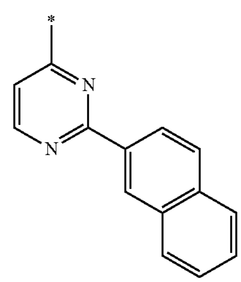
6-103
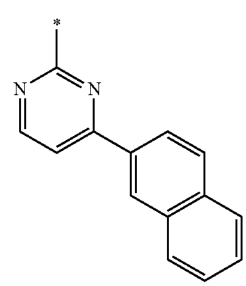
6-104
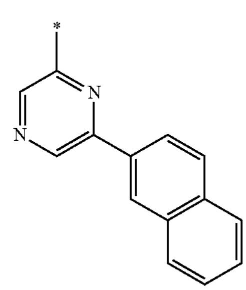

-continued
6-105
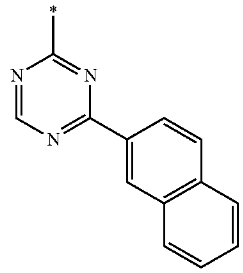
6-106
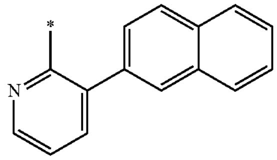
6-107
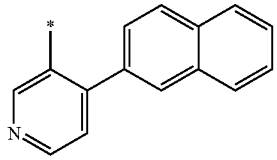
6-108
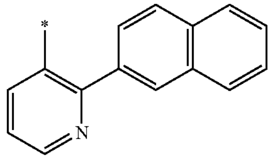
6-109
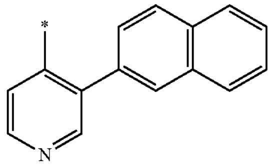
6-110
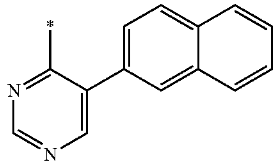
6-111
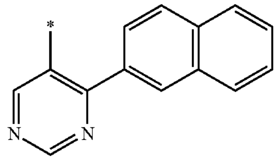
6-112
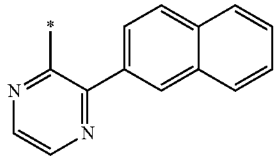
-continued
6-113
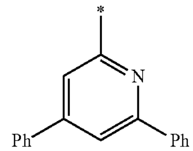
6-114
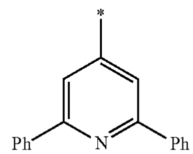
6-115
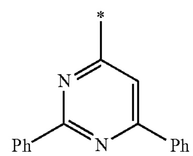
6-116
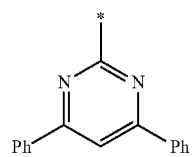
6-117
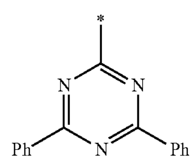
6-118
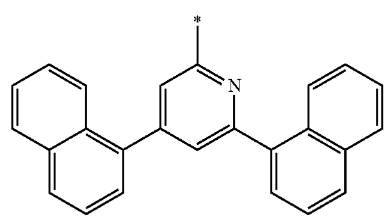
6-119
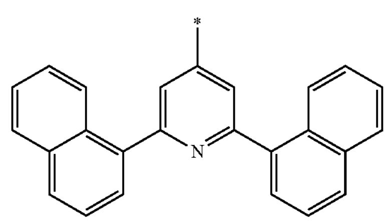
6-120
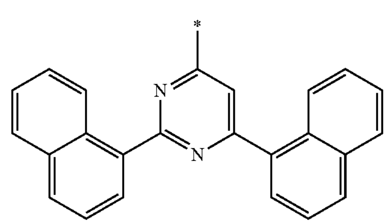

6-121
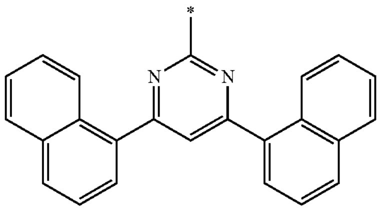
6-122
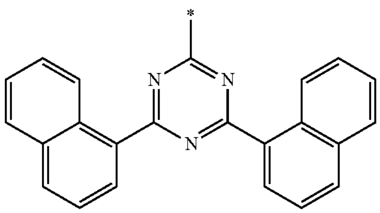
6-123
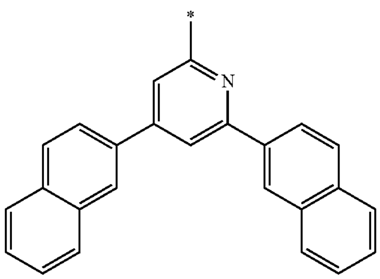
6-124
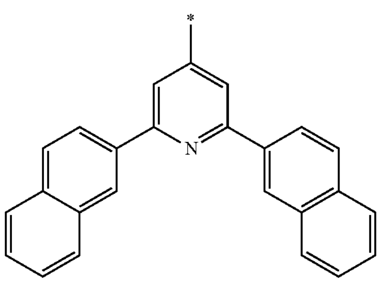
6-125
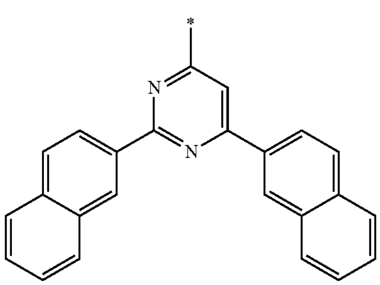
6-126
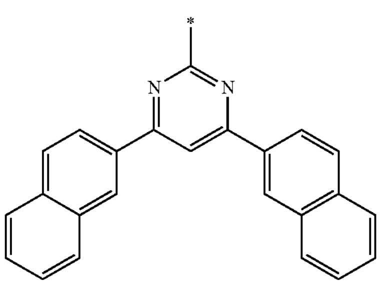
6-127
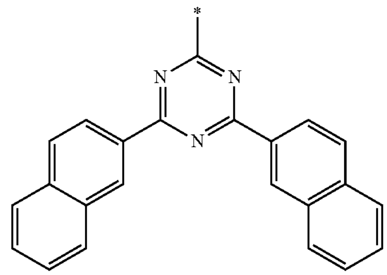
6-128
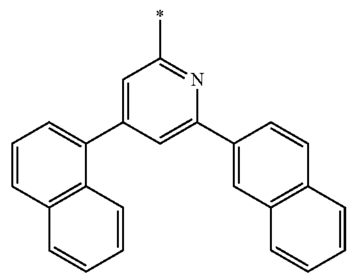
6-129
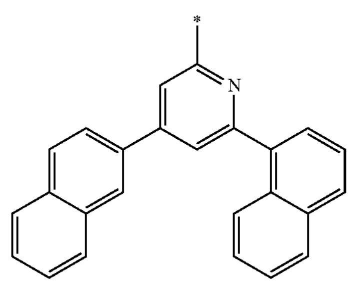
6-130
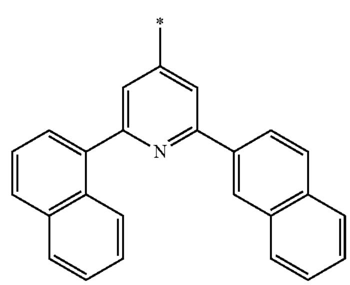
6-131
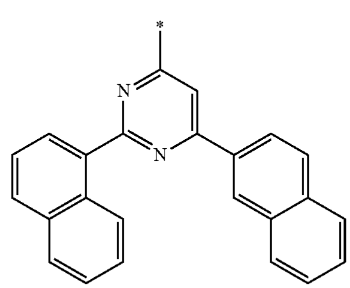

-continued 6-132

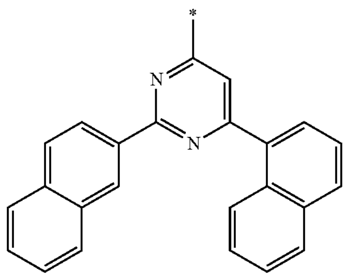

6-133

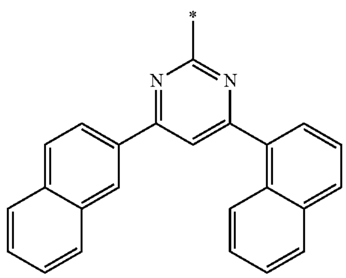

6-134

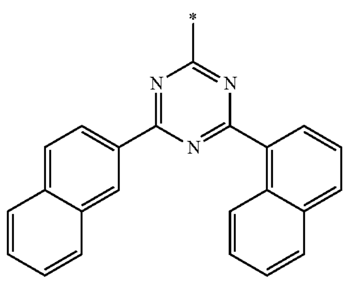

6-135

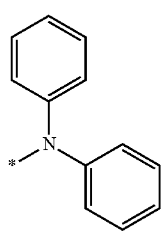

6-136

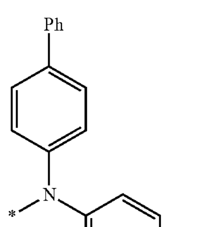

6-137

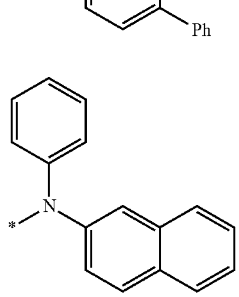

-continued 6-138

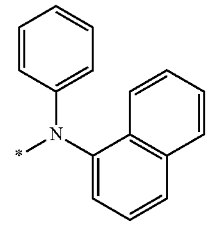

where, in Formulae 6-1 to 6-138, t-Bu denotes a tert-butyl group;

Ph denotes a phenyl group;

* is a binding site to a neighboring atom;

b11, b12, and b21 are each independently selected from 1, 2, 3, and 4;

$R_{17}$ and $R_{18}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

where $Q_1$ to $Q_7$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, the first host may be represented by one selected from Formulae 1-11 to 1-26, and the second host may be represented by one selected from Formulae 2-11 and 2-12, but they are not limited thereto:

1-11

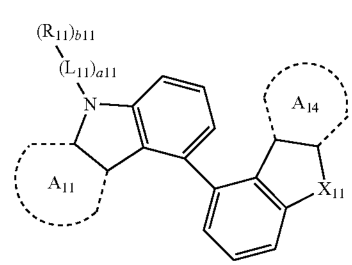

-continued
1-12
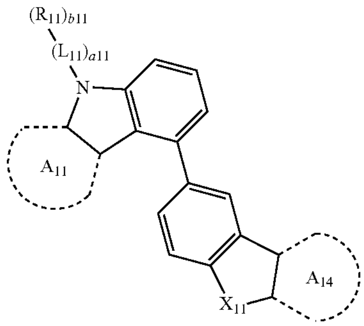
1-13
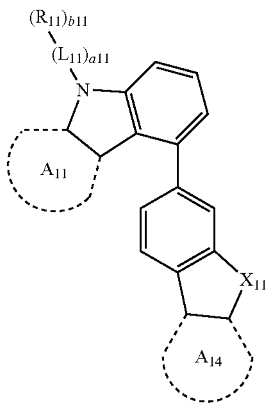
1-14
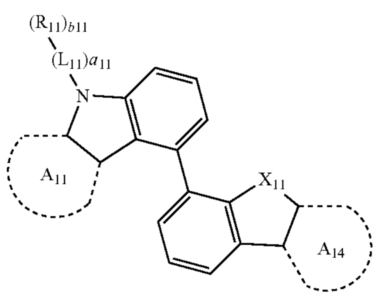
1-15
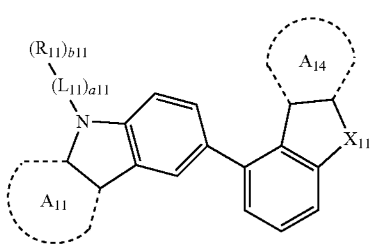
1-16
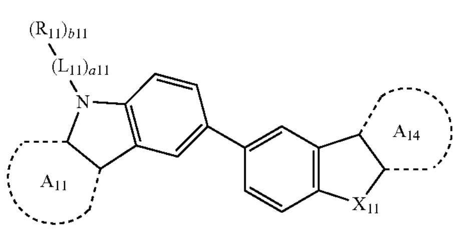
-continued
1-17
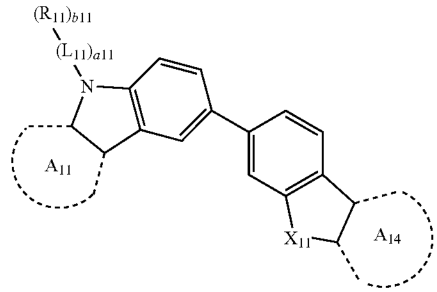
1-18
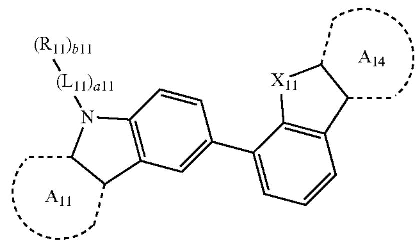
1-19
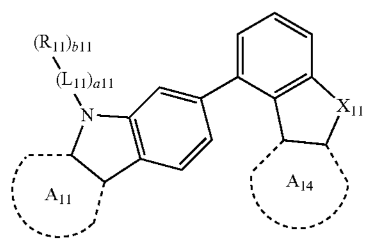
1-20
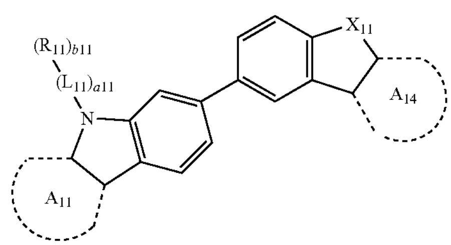
1-21
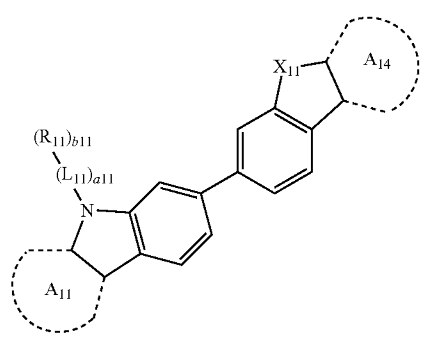

-continued 1-22

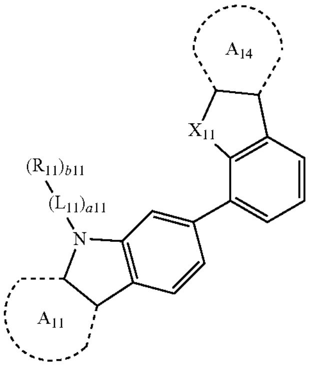

1-23

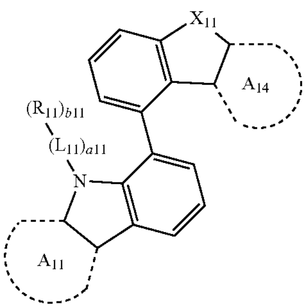

1-24

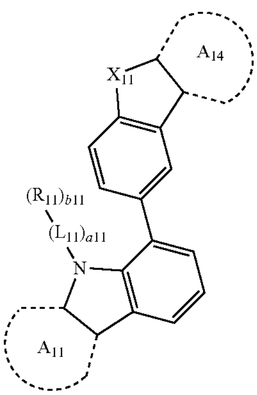

1-25

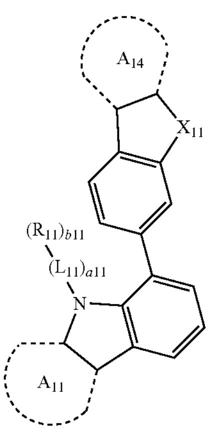

-continued 1-26

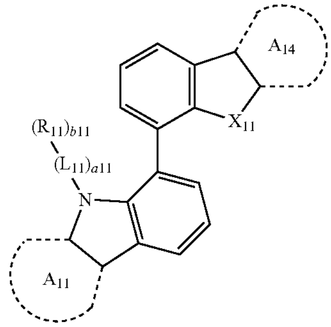

2-11

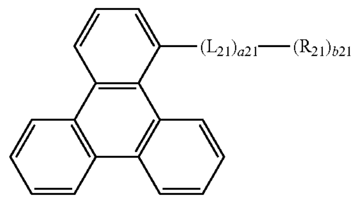

2-12

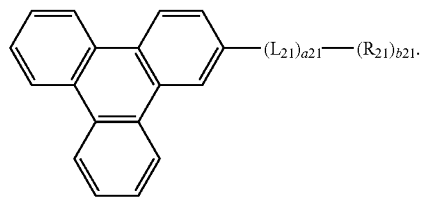

In Formulae 1-11 to 1-26, 2-11, and 2-12, $A_{11}$ and $A_{14}$ are each independently selected from a benzene, a naphthalene, a pyridine, a pyrimidine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, and a cinnoline;

$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;

$L_{11}$, $L_{12}$, and $L_{21}$ are each independently selected from Formulae 4-1 to 4-6 and 4-50 to 4-57:

4-1

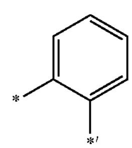

4-2

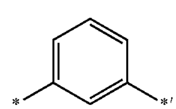

4-3

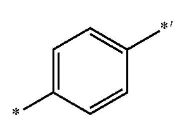

-continued 4-4

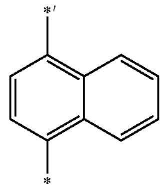

4-5

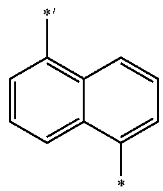

4-6

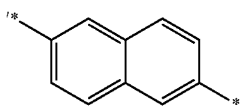

4-50

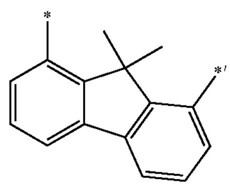

4-51

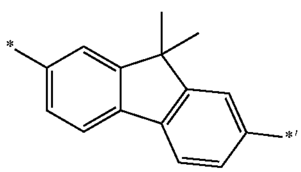

4-52

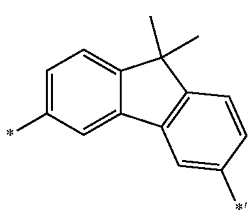

4-53

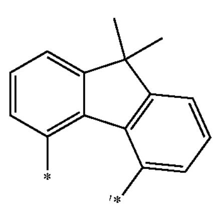

4-54

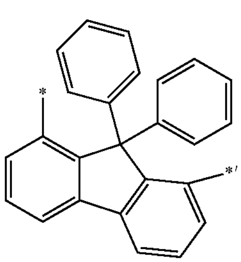

-continued 4-55

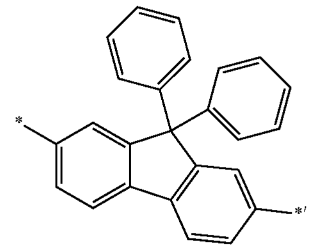

4-56

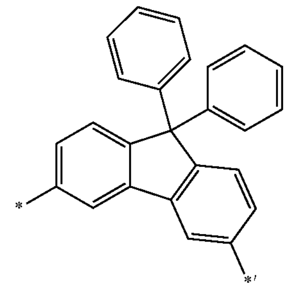

4-57

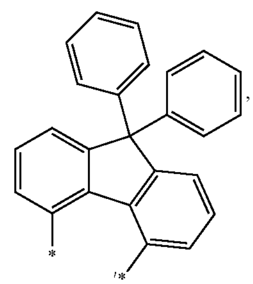

where, in Formulae 4-1 to 4-6 and 4-50 to 4-57,

* and *' are each independently a binding site to a neighboring atom;

a11, a12, and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$, where at least one of $R_{11}$ and $R_{12}$ is selected from Formulae 6-1 to 6-51 and 6-135 to 6-138, and $R_{21}$ is selected from Formulae 6-52 to 6-134:

6-1

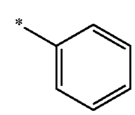

6-2

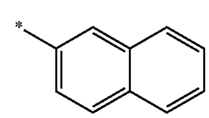

-continued
6-3
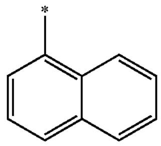
6-4
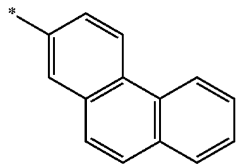
6-5
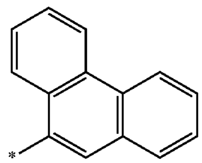
6-6
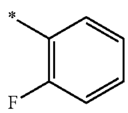
6-7
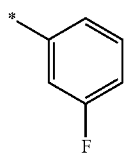
6-8
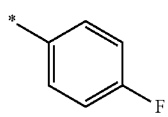
6-9
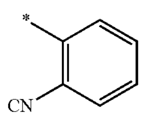
6-10
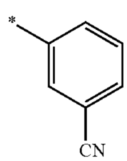
6-11
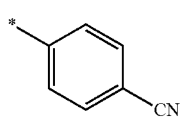
6-12
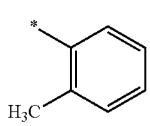
6-13
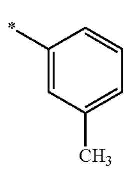
-continued
6-14
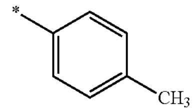
6-15
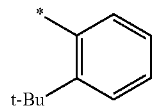
6-16
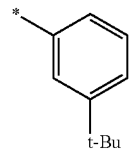
6-17
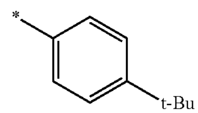
6-18
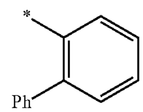
6-19
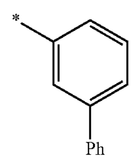
6-20
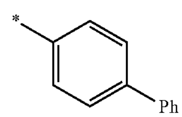
6-21
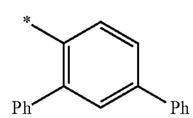
6-22
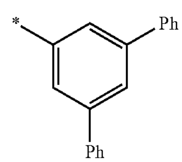
6-23
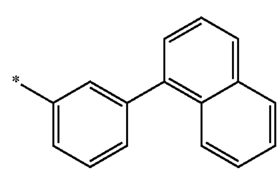
6-24
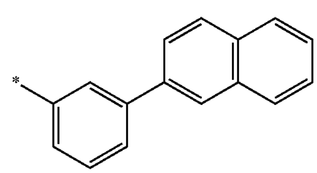

-continued
6-25
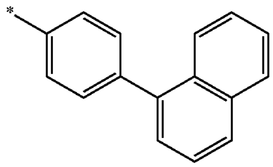
6-26
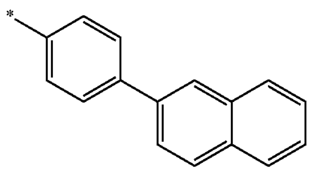
6-27
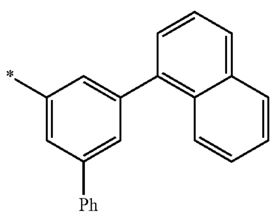
6-28
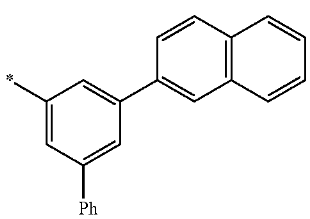
6-29
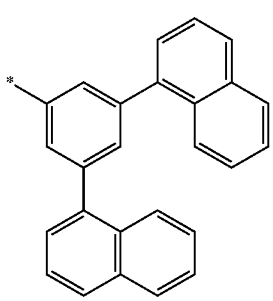
6-30
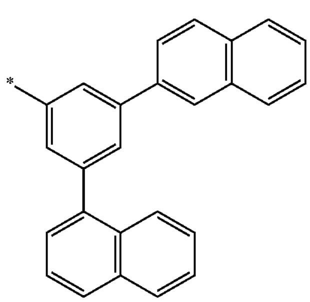
-continued
6-31
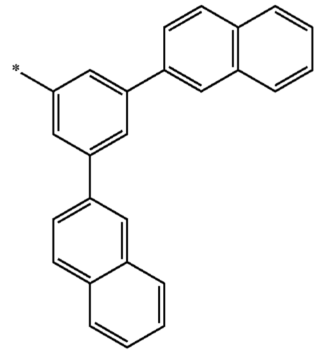
6-32
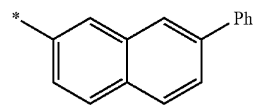
6-33
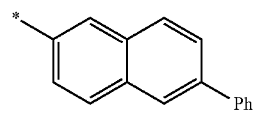
6-34
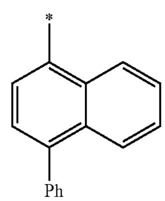
6-35
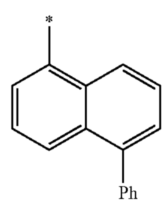
6-36
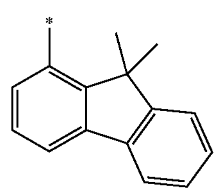
6-37
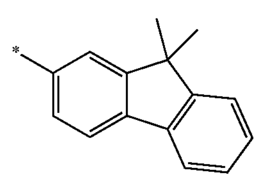
6-38
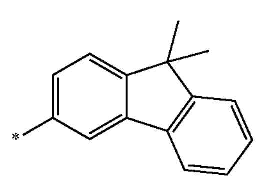

-continued
6-39
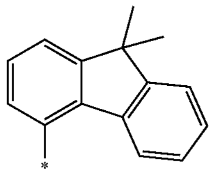
6-40
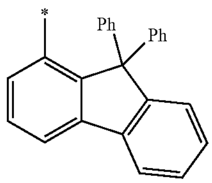
6-41
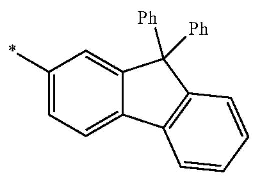
6-42
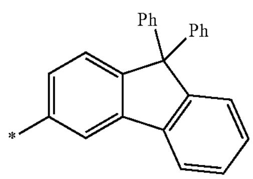
6-43
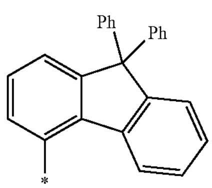
6-44
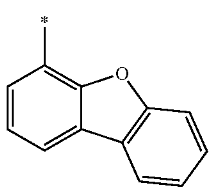
6-45
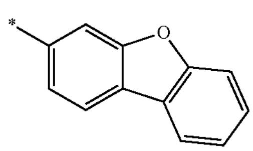
6-46
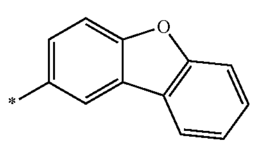
6-47
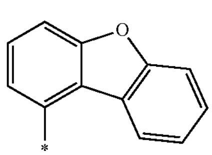
-continued
6-48
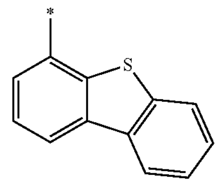
6-49
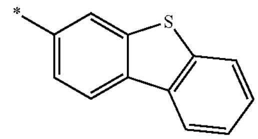
6-50
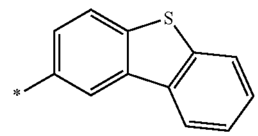
6-51
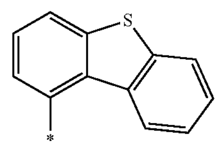
6-52
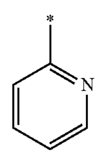
6-53
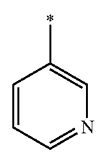
6-54
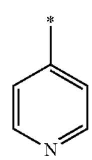
6-55
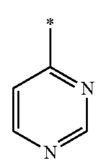
6-56
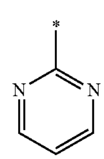
6-57
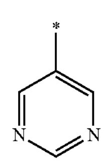

-continued
6-58
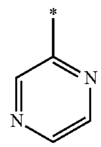
6-59
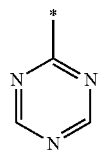
6-60
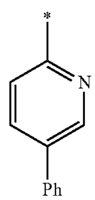
6-61
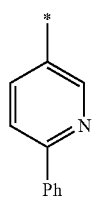
6-62
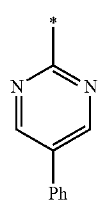
6-63
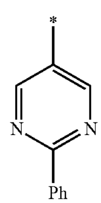
6-64
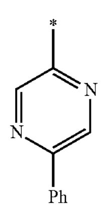
6-65
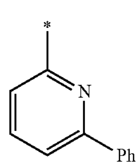
-continued
6-66
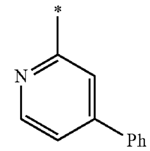
6-67
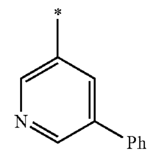
6-68
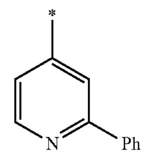
6-69
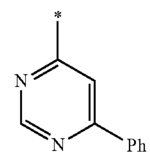
6-70
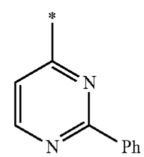
6-71
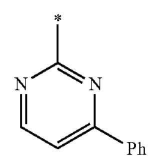
6-72
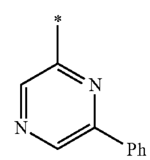
6-73
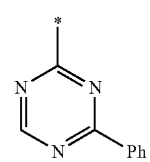
6-74
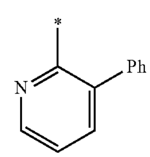
6-75
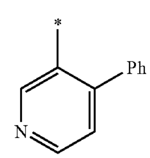

-continued
6-76
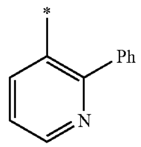
6-77
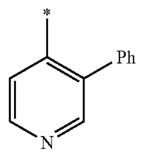
6-78
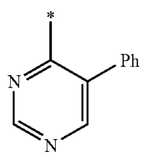
6-79
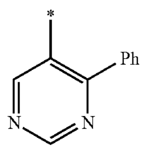
6-80
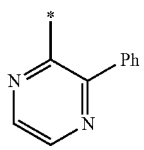
6-81
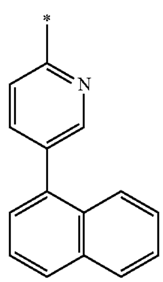
6-82
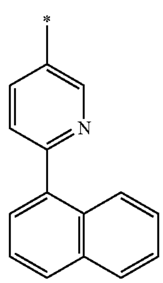
6-83
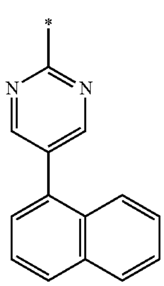
-continued
6-84
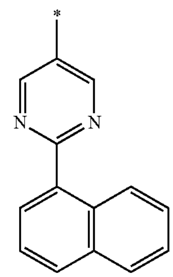
6-85
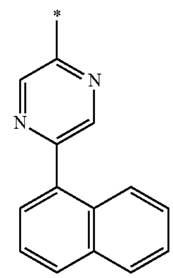
6-86
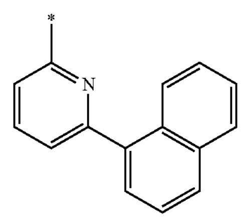
6-87
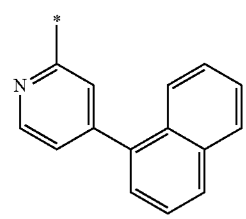
6-88
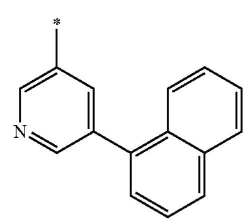
6-89
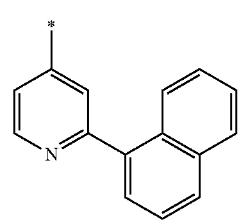

-continued
6-90
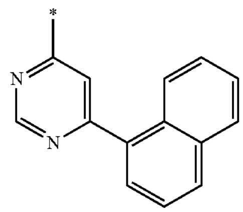
6-91
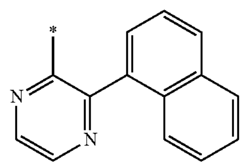
6-92
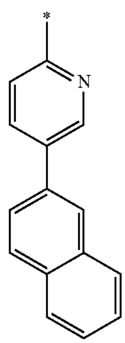
6-93
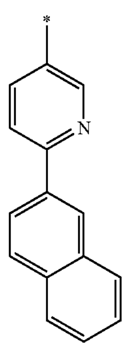
6-94
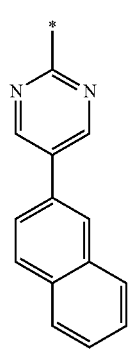
-continued
6-95
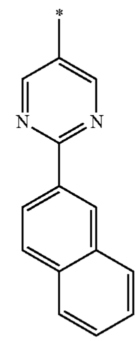
6-96
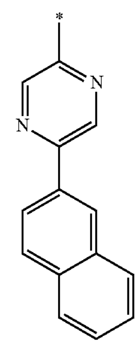
6-97
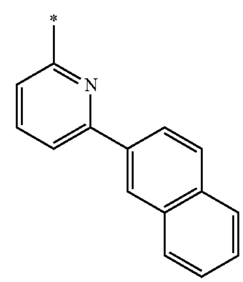
6-98
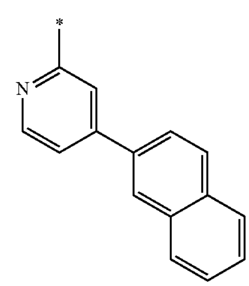
6-99
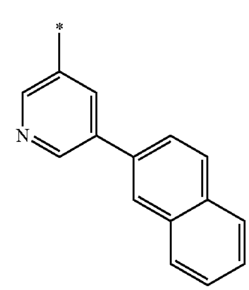

-continued
6-100
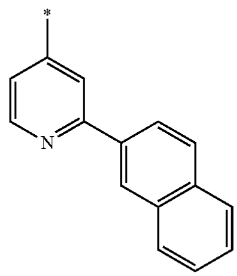
6-101
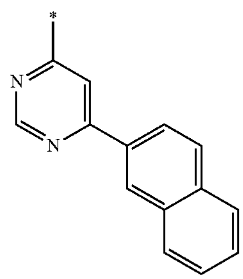
6-102
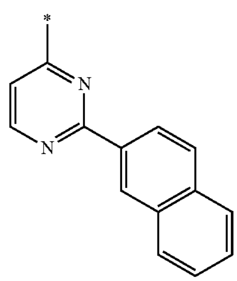
6-103
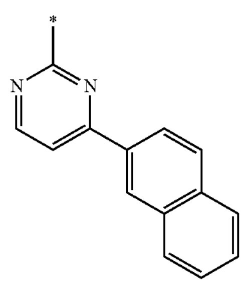
6-104
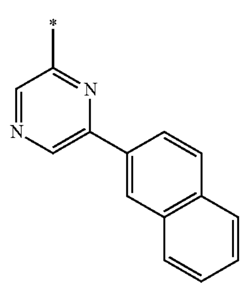
-continued
6-105
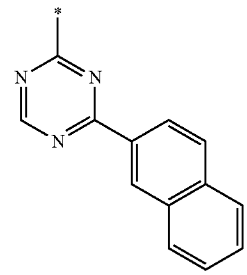
6-106
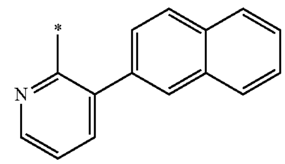
6-107
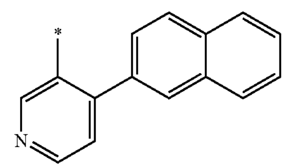
6-108
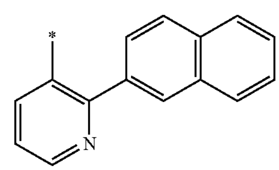
6-109
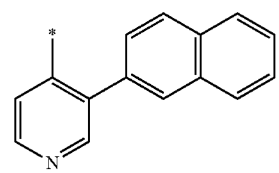
6-110
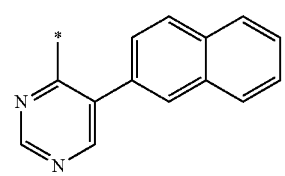
6-111
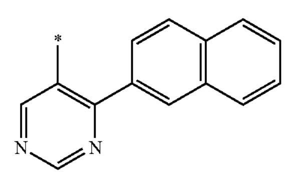
6-112
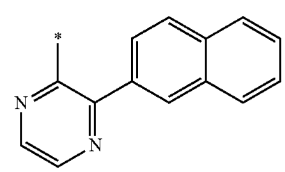

-continued
6-113
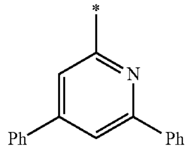
6-114
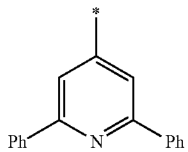
6-115
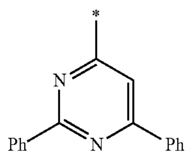
6-116
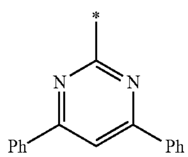
6-117
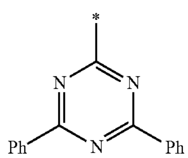
6-118
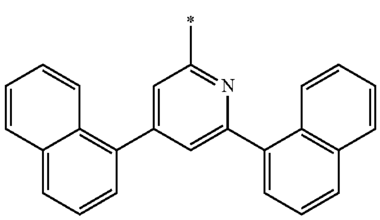
6-119
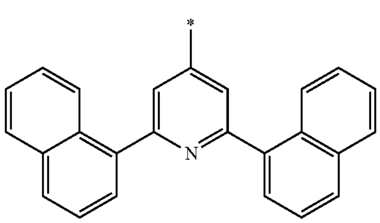
6-120
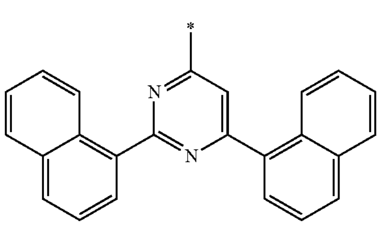
-continued
6-121
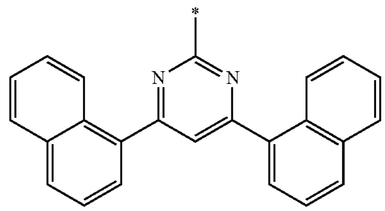
6-122
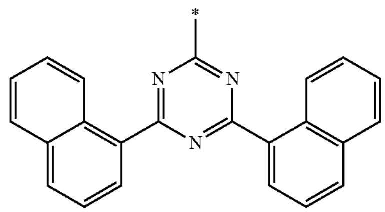
6-123
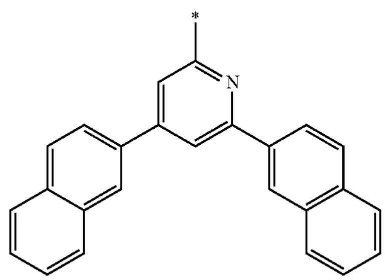
6-124
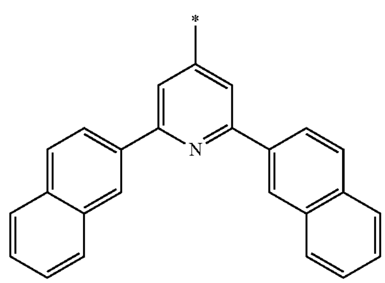
6-125
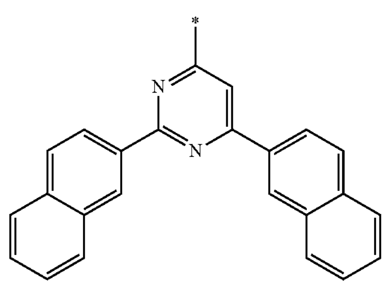
6-126
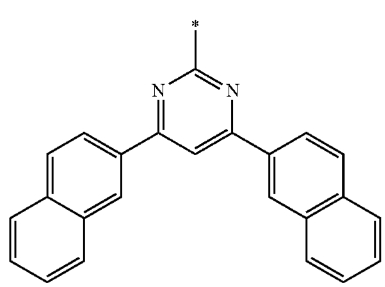

-continued
6-127
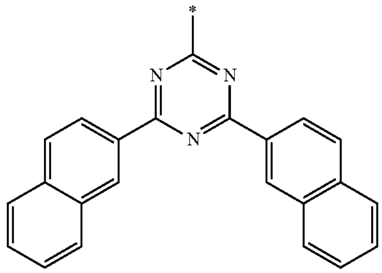
6-128
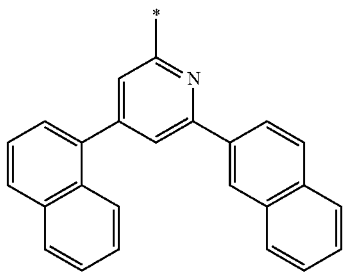
6-129
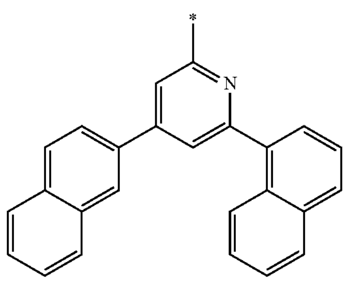
6-130
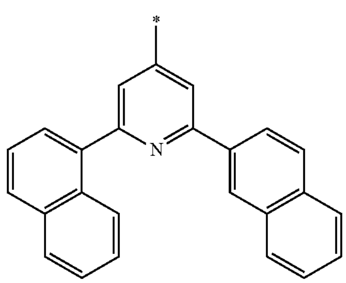
6-131
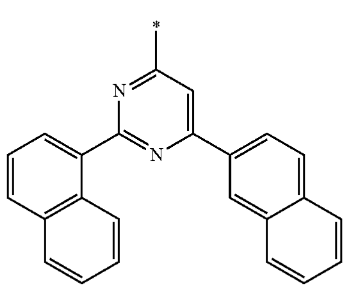
-continued
6-132
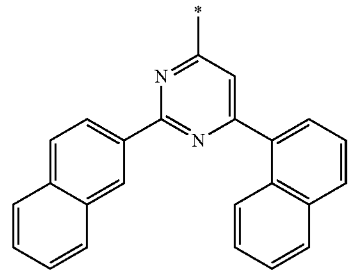
6-133
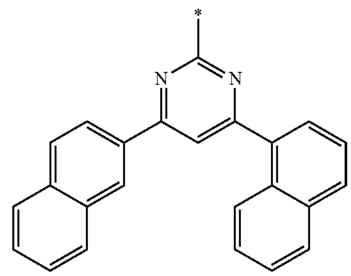
6-134
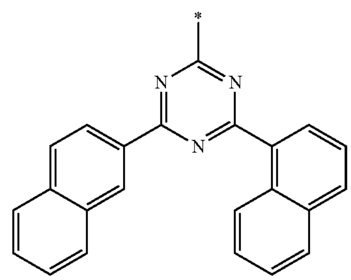
6-135
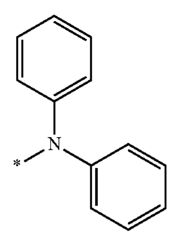
6-136
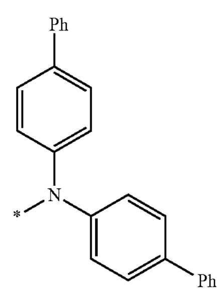
6-137
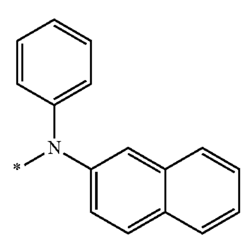

-continued 6-138

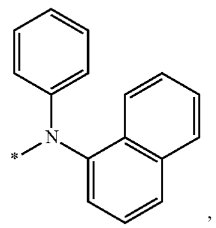

where in Formulae 6-1 to 6-138;

t-Bu denotes a tert-butyl group;

Ph denotes a phenyl group;

* is a binding site to a neighboring atom;

b11, b12, and b21 are each independently selected from 1, 2, 3, and 4;

$R_{17}$ and $R_{18}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

where $Q_1$ to $Q_7$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, the first host may be selected from Compounds 101A to 206A, and the second host may be selected from Compounds 301A to 342A, but they are not limited thereto:

101A

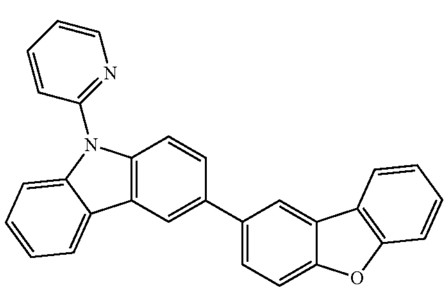

-continued

102A

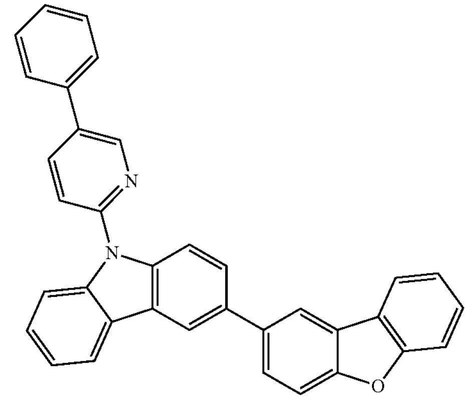

103A

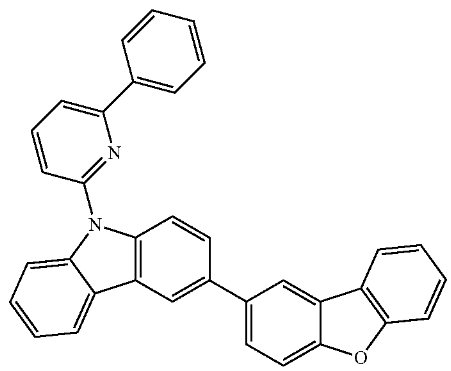

104A

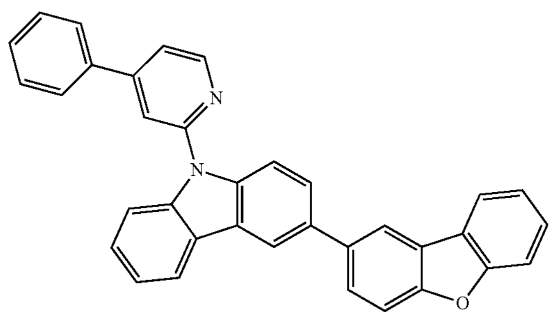

105A

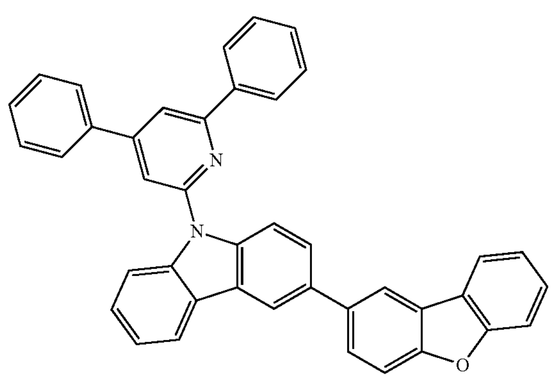

-continued
106A
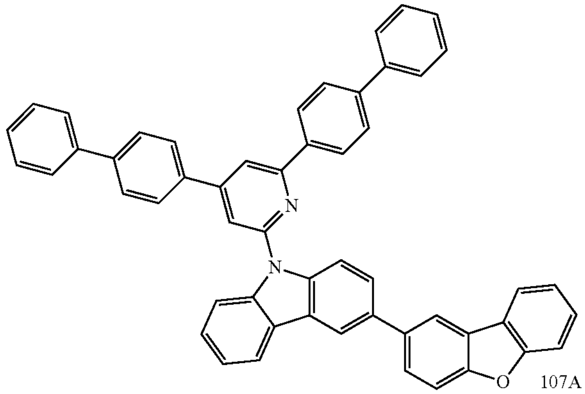
107A
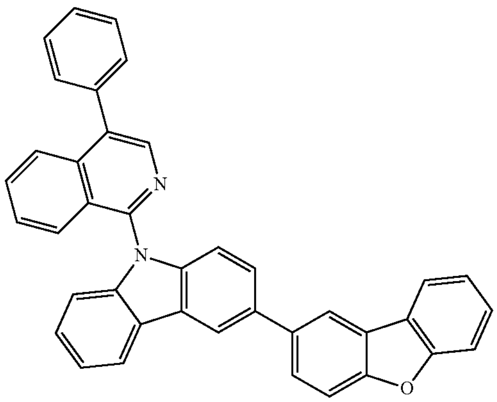
108A
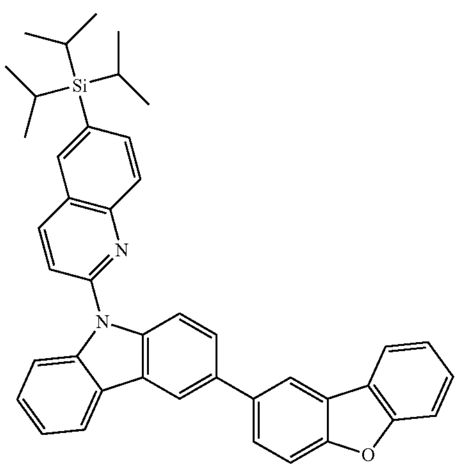
109A
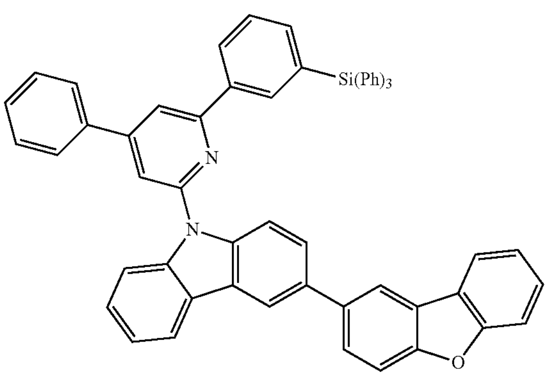
-continued
110A
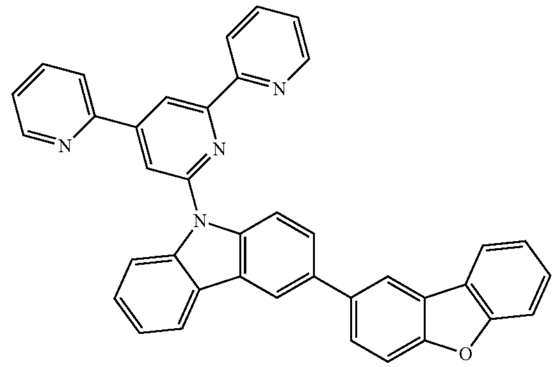
111A
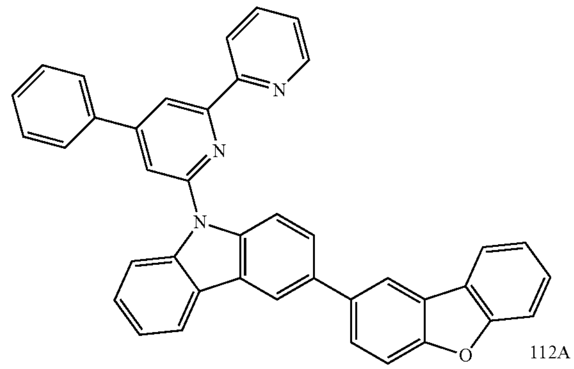
112A
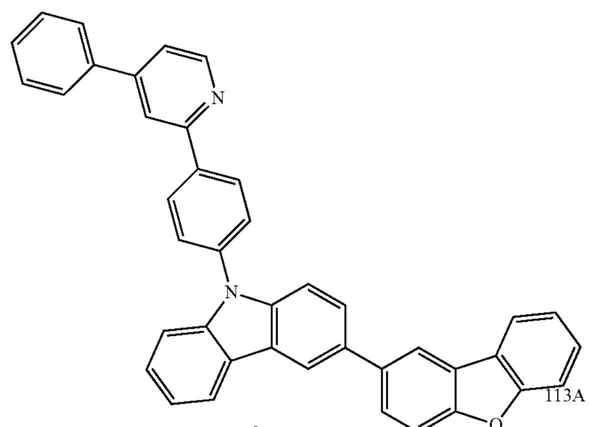
113A
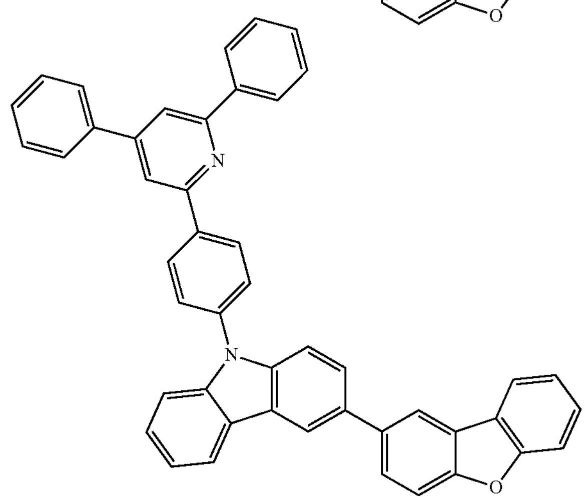

-continued
114A
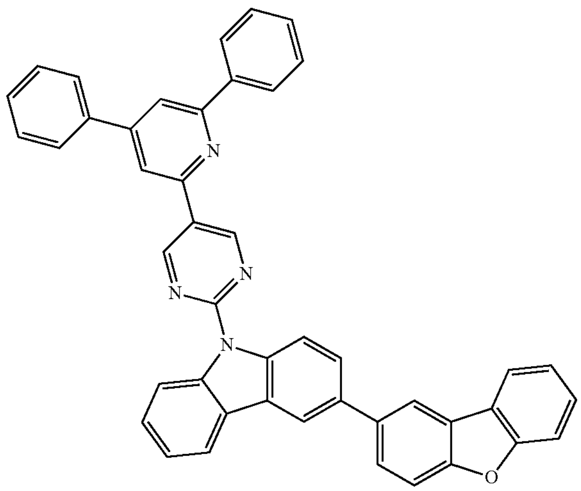
115A
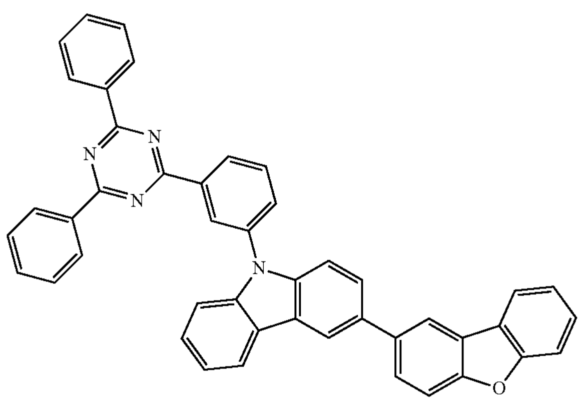
116A
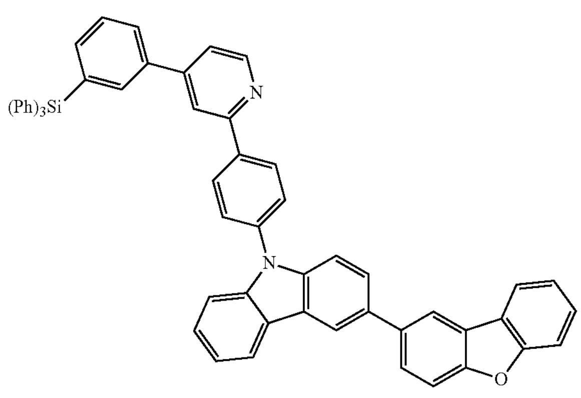
-continued
117A
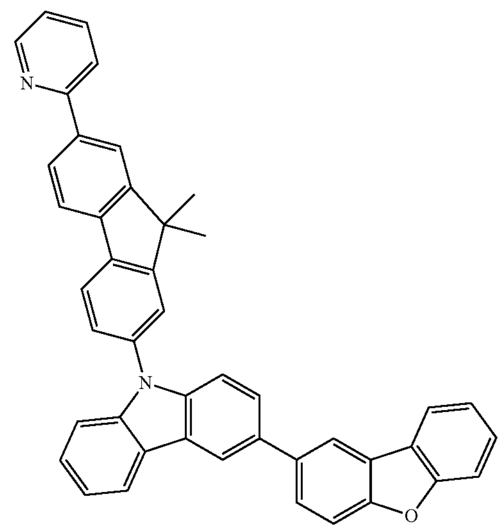
118A
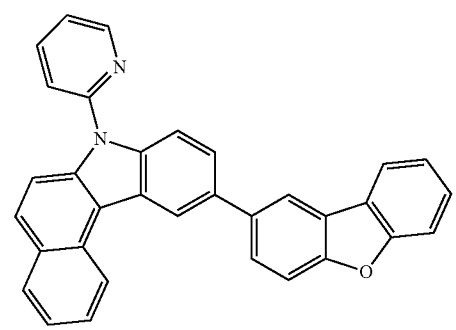
119A
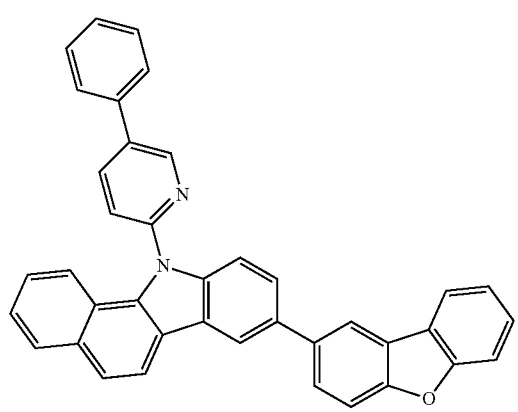

-continued
120A
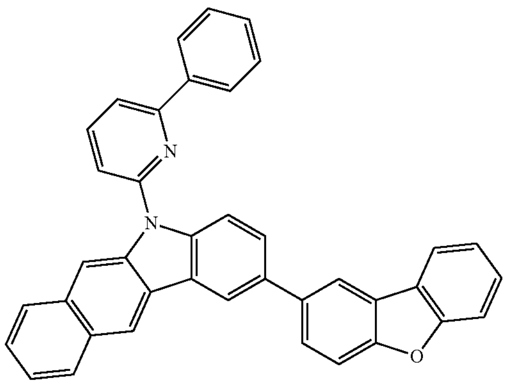
121A
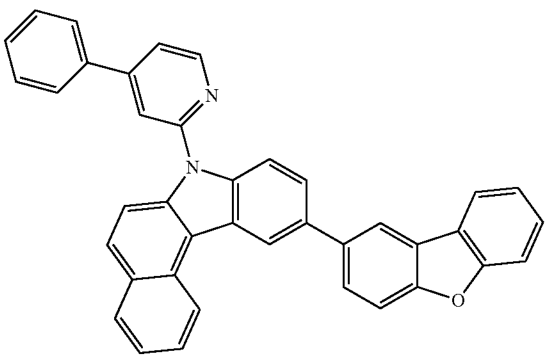
122A
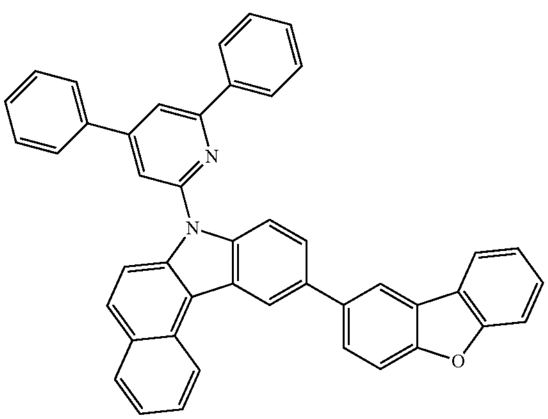
123A
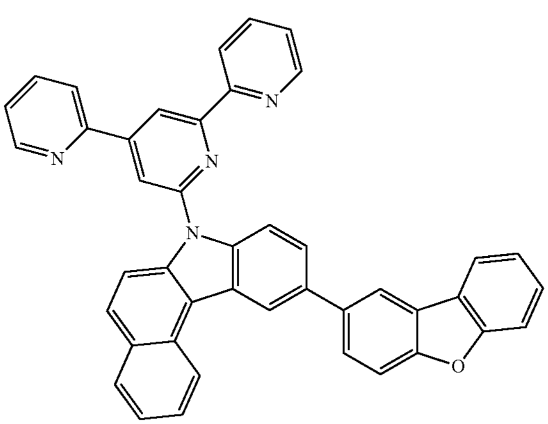
-continued
124A
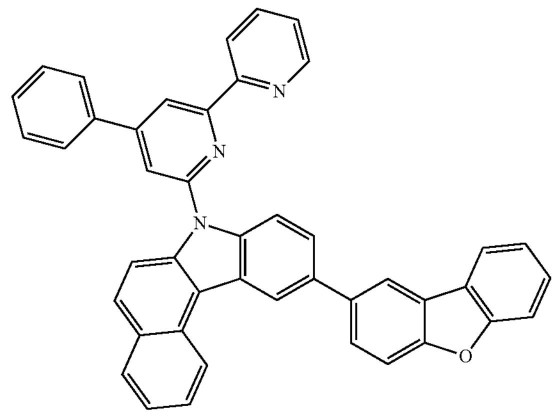
125A
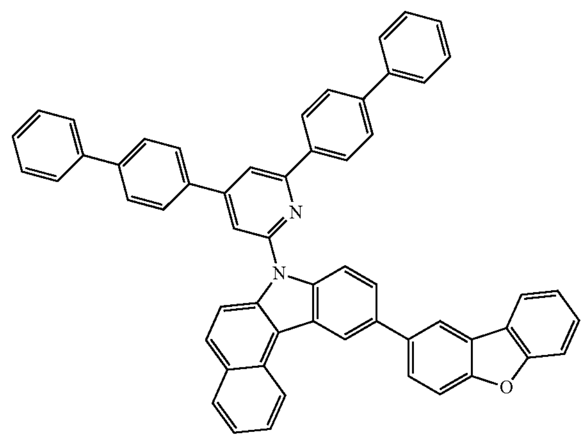
126A
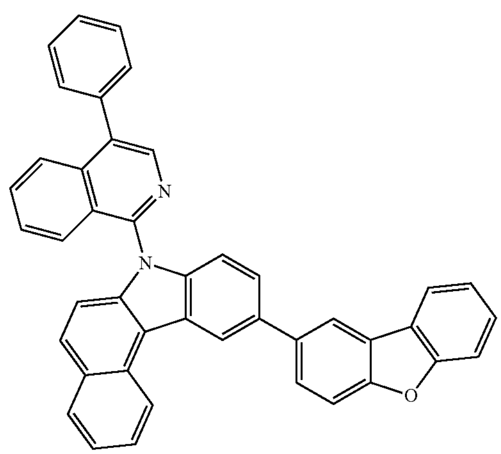

-continued
127A
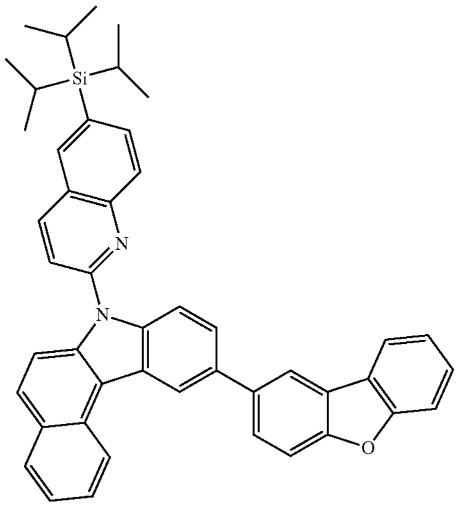
128A
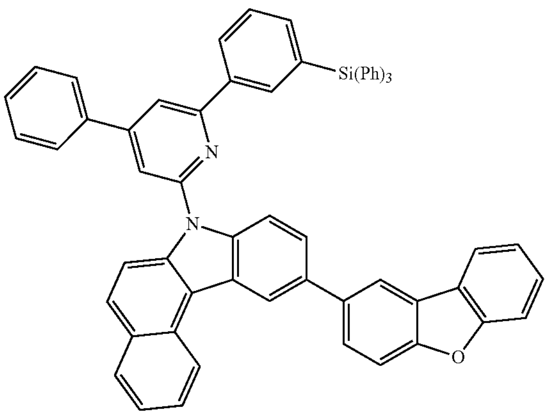
129A
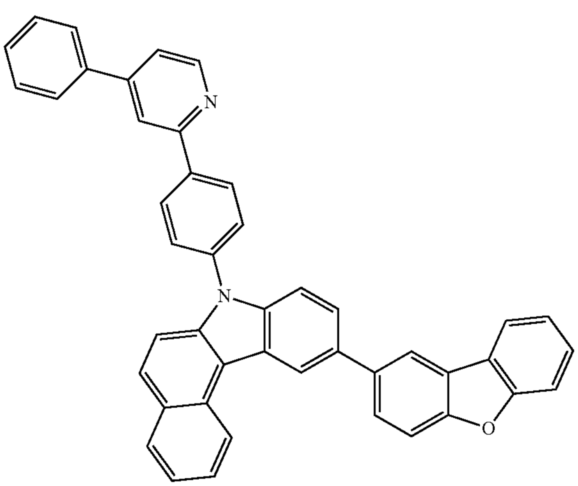
-continued
130A
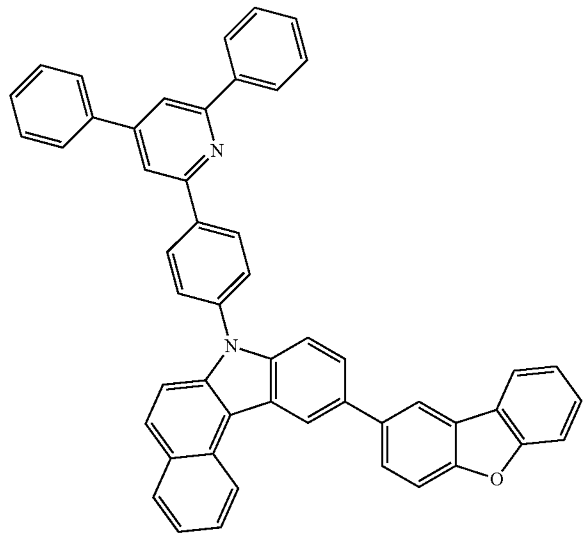
131A
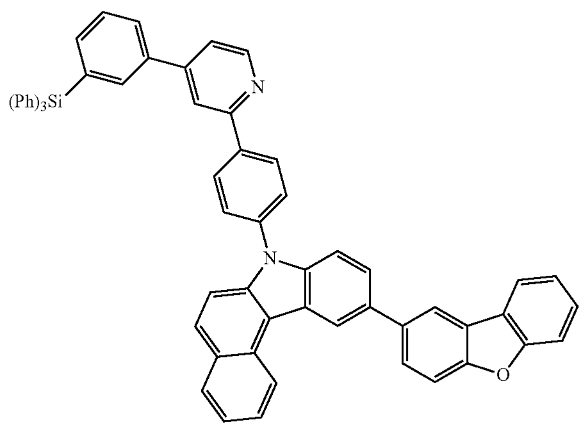
132A
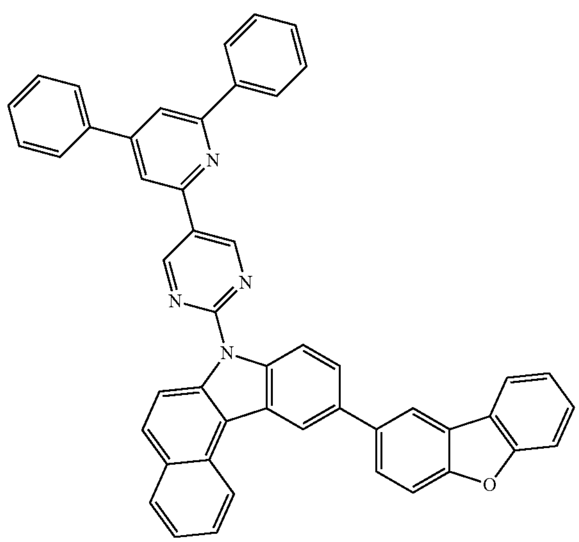

-continued
133A
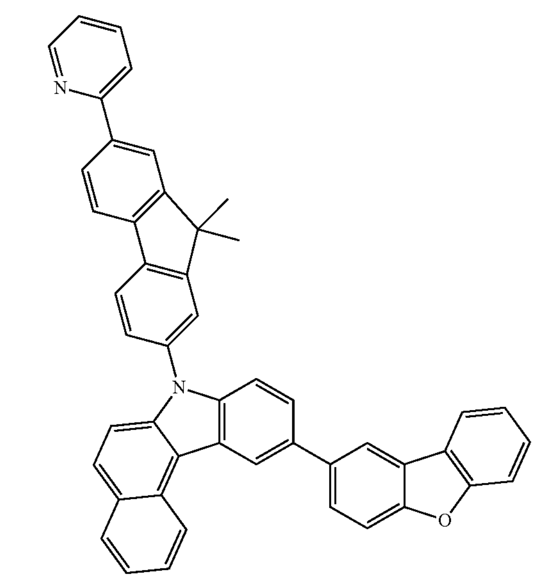
134A
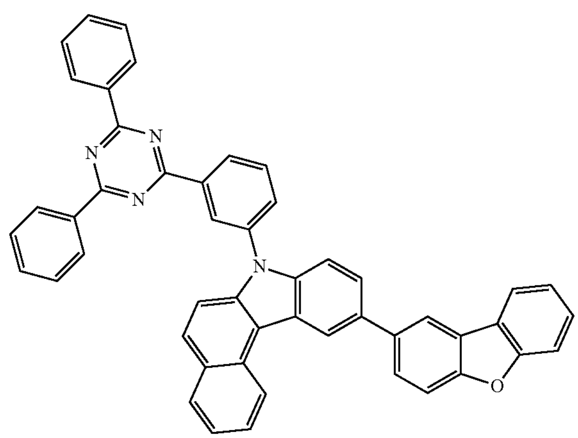
135A
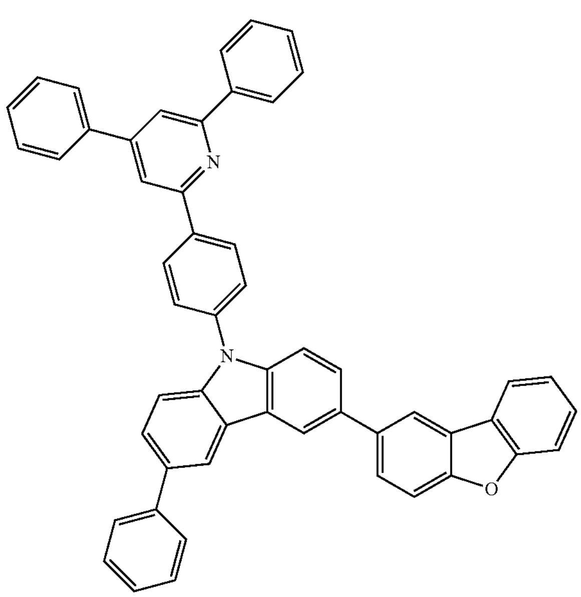
-continued
136A
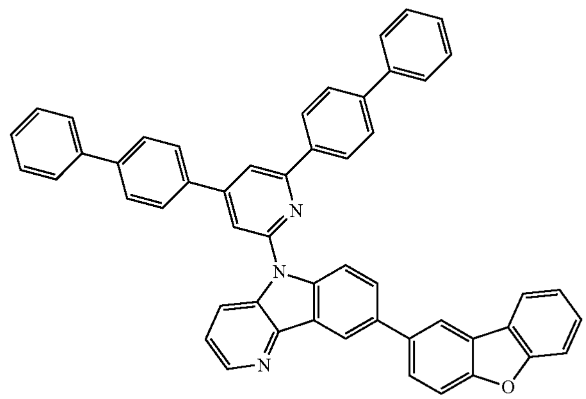
137A
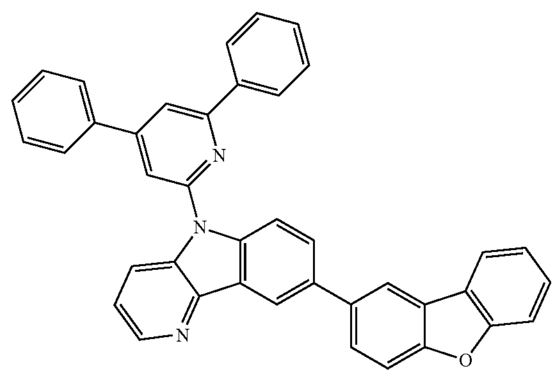
138A
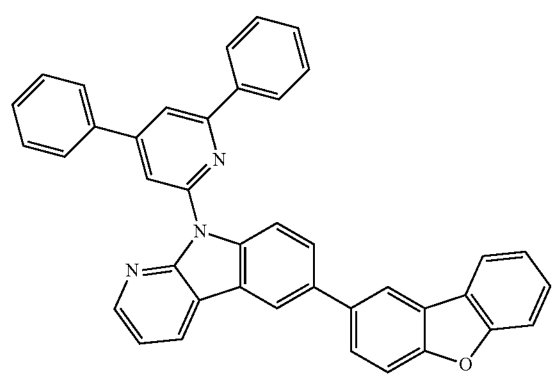
139A
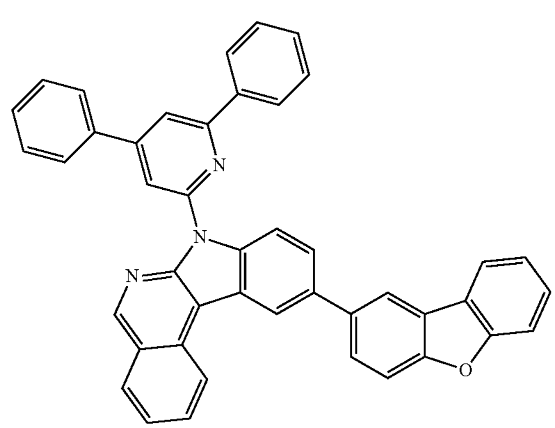

-continued
140A
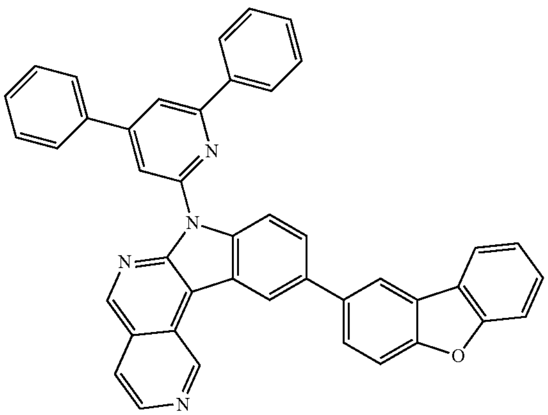
141A
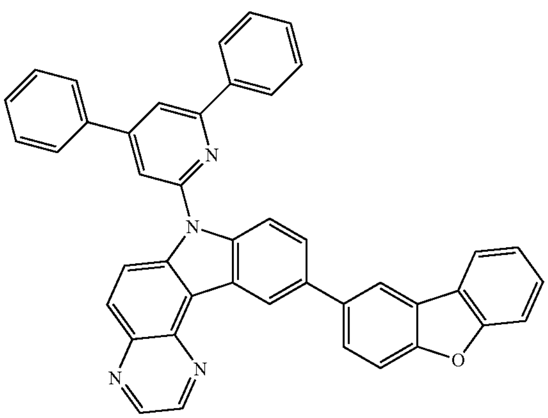
142A
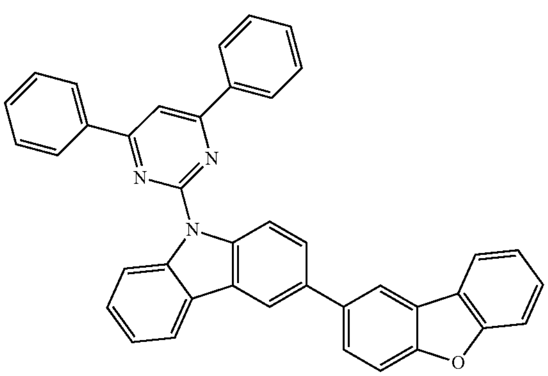
143A
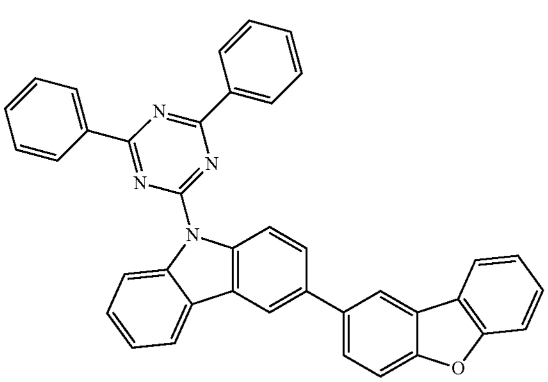
-continued
144A
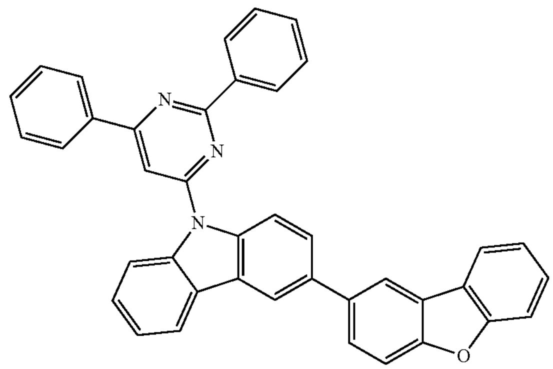
145A
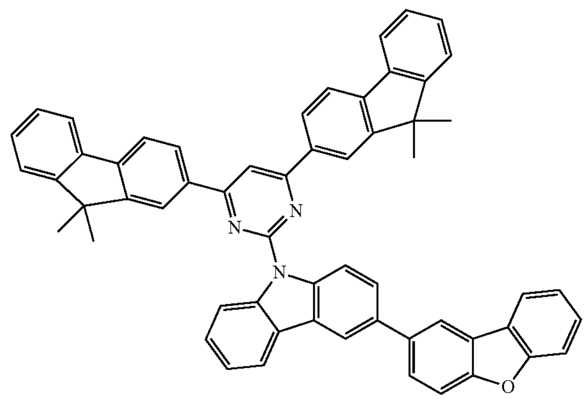
146A
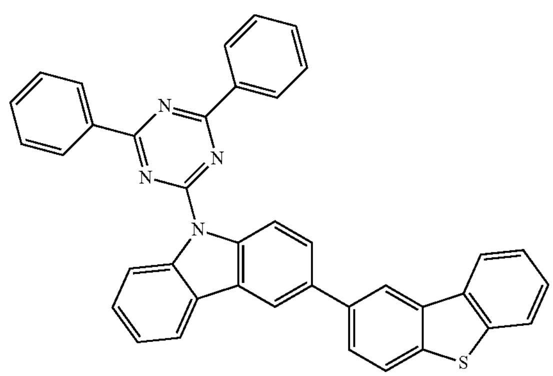
147A
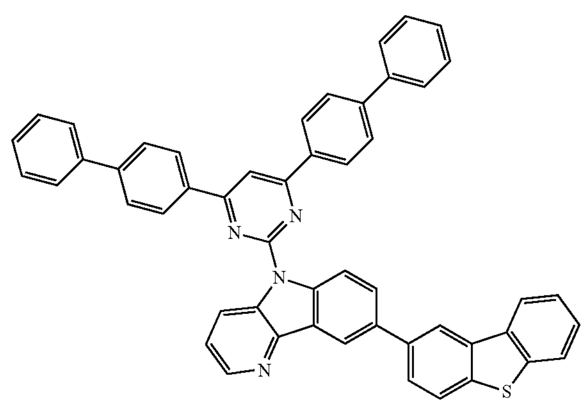

-continued
148A
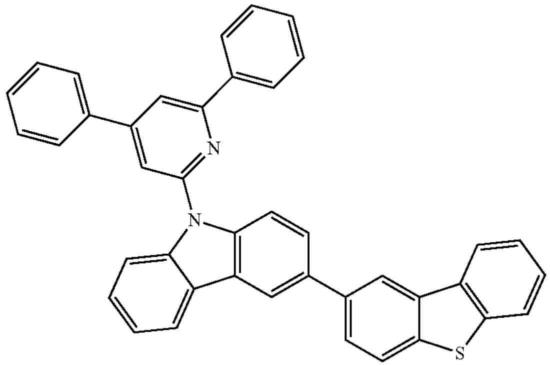
149A
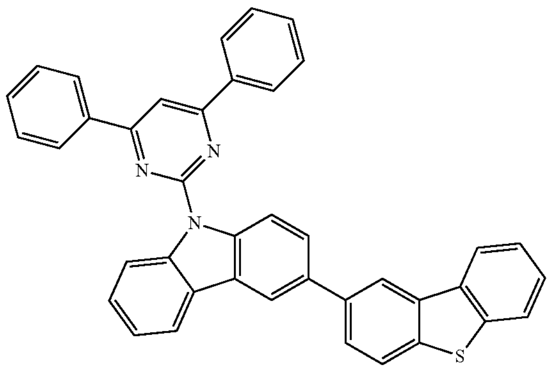
150A
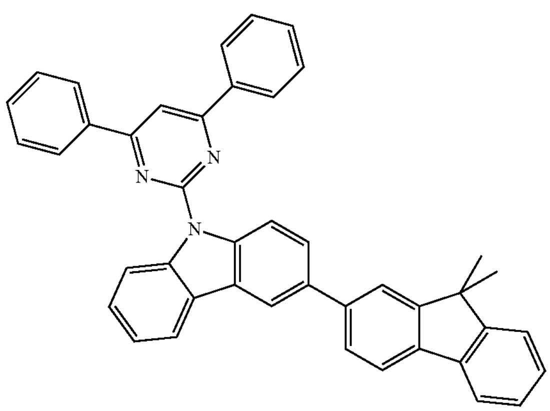
151A
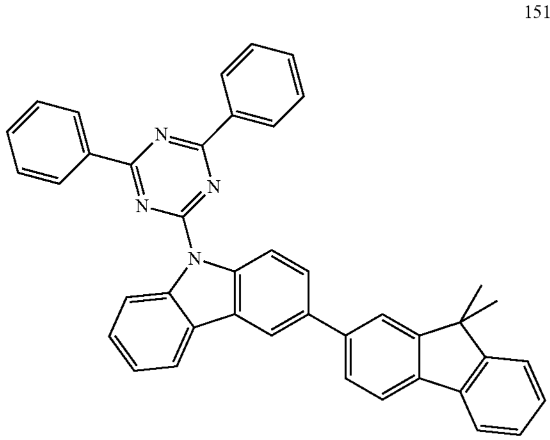
-continued
152A
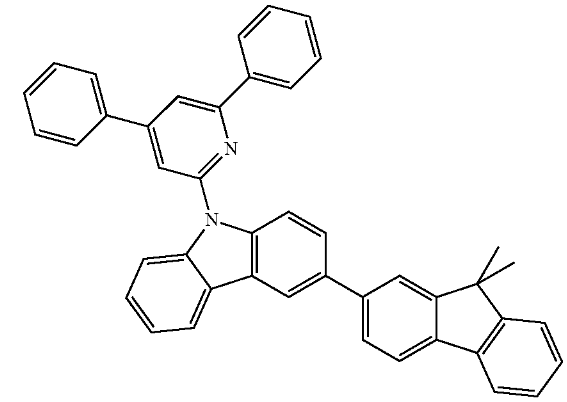
153A
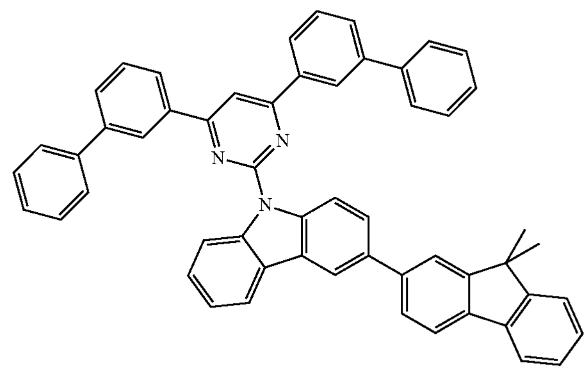
154A
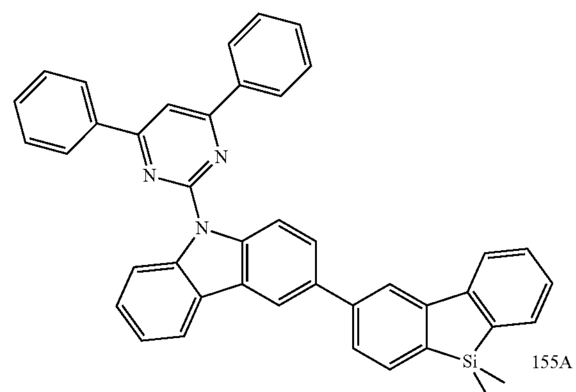
155A
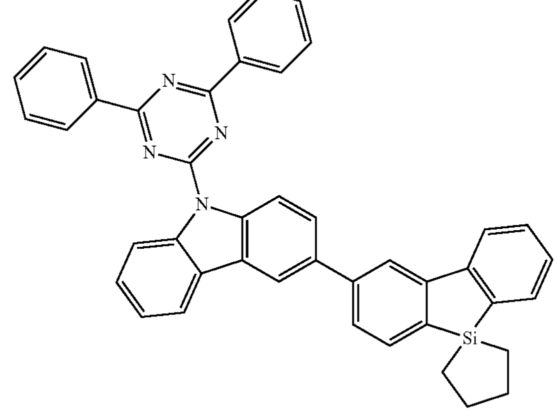

156A
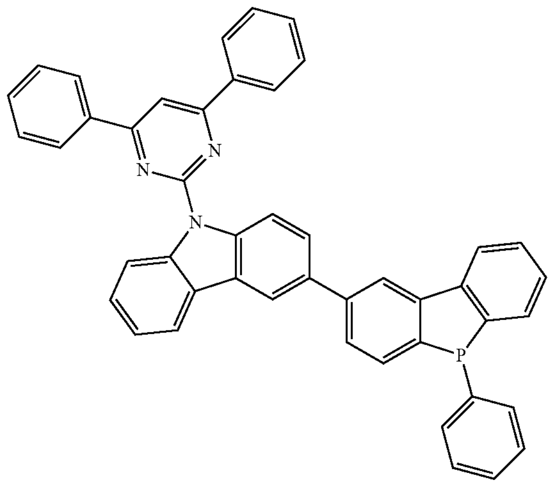
159A
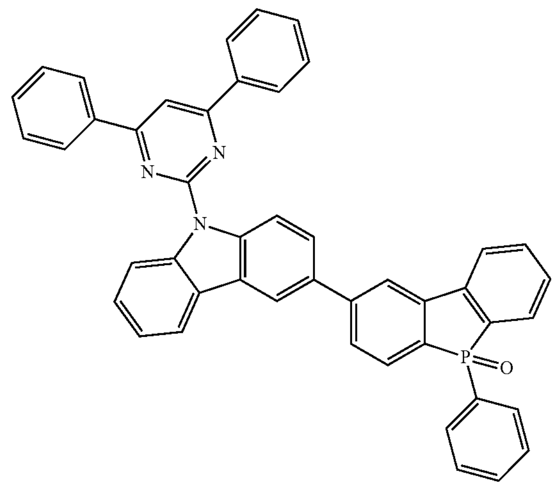
157A
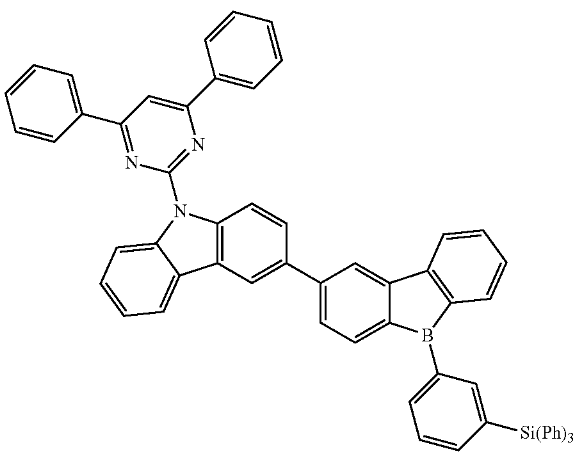
160A
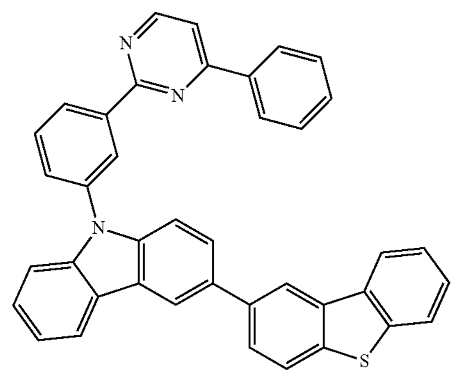
158A
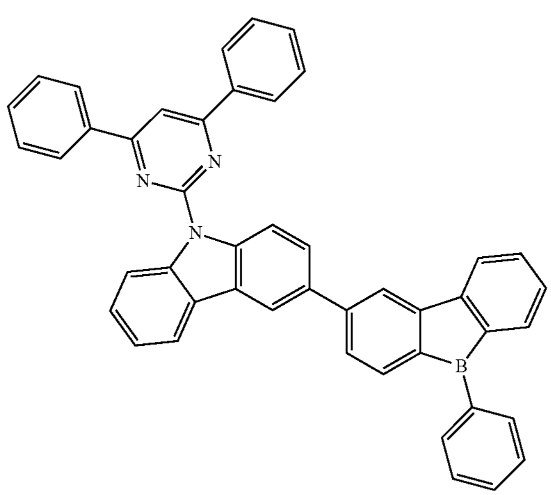
161A
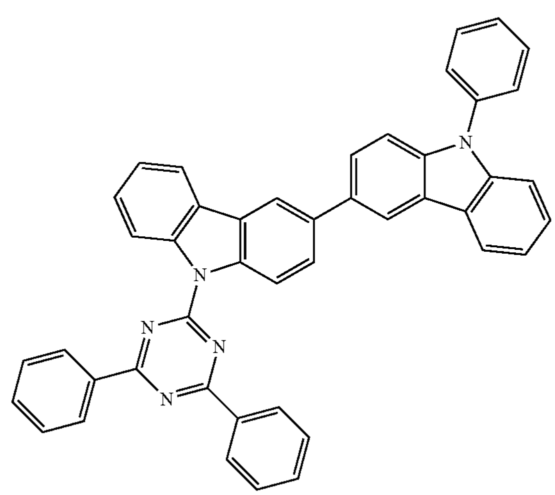

-continued
162A
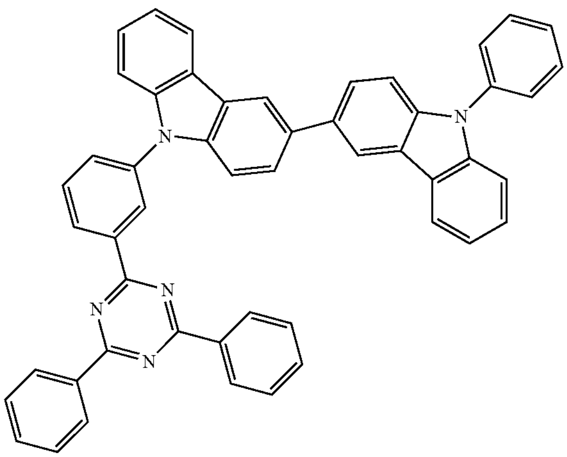
163A
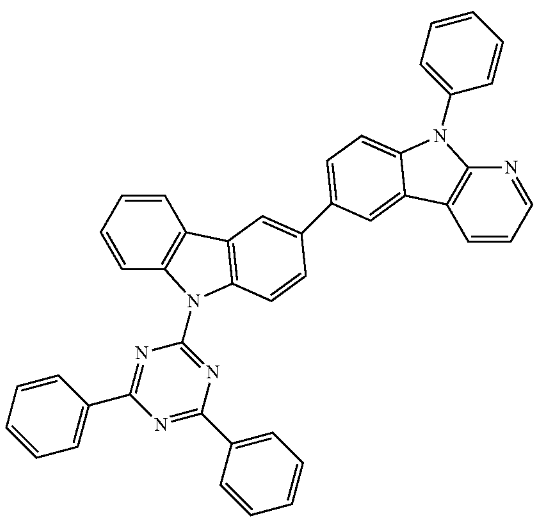
164A
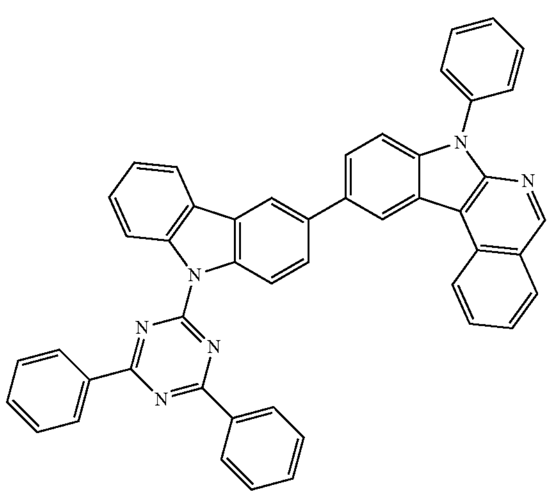
-continued
165A
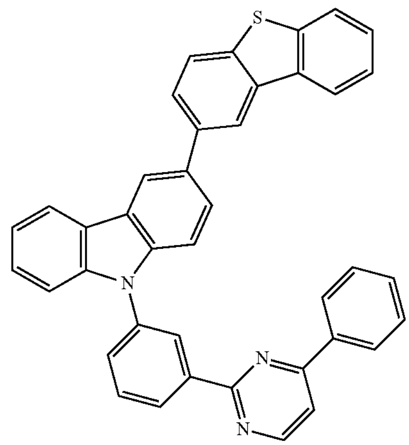
166A
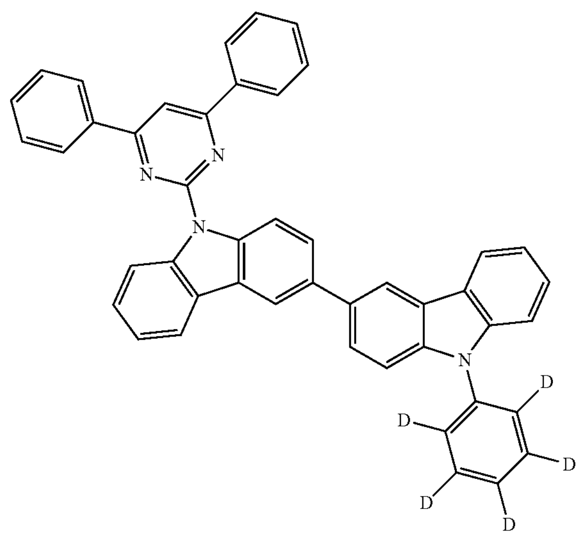
167A
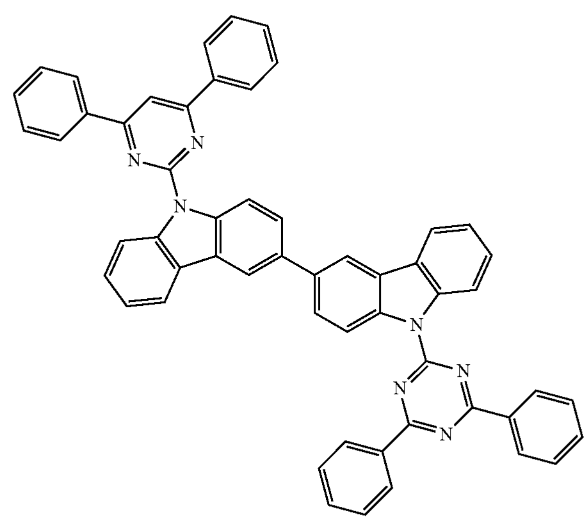

-continued
168A
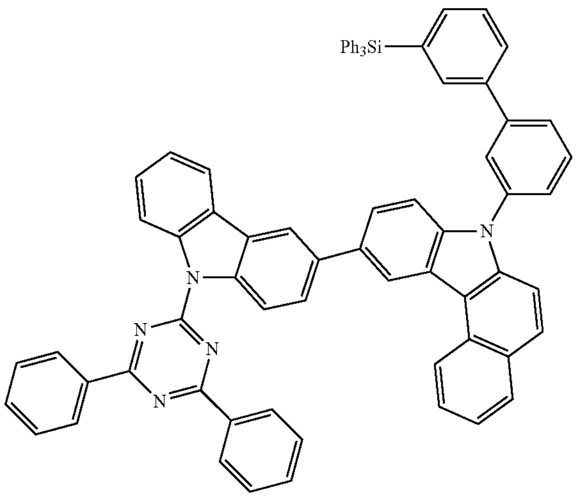
169A
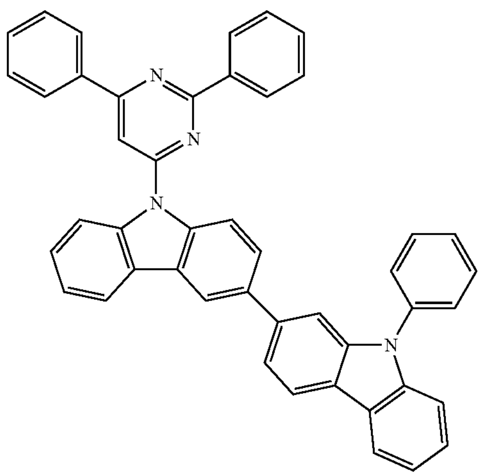
170A
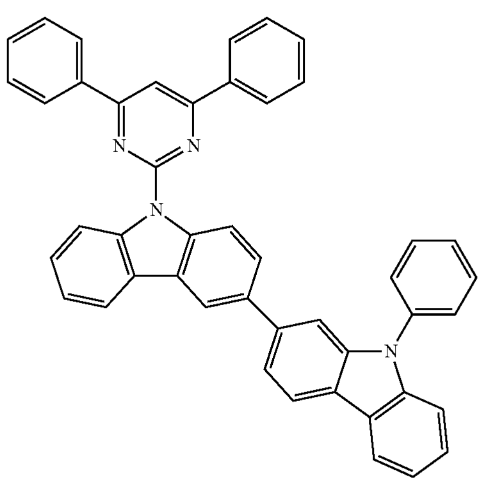
-continued
171A
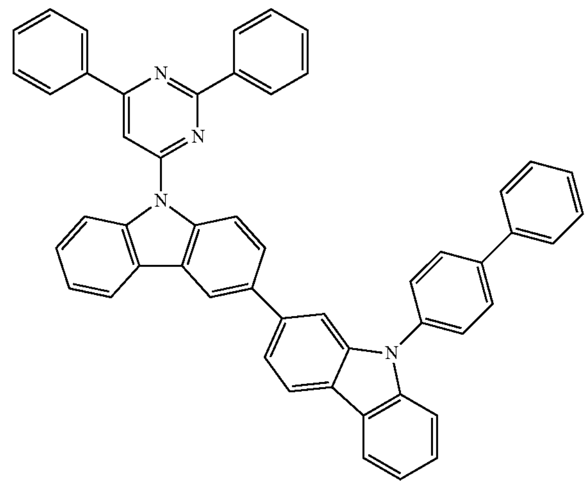
172A
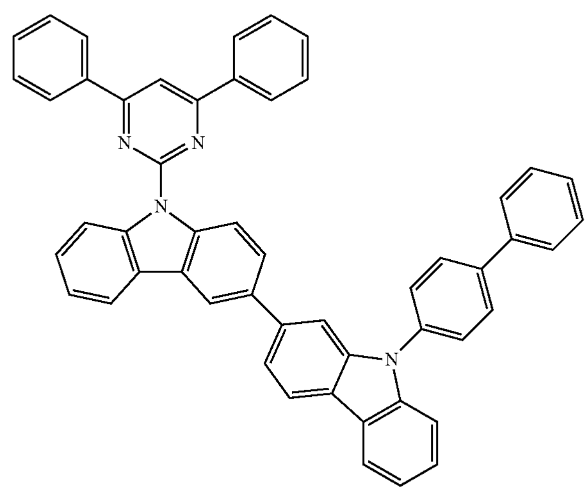
173A
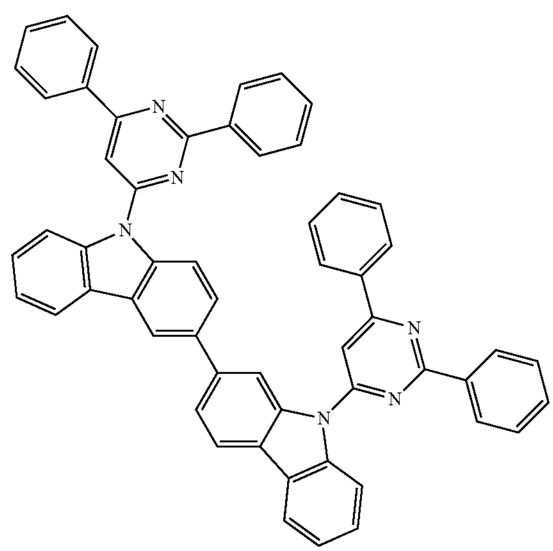

-continued
174A
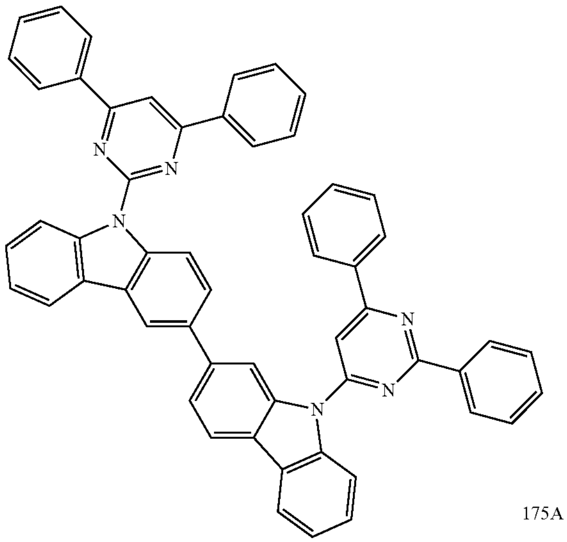
175A
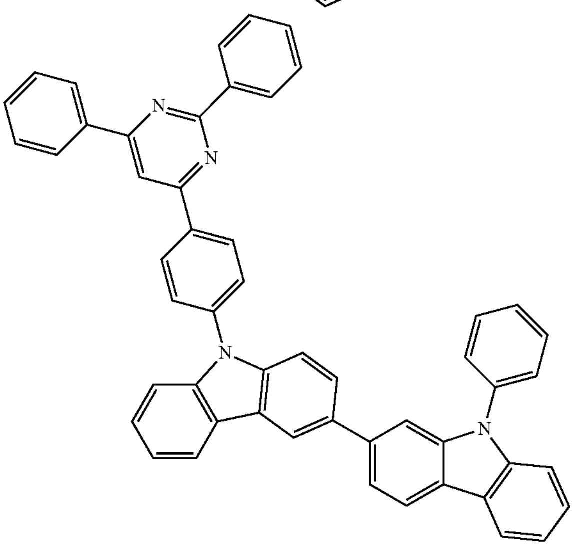
176A
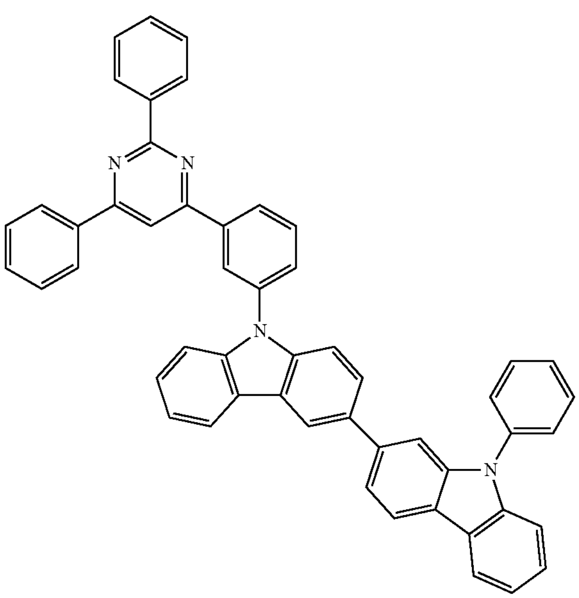
-continued
177A
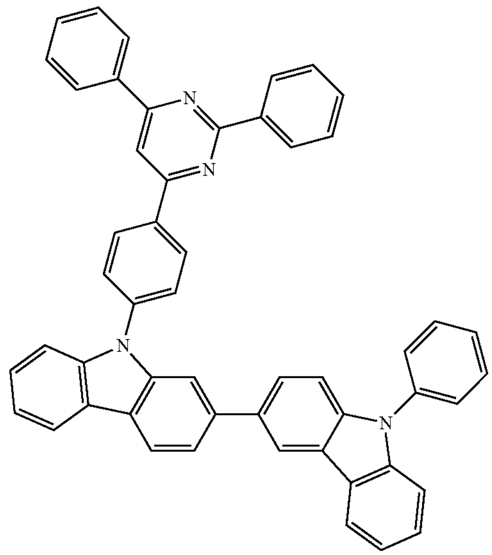
178A
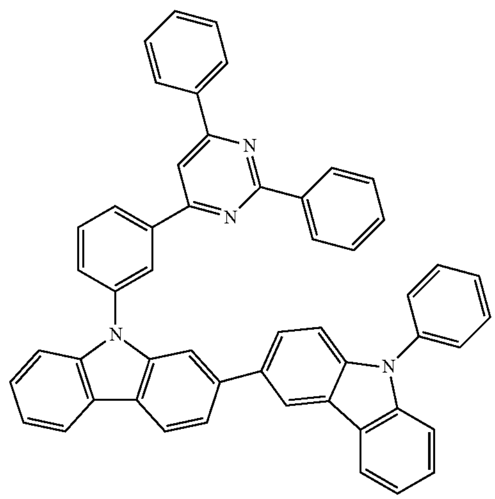
179A
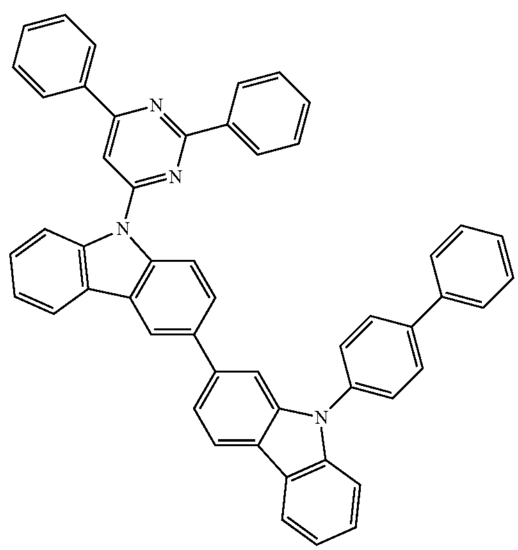

-continued
180A
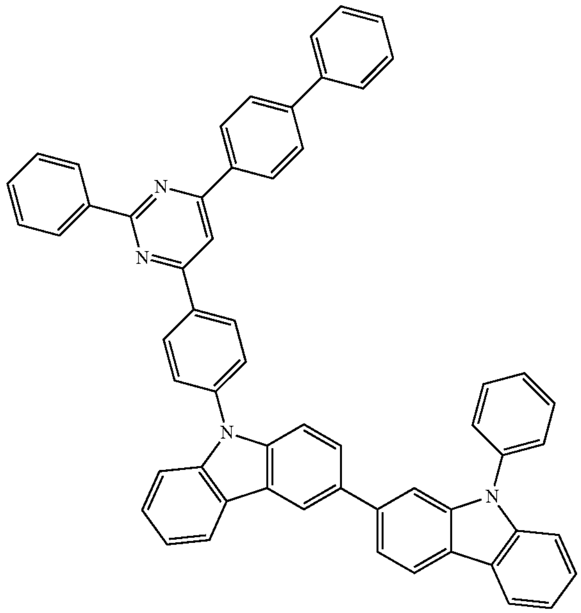
181A
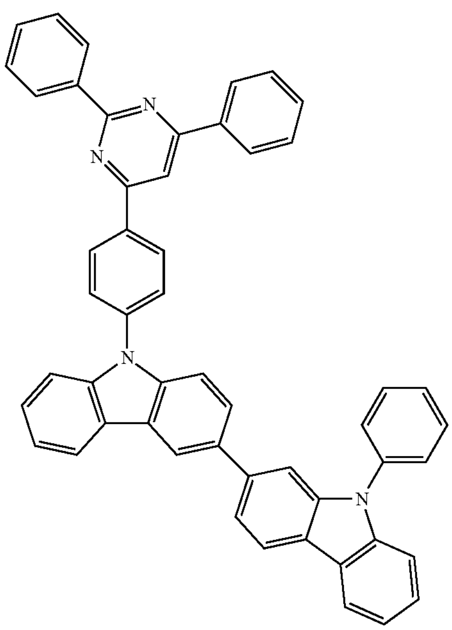
-continued
182A
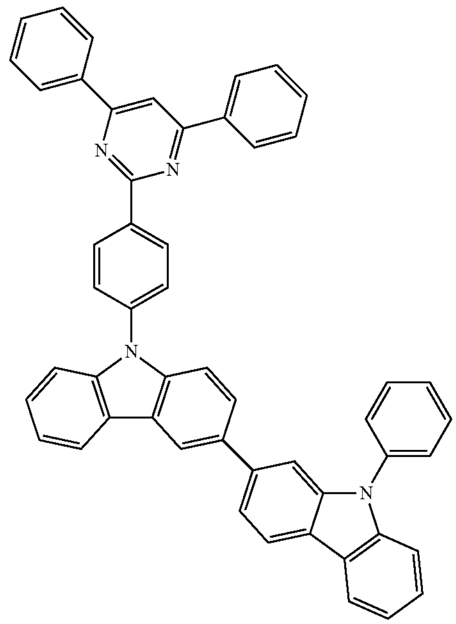
183A
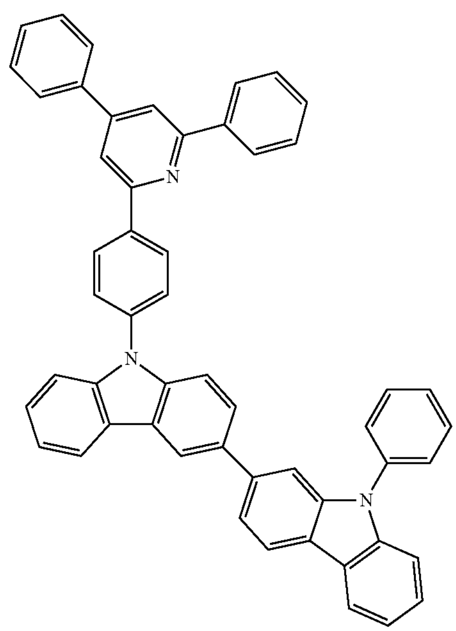

-continued
184A
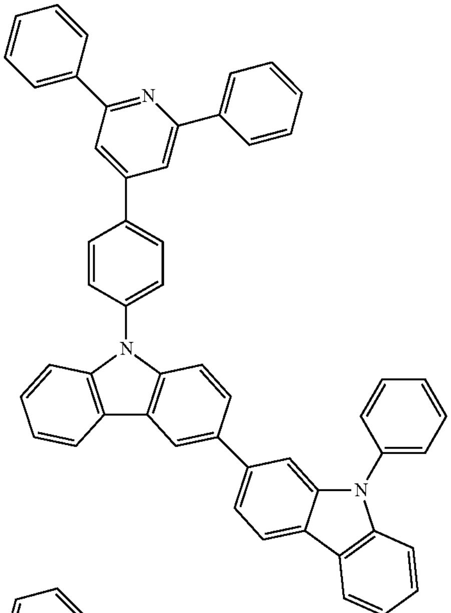
185A
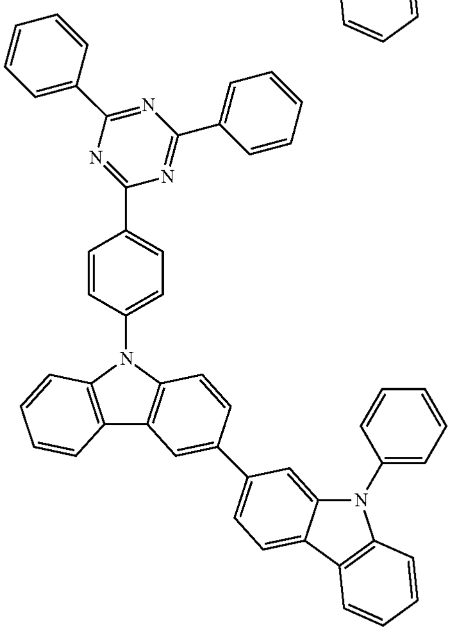
186A
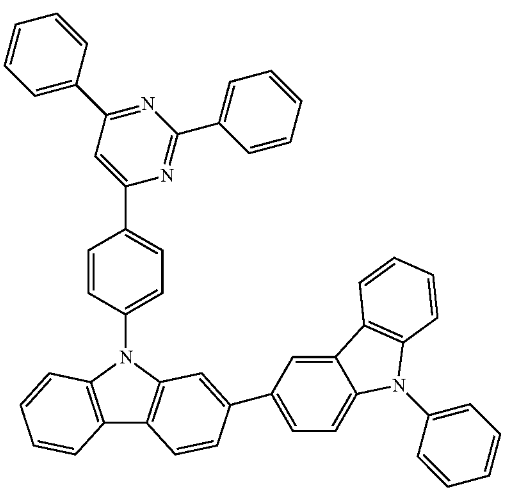
-continued
187A
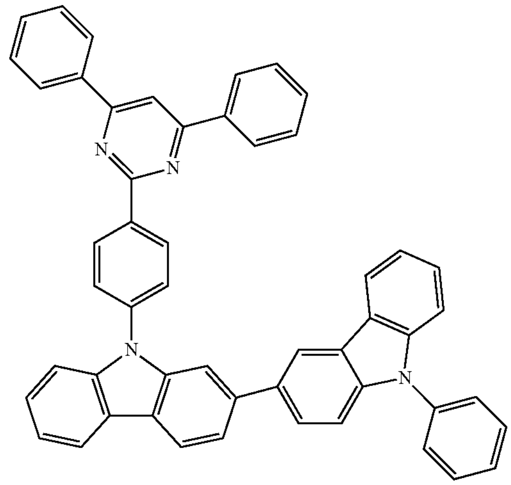
188A
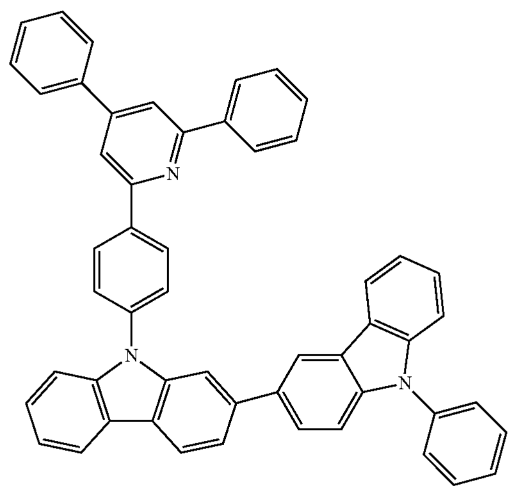
189A
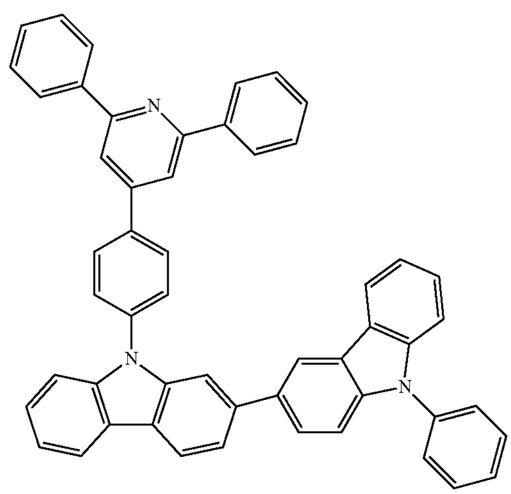

-continued
190A
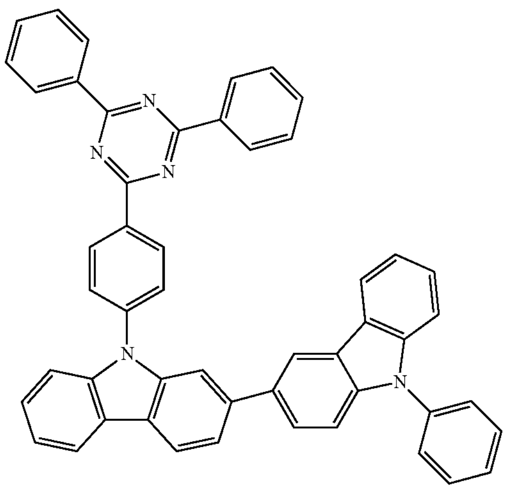
191A
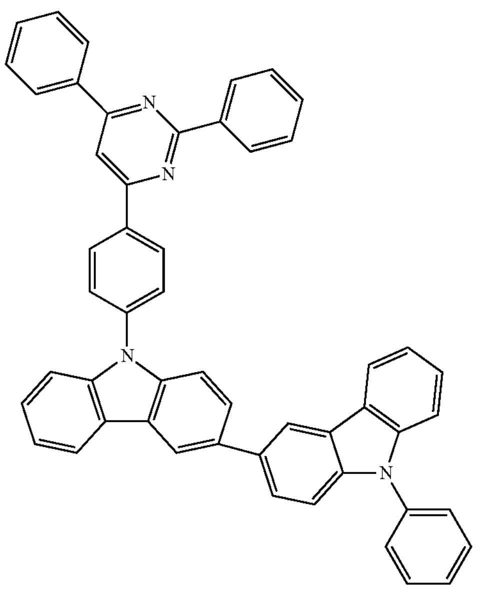
192A
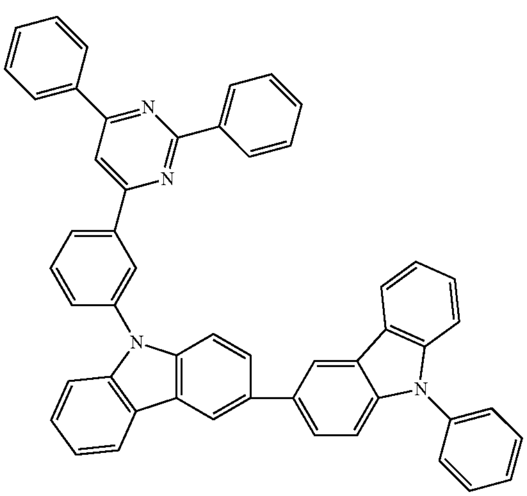
-continued
193A
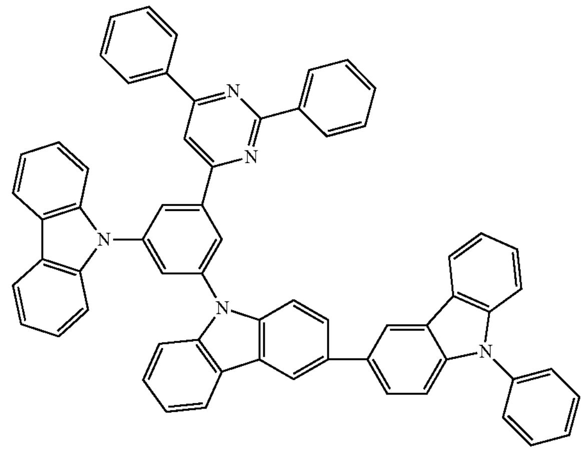
194A
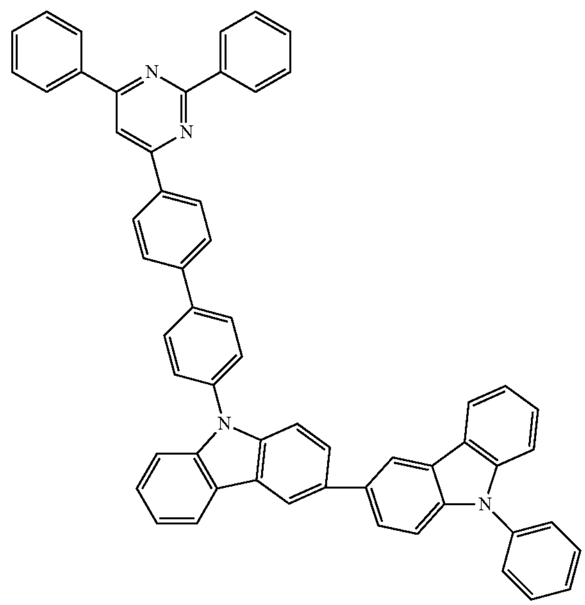
195A
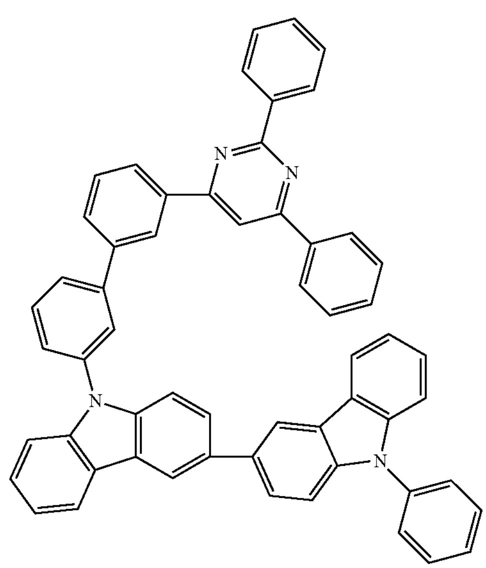

-continued
196A
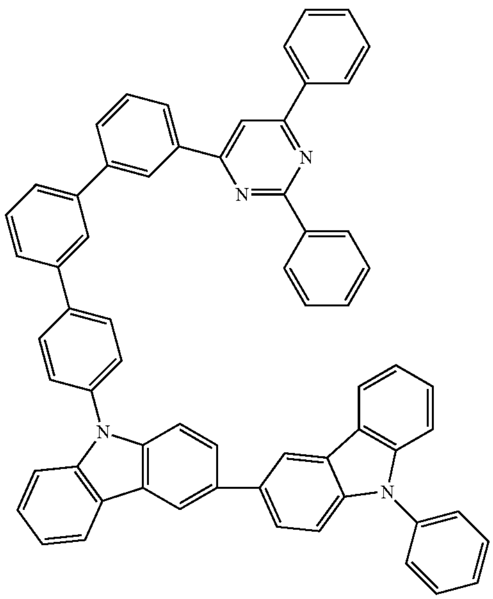
197A
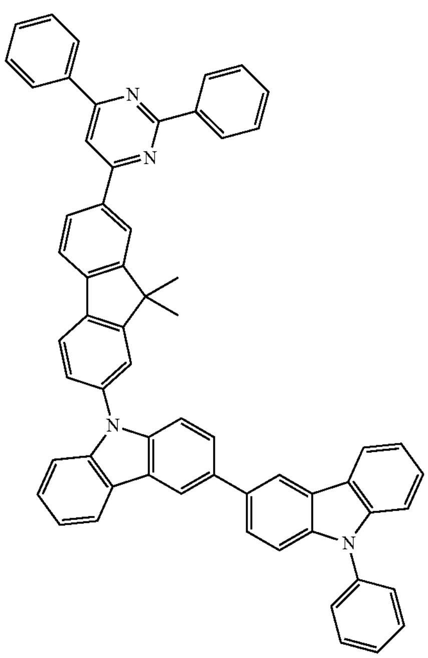
-continued
198A
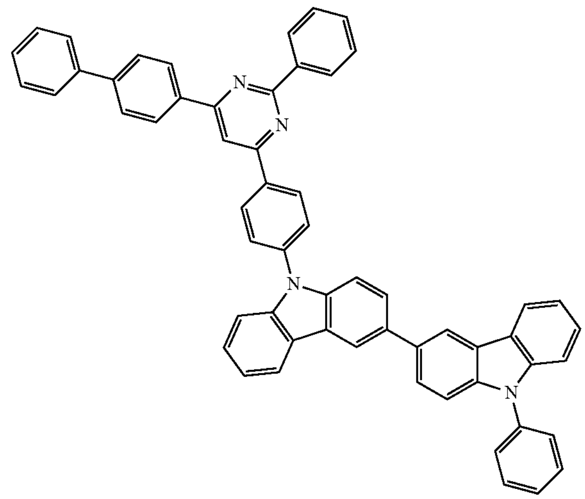
199A
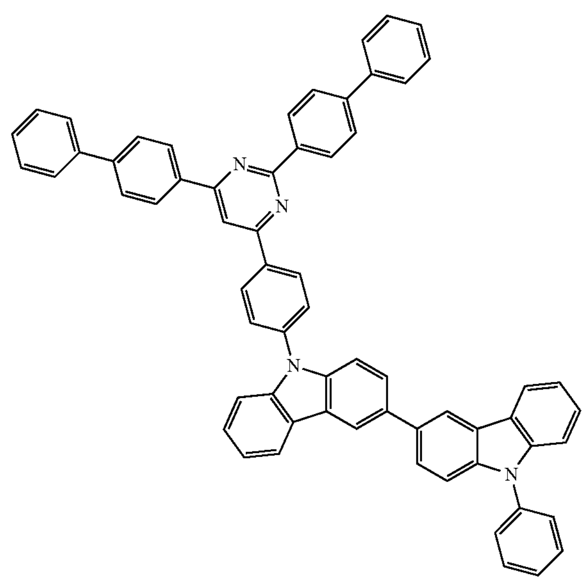

-continued
200A
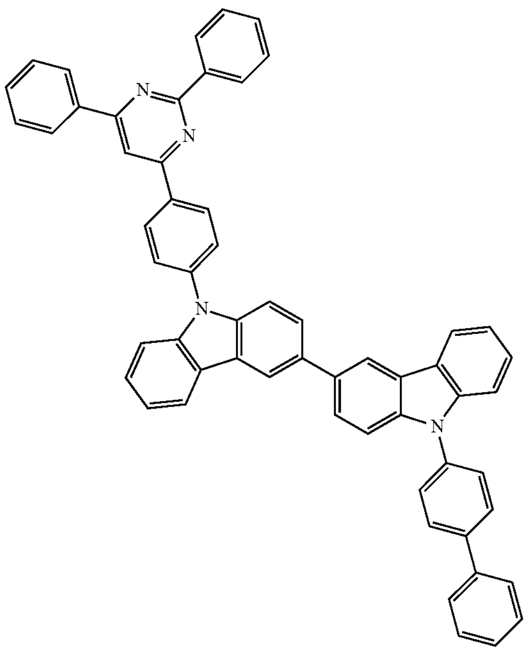
201A
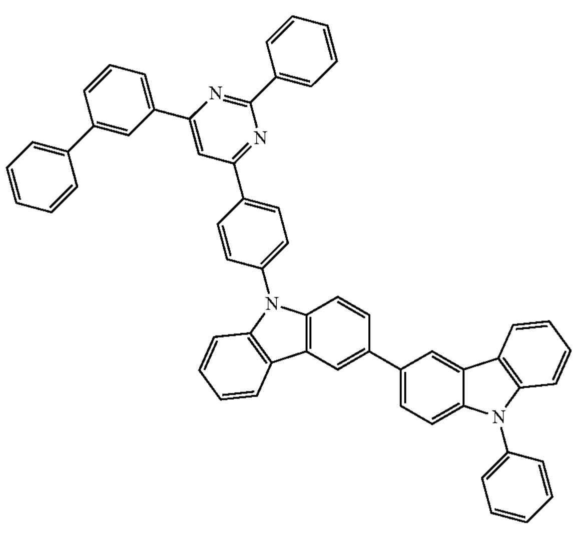
-continued
202A
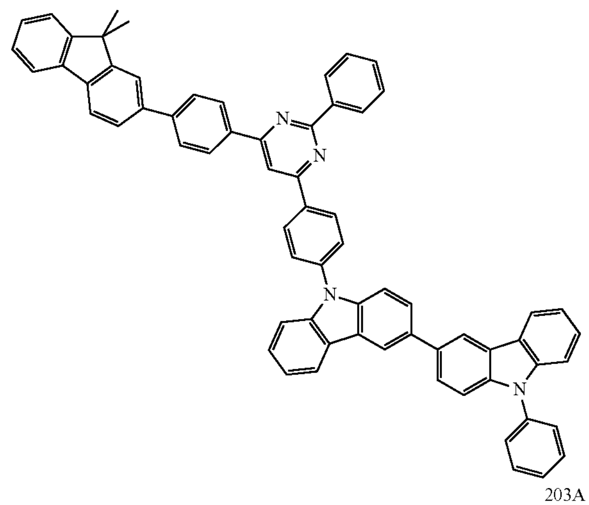
203A
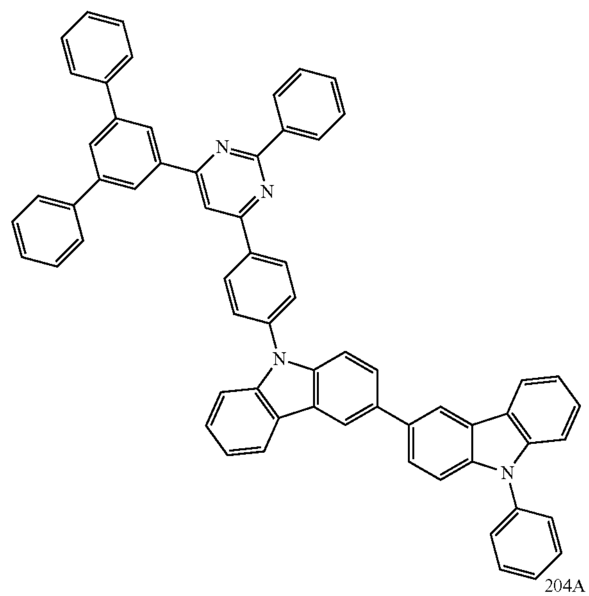
204A
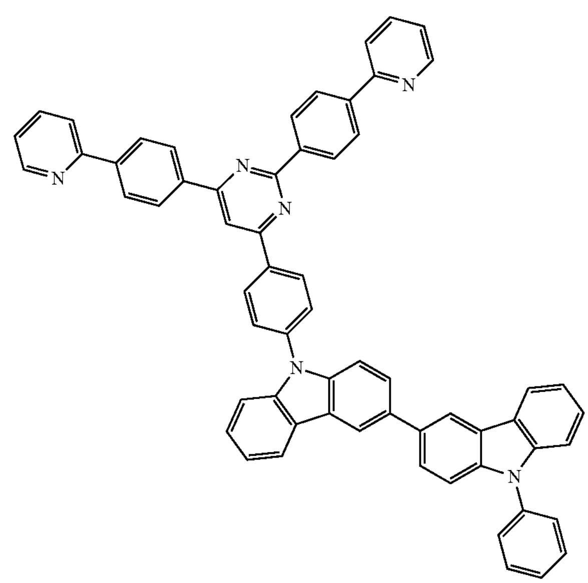

-continued
205A
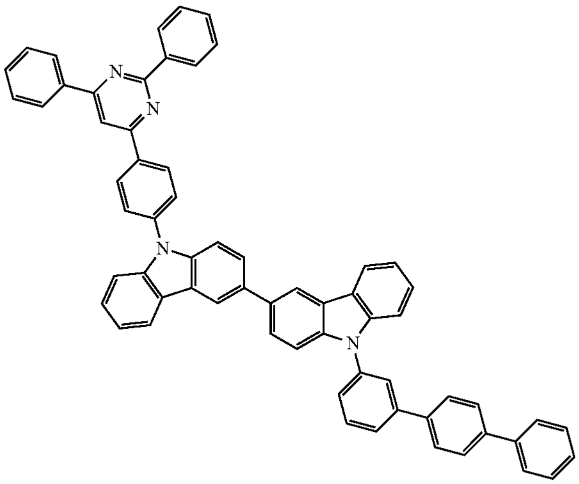
206A
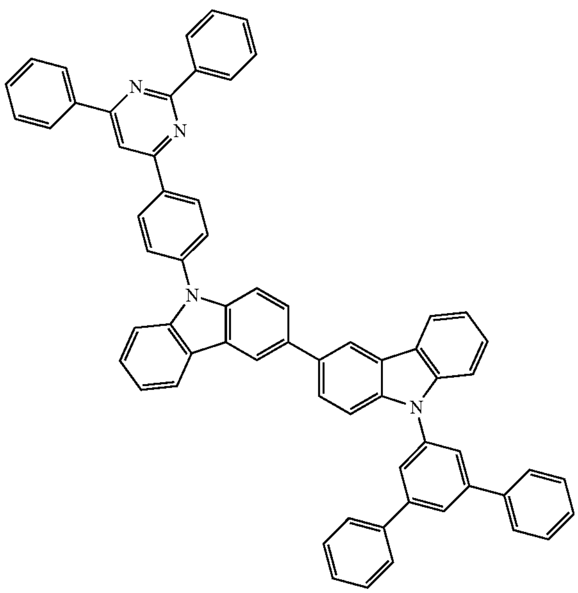
301A
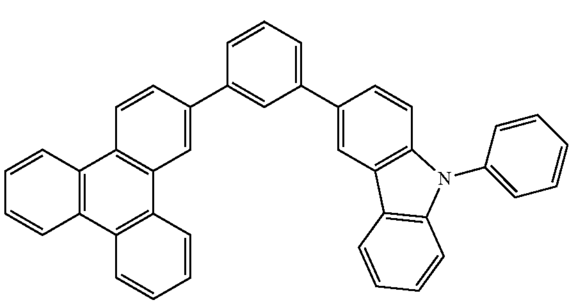
-continued
302A
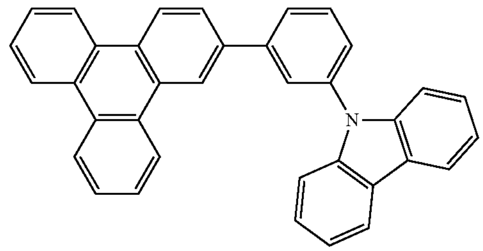
303A
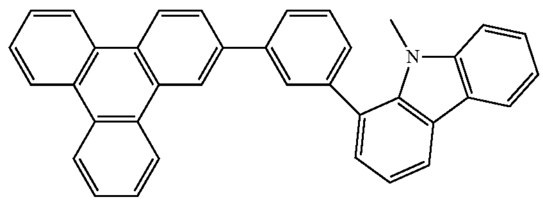
304A
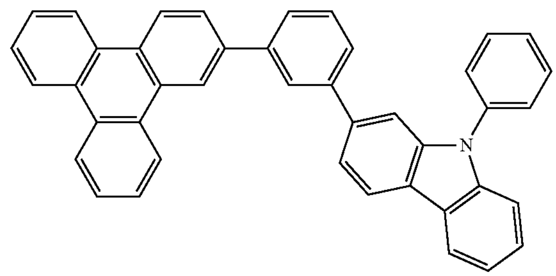
305A
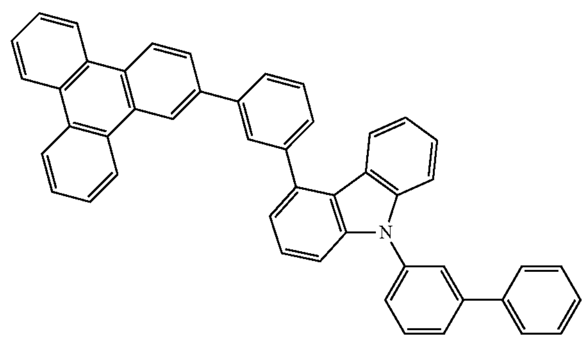
306A
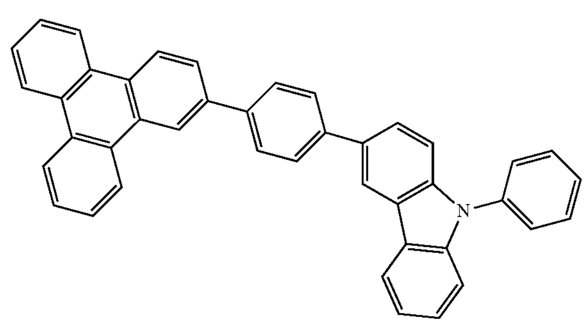

307A
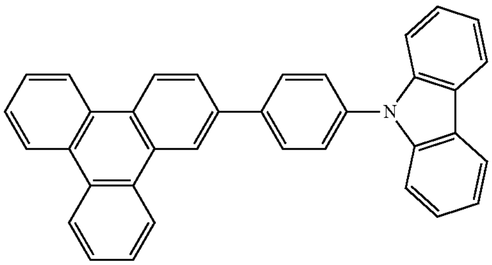
308A
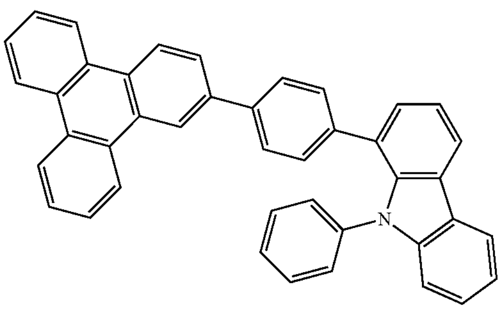
309A
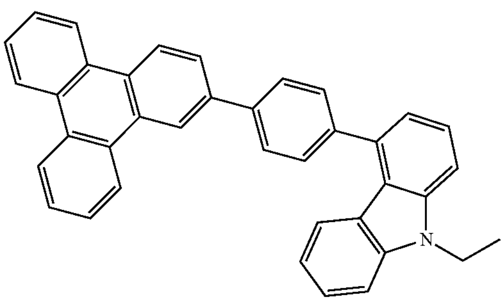
310A
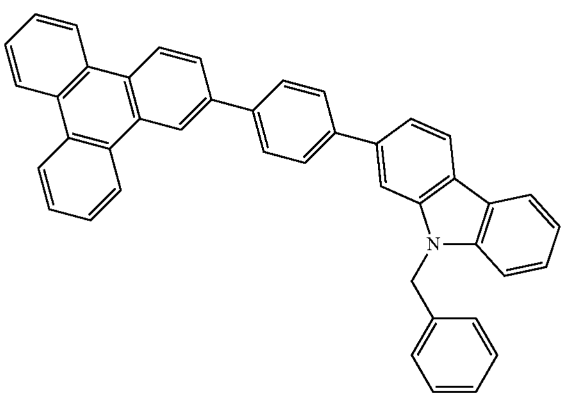
311A
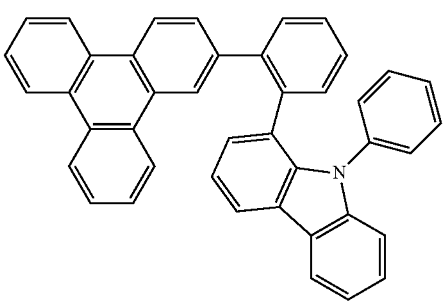
312A
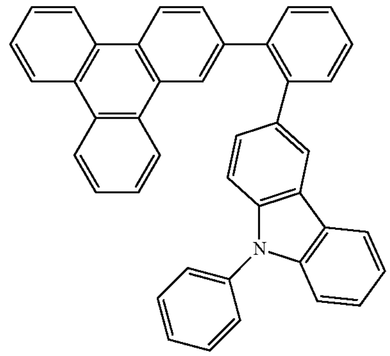
313A
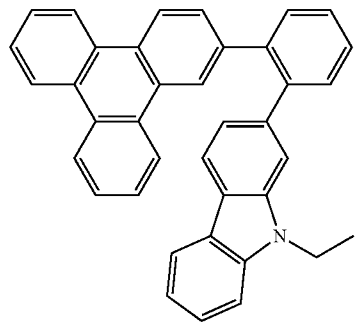
314A
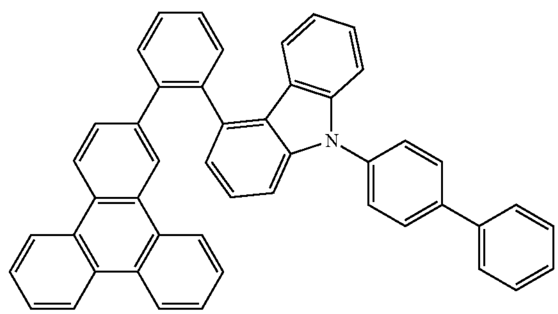
315A
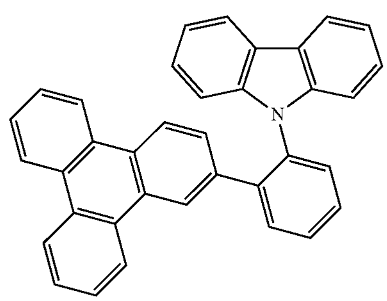
316A
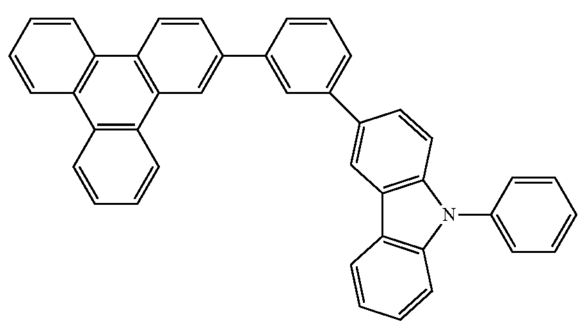

-continued
317A
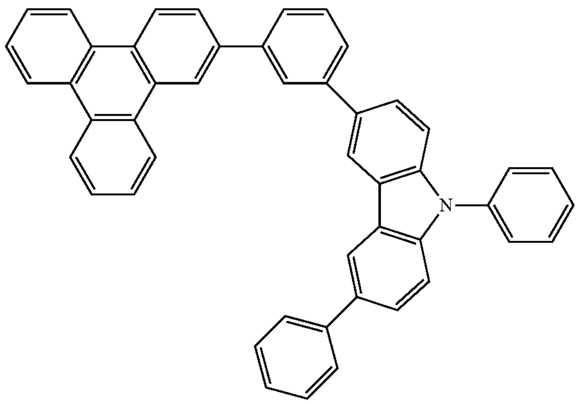
318A
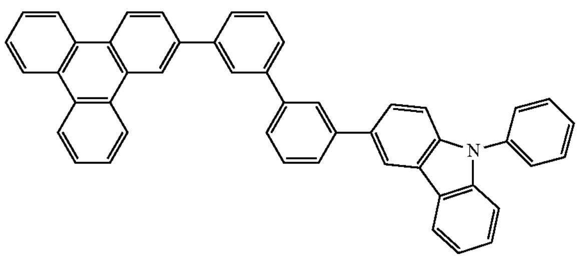
319A
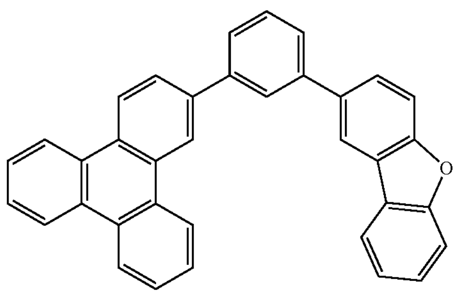
320A
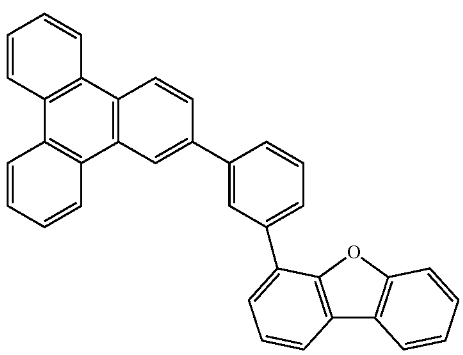
321A
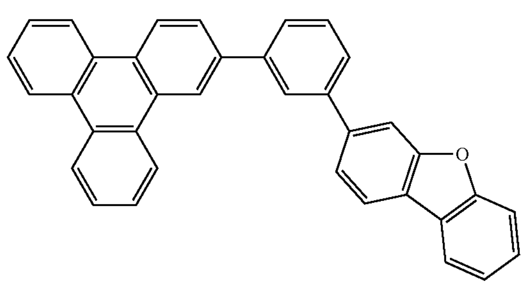
-continued
322A
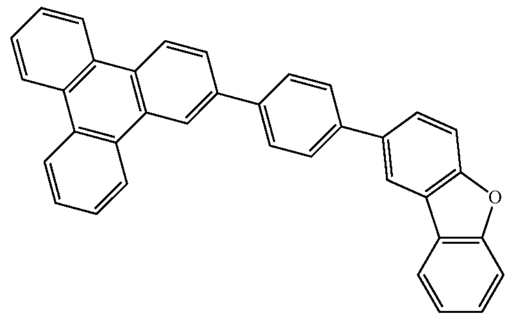
323A
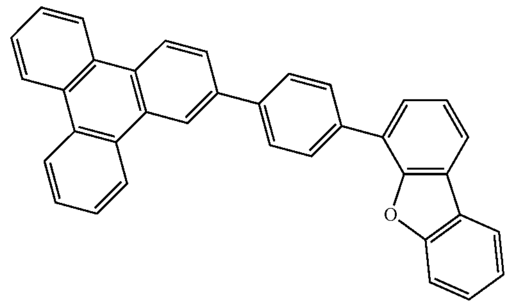
324A
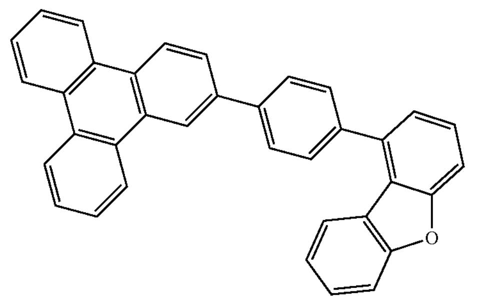
325A
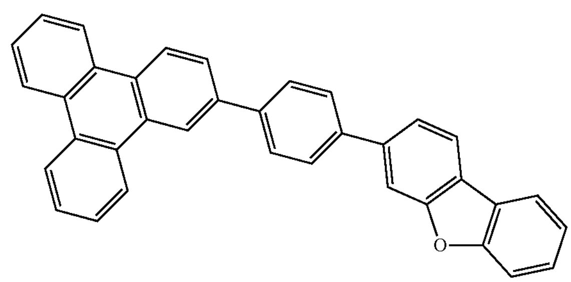
326A
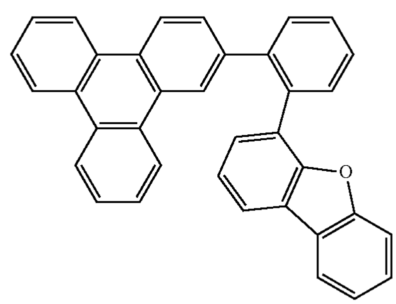

-continued
327A
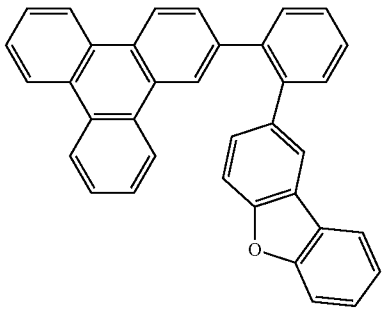
328A
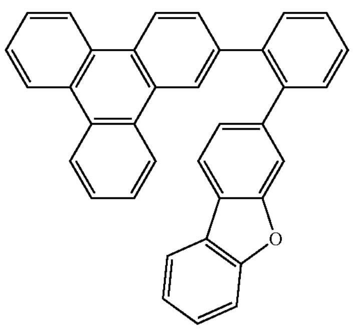
329A
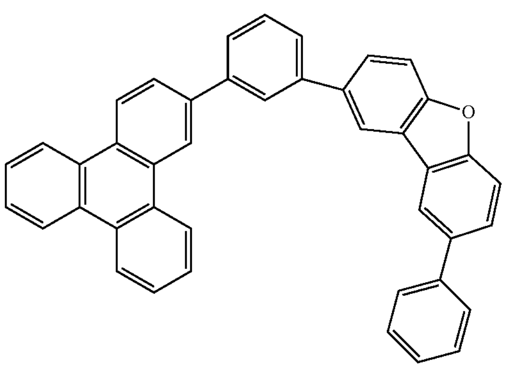
330A
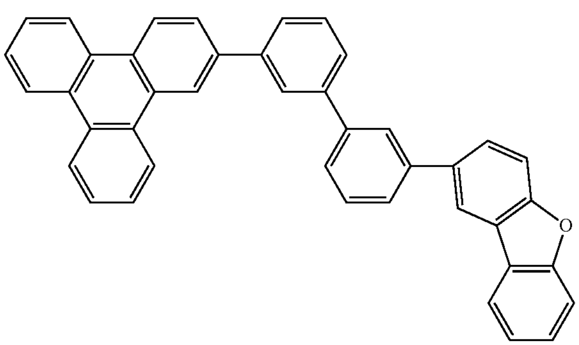
-continued
331A
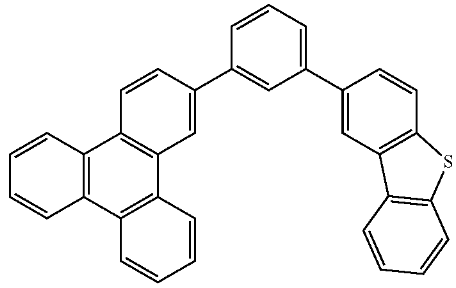
332A
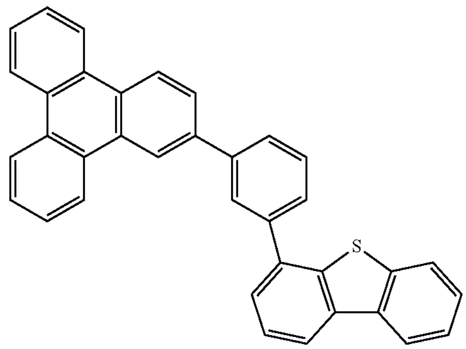
333A
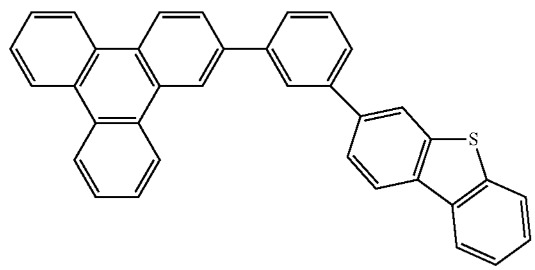
334A
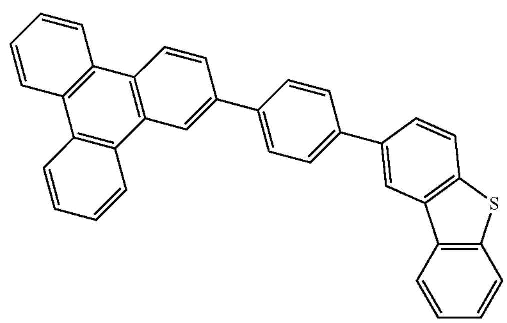
335A
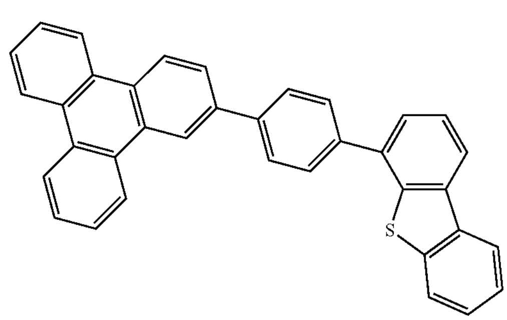

-continued
336A
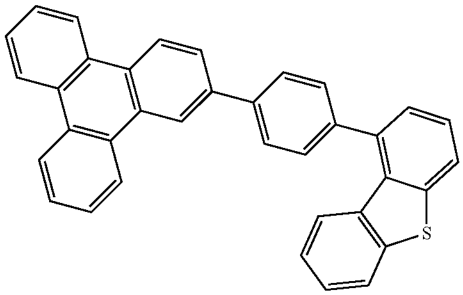
337A
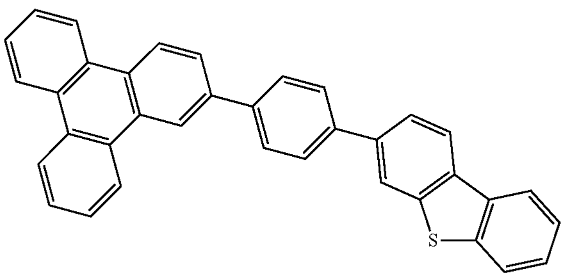
338A
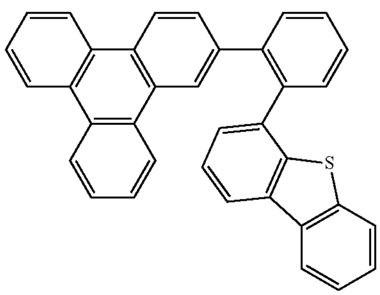
339A
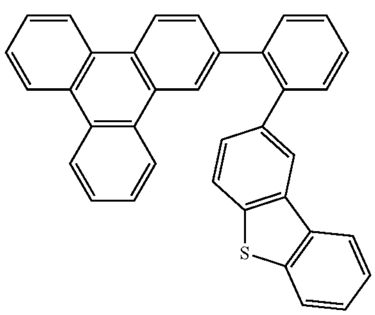
340A
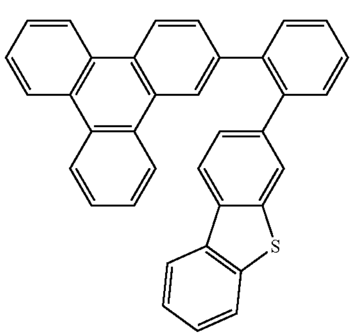
-continued
341A
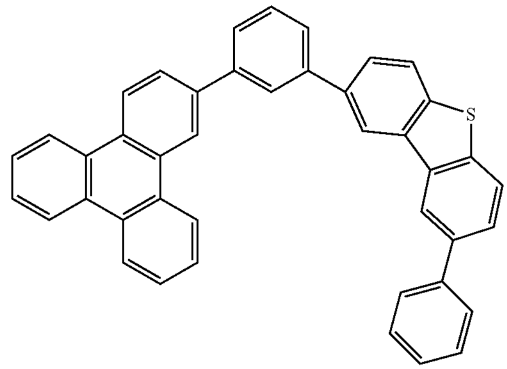
342A
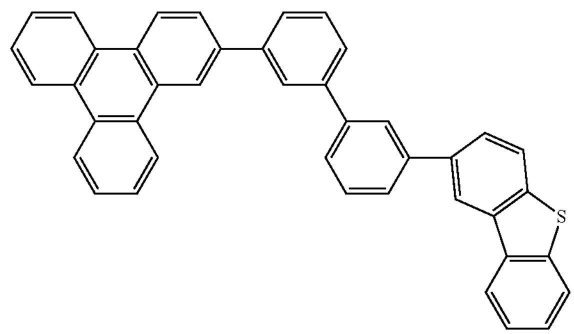
In some embodiments, the first host may be selected from Compounds 101B to 230B, and the second host may be selected from Compounds 301B to 345B, but they are not limited thereto:
101B
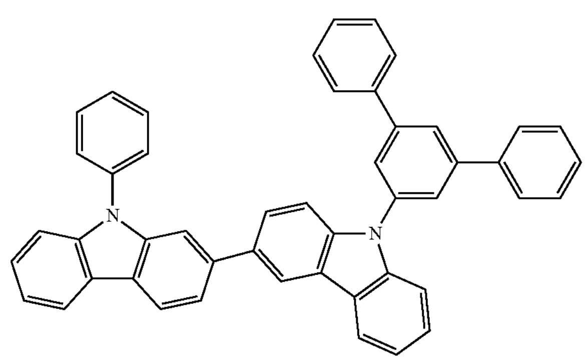

102B
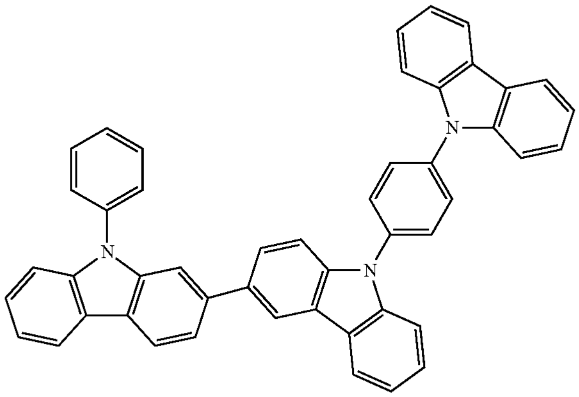
103B
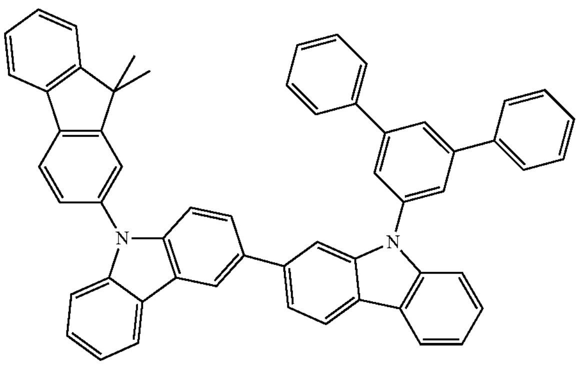
104B
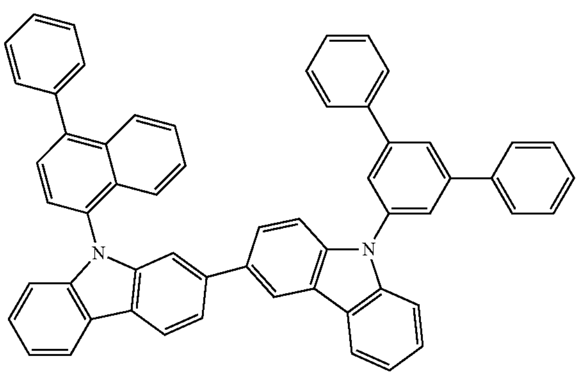
105B
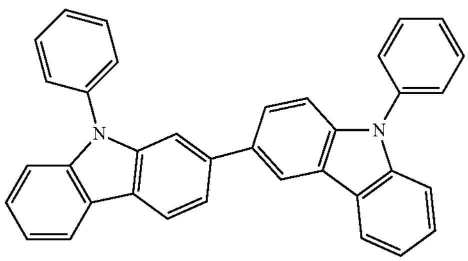
106B
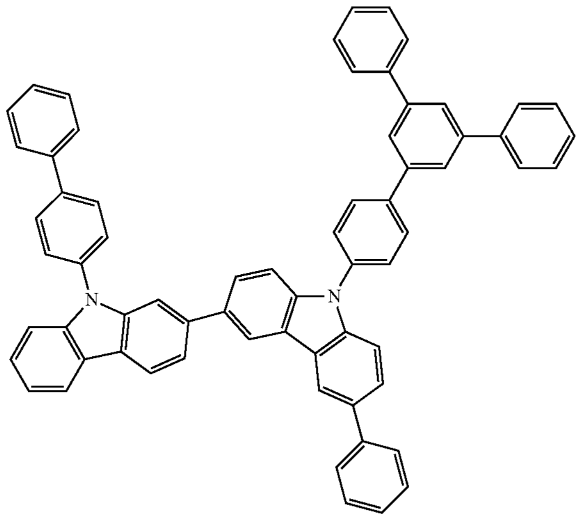
107B
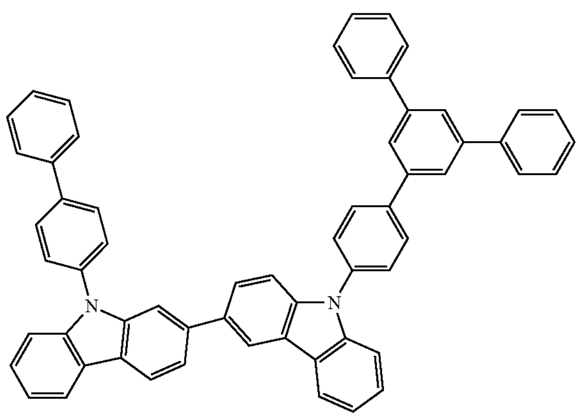
108B
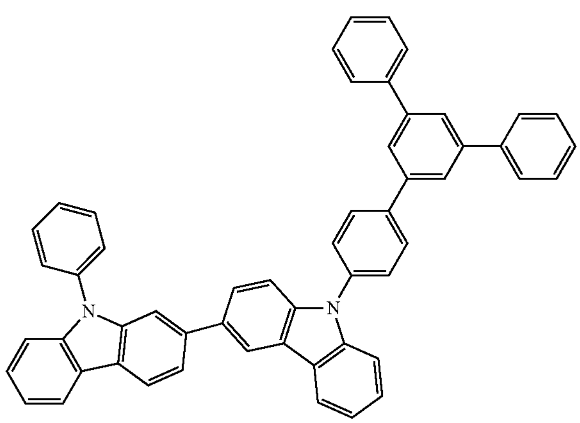

-continued
109B
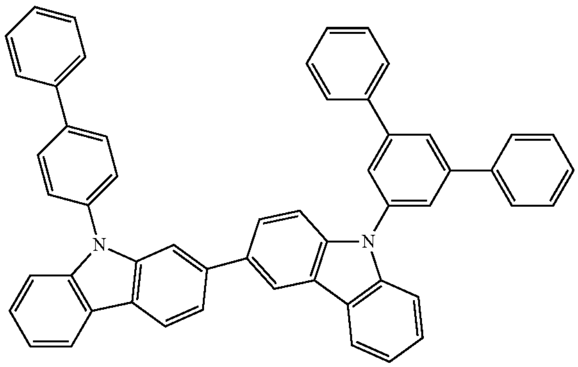
110B
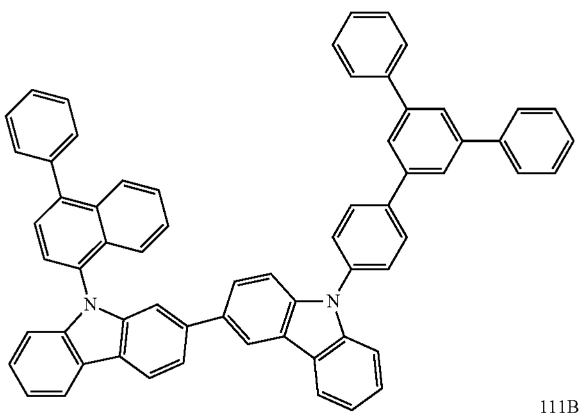
111B
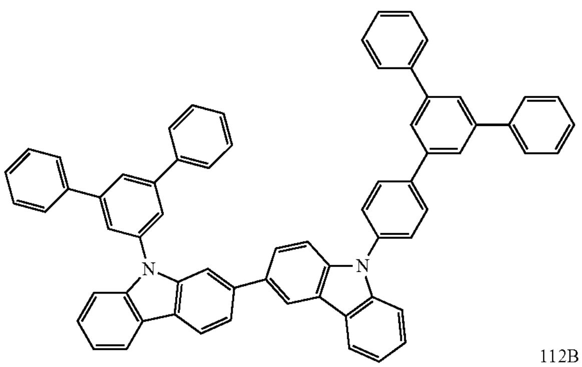
112B
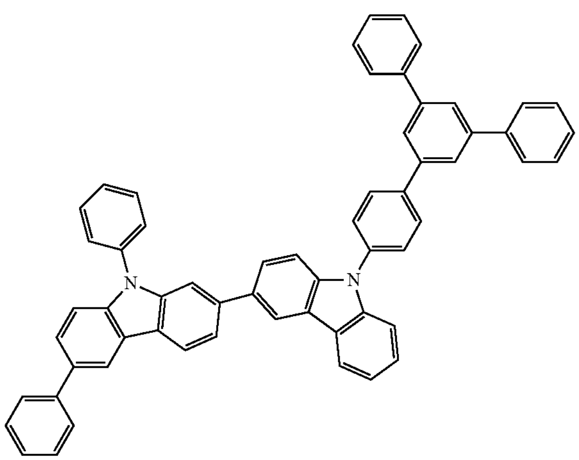
-continued
113B
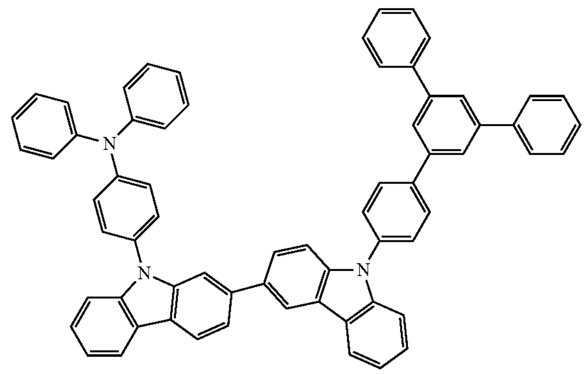
114B
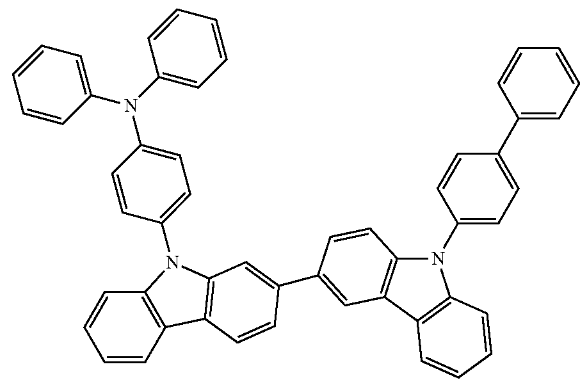
115B
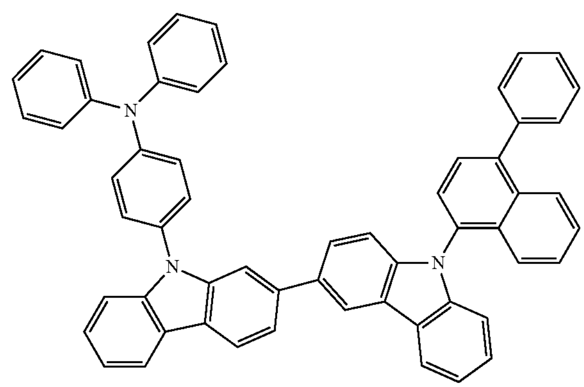
116B
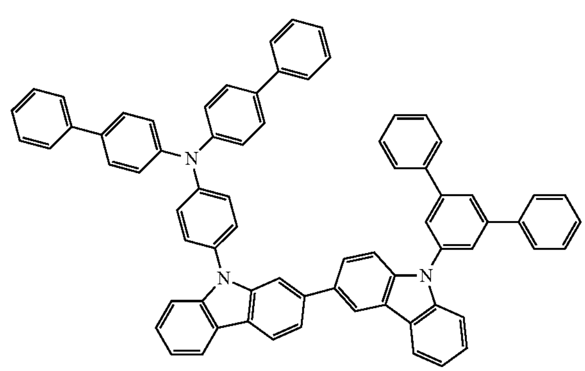

-continued
117B
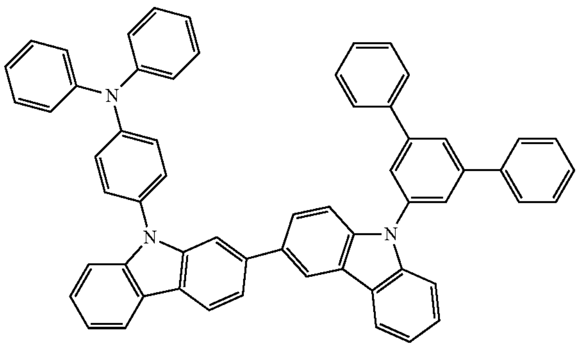
118B
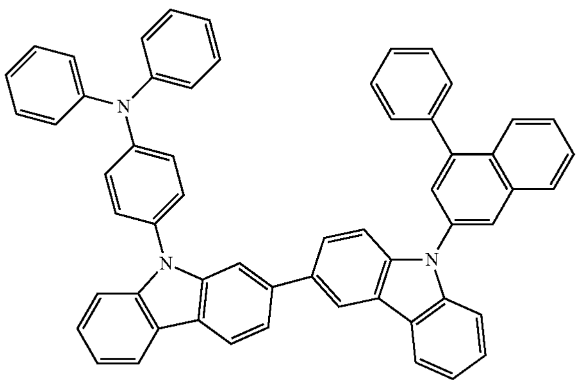
119B
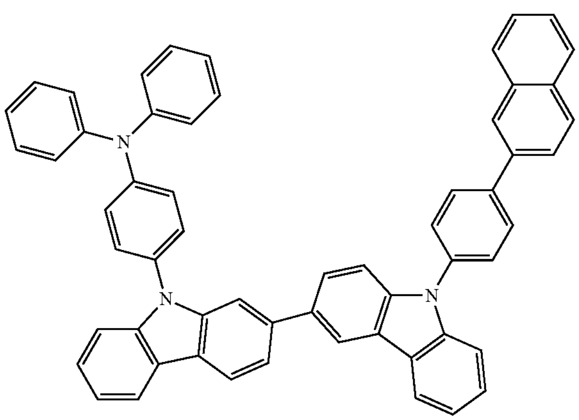
120B
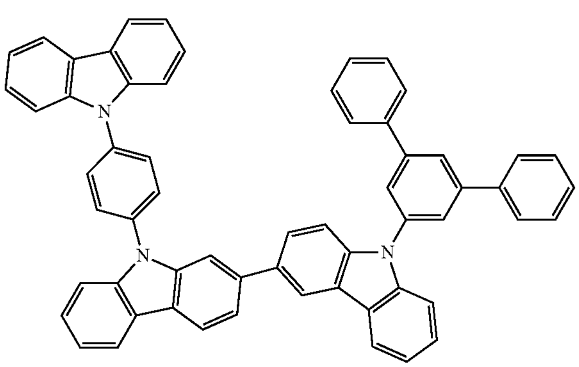
-continued
121B
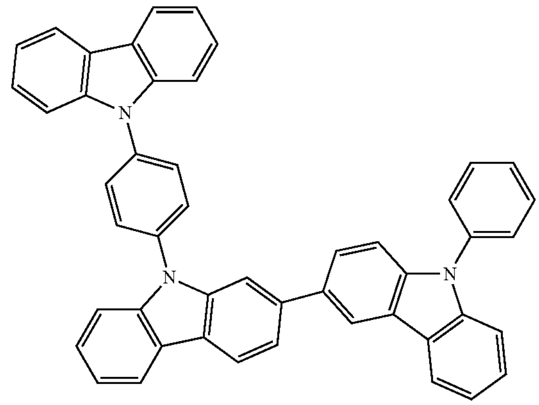
122B
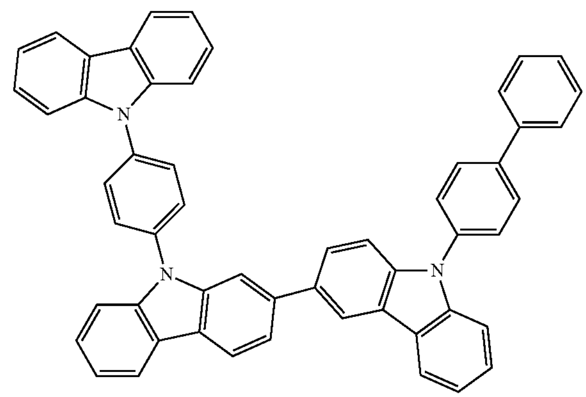
123B
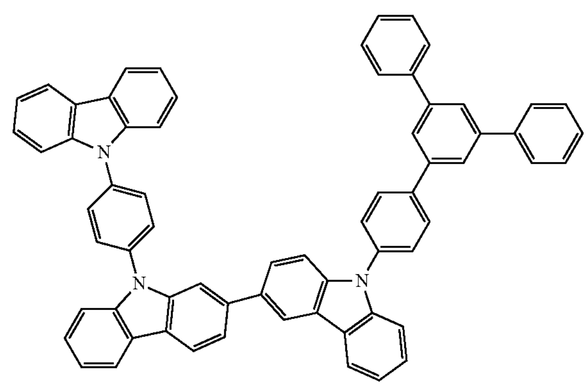
124B
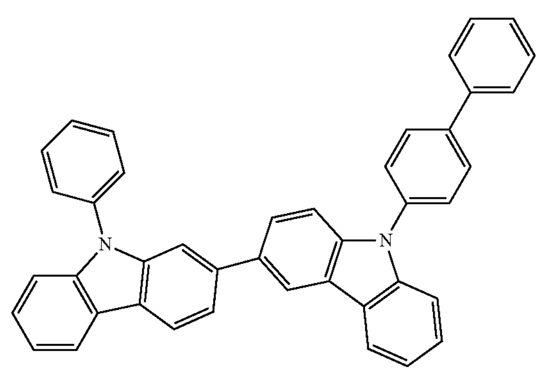

-continued
125B
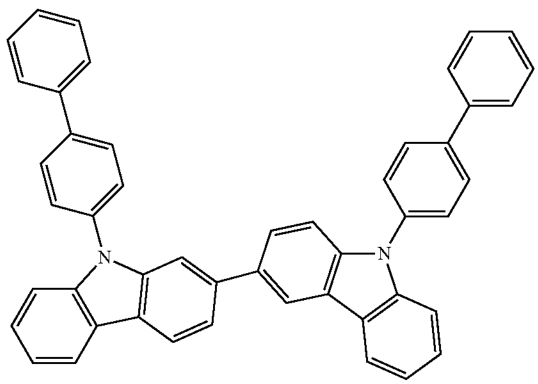
126B
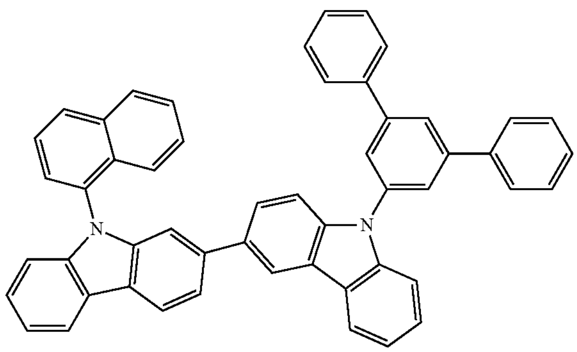
127B
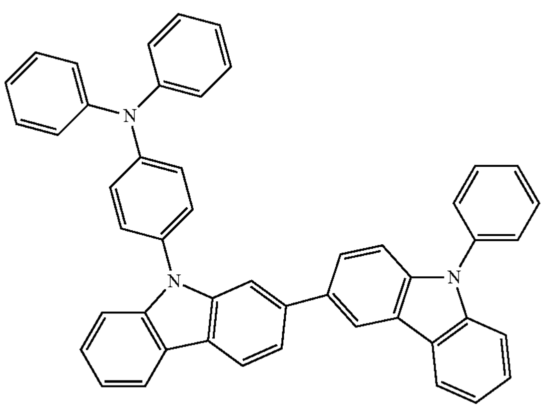
128B
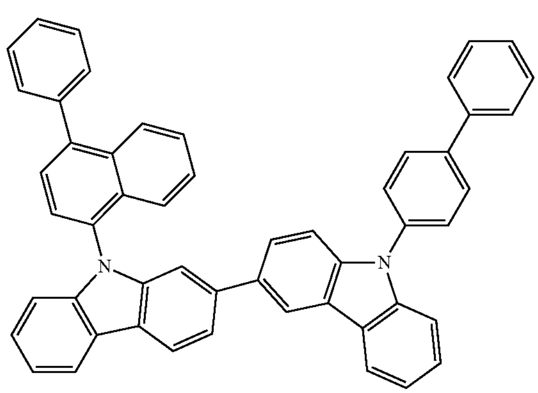
-continued
129B
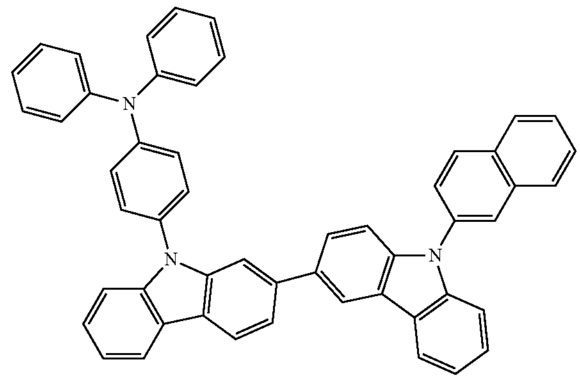
130B
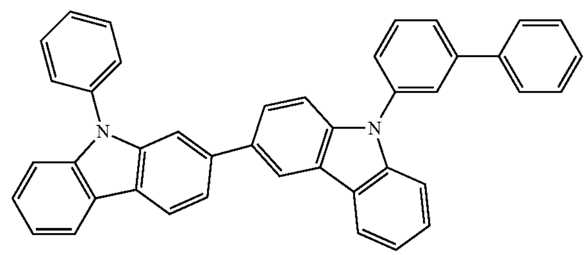
131B
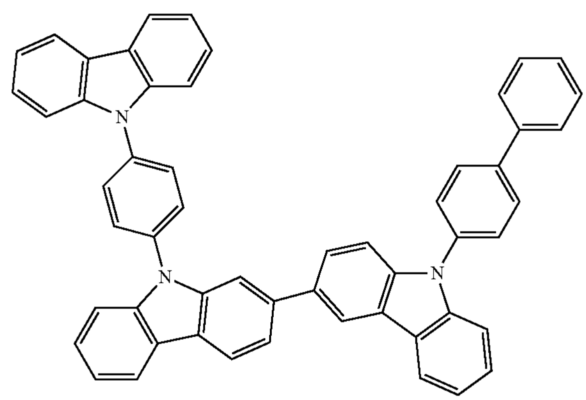
132B
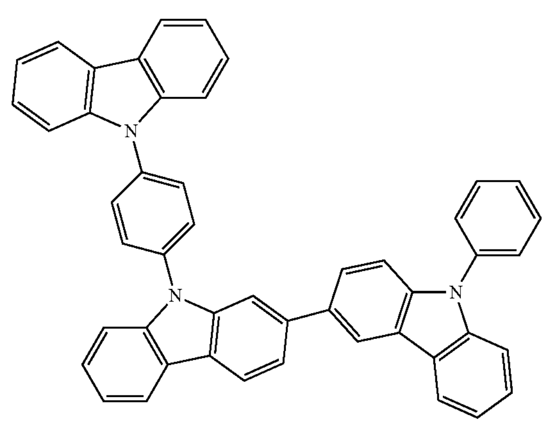

-continued
133B
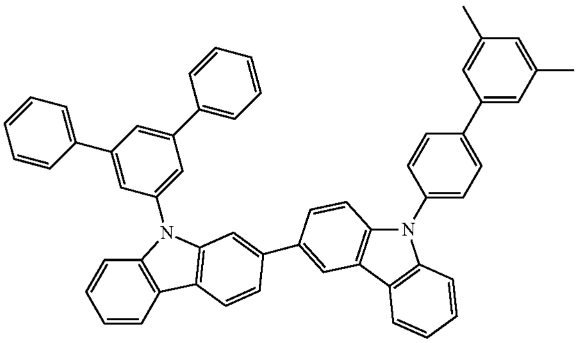
134B
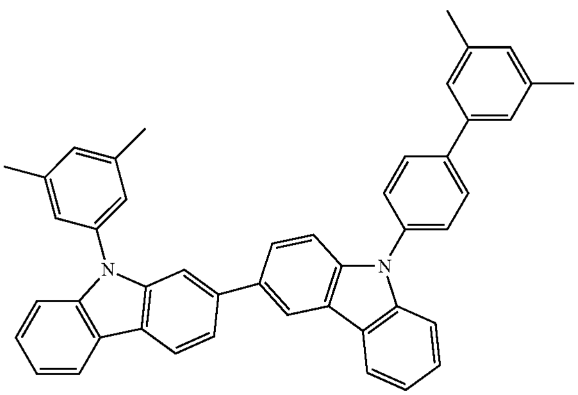
135B
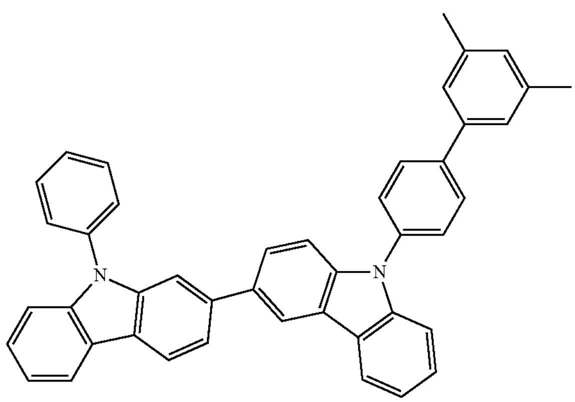
136B
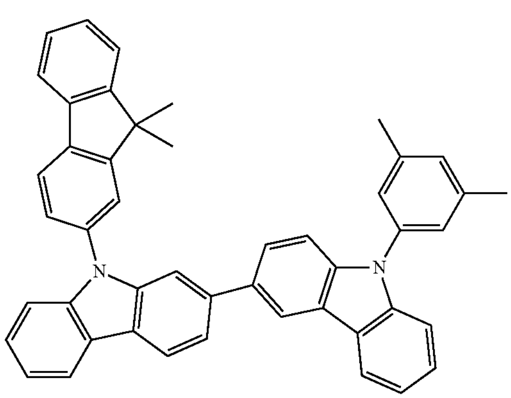
-continued
137B
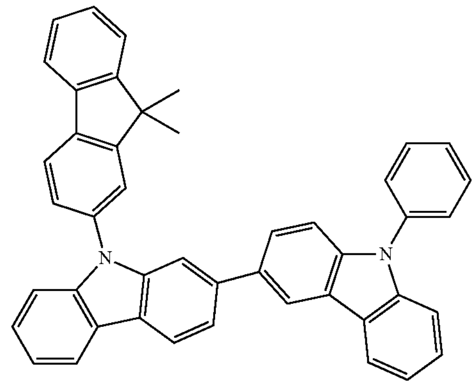
138B
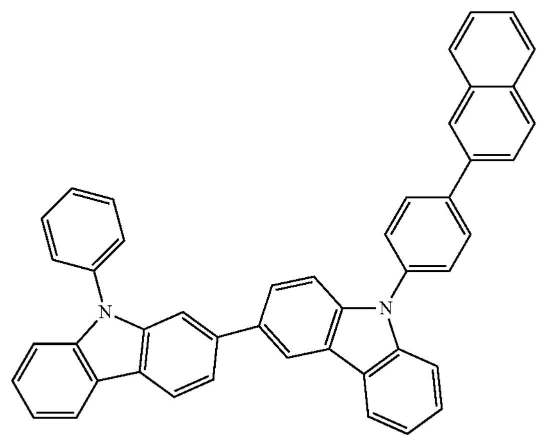
139B
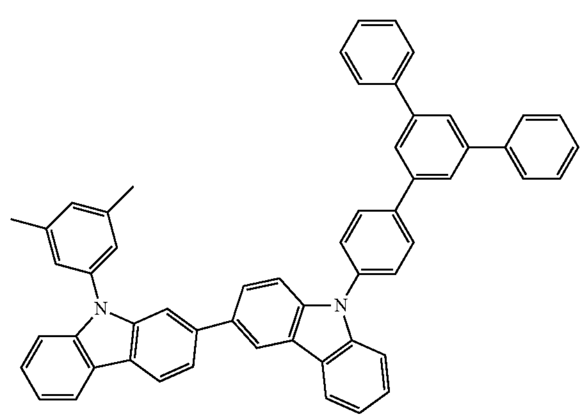

-continued
140B
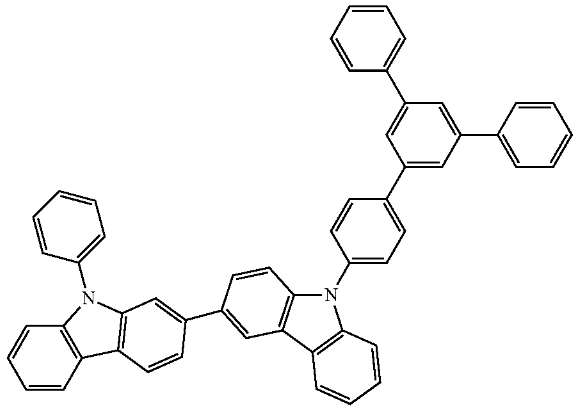
141B
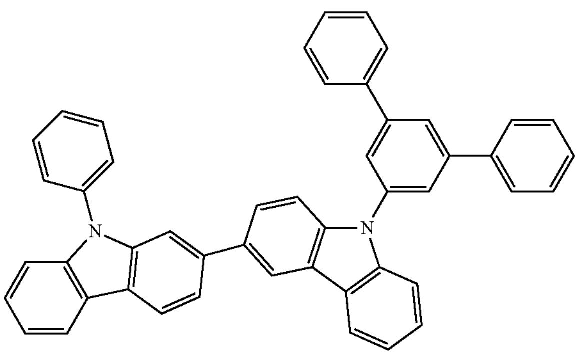
142B
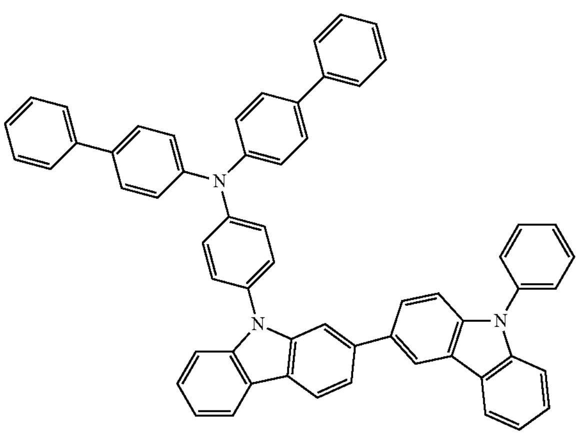
143B
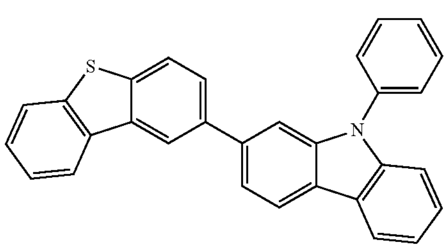
-continued
144B
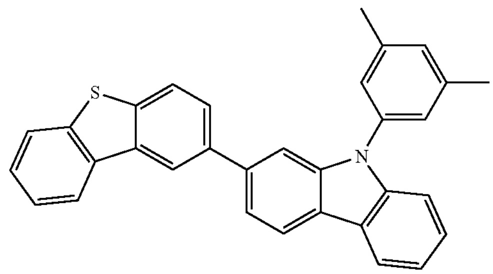
145B
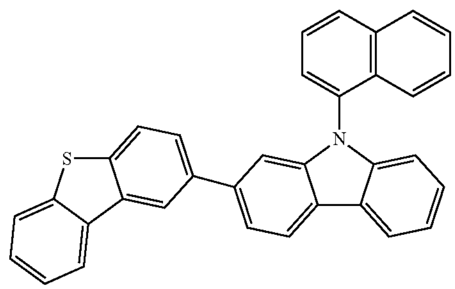
146B
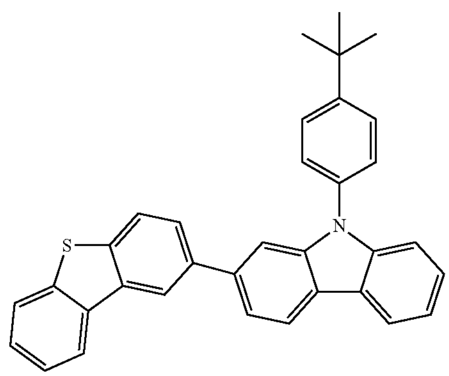
147B
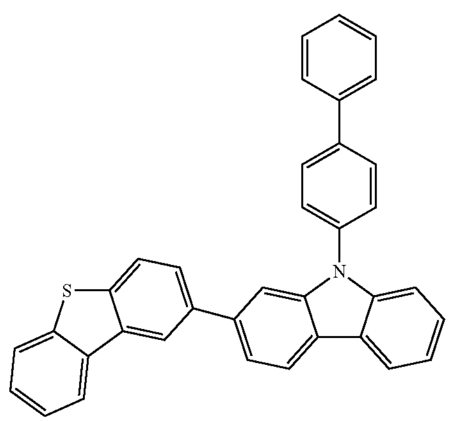

-continued
148B
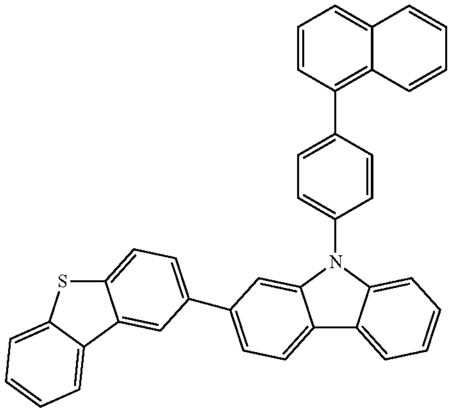
149B
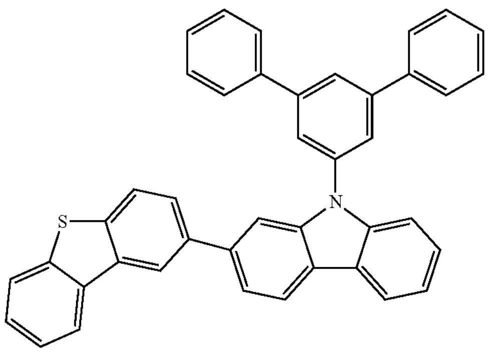
150B
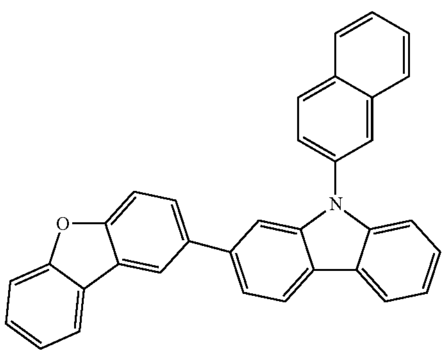
151B
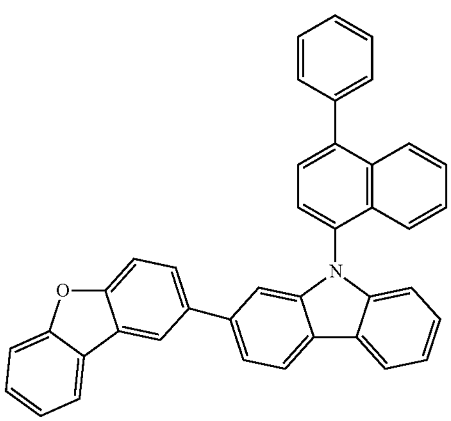
-continued
152B
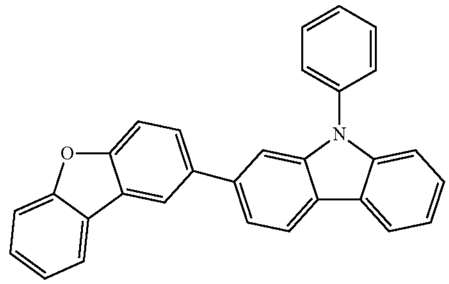
153B
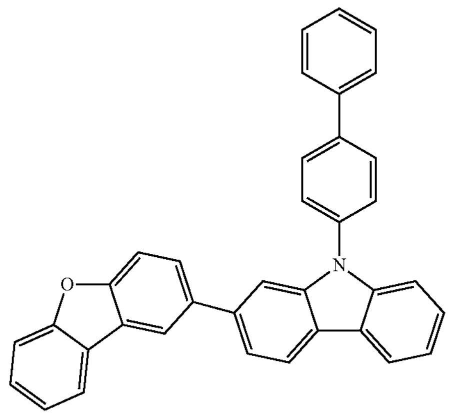
154B
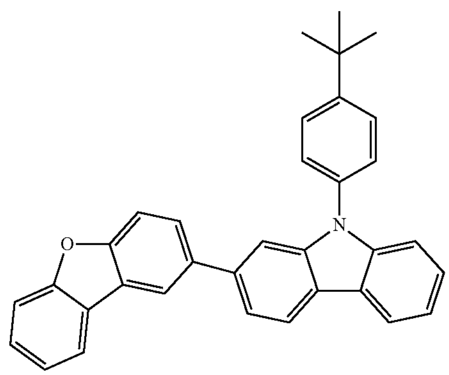
155B
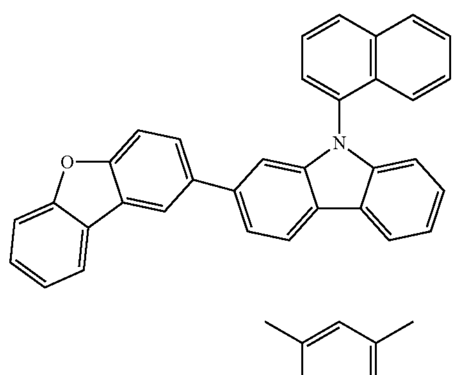
156B
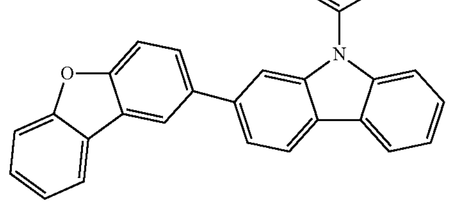

157B
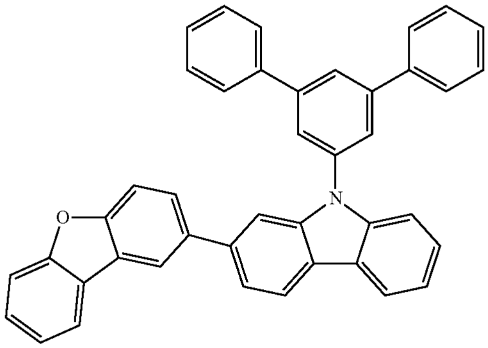
158B
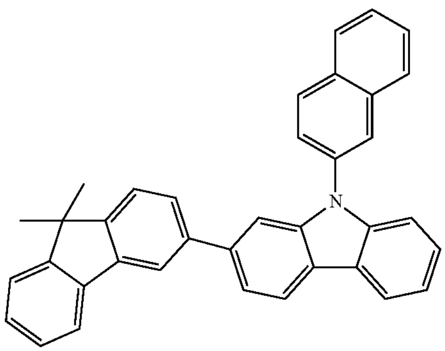
159B
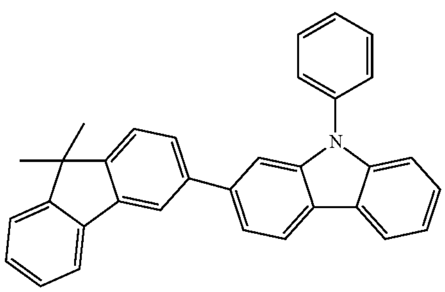
160B
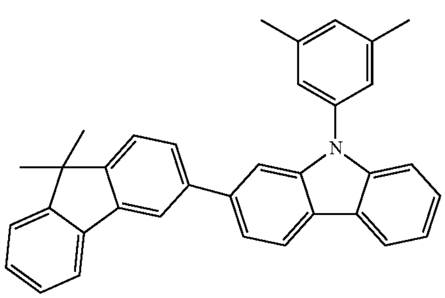
161B
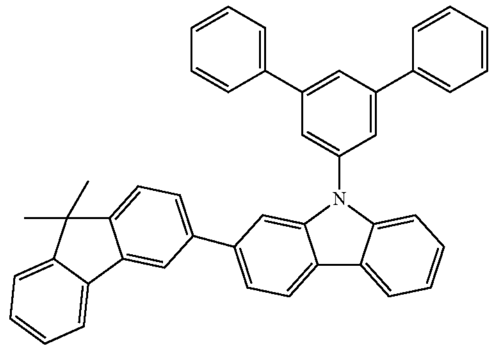
162B
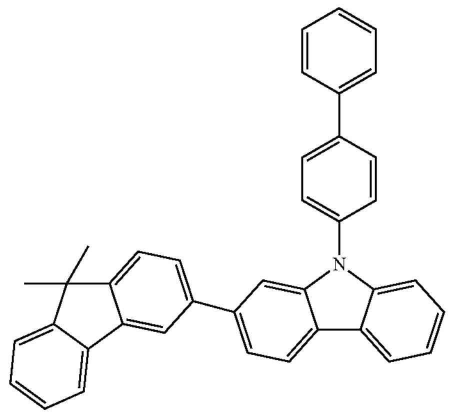
163B
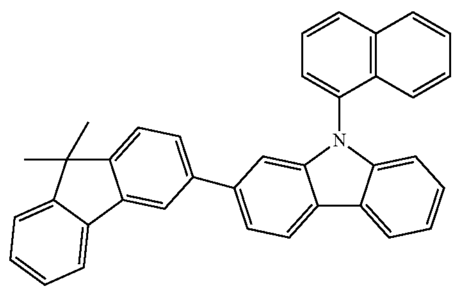
164B
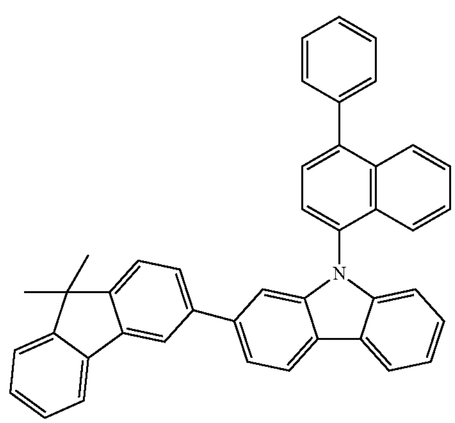

-continued
165B
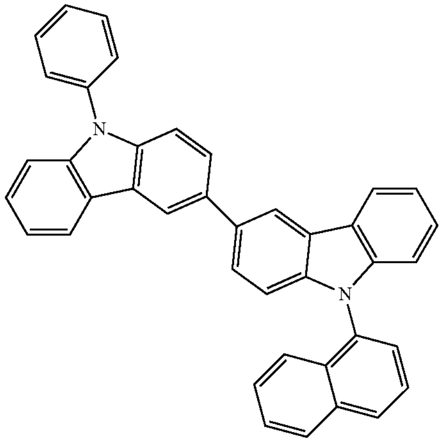
166B
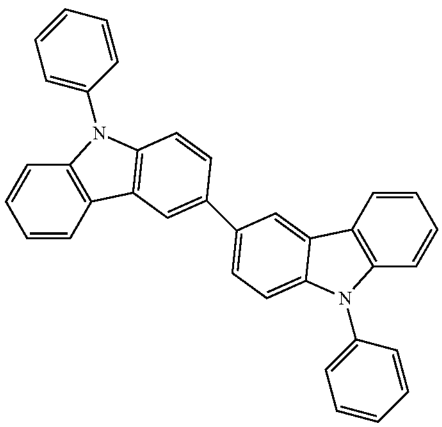
167B
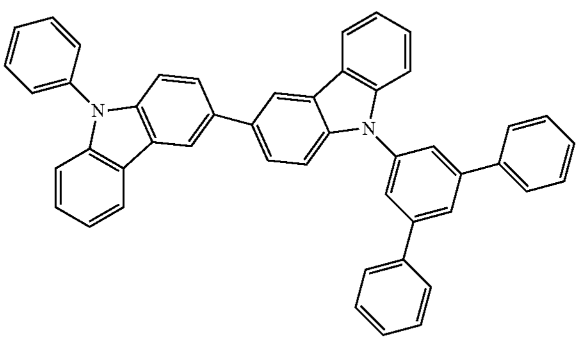
168B
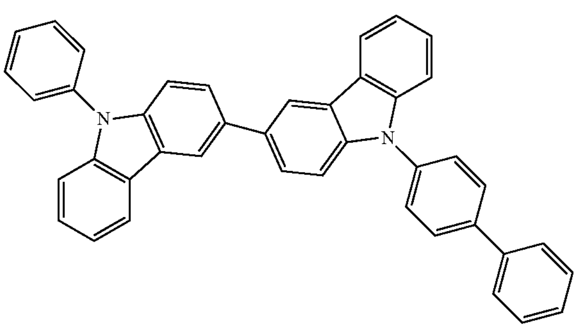
-continued
169B
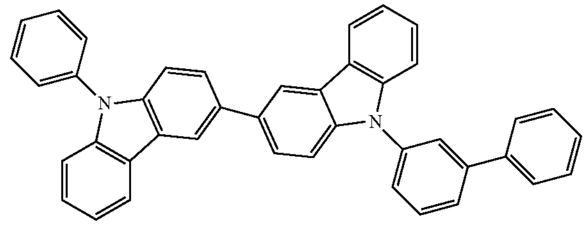
170B
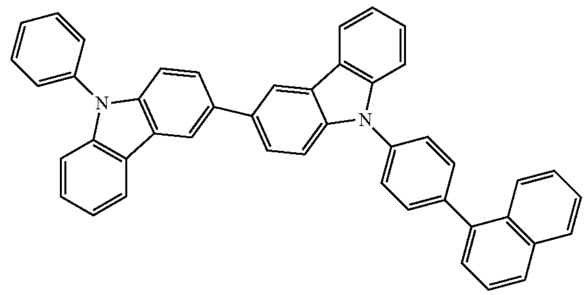
171B
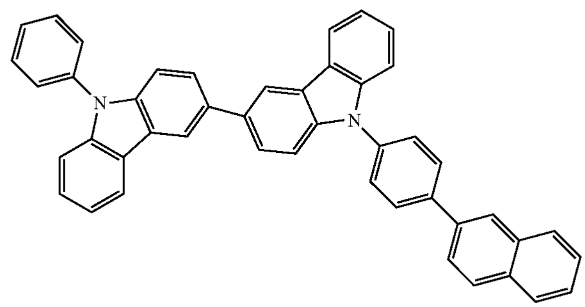
172B
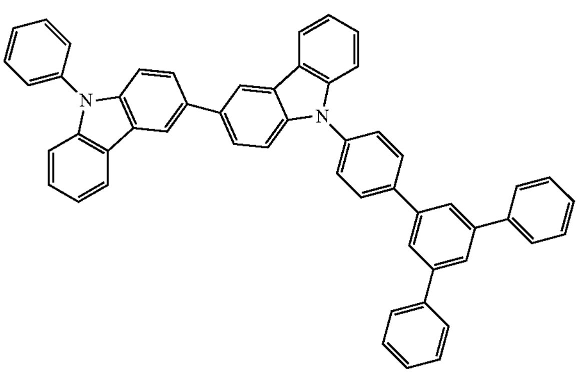

-continued
173B
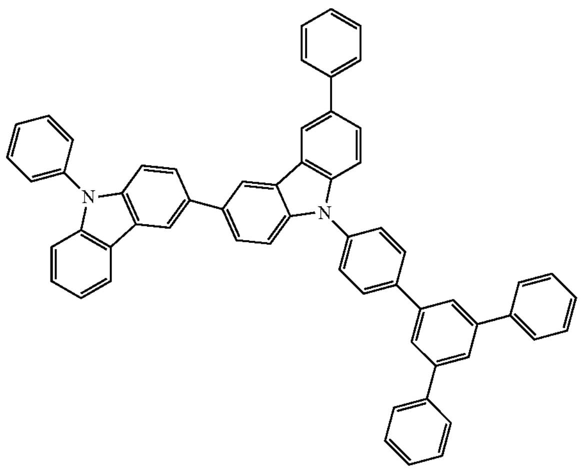
174B
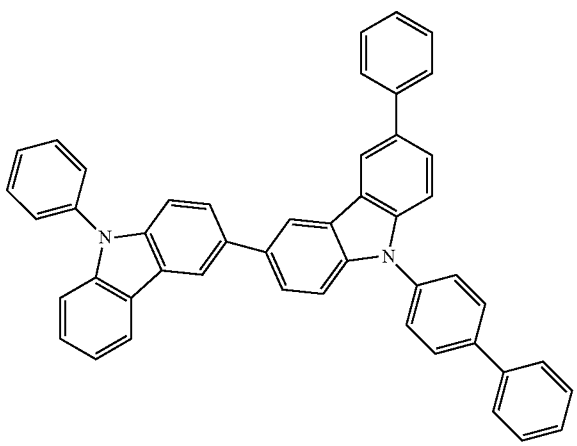
175B
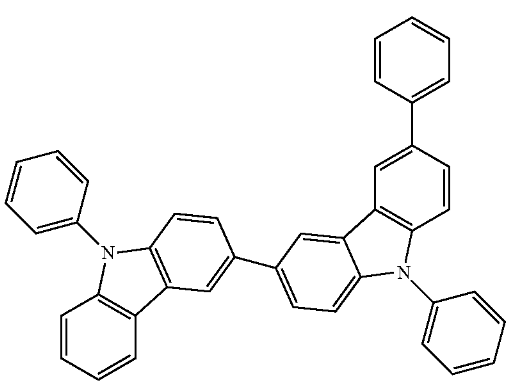
-continued
176B
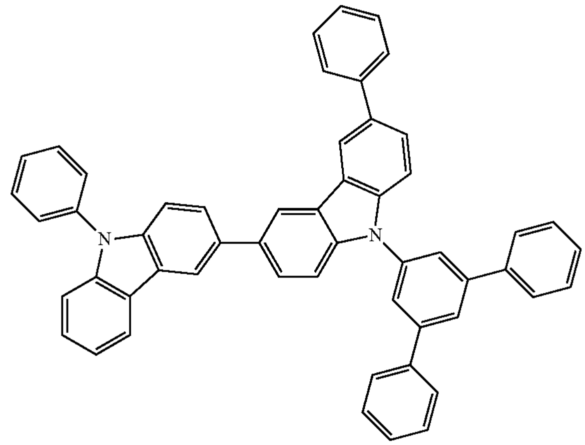
177B
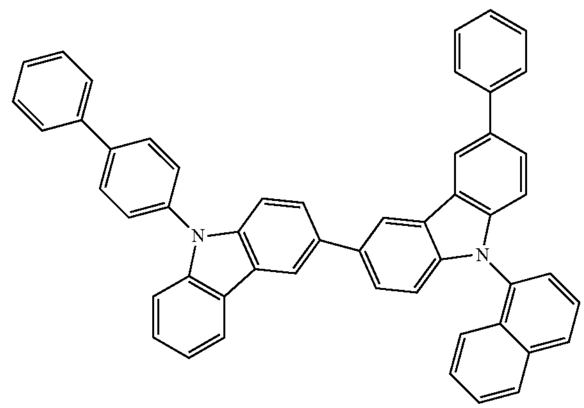
178B
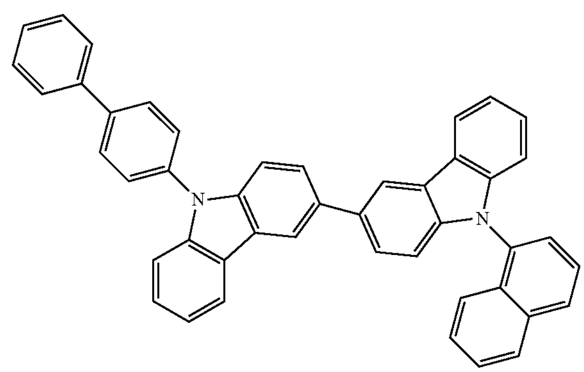
179B
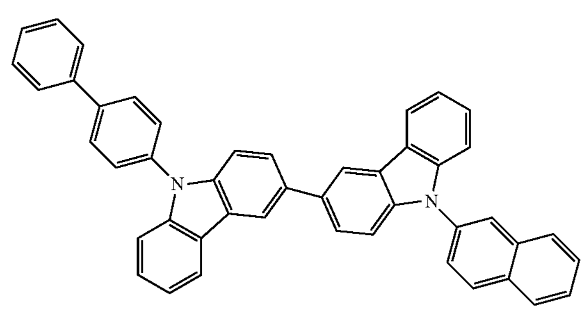

-continued
180B
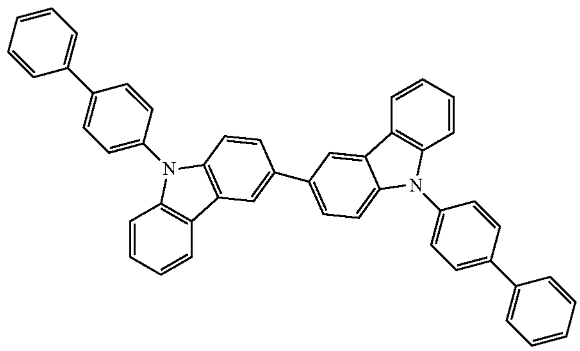
184B
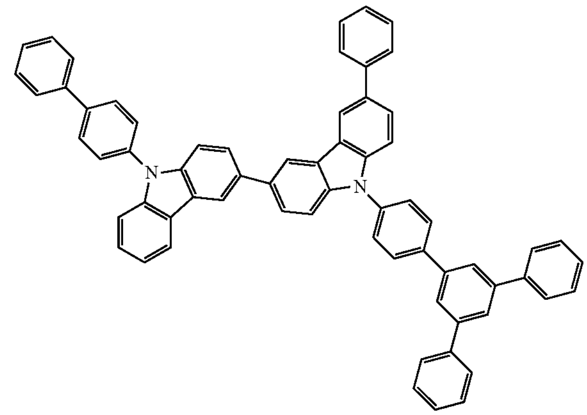
181B
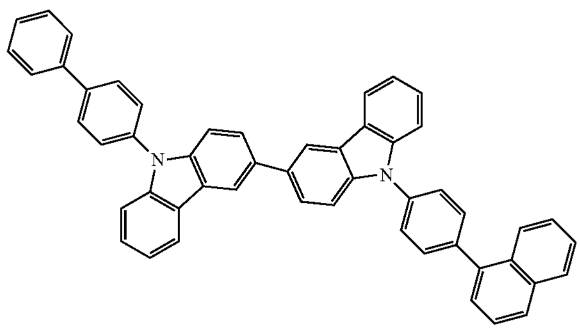
185B
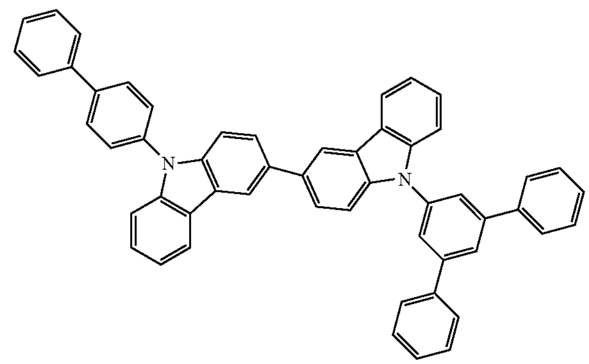
182B
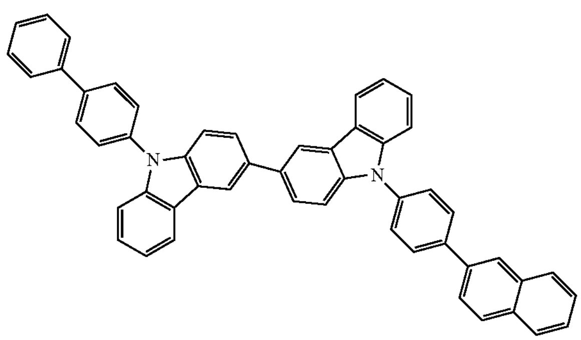
186B
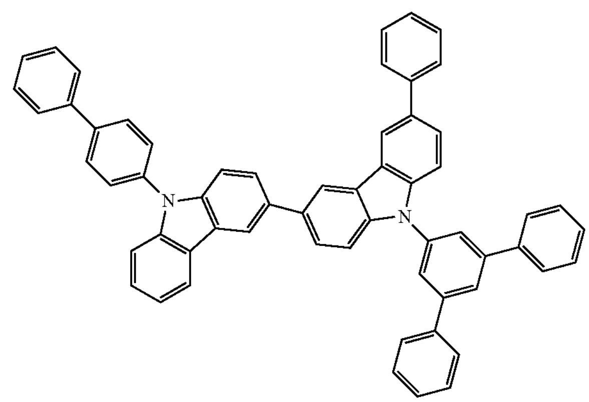
183B
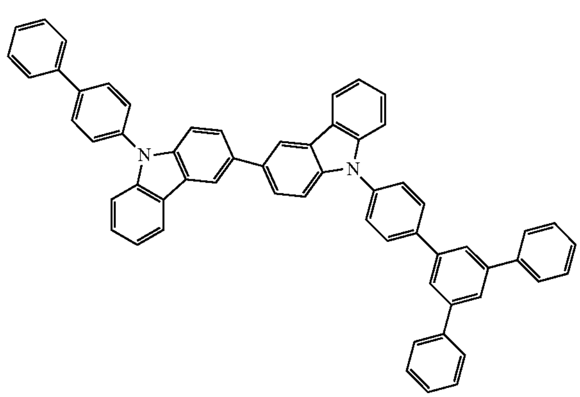
187B
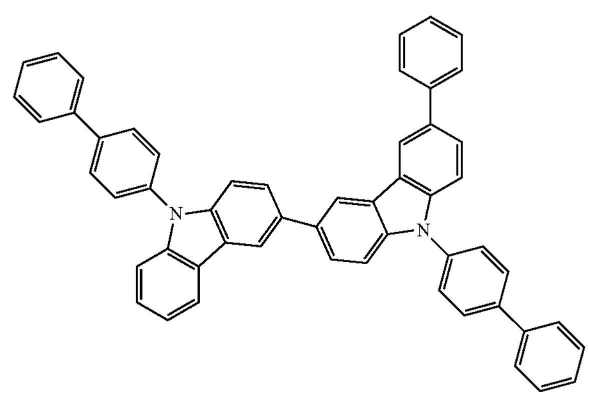

-continued
188B
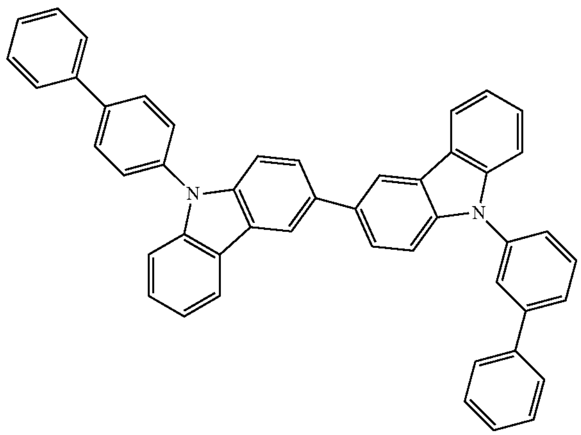
189B
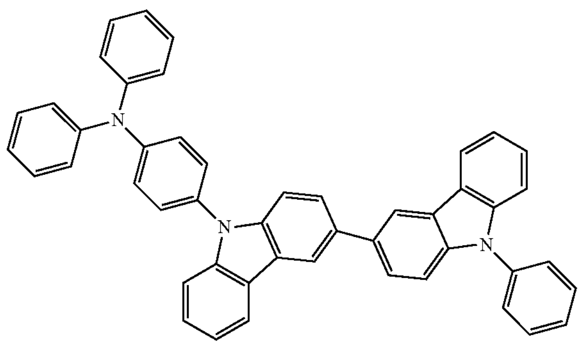
190B
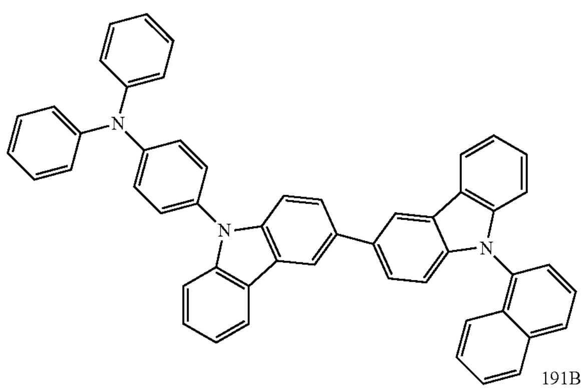
191B
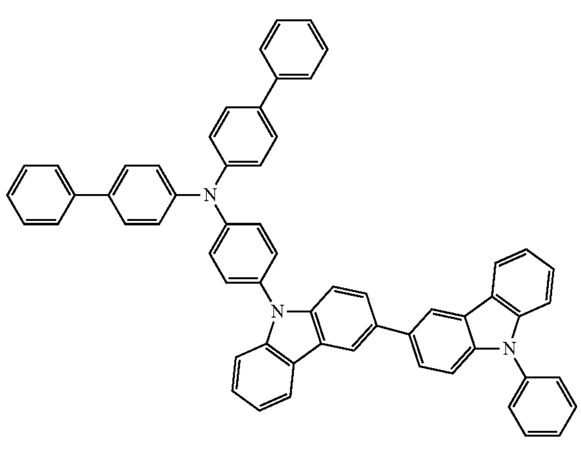
-continued
192B
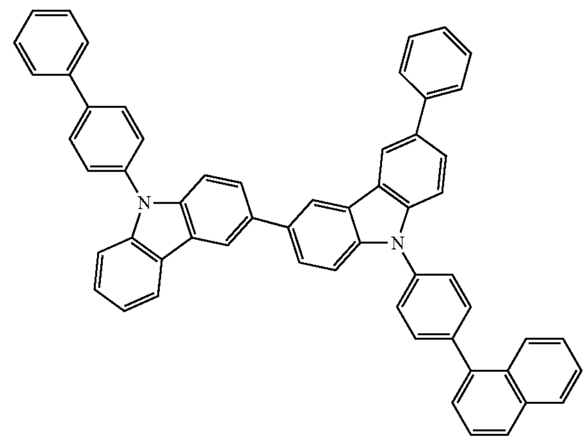
193B
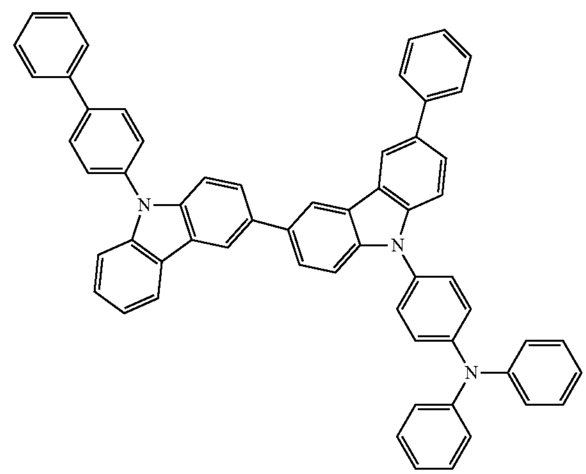
194B
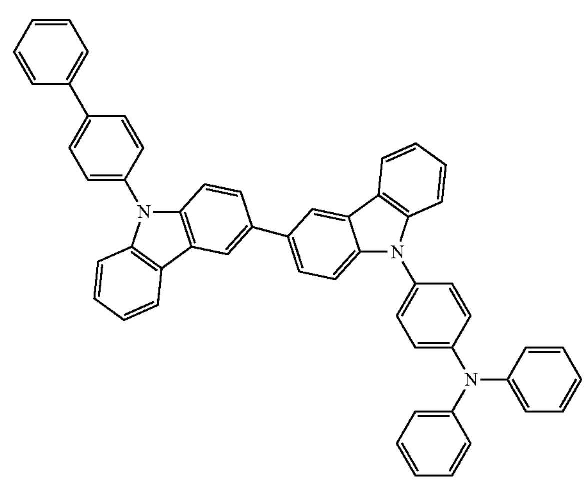

-continued
195B
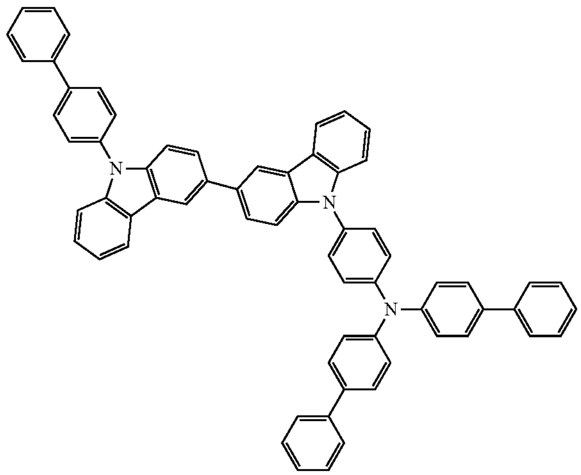
196B
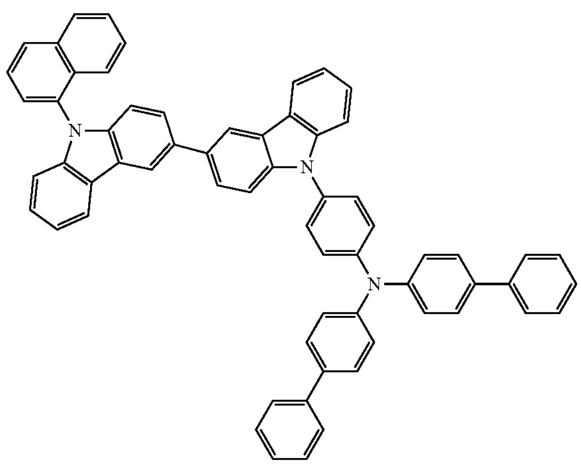
197B
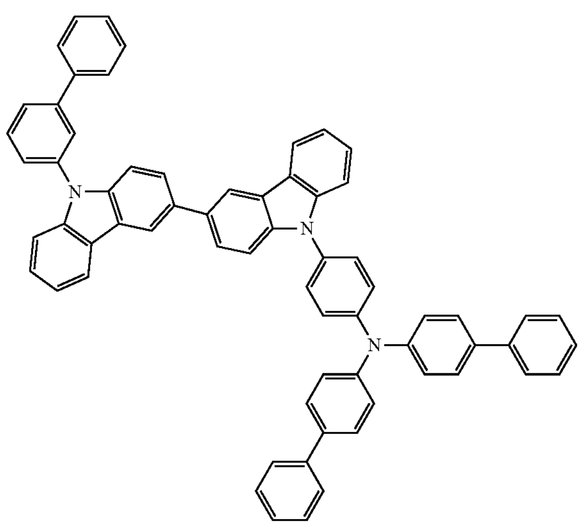
-continued
198B
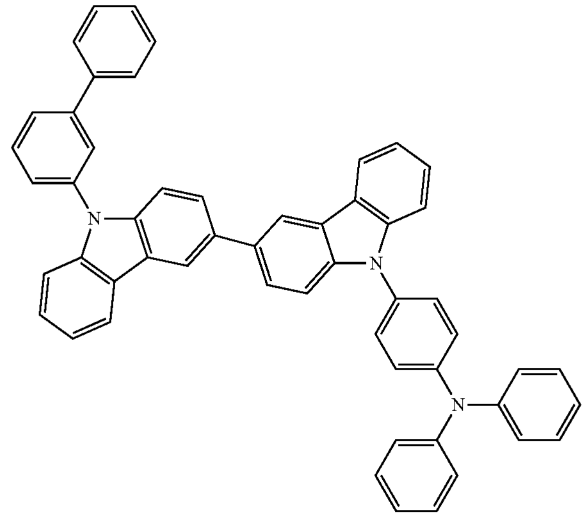
199B
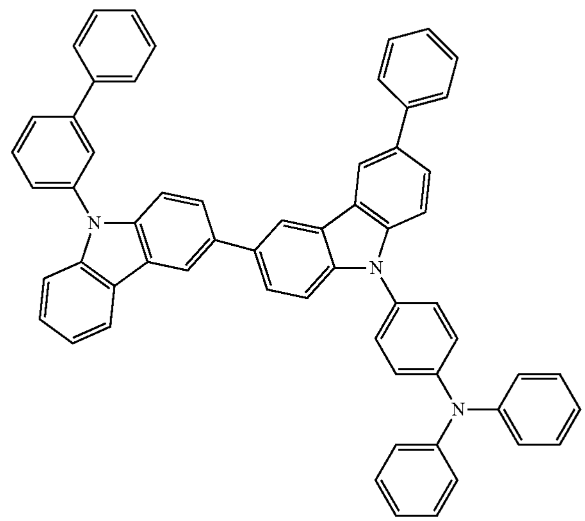
200B
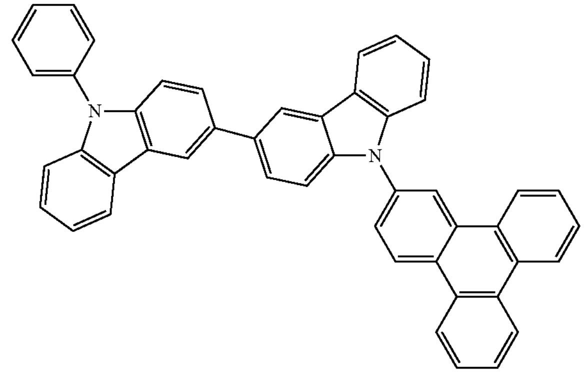

-continued
201B
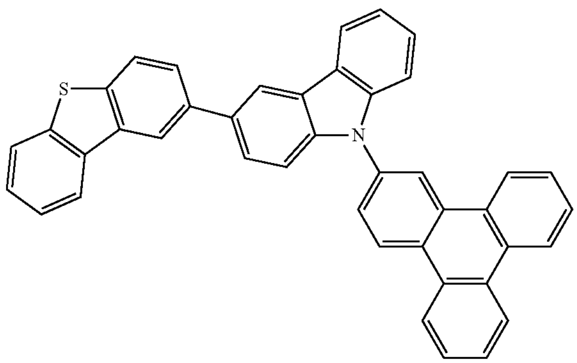
202B
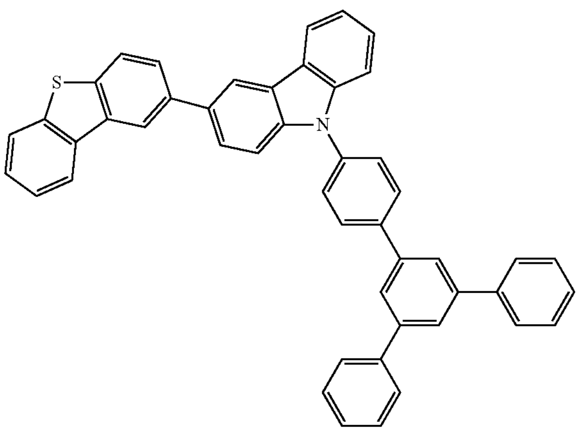
203B
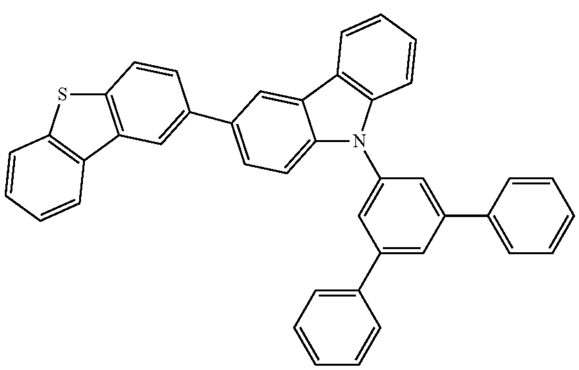
204B
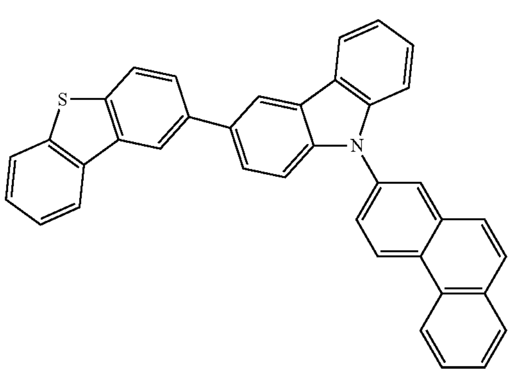
-continued
205B
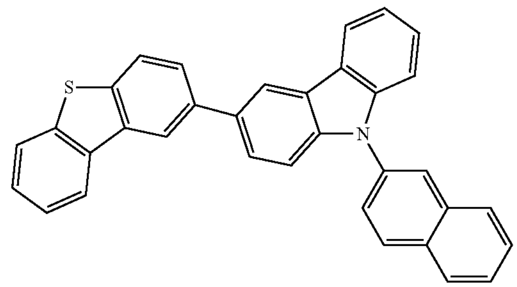
206B
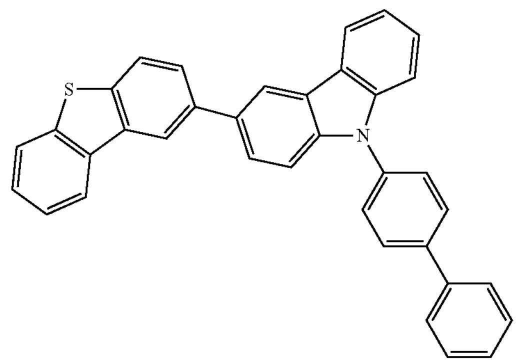
207B
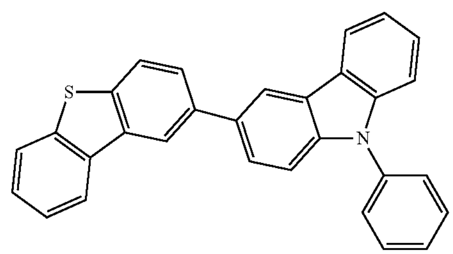
208B
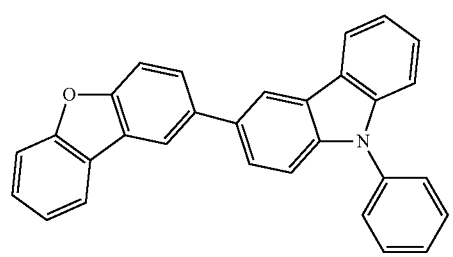
209B
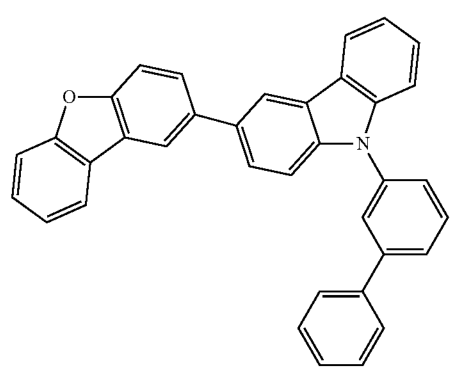

-continued
210B
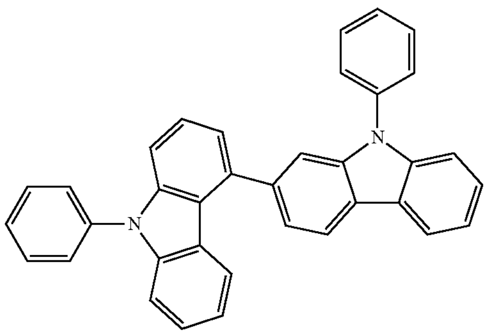
211B
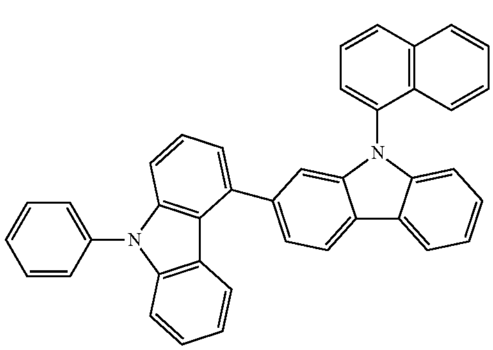
212B
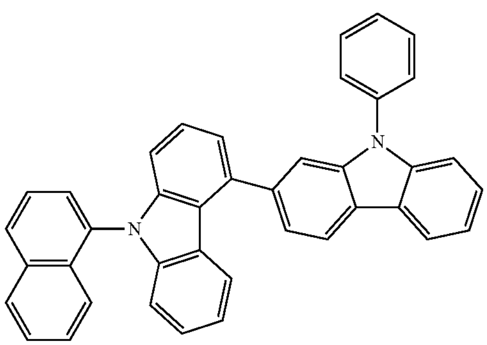
213B
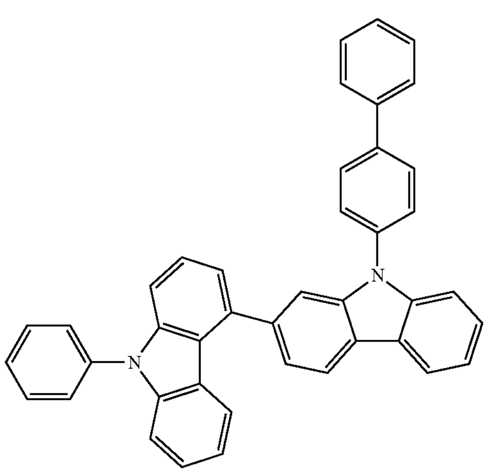
-continued
214B
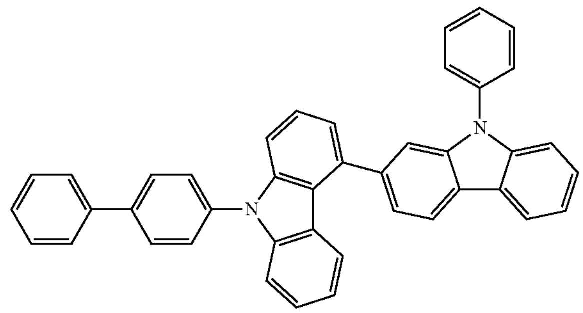
215B
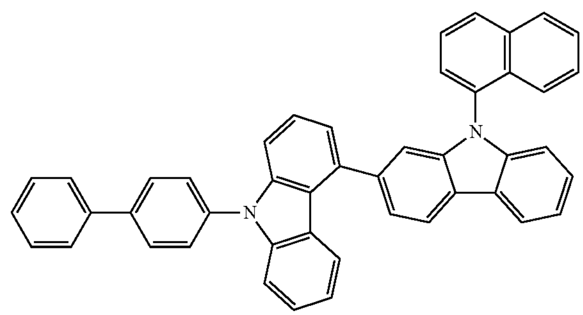
216B
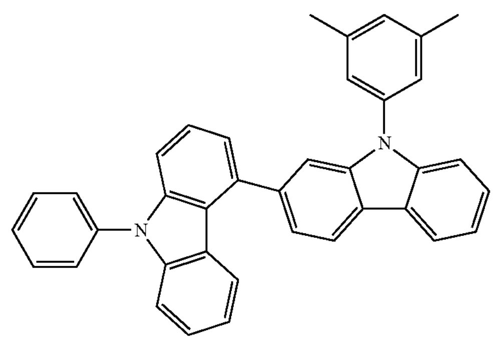
217B
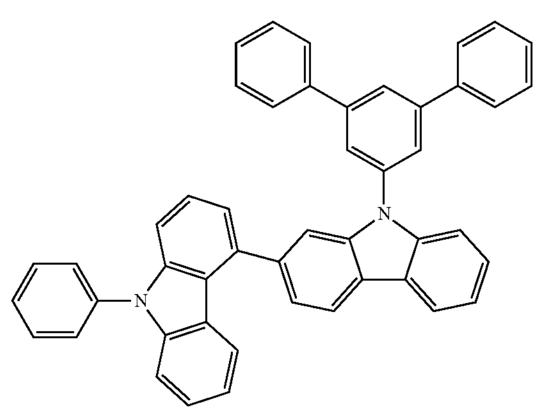

-continued
218B
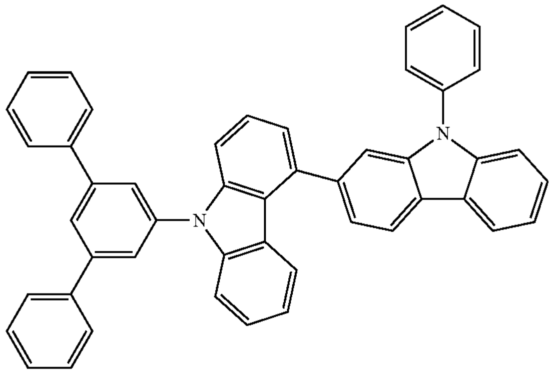
219B
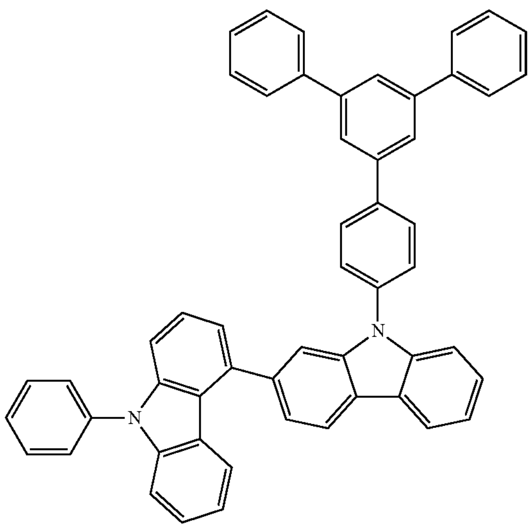
220B
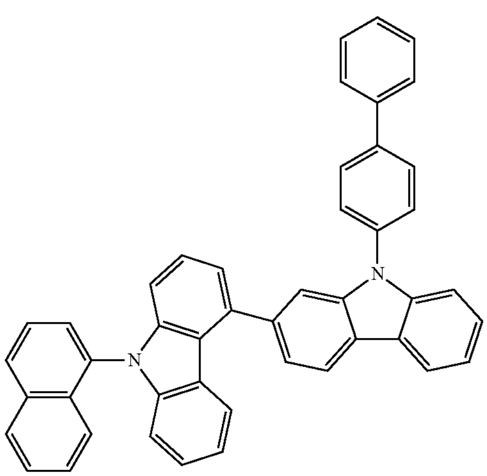
-continued
221B
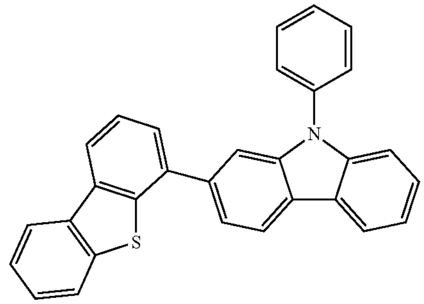
222B
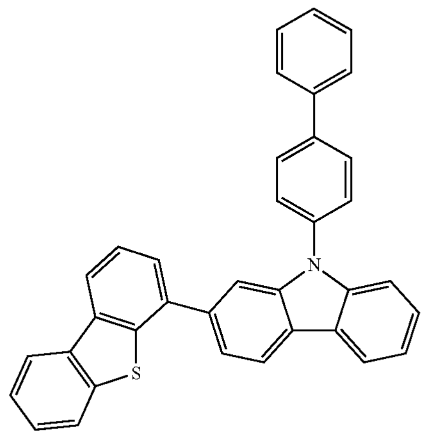
223B
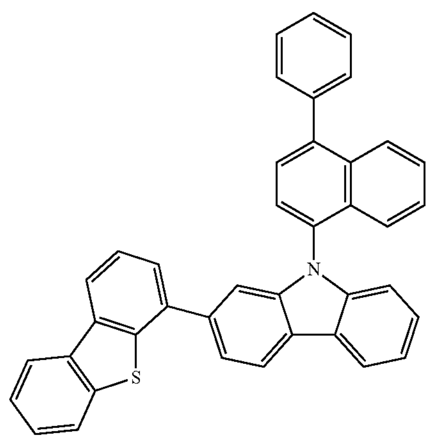
224B
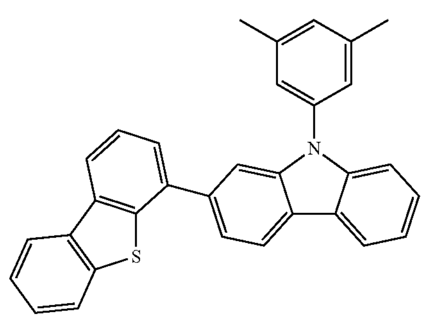

-continued
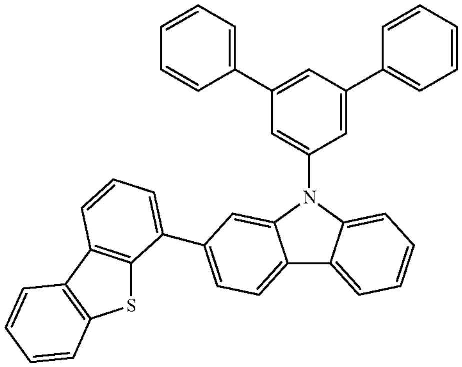
225B
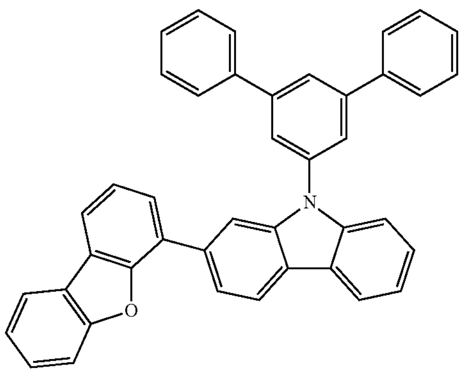
226B
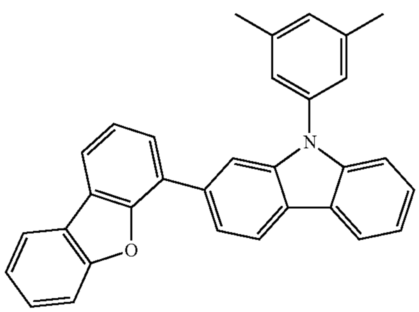
227B
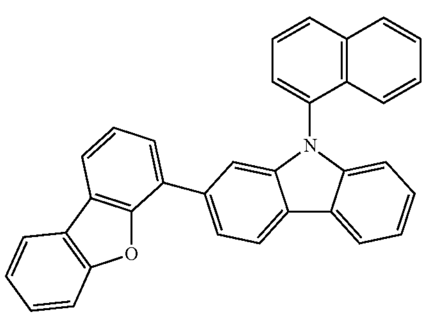
228B
-continued
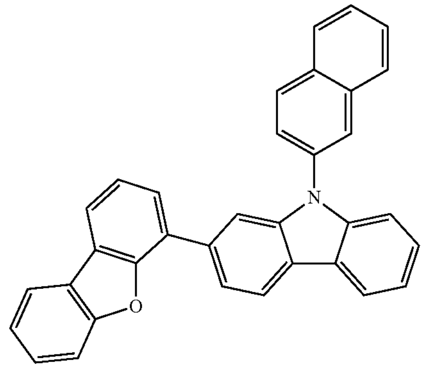
229B
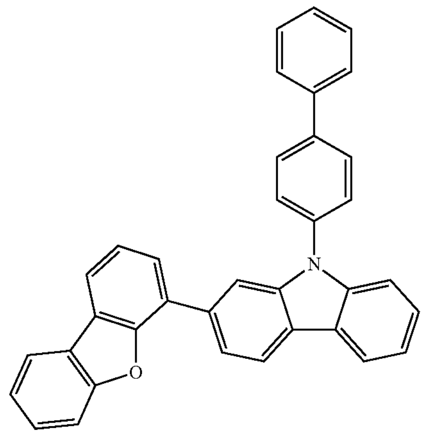
230B
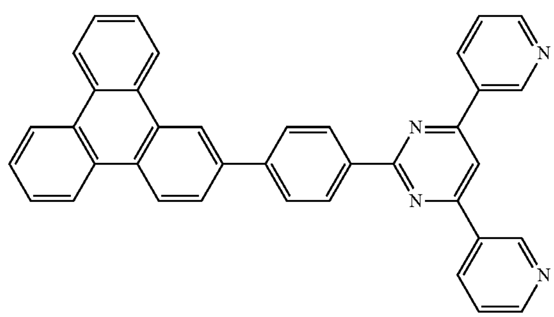
301B
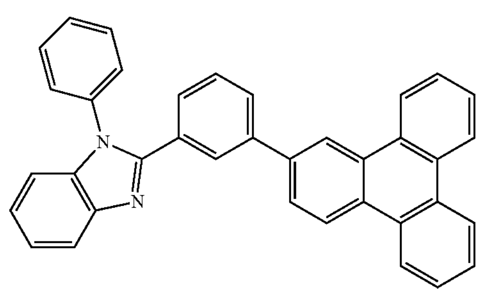
302B -continued
303B
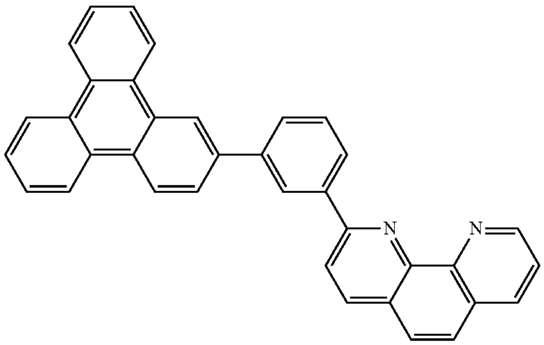
304B
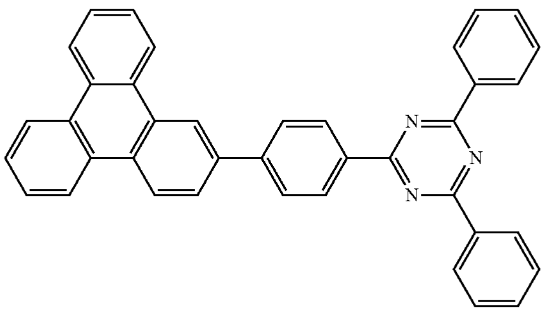
305B
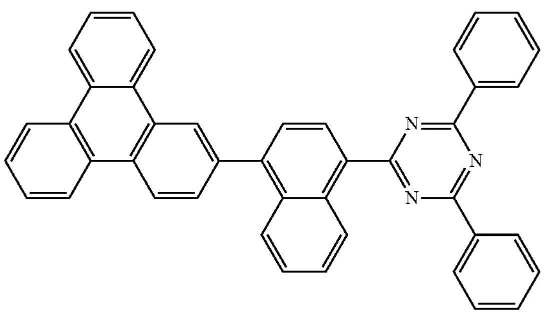
306B
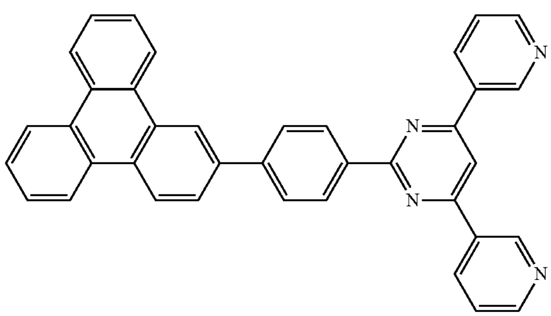
307B
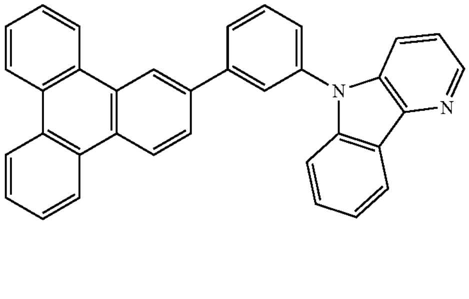
-continued
308B
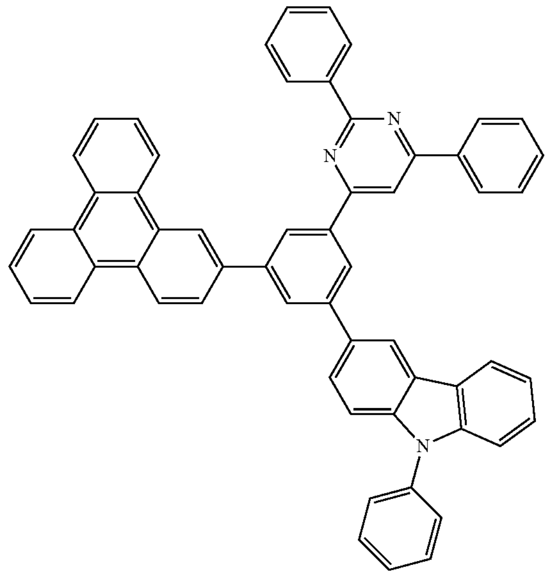
309B
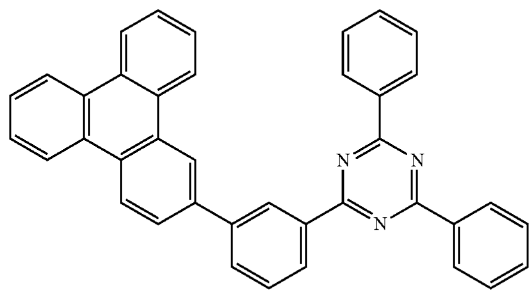
310B
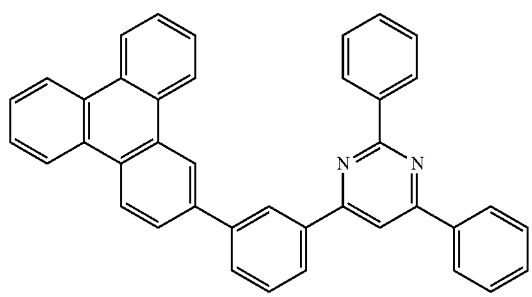
311B
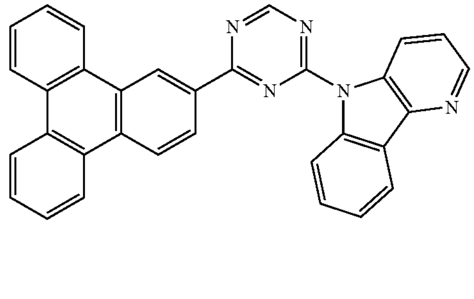

312B
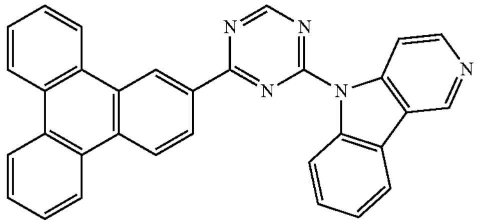
313B
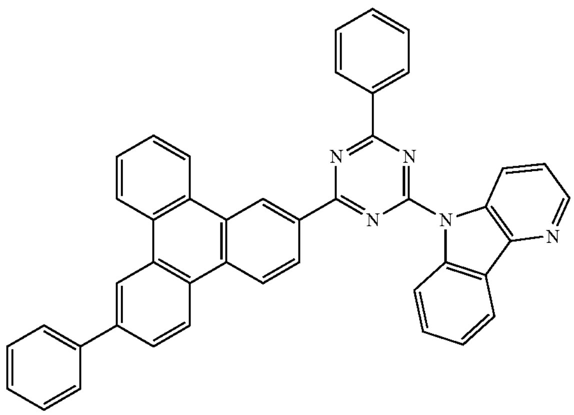
314B
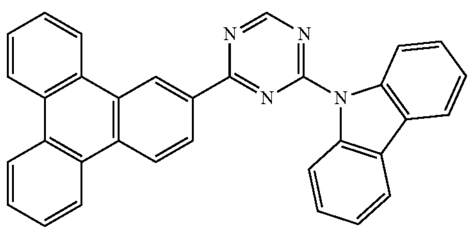
315B
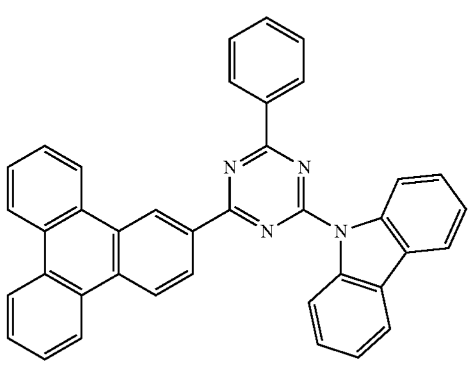
316B
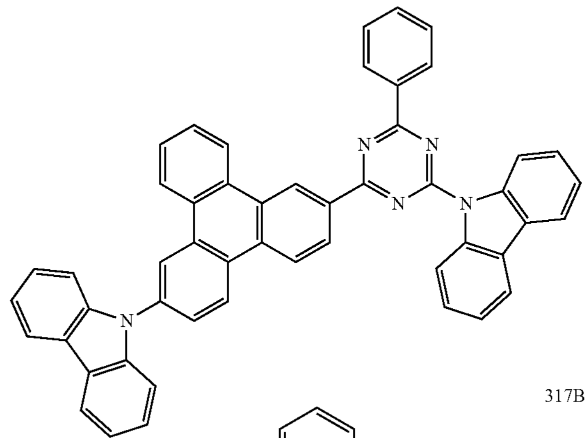
317B
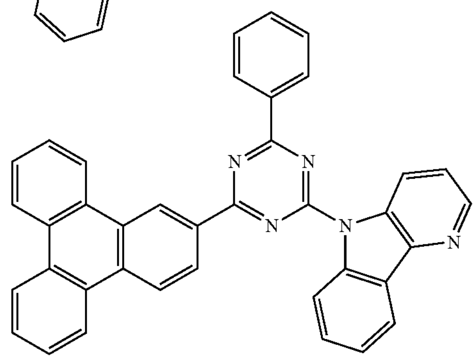
318B
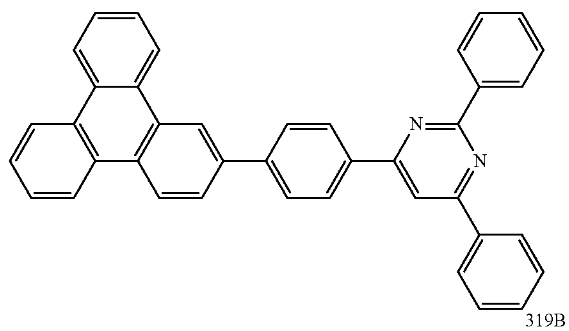
319B
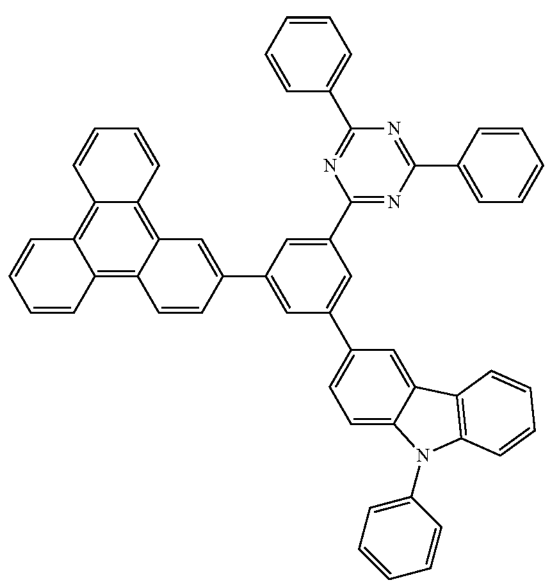

-continued
320B
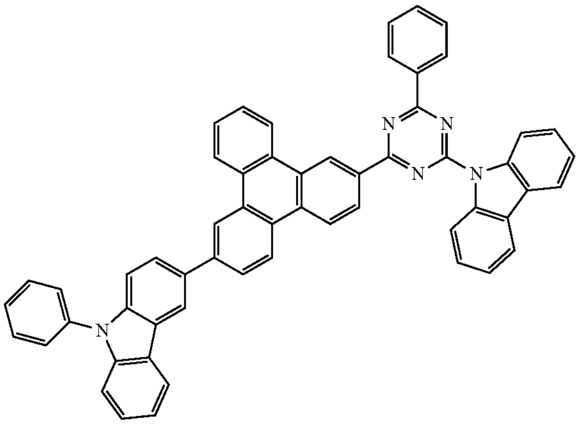
321B
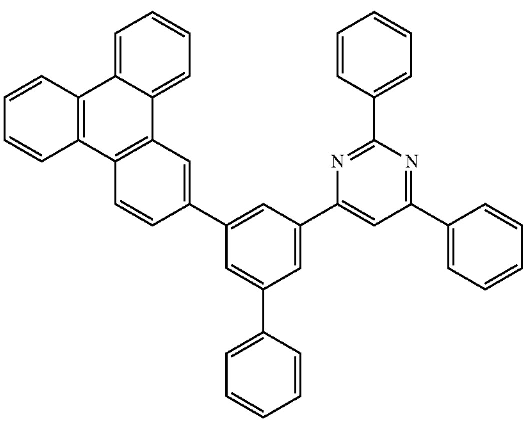
322B
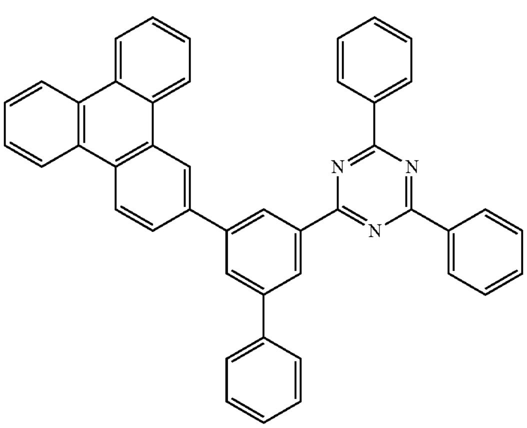
-continued
323B
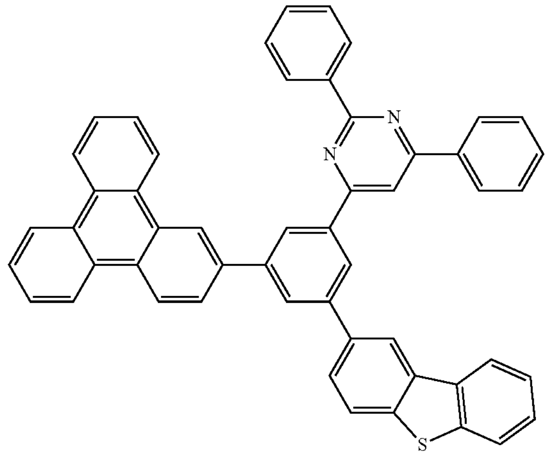
324B
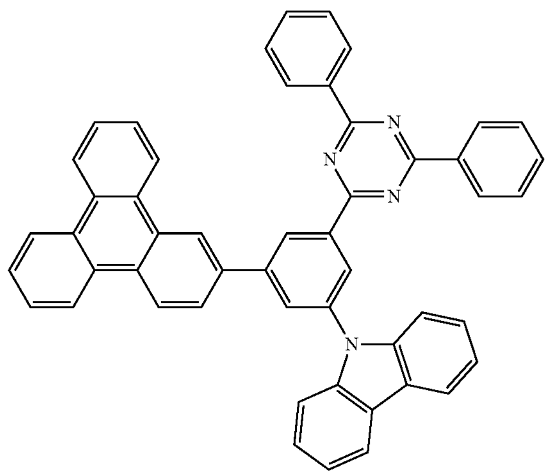
325B
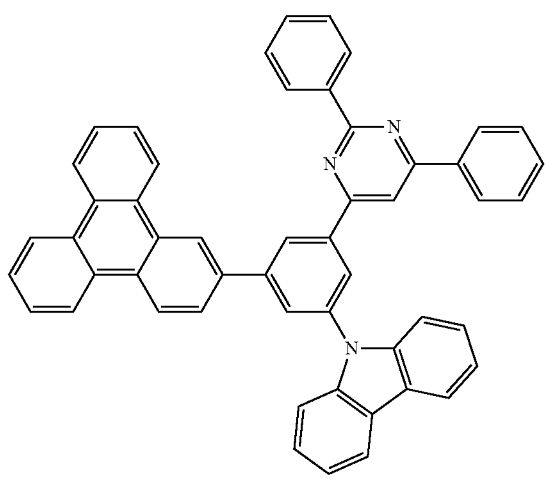

326B
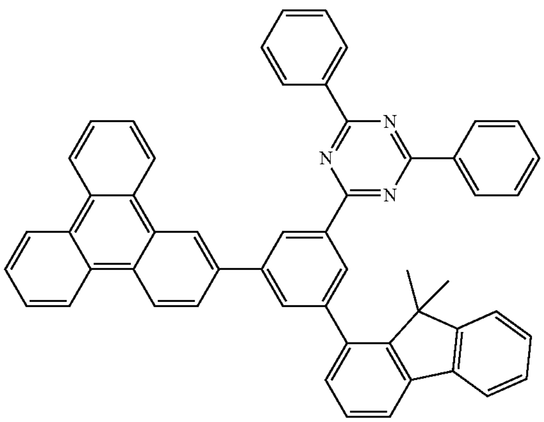
327B
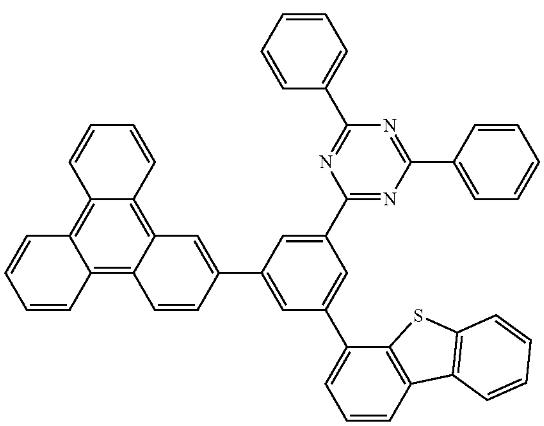
328B
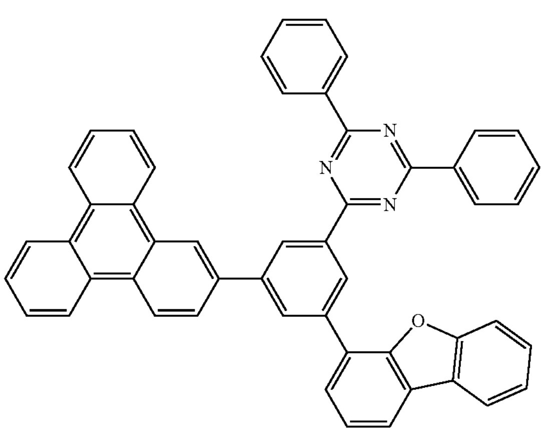
329B
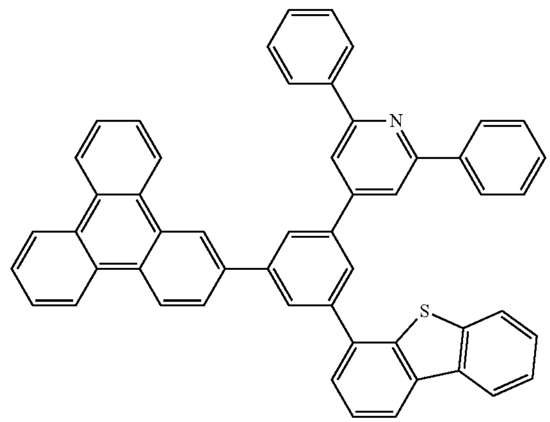
330B
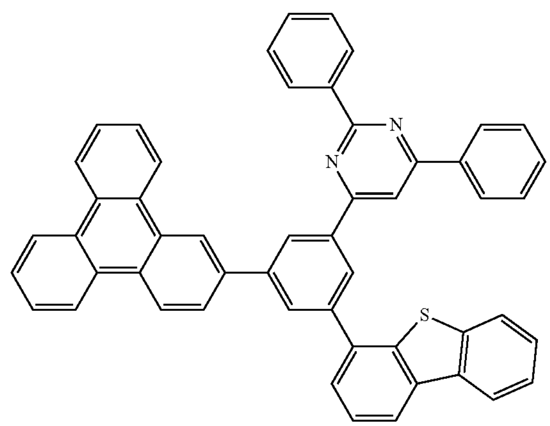
331B
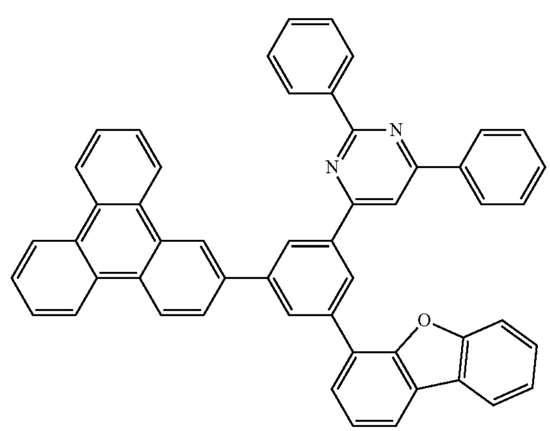

-continued
332B
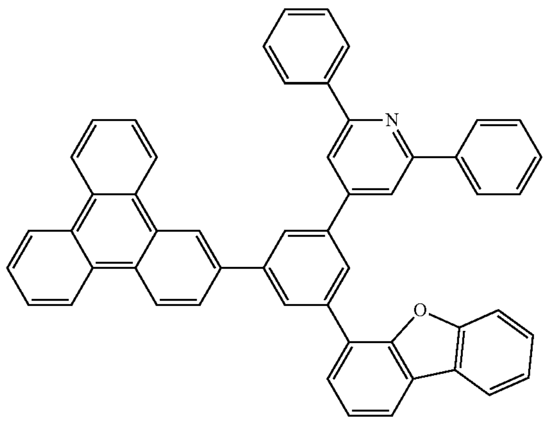
333B
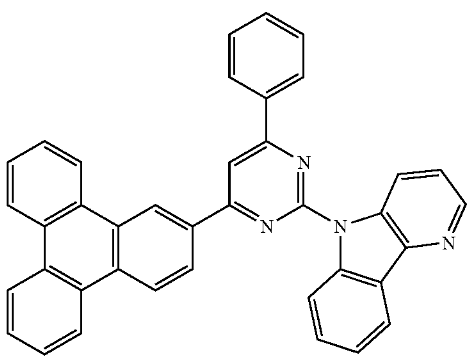
334B
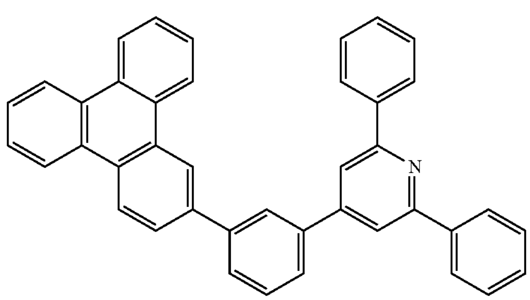
335B
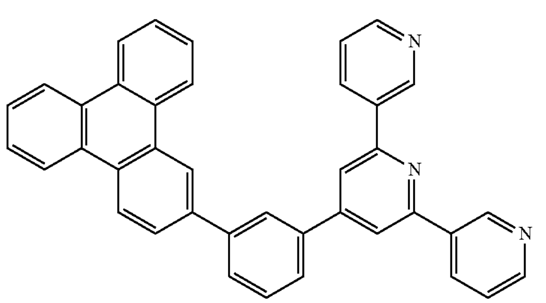
-continued
336B
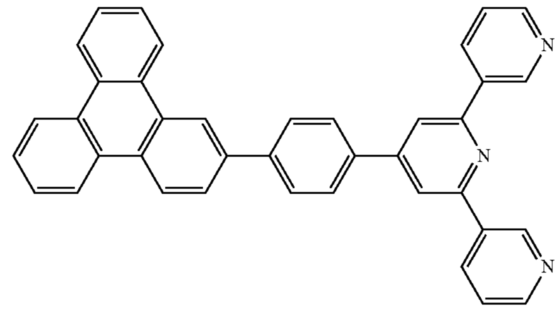
337B
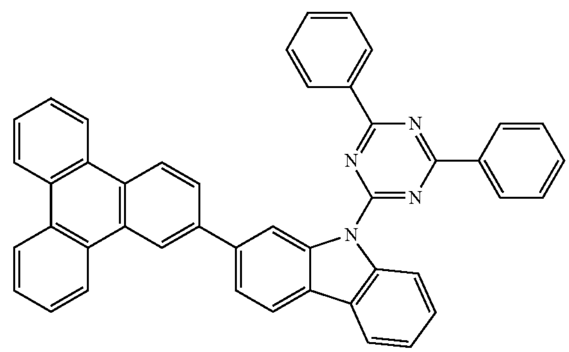
338B
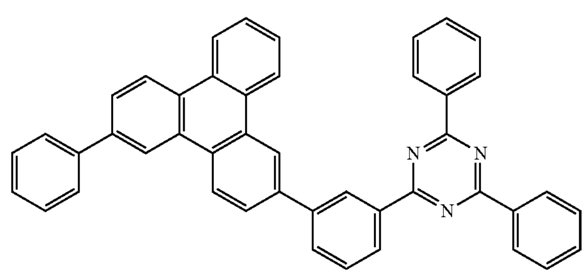
339B
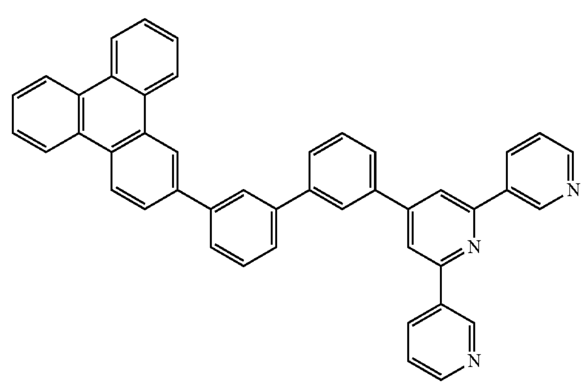

-continued

340B

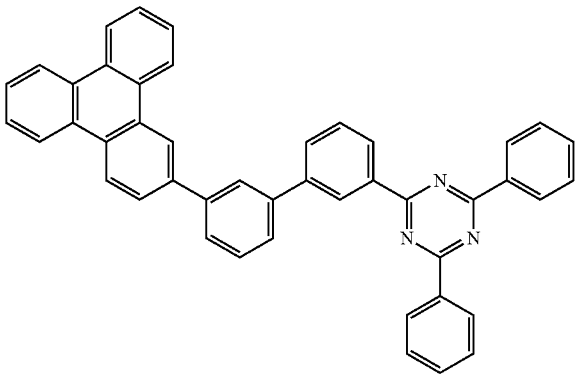

341B

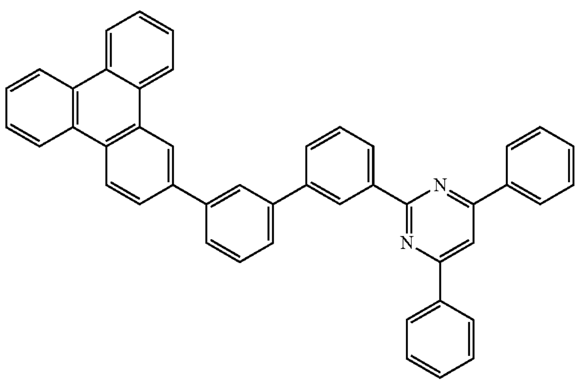

342B

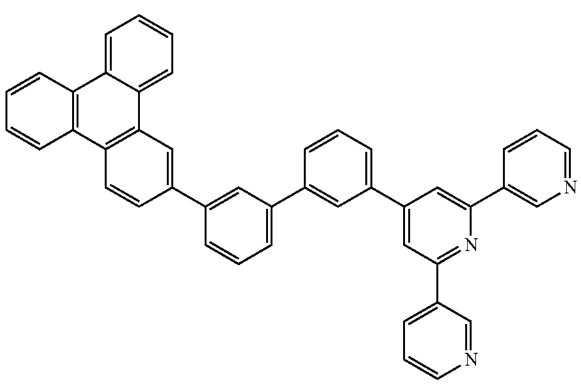

343B

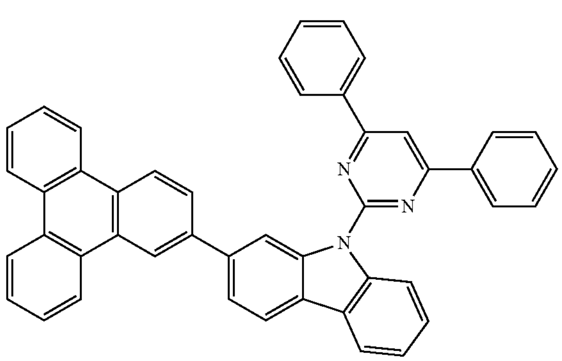

-continued

344B

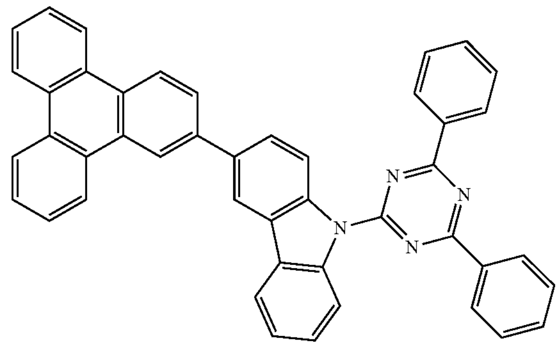

345B

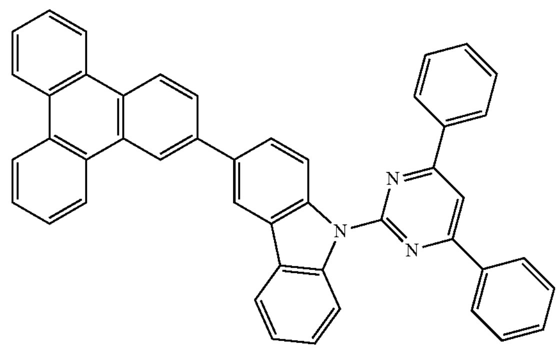

Factors that may influence the efficiency and lifespan of an organic light-emitting device may include i) whether electrons and holes in an emission layer are balanced or not; and ii) whether an emission region in the emission layer is widely (or evenly) distributed throughout the emission layer without being weighted toward a hole transport layer or an electron transport layer.

When only one type (kind) of material is used as a host in an emission layer, not all of the above-listed conditions (or factors) may be satisfied. However, all of the above-listed conditions (or factors) may be satisfied if a) at least two different types (kinds) of materials are used as a host, and b) substituent characteristics of the at least two different types (kinds) of materials are different from each other.

Thus, when an emission layer includes (a) a first host and a second host, and (b) either the second host includes a hole transporting group when the first host includes an electron transporting group, or the second host includes an electron transporting group when the first host includes a hole transporting group, an organic light-emitting device may have improved efficiency and increased lifespan.

In some embodiments, the second host including a hole transporting group may have a relatively wide energy gap, and the first host including an electron transporting group may have a relatively narrow energy gap. In this case, the second host may control the electron transporting characteristics of the first host, and the possibility of the emission region in the emission layer being weighed toward an interface between the hole transport layer and the emission layer may be prevented or reduced. Therefore, efficiency and life characteristics of an organic light-emitting device may be improved.

A weight ratio of the first host to the second host may be in a range of about 1:10 to about 10:1, for example, in a range of about 1:9 to about 9:1. For example, a weight ratio of the first host to the second host may be in a range of about 2:8 to about 8:2, about 3:7 to about 7:3, or about 5:5, but it is not limited thereto.

In some embodiments, when the first host includes a group having a relatively strong electron transporting property (e.g., a triazine), and the second host includes a hole transporting group, efficiency and life characteristics of an organic light-emitting device may improve, and if the second host including the hole transporting group is included in the organic light-emitting device in a relatively large amount, the efficiency and life characteristics of the organic light-emitting device may be further improved.

In some embodiments, when the first host includes a group having a relatively weak electron transporting property (e.g., a pyridine or a pyrimidine), and the second host includes a hole transporting group, efficiency and life characteristics of an organic light-emitting device may improve, and if the second host including the hole transporting group is included in the organic light-emitting device in a relatively small amount, the efficiency and life characteristics of the organic light-emitting device may be improved.

As described above, a weight ratio of the first host to the second host may vary depending on the electric characteristics of the first host and the second host.

The dopant may be a phosphorescent dopant.

The phosphorescent dopant may include an organometallic compound including one selected from iridium (Ir), platinum (Pt), osmium (Os), titanium (Ti), zirconium (Zr), hafnium (Hf), europium (Eu), terbium (Tb), thulium (Tm), rhodium (Rh) and copper (Cu).

The phosphorescent dopant may include an organic metal complex that is represented by Formula 401:

Formula 401

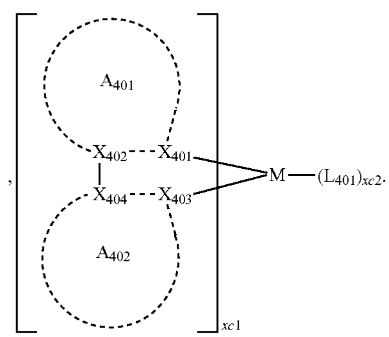

In Formula 401,

M is selected from iridium (Ir), platinum (Pt), osmium (Os), titanium (Ti), zirconium (Zr), hafnium (Hf), europium (Eu), terbium (Tb), and thulium (TM);

$X_{401}$ to $X_{404}$ are each independently a nitrogen atom or a carbon atom;

rings $A_{401}$ and $A_{402}$ are each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzooxazole, substituted isobenzooxazole, substituted triazole, substituted oxadiazole, substituted triazine, substituted dibenzofuran, and substituted dibenzothiophene is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, of monovalent non-aromatic condensed heteropolycyclic group, $—N(Q_{401})(Q_{402})$, $—Si(Q_{403})(Q_{404})(Q_{405})$, and $—B(Q_{406})(Q_{407})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and N($Q_{421}$)($Q_{422}$), —Si($Q_{423}$)($Q_{424}$)($Q_{425}$), and —B($Q_{426}$)($Q_{427}$);

where $Q_{401}$ to $Q_{407}$, $Q_{411}$ to $Q_{417}$, and $Q_{421}$ to $Q_{427}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

$L_{401}$ is an organic ligand;

xc1 is 1, 2, or 3;

xc2 is 0, 1, 2, or 3.

$L_{401}$ may be a monovalent, divalent, or trivalent organic ligand. For example, $L_{401}$ may be, selected from a halogen ligand (for example, $Cl^-$ or $F^-$), a diketone ligand (for example, acetylacetonate, 1,3-diphenyl-1,3-propanedionate, 2,2,6,6-tetramethyl-3,5-heptanedionate, or hexafluoroacetonate), a carboxylic acid ligand (for example, picolinate, dimethyl-3-pyrazolecarboxylate, or benzoate), a carbon monoxide ligand, an isonitrile ligand, a cyano ligand, and a phosphorus ligand (for example, phosphine or phosphite), but it is not limited thereto.

In Formula 401, when $A_{401}$ has two or more substituents, the two or more substituents of $A_{401}$ may be linked to each other to form a saturated or unsaturated ring.

In Formula 401, when $A_{402}$ has two or more substituents, the two or more substituents of $A_{402}$ may be linked to each other to form a saturated or unsaturated ring.

In Formula 401, when xc1 is two or greater, a plurality of ligands

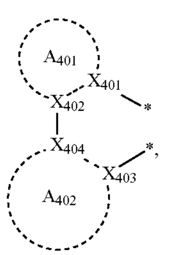

in Formula 401 may be identical to or different from each other. In Formula 401, when xc1 is two or greater, $A_{401}$ and/or $A_{402}$ of one ligand may be respectively linked to $A_{401}$ and/or $A_{402}$ of a neighboring ligand either directly (e.g., via a single bond) or via a linking group (e.g., a $C_1$-$C_5$ alkylene group, —N(R')— (where, R' is a $C_1$-$C_{10}$ alkyl group or a $C_6$-$C_{20}$ aryl group), or —C(=O)—) therebetween.

In some embodiments, in Formula 401, M may be selected from iridium (Ir), platinum (Pt), and osmium (OS), but it is not limited thereto.

The phosphorescent dopant may include at least one of Compounds PD1 to PD82, but it is not limited thereto:

PD1

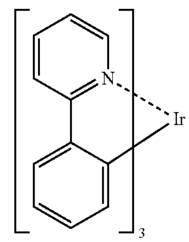

PD2

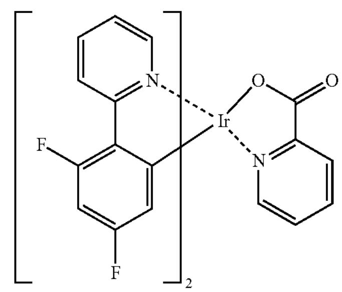

PD3

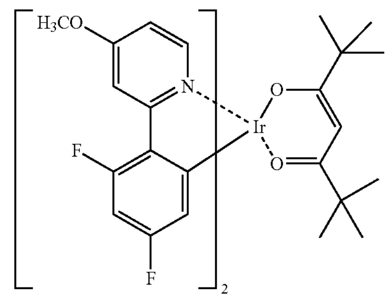

PD4

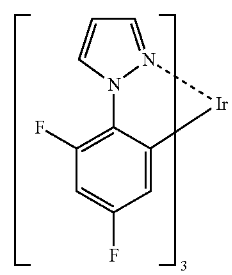

PD5

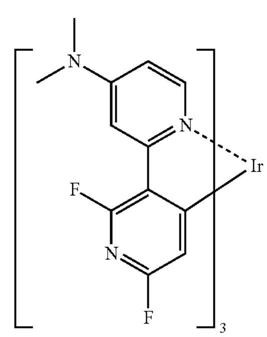

-continued
PD6
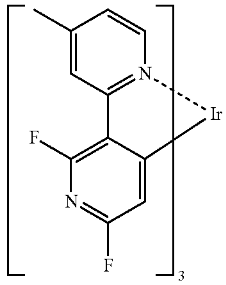
PD7
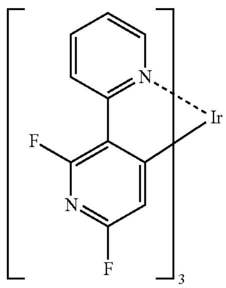
PD8
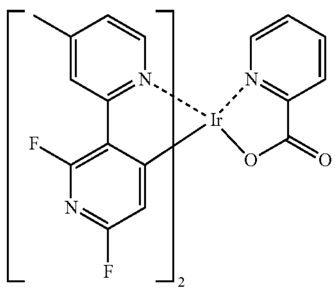
PD9
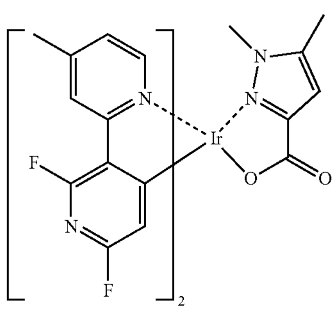
PD10
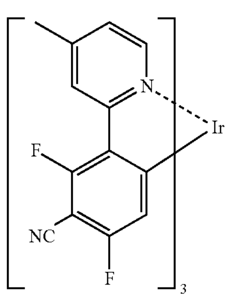
-continued
PD11
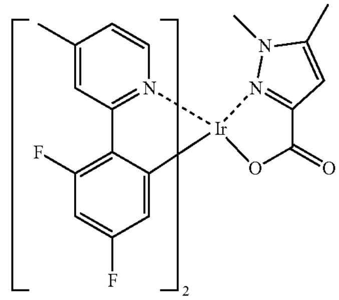
PD12
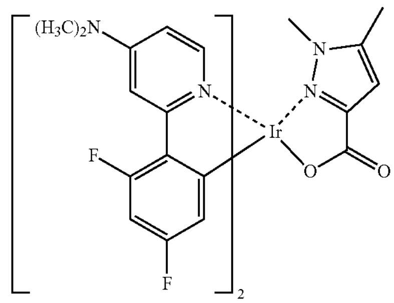
PD13
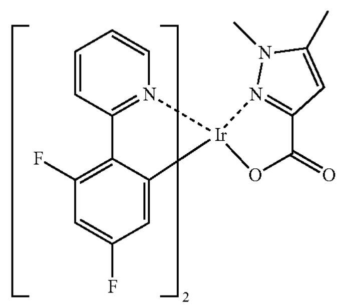
PD14
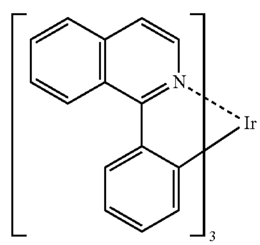
PD15
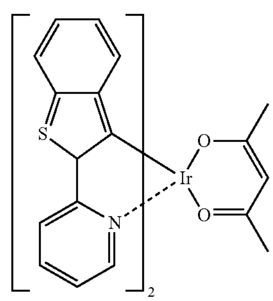

PD16
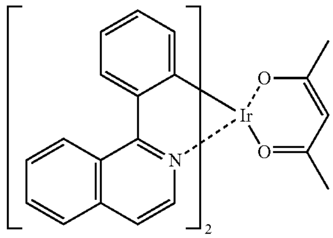
PD17
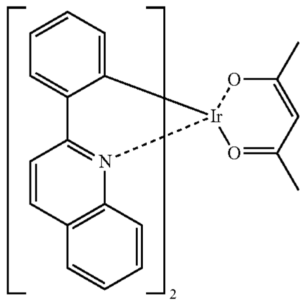
PD18
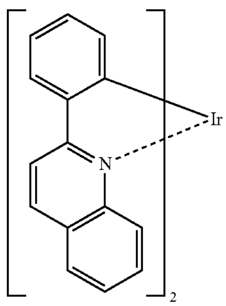
PD19
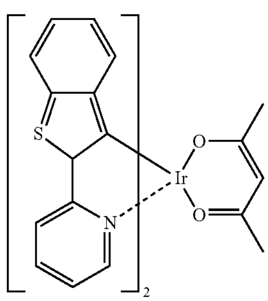
PD20
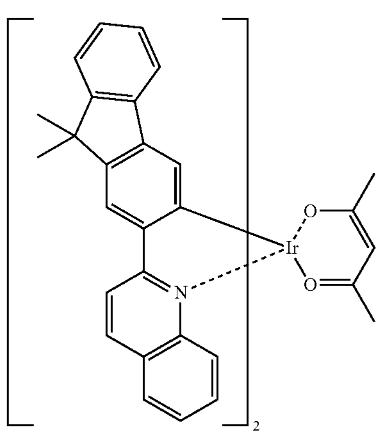
PD21
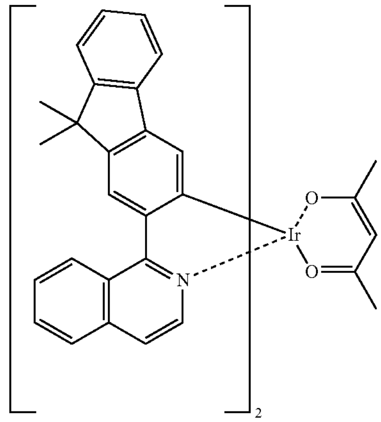
PD22
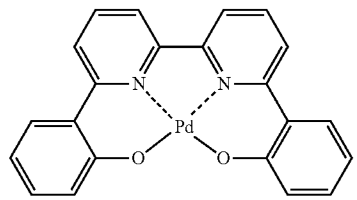
PD23
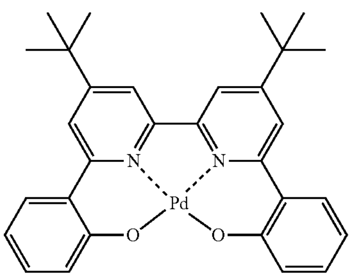
PD24
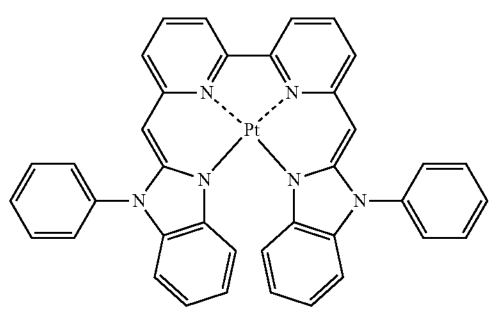
PD25
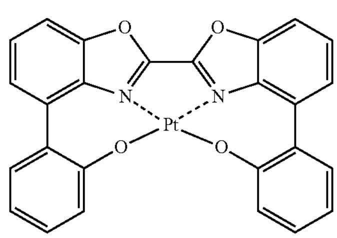

PD26
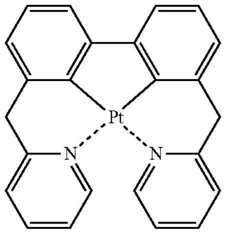
PD27
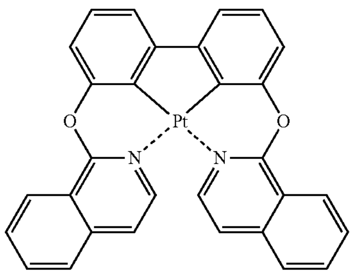
PD28
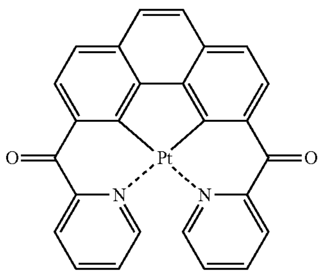
PD29
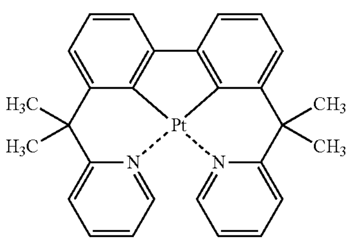
PD30
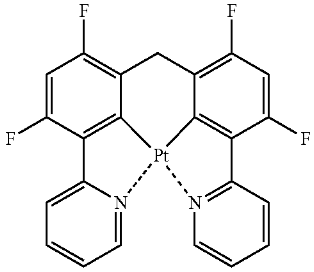
PD31
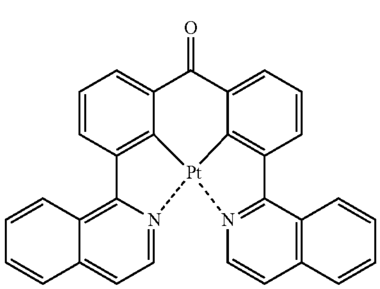
PD32
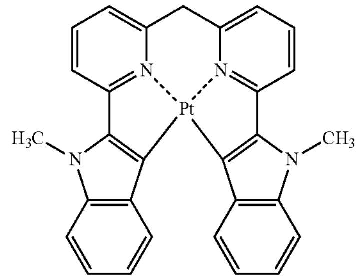
PD33
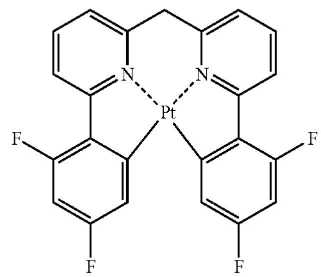
PD34
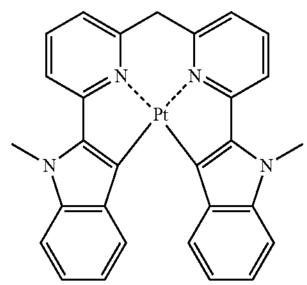
PD35
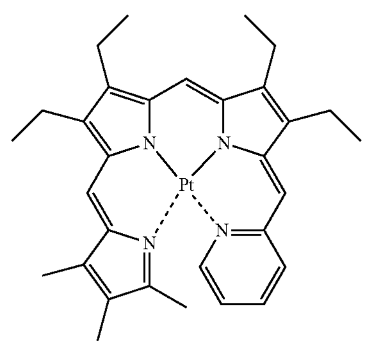
PD36
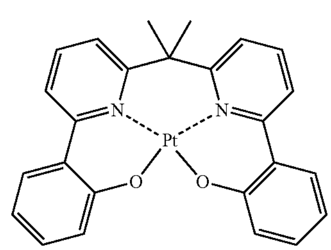

-continued
PD37
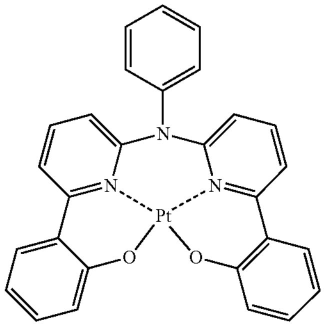
PD38
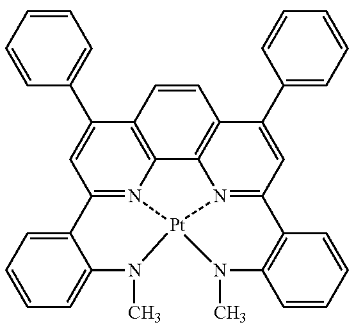
PD39
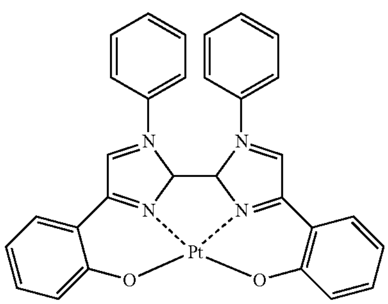
PD40
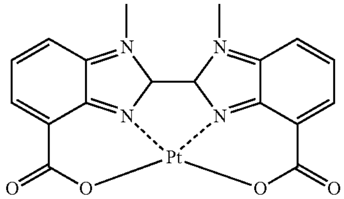
PD41
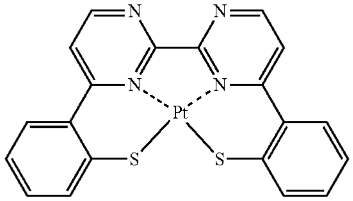
-continued
PD42
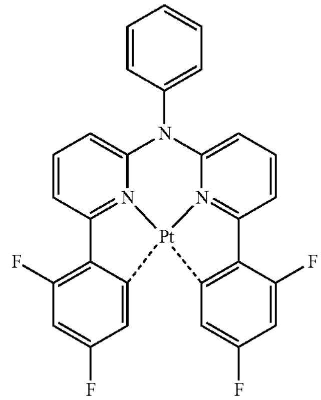
PD43
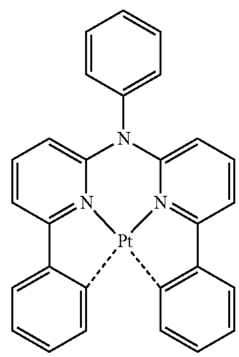
PD44
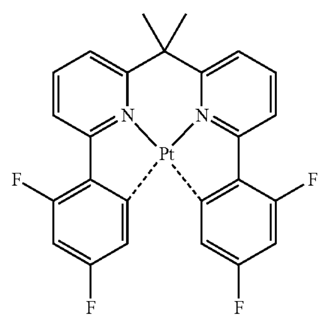
PD45
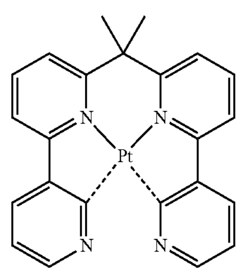
PD46
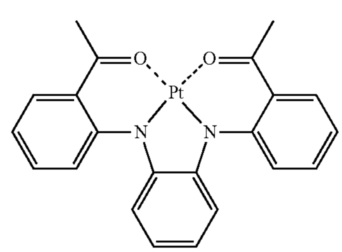

-continued
PD47
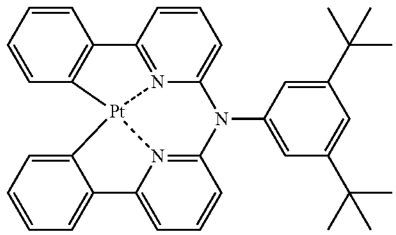
PD48
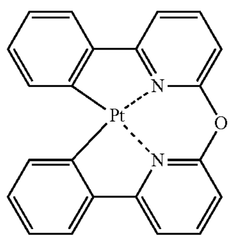
PD49
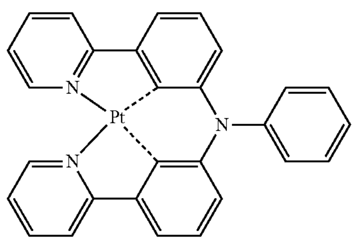
PD50
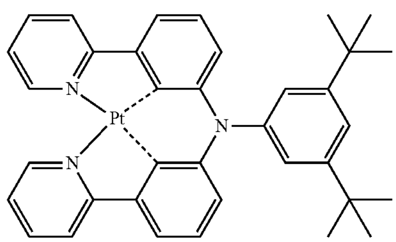
PD51
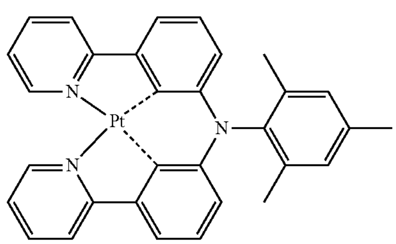
PD52
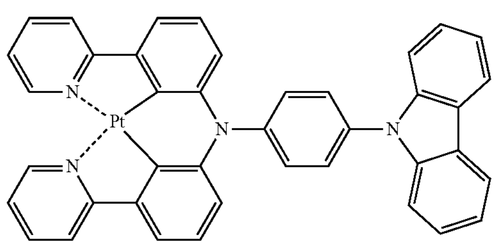
-continued
PD53
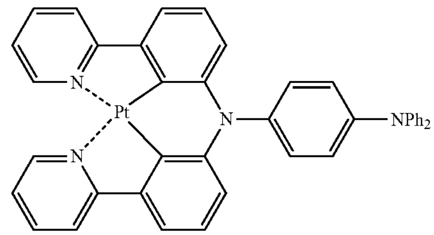
PD54
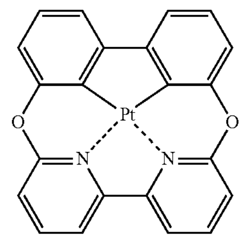
PD55
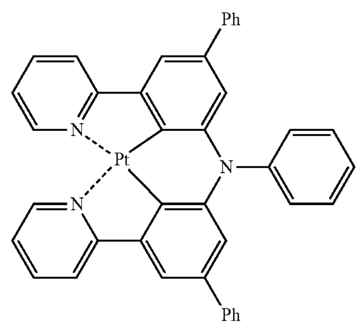
PD56
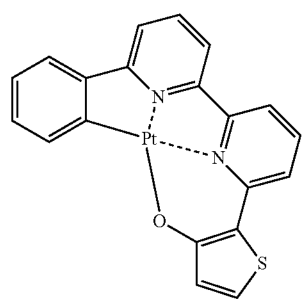
PD57
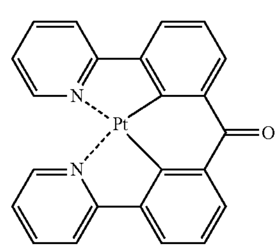

-continued
PD58
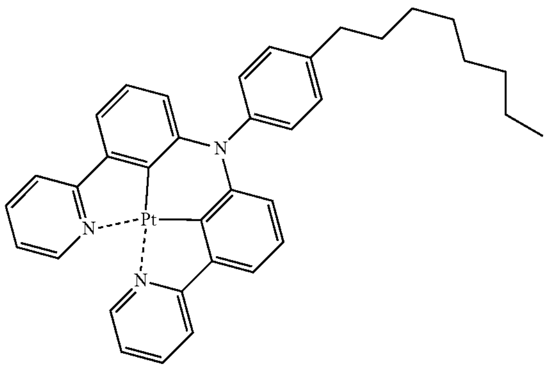
PD59
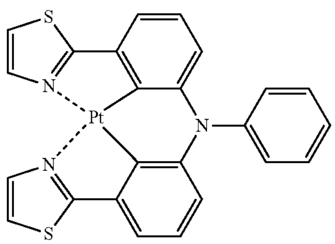
PD60
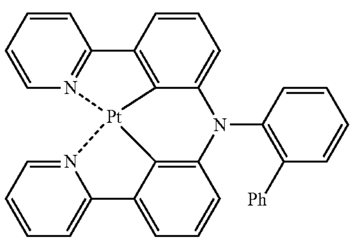
PD61
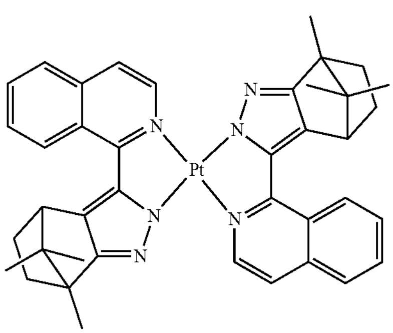
PD62
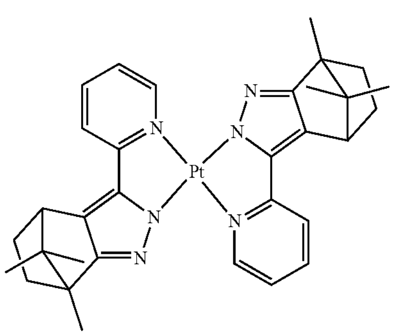
-continued
PD63
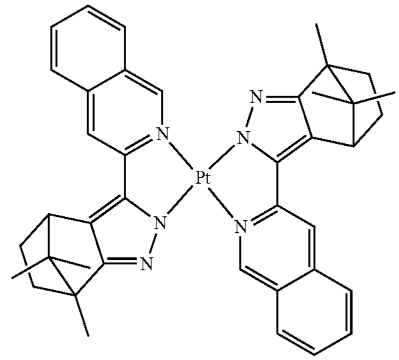
PD64
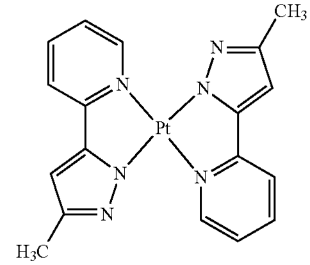
PD65
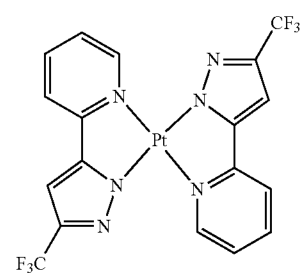
PD66
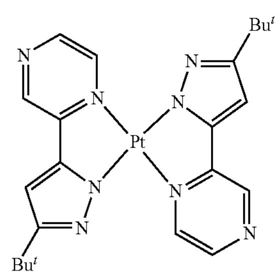
PD67
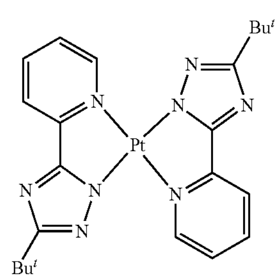

PD68
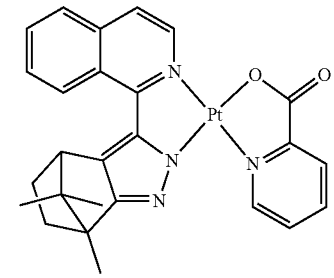
PD69
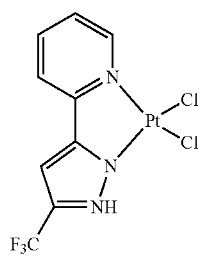
PD70
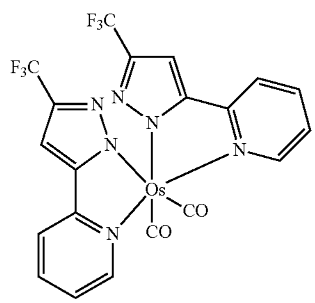
PD71
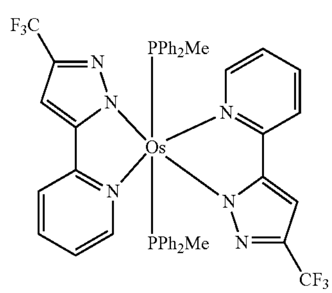
PD72
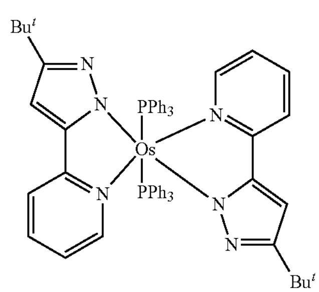
PD73
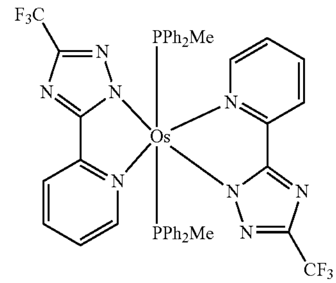
PD74
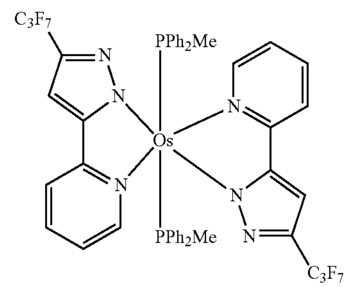
PD75
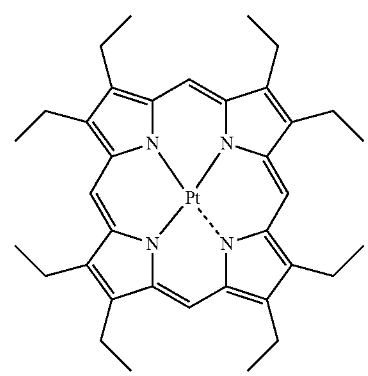
PD76
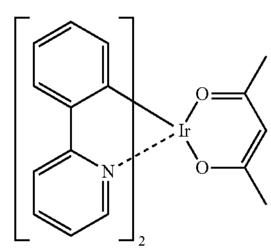
PD77
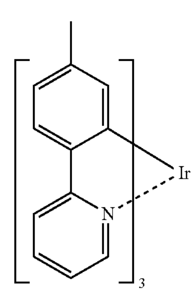

-continued

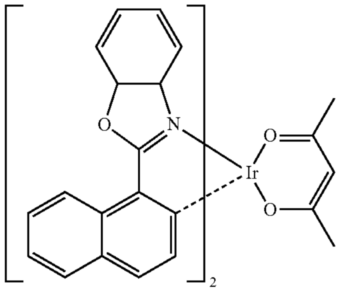

PD78

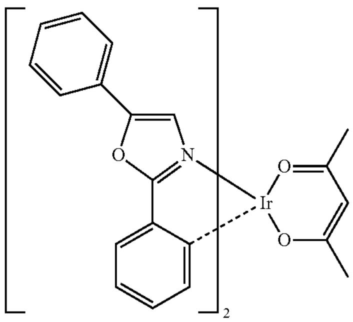

PD79

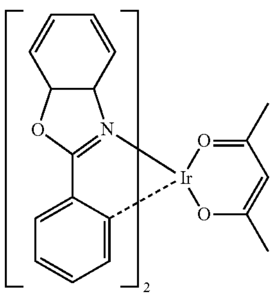

PD80

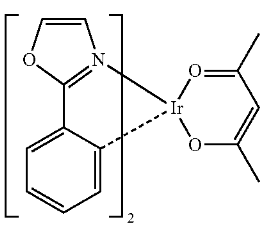

PD81

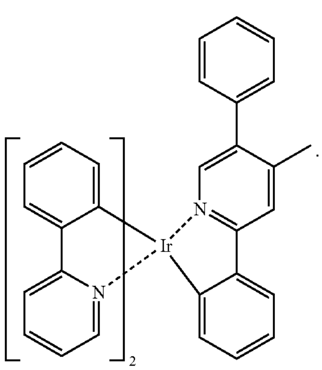

PD82

An amount of the dopant in the emission layer may be generally in a range of about 0.01 parts by weight to about 15 parts by weight based on 100 parts by weight of a host (i.e., the total weight of the first host and the second host), but it is not limited thereto.

A thickness of the emission layer may be in a range of about 100 Å to about 1000 Å, or, for example, about 200 Å to about 600 Å. When a thickness of the emission layer is within any of these ranges, light-emission characteristics of the emission layer may be improved without a substantial increase in driving voltage.

The electron transport region may include at least one selected from a hole blocking layer, an electron transport layer (ETL), and an electron injection layer, but it is not limited thereto.

For example, the electron transport region may have a structure of electron transport layer/electron injection layer or a structure of hole blocking layer/electron transport layer/electron injection layer, where the layers of each structure are sequentially stacked on the emission layer in the stated order, but it is not limited thereto.

The electron transport region may include a hole blocking layer. The hole blocking layer may be included to prevent or reduce the diffusion of triplet excitons or holes into an electron transport layer when a phosphorescent dopant is included in the emission layer.

When the electron transport region includes a hole blocking layer, the hole blocking layer may be formed on the emission layer by using various methods, such as, for example, vacuum deposition, spin coating, casting, a Langmuir-Blodgett (LB) method, ink-jet printing, laser-printing, or laser-induced thermal imaging (LITI). When the hole blocking layer is formed by vacuum deposition or by spin coating, the deposition conditions or the coating conditions may be similar to the deposition conditions or the coating conditions for forming the hole injection layer.

For example, the hole blocking layer may include at least one selected from BCP and Bphen, but it is not limited thereto.

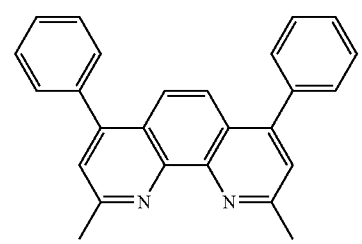

BCP

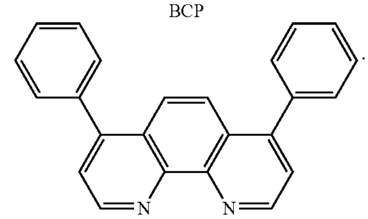

Bphen

A thickness of the hole blocking layer may be in a range of about 20 Å to about 1000 Å, for example, about 30 Å to about 300 Å. When the thickness of the hole blocking layer is within any of these ranges, hole blocking characteristics of the hole blocking layer may be improved without a substantial increase in driving voltage.

The electron transport region may also include an electron transport layer. The electron transport layer may be formed on the emission layer or on the charge control layer by using various methods, such as vacuum deposition, spin coating, casting, a LB method, ink-jet printing, laser-printing, or laser-induced thermal imaging. When the electron transport layer is formed by vacuum deposition or spin coating, vacuum deposition and coating conditions for the electron transport layer may be similar to the vacuum deposition and coating conditions for the hole injection layer.

The electron transport layer may include at least one selected from BCP and BPhen above and $Alq_3$, Balq, TAZ, and NTAZ below:

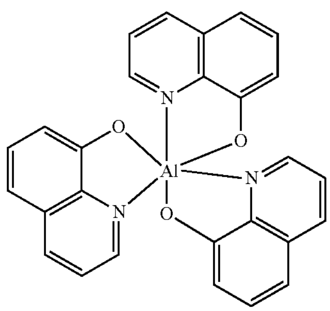

$Alq_3$

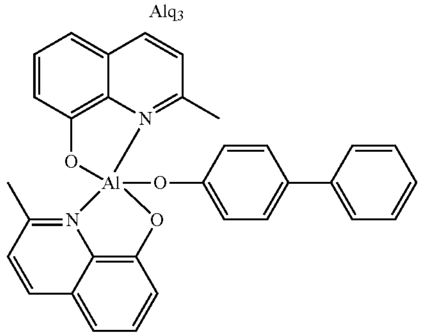

BAlq

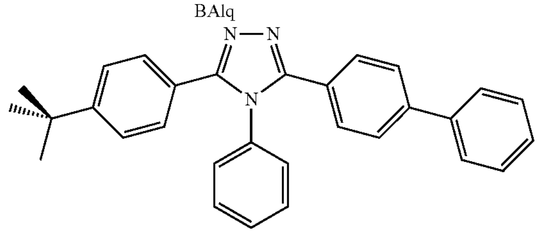

TAZ

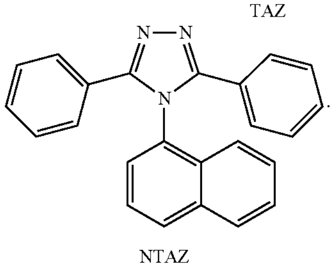

NTAZ

In some embodiments, the electron transport layer may include a compound represented by Formula 601:

$$Ar_{601}\text{-}[(L_{601})_{xe1}\text{-}E_{601}]_{xe2}. \qquad \text{Formula 601}$$

In Formula 601, $Ar_{601}$ is selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and $—Si(Q_3O(Q_{302})(Q_{303})$ (where, $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group);

$L_{601}$ is as defined in connection with $L_{201}$;

$E_{601}$ is selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 is selected from 0, 1, 2, and 3;

xe2 is selected from 1, 2, 3, and 4.

In some embodiments, the electron transport layer may include a compound represented by Formula 602:

Formula 602

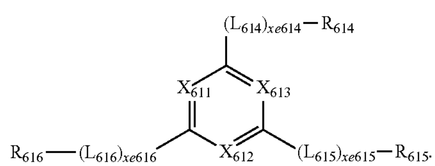

In Formula 602, $X_{611}$ is N or C-$(L_{611})_{xe611}$-$R_{611}$, $X_{612}$ is N or C-$(L_{612})_{xe612}$-$R_{612}$, $X_{613}$ is N or C-$(L_{613})_{xe613}$-$R_{613}$, and at least one of $X_{611}$ to $X_{613}$ is N;

$L_{611}$ to $L_{616}$ are each independently as defined in connection with $L_{201}$;

$R_{611}$ to $R_{616}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 are each independently selected from 0, 1, 2, and 3.

A compound represented by Formula 601 and a compound represented by Formula 602 may each independently include at least one of Compound ET1 to ET15:

ET1

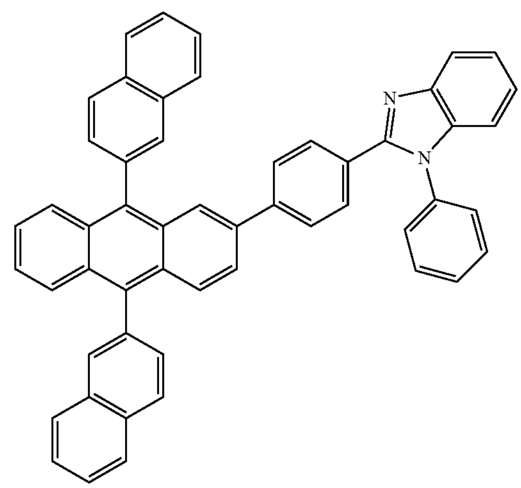

ET2

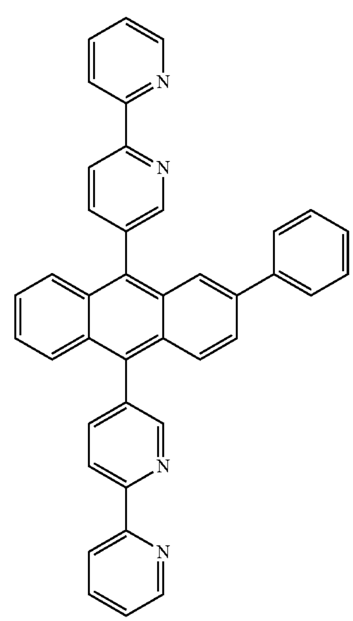

-continued
ET3
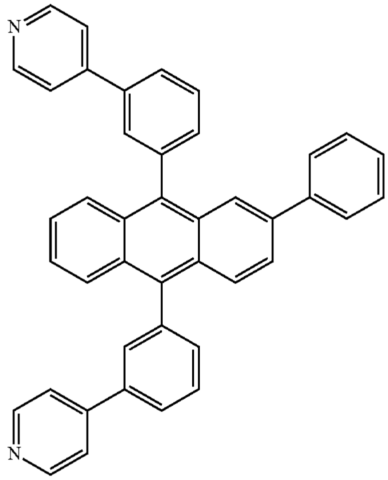
ET4
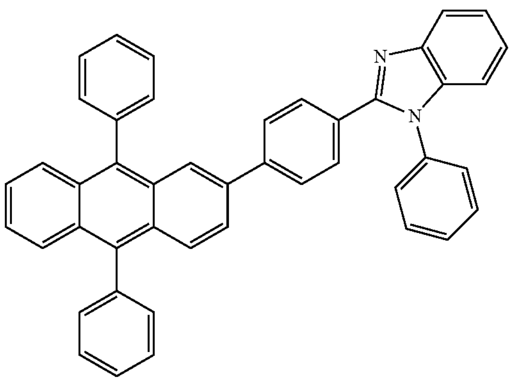
ET5
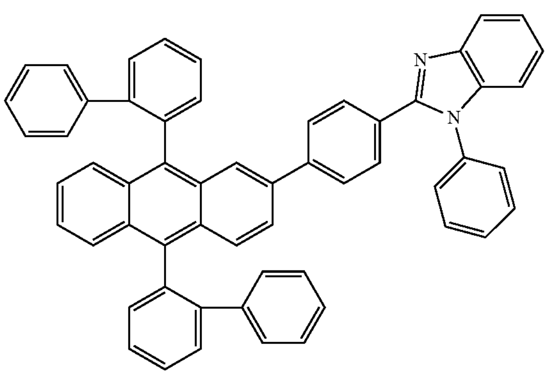
ET6
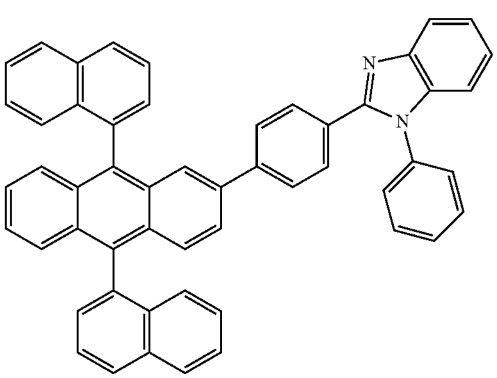
-continued
ET7
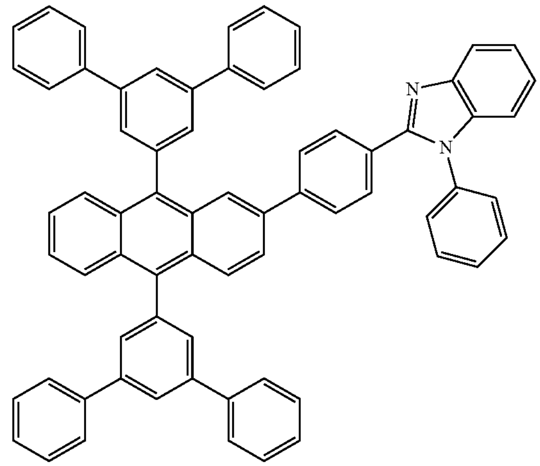
ET8
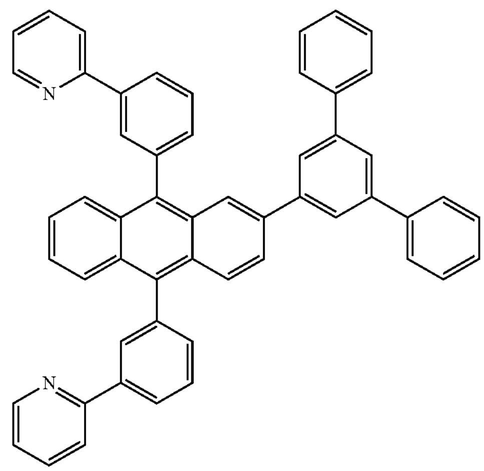
ET9
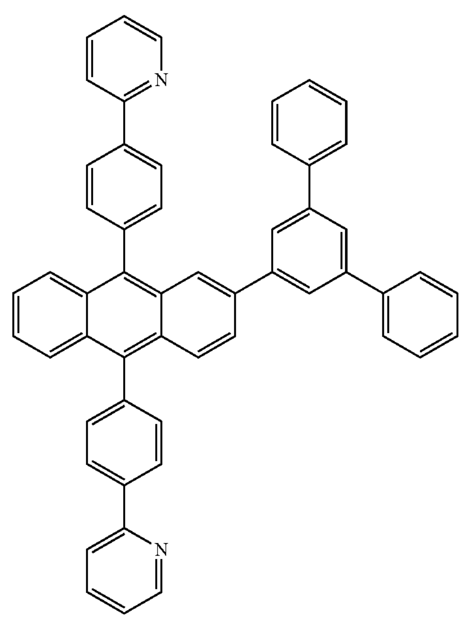

-continued

ET10

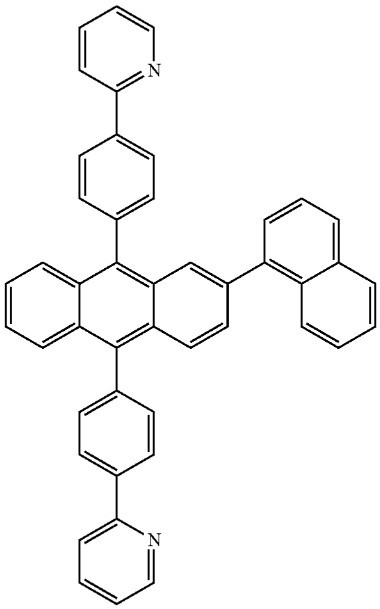

ET11

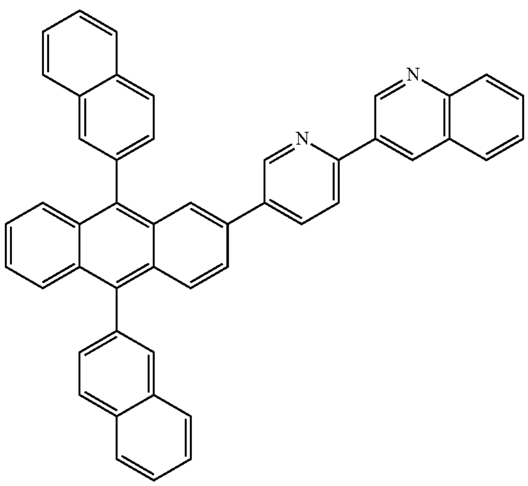

ET12

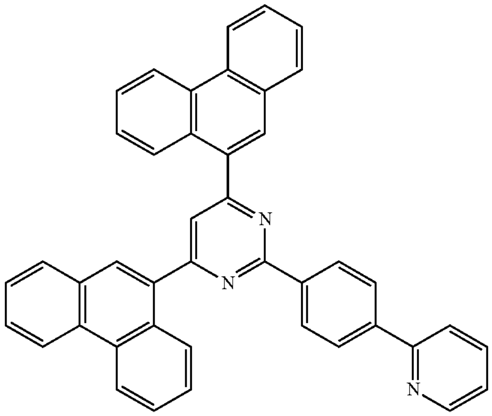

-continued

ET13

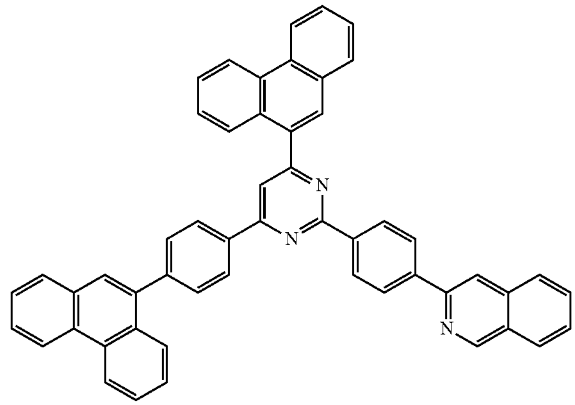

ET14

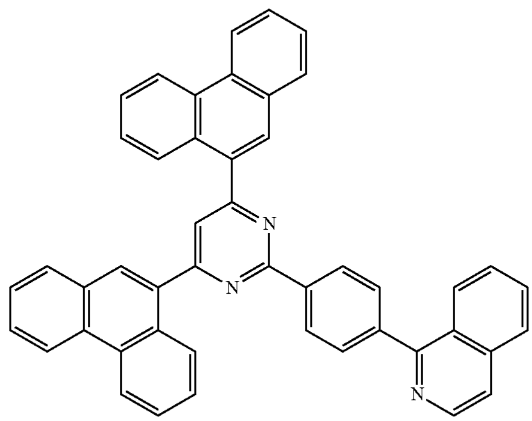

ET15

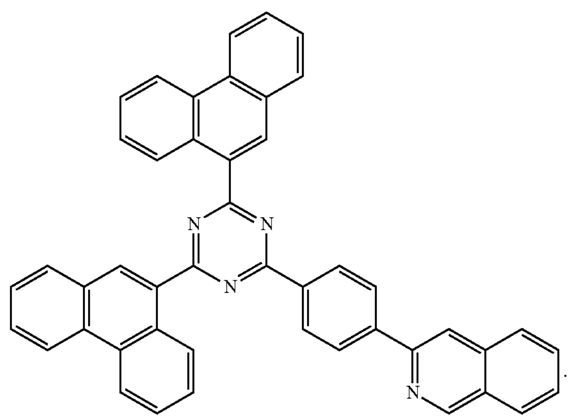

A thickness of the electron transport layer may be in a range of about 100 Å to about 1000 Å, for example, about 150 Å to about 500 Å. When the thickness of the electron transport layer is within any of these ranges, hole transporting characteristics of the electron transport layer may be improved without a substantial increase in driving voltage.

Also, the electron transport layer may further include a metal-containing material, in addition to the materials described above.

The metal-containing material may include a Li complex. The Li complex may include, for example, Compound ET-D1 (lithium quinolate, LiQ) or ET-D2:

ET-D1

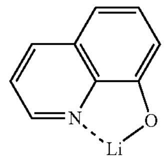

ET-D2

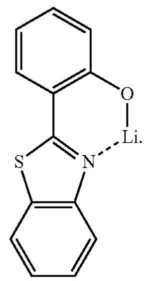

The electron transport region may include an electron injection layer that may facilitate electron injection from the second electrode 190.

The electron injection layer may be formed on the electron transport layer by using various methods, such as, for example, vacuum deposition, spin coating, casting, a LB method, ink-jet printing, laser-printing, or LITI. When the electron injection layer is formed by vacuum deposition or spin coating, vacuum deposition and coating conditions for the electron injection layer may be similar to the vacuum deposition and coating conditions for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of these ranges, electron injecting characteristics of the electron injection layer may be improved without a substantial increase in driving voltage.

The second electrode 190 may be positioned on the electron transport region. The second electrode 190 may be a cathode (i.e. an electron injection electrode), and, when the second electrode 190 is a cathode, a material for forming the second electrode 190 may be a material having a low work function, such as, for example, a metal, an alloy, an electrically conductive compound, or a mixture thereof. Non-limiting examples of the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO or IZO. The second electrode 190 may be a reflective electrode, a semi-transmissive electrode, or a transmissive electrode.

The organic light-emitting device 10 may be included in a flat display device that includes at least one thin film transistor. The thin film transistor may include a gate electrode, source and drain electrodes, a gate insulating layer, and an active layer, and one of the source and drain electrodes may be electrically connected to the first electrode 110 of the organic light-emitting device 10. The active layer may include crystalline silicon, amorphous silicon, an organic semiconductor, or an oxide semiconductor, but it is not limited thereto.

A $C_1$-$C_{60}$ alkyl group as used herein refers to a linear or branched aliphatic monovalent hydrocarbon group having 1 to 60 carbon atoms in the main chain, and non-limiting examples of the $C_1$-$C_{60}$ alkyl group may include a methyl group, an ethyl group, a propyl group, an isobutyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (where, $A_{101}$ is the $C_1$-$C_{60}$ alkyl group), and non-limiting examples of the $C_1$-$C_{60}$ alkoxy group may include a methoxy group, an ethoxy group, and an isopropyloxy group.

A $C_2$-$C_{60}$ alkenyl group as used herein refers to a hydrocarbon group including at least one carbon-carbon double bond at one or more positions along a carbon chain of the $C_2$-$C_{60}$ alkyl group (e.g., in the middle or at a terminal end of the $C_2$-$C_{60}$ alkyl group), and non-limiting examples of the $C_2$-$C_{60}$ alkenyl group may include an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group including at least one carbon-carbon triple bond at one or more positions along a carbon chain of the $C_2$-$C_{60}$ alkyl group (e.g., in the middle or at a terminal end of the $C_2$-$C_{60}$ alkyl group), and non-limiting examples of the $C_2$-$C_{60}$ alkynyl group may include an ethynyl group and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent monocyclic saturated hydrocarbon group including 3 to 10 carbon atoms as ring-forming atoms, and non-limiting examples of the $C_3$-$C_{10}$ cycloalkyl group may include a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent monocyclic group including at least one hetero atom selected from N, O, P, and S and 1 to 10 carbon atoms as ring-forming atoms, and non-limiting examples of the $C_1$-$C_{10}$ heterocycloalkyl group may include a tetrahydrofuranyl group and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group as used herein refers to a monovalent monocyclic group including 3 to 10 carbon atoms as ring-forming atoms and at least one carbon-carbon double bond in the ring of the $C_3$-$C_{10}$ cycloalkenyl group, and does not have overall aromaticity. Non-limiting examples of the $C_3$-$C_{10}$ cycloalkenyl group may include a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group including at least one hetero atom selected from N, O, P, and S and 1 to 10 carbon atoms as ring-forming atoms, and at least one double bond in its ring. Non-limiting examples of the $C_1$-$C_{10}$ heterocycloalkenyl group may include a 2,3-hydrofuranyl group and a 2,3-hydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group used herein refers to a monovalent group including a carbocyclic aromatic system having 6 to 60 carbon atoms as ring-forming atoms, and a $C_6$-$C_{60}$ arylene group as used herein refers to a divalent group including a carbocyclic aromatic system having 6 to 60 carbon atoms as ring-forming atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include two or more rings, the rings may be fused to each other.

A $C_1$-$C_{60}$ heteroaryl group as used herein refers to a monovalent group having a carbocyclic aromatic system including at least one hetero atom selected from N, O, P, and S and 1 to 60 carbon atoms as ring-forming atoms. A $C_2$-$C_{60}$ heteroarylene group as used herein refers to a divalent group having a carbocyclic aromatic system including at least one hetero atom selected from N, O, P, and S and 1 to 60 carbon atoms as ring-forming atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include two or more rings, the rings may be fused to each other.

A $C_6$-$C_{60}$ aryloxy group as used herein refers to a group represented by —$OA_{102}$ (where, $A_{102}$ is the $C_6$-$C_{60}$ aryl group), and a $C_6$-$C_{60}$ arylthio group as used herein refers to a group represented by —$SA_{103}$ (where, $A_{103}$ is the $C_6$-$C_{60}$ aryl group).

A monovalent non-aromatic condensed polycyclic group as used herein refers to a monovalent group that has two or more rings condensed to each other, only carbon atoms as ring forming atoms (for example, 8 to 60 carbon atoms as ring-forming atoms), and the entire molecular structure does not have overall aromaticity. Non-limiting examples of the monovalent non-aromatic condensed polycyclic group may include a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group that has two or more rings condensed to each other, has at least one hetero atom selected from N, O, P, and S and carbon atoms as ring-forming atoms (for example, 1 to 60 carbon atoms), and the entire molecular structure does not have overall aromaticity. Non-limiting examples of the monovalent non-aromatic condensed heteropolycyclic group may include a carbazolyl group. A divalent non-aromatic condensed heteropolycyclic group as used herein refers to a divalent group having the same structure as the monovalent non-aromatic condensed heteropolycyclic group.

As used herein, the expression "Ph" denotes a phenyl group, the expression "Me" denotes a methyl group, the expression "Et" denotes an ethyl group, and the expression "ter-Bu" or "$Bu^t$" denotes a tert-butyl group.

Hereinafter, an organic light-emitting device according to an embodiment of the present invention will be described with reference to Synthesis Examples and Examples. However, these examples are for illustrative purposes only and are not intended to limit the scope of the present invention.

EXAMPLES

Example 1

As an anode, a glass substrate of ITO/Ag/ITO deposited at a thickness of 70 Å/1000 Å/70 Å, respectively, was cut into a size of 50 mm×50 mm×0.4 mm. The substrate was sonicated in isopropyl alcohol and pure water for 10 minutes in each, cleaned with ozone for 10 minutes, and then mounted on a vacuum depositor.

Compound HT13 was deposited on the anode to form a hole injection layer having a thickness of 700 Å, Compound HT3 was deposited thereon to form a hole transport layer having a thickness of 800 Å, and then Compound 161A (a first host), Compound 318A (a second host), and Compound PD82 (a dopant) were co-deposited at a weight ratio of 50:50:15 on the hole transport layer to form an emission layer having a thickness of 400 Å.

Subsequently, Compound ET1 and LiQ were co-deposited at a weight ratio of 100:100 on the emission layer to form an electron transport layer having a thickness of 300 Å, LiQ was deposited on the electron transport layer to form an electron injection layer having a thickness of about 10 Å, and then Mg and Ag were co-deposited at a weight ratio of 90:10 on the electron injection layer to form a cathode having a thickness of 120 Å, thereby manufacturing an organic light-emitting device.

Examples 2 to 16 and Comparative Examples 1 to 11

Organic light-emitting devices were manufactured in the same (or substantially the same) manner as in Example 1, except that compounds as shown in Table 1 were used in the formation of the emission layer for each of Examples 2 to 16 and Comparative Examples 1 to 11.

TABLE 1

| | First host | Second host | Dopant | Weight ratio (first host:second host:dopant) |
|---|---|---|---|---|
| Example 1 | 161A | 318A | PD82 | 50:50:15 |
| Example 2 | 161A | 318A | PD82 | 30:70:15 |
| Example 3 | 161A | 301A | PD82 | 50:50:15 |
| Example 4 | 161A | 301A | PD82 | 30:70:15 |
| Example 5 | 182A | 318A | PD82 | 50:50:15 |
| Example 6 | 182A | 318A | PD82 | 30:70:15 |
| Example 7 | 149A | 302A | PD82 | 50:50:15 |
| Example 8 | 149A | 302A | PD82 | 30:70:15 |
| Example 9 | 185B | 315B | PD82 | 50:50:15 |
| Example 10 | 185B | 315B | PD82 | 70:30:15 |
| Example 11 | 185B | 309B | PD82 | 50:50:15 |
| Example 12 | 185B | 309B | PD82 | 70:30:15 |
| Example 13 | 203B | 309B | PD82 | 50:50:15 |
| Example 14 | 203B | 309B | PD82 | 70:30:15 |
| Example 15 | 167B | 345B | PD82 | 50:50:15 |
| Example 16 | 167B | 345B | PD82 | 70:30:15 |
| Comparative Example 1 | 161A | — | PD82 | 100:0:15 |
| Comparative Example 2 | 182A | — | PD82 | 100:0:15 |
| Comparative Example 3 | — | 318A | PD82 | 0:100:15 |
| Comparative Example 4 | — | 301A | PD82 | 0:100:15 |
| Comparative Example 5 | 185B | — | PD82 | 100:0:15 |
| Comparative Example 6 | 203B | — | PD82 | 100:0:15 |
| Comparative Example 7 | 167B | — | PD82 | 100:0:15 |

TABLE 1-continued

| | First host | Second host | Dopant | Weight ratio (first host:second host:dopant) |
|---|---|---|---|---|
| Comparative Example 8 | — | 315B | PD82 | 0:100:15 |
| Comparative Example 9 | — | 309B | PD82 | 0:100:15 |
| Comparative Example 10 | — | 345B | PD82 | 0:100:15 |
| Comparative Example 11 | Compound A | Compound B | PD82 | 50:50:15 |

Compound A

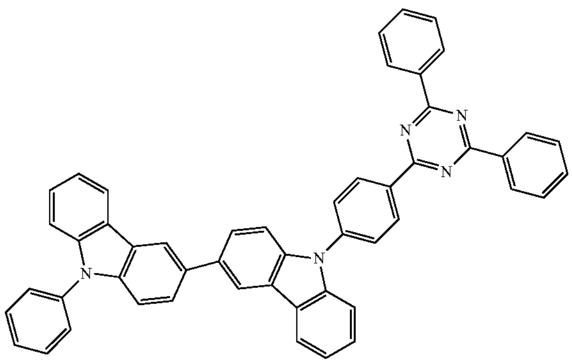 [SMILES: c1ccc(-c2nc(-c3ccccc3)nc(-c3ccc(-n4c5ccccc5c5cc(-c6ccc7c(c6)c6ccccc6n7-c6ccccc6)ccc54)cc3)n2)cc1]

TABLE 1-continued

Compound B

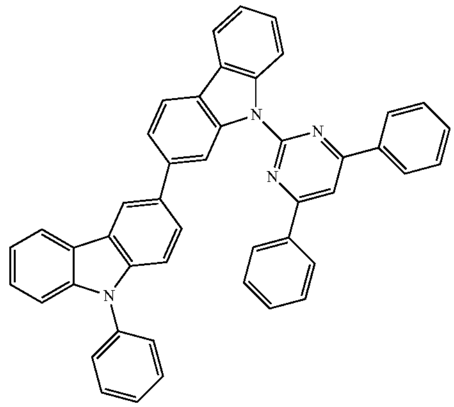

Evaluation Example 1

Driving voltages, current densities, brightnesses, color of emitted light, efficiencies, and lifespans of the organic light-emitting devices prepared in Examples 1 to 16 and Comparative Examples 1 to 11 were evaluated by using PR650 Spectroscan Source Measurement Unit (by Photo-Research, Inc.). $T_{97}$ lifespan was defined as the time it took for the brightness of the organic light-emitting device to decline to 97% of its initial brightness, when 100% of the initial brightness was 9000 cd/m$^2$. The results are shown in Table 2.

TABLE 2

| | Driving voltage (V) | Current density (mA/cm$^2$) | Efficiency (cd/A) | Power (lm/W) | CIE_x | CIE_y | $T_{97}$ (hour) |
|---|---|---|---|---|---|---|---|
| Example 1 | 4.2 | 9.8 | 92.3 | 69.5 | 0.267 | 0.702 | 156 |
| Example 2 | 4.9 | 10.1 | 89.1 | 57.0 | 0.284 | 0.691 | 158 |
| Example 3 | 4.1 | 9.9 | 91.1 | 69.0 | 0.276 | 0.695 | 123 |
| Example 4 | 5.1 | 9.3 | 96.8 | 59.3 | 0.281 | 0.690 | 153 |
| Example 5 | 4.5 | 11.0 | 82.0 | 57.0 | 0.312 | 0.665 | 128 |
| Example 6 | 5.0 | 10.8 | 83.2 | 52.1 | 0.293 | 0.680 | 161 |
| Example 7 | 4.2 | 10.0 | 90.1 | 66.8 | 0.277 | 0.697 | 145 |
| Example 8 | 5.1 | 9.6 | 94.2 | 57.8 | 0.285 | 0.691 | 163 |
| Example 9 | 4.2 | 10.2 | 88.3 | 66.0 | 0.238 | 0.721 | 148 |
| Example 10 | 4.7 | 10.4 | 86.6 | 57.9 | 0.241 | 0.718 | 161 |
| Example 11 | 4.1 | 10.1 | 89.3 | 68.4 | 0.248 | 0.717 | 134 |
| Example 12 | 4.6 | 9.8 | 91.6 | 62.6 | 0.249 | 0.715 | 156 |
| Example 13 | 4.3 | 10.4 | 86.3 | 63.1 | 0.262 | 0.704 | 145 |
| Example 14 | 4.8 | 10.5 | 85.9 | 56.2 | 0.250 | 0.704 | 156 |
| Example 15 | 4.4 | 10.1 | 89.1 | 63.6 | 0.252 | 0.715 | 121 |
| Example 16 | 4.9 | 10.3 | 87.8 | 56.3 | 0.267 | 0.704 | 163 |
| Comparative Example 1 | 4.0 | 12.8 | 70.4 | 54.8 | 0.242 | 0.720 | 52 |
| Comparative Example 2 | 4.5 | 13.0 | 69.0 | 48.2 | 0.289 | 0.687 | 45 |
| Comparative Example 3 | 7.3 | 20.8 | 43.2 | 18.6 | 0.264 | 0.703 | 2 |
| Comparative Example 4 | 7.2 | 16.7 | 53.8 | 23.5 | 0.268 | 0.703 | 4 |
| Comparative Example 5 | 9.0 | 145.2 | 6.2 | 2.2 | 0.235 | 0.718 | 1 |
| Comparative Example 6 | 9.6 | 187.5 | 4.8 | 1.6 | 0.256 | 0.703 | 1 |
| Comparative Example 7 | 8.7 | 121.6 | 7.4 | 2.7 | 0.287 | 0.690 | 1 |
| Comparative Example 8 | 4.1 | 16.6 | 54.2 | 41.5 | 0.295 | 0.678 | 41 |

TABLE 2-continued

| | Driving voltage (V) | Current density (mA/cm²) | Efficiency (cd/A) | Power (lm/W) | CIE_x | CIE_y | $T_{97}$ (hour) |
|---|---|---|---|---|---|---|---|
| Comparative Example 9 | 4.0 | 15.4 | 58.5 | 45.9 | 0.266 | 0.701 | 38 |
| Comparative Example 10 | 4.1 | 14.7 | 61.2 | 46.9 | 0.261 | 0.702 | 46 |
| Comparative Example 11 | 4.1 | 12.8 | 70.3 | 53.4 | 0.277 | 0.697 | 64 |

As illustrated by the results shown in Table 2, the organic light-emitting devices prepared in Examples 1 to 16 may have overall improved characteristics compared to the organic light-emitting devices prepared in Comparative Examples 1 to 11.

As described above, the organic light-emitting device according to one or more embodiments of the present invention may have high efficiency and long lifespan characteristics.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An organic light-emitting device comprising:

a first electrode;

a second electrode; and an organic layer between the first electrode and the second electrode, the organic layer comprising an emission layer, wherein the emission layer comprises a first host represented by Formula 1 and a second host represented by Formula 2:

Formula 1

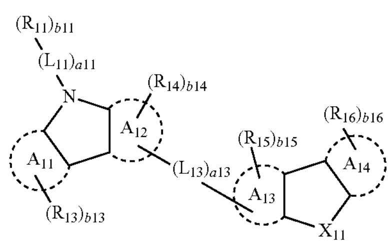

Formula 2

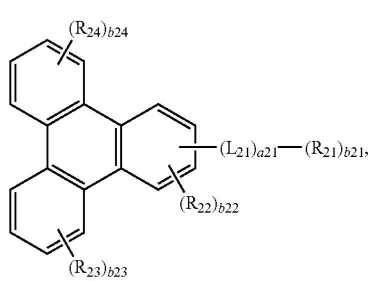

wherein, in Formulae 1 and 2, $A_{11}$, $A_{12}$, $A_{13}$, and $A_{14}$ are each independently selected from a benzene and a naphthalene;

$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;

$L_{11}$ to $L_{13}$ and $L_{21}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-N(Q_1)(Q_2)$, $-Si(Q_3)(Q_4)(Q_5)$, and $-B(Q_6)(Q_7)$;

b11, b12, and b21 are each independently selected from 1, 2, 3, and 4;

$R_{13}$ to $R_{18}$ and $R_{22}$ to $R_{24}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b13 to b16 and b22 to b24 are each independently selected from 1, 2, 3, and 4;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and $N(Q_{31})(Q_{32})$, —$Si(Q_{33})(Q_{34})(Q_{35})$, and —$B(Q_{36})(Q_{37})$;

wherein $Q_1$ to $Q_7$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein $X_{11}$ is O, S, $C(R_{17})(R_{18})$, or N-$[(L_{12})_{a12}$-$(R_{12})_{b12}]$.

3. The organic light-emitting device of claim 1, wherein $L_{11}$ to $L_{13}$ and $L_{21}$ are each independently a group selected from Formulae 3-1 to 3-41:

3-1

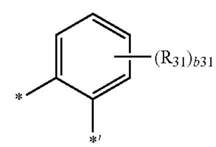

3-2

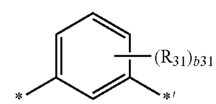

3-3

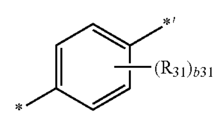

3-4

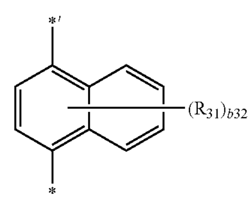

3-5

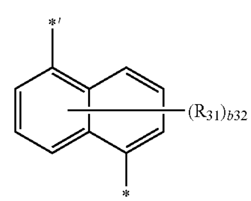

3-6

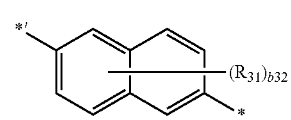

3-7

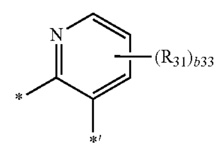

-continued
3-8
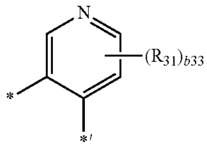
3-9
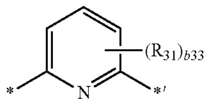
3-10
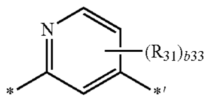
3-11
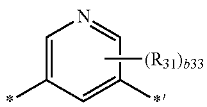
3-12
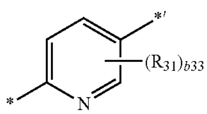
3-13
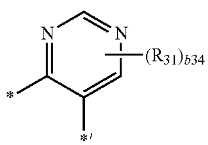
3-14
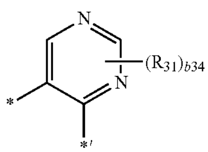
3-15
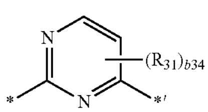
3-16
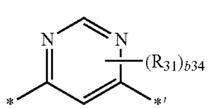
3-17
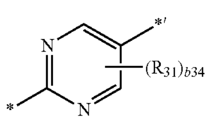
3-18
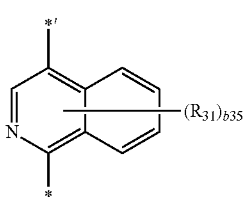
-continued
3-19
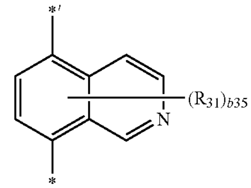
3-20
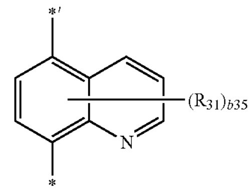
3-21
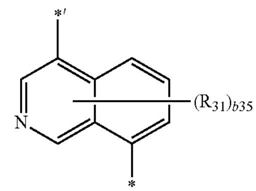
3-22
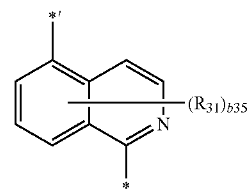
3-23
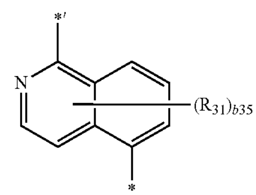
3-24
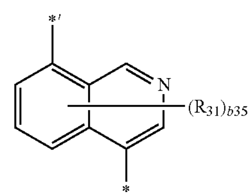
3-25
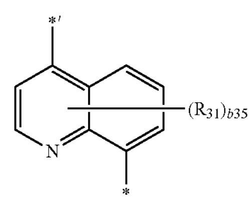
3-26
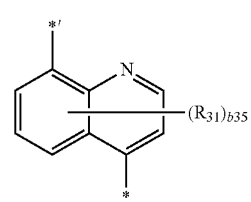

-continued 3-27
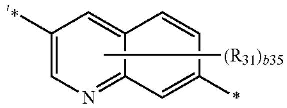

3-28
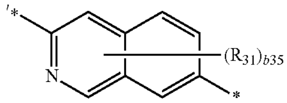

3-29
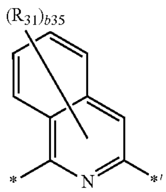

3-30
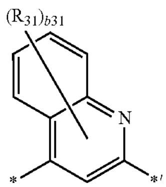

3-31
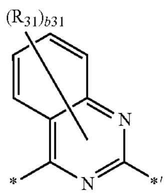

3-32
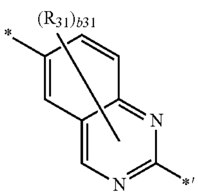

3-33
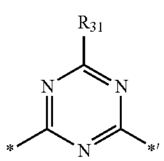

3-34
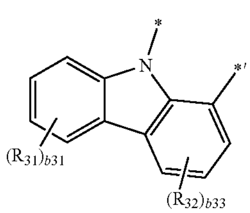

3-35
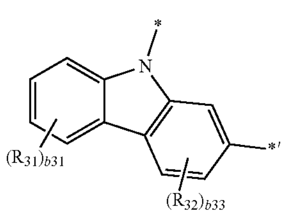

-continued 3-36
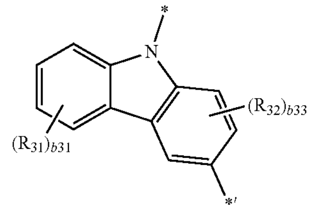

3-37
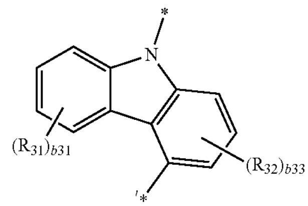

3-38
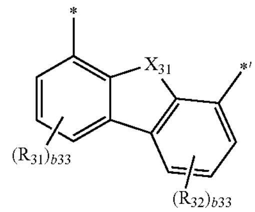

3-39
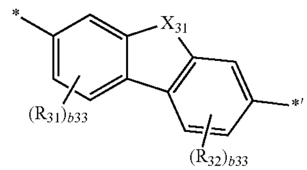

3-40
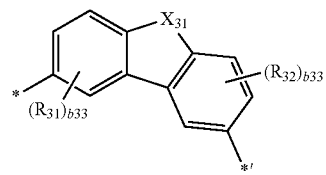

3-41
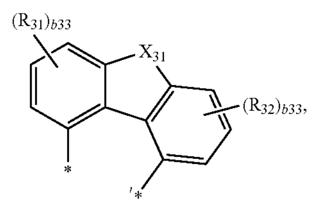

wherein $X_{31}$ is selected from O, S, $N(R_{33})$, and $C(R_{33})(R_{34})$;

$R_{31}$ to $R_{34}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

b31 is selected from 1, 2, 3, and 4;

b32 is selected from 1, 2, 3, 4, 5, and 6;

b33 is selected from 1, 2, and 3;

b34 is selected from 1 and 2;

b35 is selected from 1, 2, 3, 4, and 5;

* and *' are each independently a binding site to a neighboring atom.

4. The organic light-emitting device of claim 1, wherein $L_{11}$ to $L_{13}$ and $L_{21}$ are each independently selected from Formulae 4-1 to 4-6 and 4-50 to 4-57:

4-1

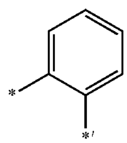

4-2

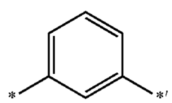

4-3

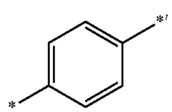

4-4

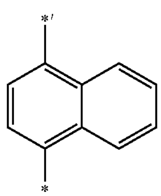

4-5

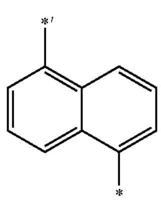

4-6

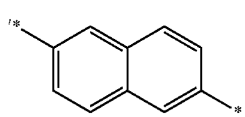

4-50

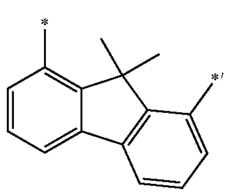

4-51

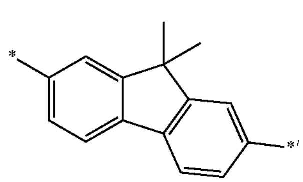

-continued 4-52

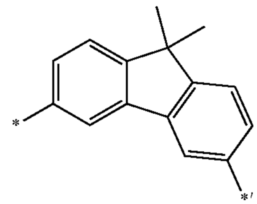

4-53

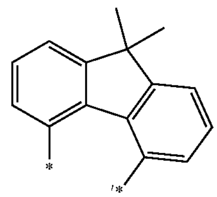

4-54

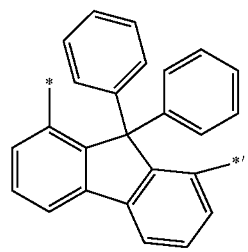

4-55

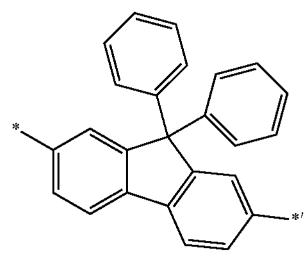

4-56

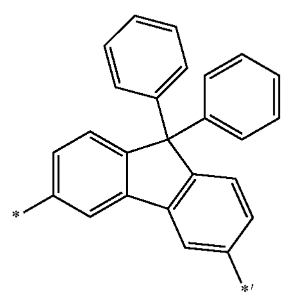

4-57

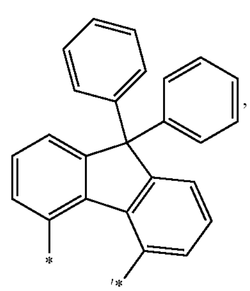

wherein, in Formulae 4-1 to 4-6 and 4-50 to 4-57,

* and *' are each independently a binding site to a neighboring atom.

5. The organic light-emitting device of claim 1, wherein $R_{11}$, $R_{12}$, and $R_{21}$ are each independently selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, a dibenzodioxinyl group, and —$N(Q_1)(Q_2)$; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, a thianthrenyl group, a phenoxathinyl group, and a dibenzodioxinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —$Si(Q_{33})(Q_{34})(Q_{35})$;

wherein $Q_1$, $Q_2$, and $Q_{33}$ to $Q_{35}$ are each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group.

6. The organic light-emitting device of claim 1, wherein $R_{11}$, $R_{12}$, and $R_{21}$ are each independently a group selected from Formulae 5-1 to 5-58:

5-1

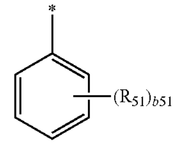

5-2

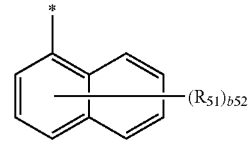

5-3

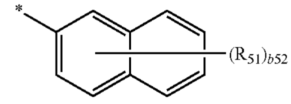

-continued
5-4
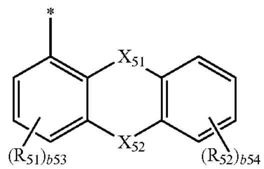
5-5
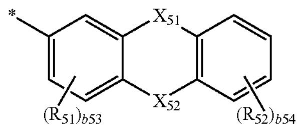
5-6
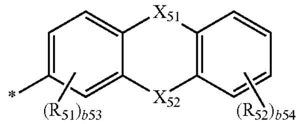
5-7
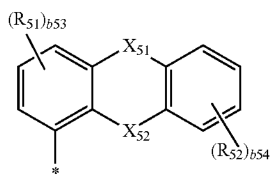
5-8
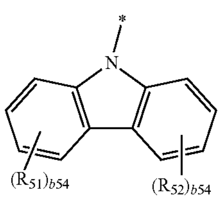
5-9
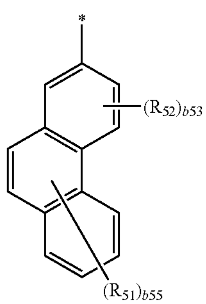
5-10
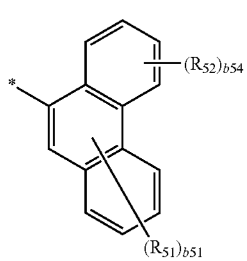
-continued
5-11
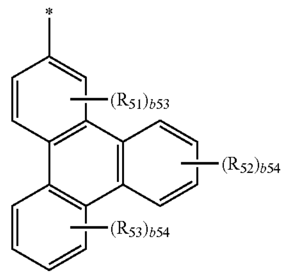
5-12
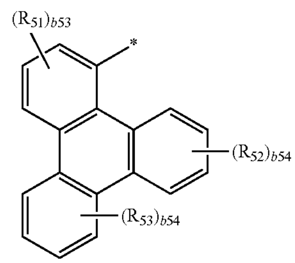
5-13
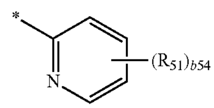
5-14
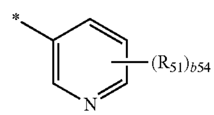
5-15
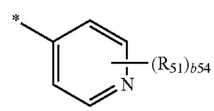
5-16
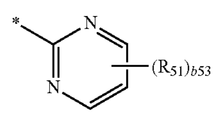
5-17
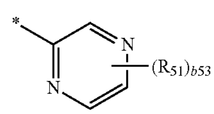
5-18
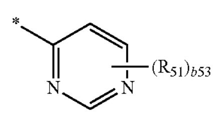
5-19
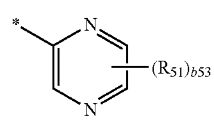
5-20
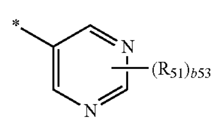

-continued
5-21
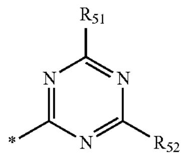
5-22
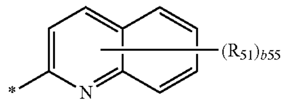
5-23
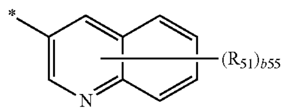
5-24
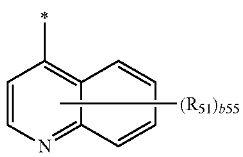
5-25
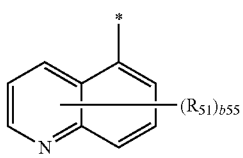
5-26
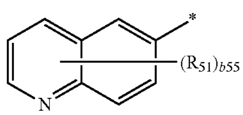
5-27
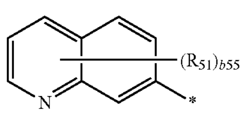
5-28
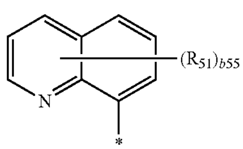
5-29
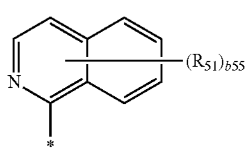
5-30
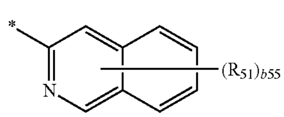
5-31
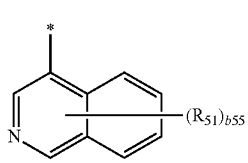
-continued
5-32
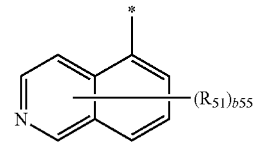
5-33
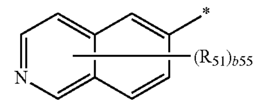
5-34
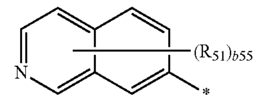
5-35
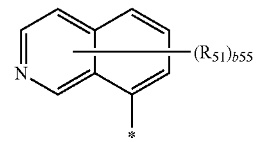
5-36
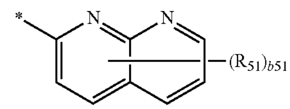
5-37
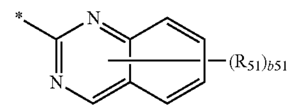
5-38
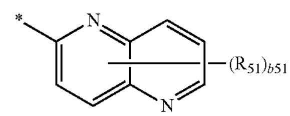
5-39
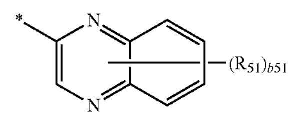
5-40
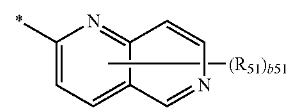
5-41
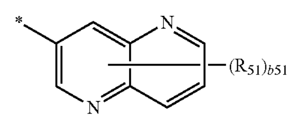
5-42
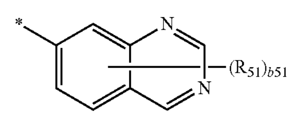
5-43
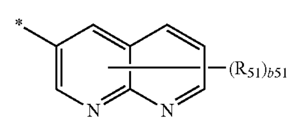
5-44
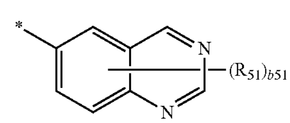

-continued 5-45

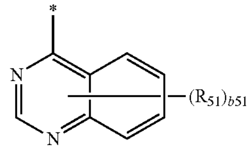

5-46

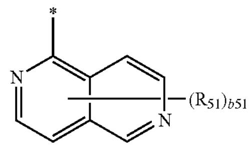

5-47

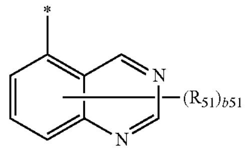

5-48

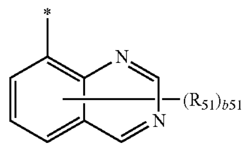

5-49

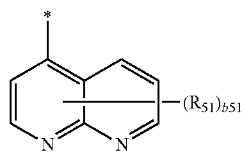

5-50

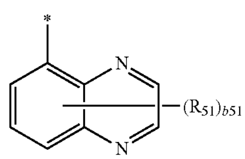

5-51

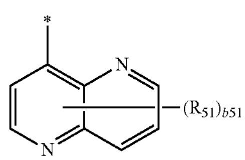

5-52

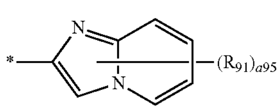

5-53

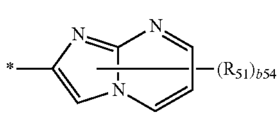

5-54

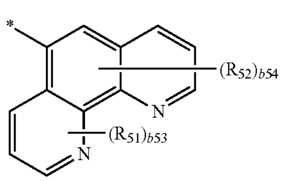

-continued 5-55

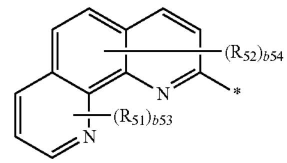

5-56

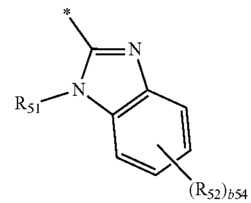

5-57

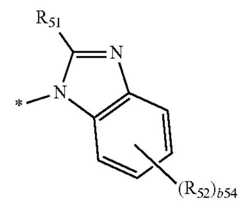

5-58

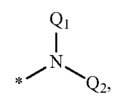

wherein, in Formulae 5-1 to 5-58, $X_{51}$ is selected from a single bond, $N(R_{54})$, $C(R_{54})(R_{55})$, O, and S;

$X_{52}$ is selected from $N(R_{56})$, $C(R_{56})(R_{57})$, O, and S;

$R_{51}$ to $R_{57}$ are each independently selected from a hydrogen, a deuterium, —F, —Cl, —Br, —I, a cyano group, a nitro group, a $C_1$-$C_{20}$ alkyl group, a phenyl group, a biphenyl group, a naphthyl group, a fluorenyl group, a carbazolyl group, a dibenzofuranyl group, a dibenzothiophenyl group, and $—Si(Q_{33})(Q_{34})(Q_{35})$;

wherein $Q_1$, $Q_2$, and $Q_{33}$ to $Q_{35}$ are each independently selected from a methyl group, an ethyl group, an n-propyl group, an iso-propyl group, an n-butyl group, an iso-butyl group, a sec-butyl group, a tert-butyl group, a phenyl group, a biphenyl group, a naphthyl group, and a fluorenyl group;

b51 is selected from 1, 2, 3, 4, and 5;

b52 is selected from 1, 2, 3, 4, 5, 6, and 7;

b53 is selected from 1, 2, and 3;

b54 is selected from 1, 2, 3, and 4;

b55 is selected from 1, 2, 3, 4, 5, and 6;

* is a binding site to a neighboring atom.

7. The organic light-emitting device of claim 6, wherein at least one of $R_{11}$ and $R_{12}$ is selected from Formulae 5-13 to 5-57; and $R_{21}$ is selected from Formulae 5-1 to 5-12 and 5-58.

8. The organic light-emitting device of claim 6, wherein at least one of $R_{11}$ and $R_{12}$ is selected from Formulae 5-1 to 5-12 and 5-58; and $R_{21}$ is selected from Formulae 5-13 to 5-57.

9. The organic light-emitting device of claim 1, wherein b11, b12, and b21 are each independently selected from 1 and 2.

10. The organic light-emitting device of claim 1, wherein $R_{13}$ to $R_{18}$ and $R_{22}$ to $R_{24}$ are each independently selected from:

a hydrogen, a methyl group, an ethyl group, an n-propyl group, an n-butyl group, a phenyl group, a naphthyl group, an anthryl group, a pyrenyl group, a phenanthrenyl group, a fluorenyl group, and a carbazolyl group; and a phenyl group, a naphthyl group, an anthryl group, a pyrenyl group, a phenanthrenyl group, a fluorenyl group, and a carbazolyl group, each substituted with at least one selected from a deuterium, —F, —Cl, —Br, —I, a cyano group, a nitro group, a methyl group, a phenyl group, and a naphthyl group.

11. The organic light-emitting device of claim 1, wherein the first host is represented by Formula 1-1:

Formula 1-1

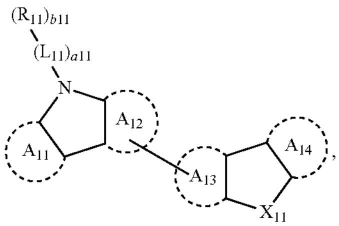

wherein, in Formula 1-1, $A_{11}$ to $A_{14}$, $X_{11}$, $L_{11}$, a11, $R_{11}$, and b11 are as defined in Formula 1.

12. The organic light-emitting device of claim 1, wherein the second host is represented by Formula 2-1:

Formula 2-1

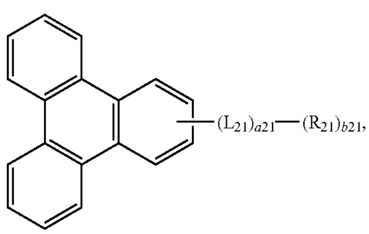

wherein, in Formula 2-1, $L_{21}$, a21, $R_{21}$, and b21 are as defined in Formula 2.

13. The organic light-emitting device of claim 1, wherein the first host is represented by any one of Formulae 1-11 to 1-26; and the second host is represented by any one of Formulae 2-11 and 2-12:

1-11

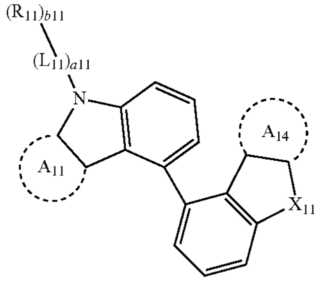

-continued 1-12

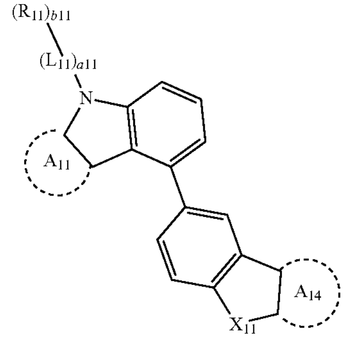

1-13

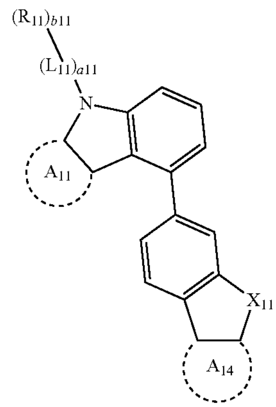

1-14

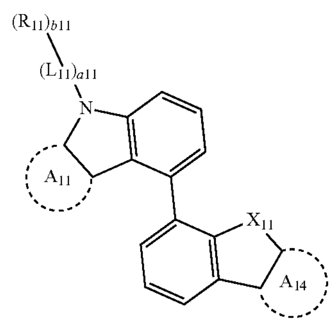

1-15

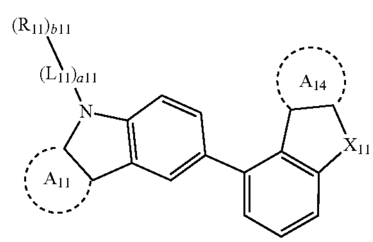

1-16

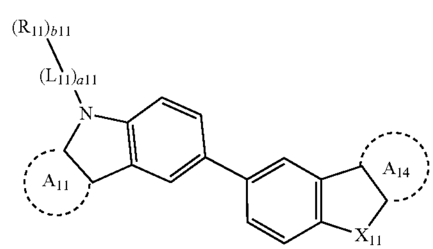

-continued
1-17
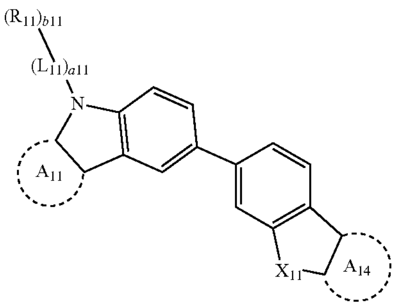
1-18
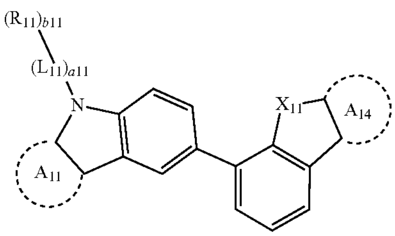
1-19
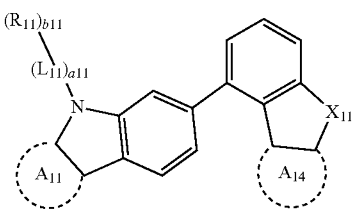
1-20
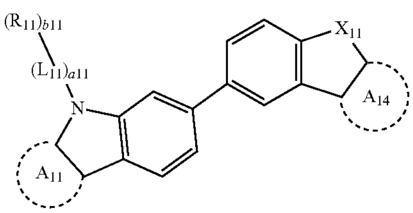
1-21
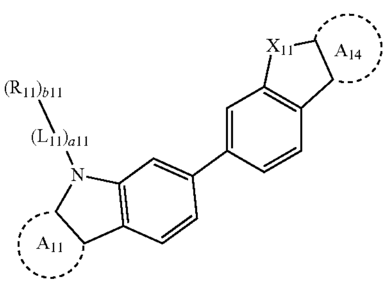
1-22
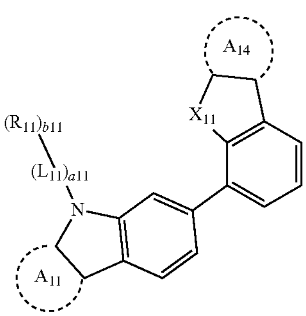
-continued
1-23
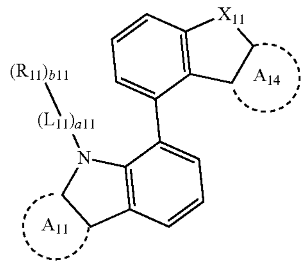
1-24
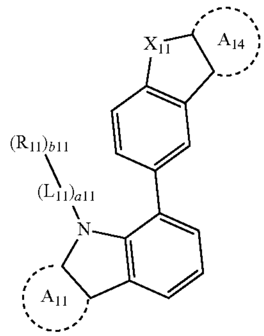
1-25
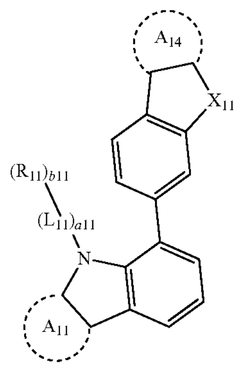
1-26
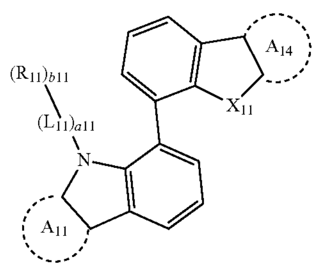
2-11
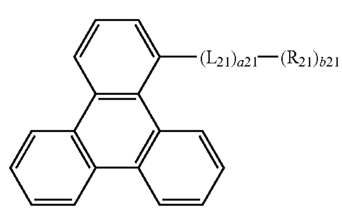

-continued
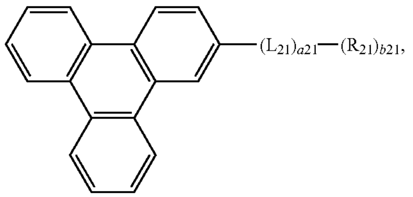
2-12
wherein, in Formulae 1-11 to 1-26, 2-11, and 2-12,
$A_{11}$ and $A_{14}$ are each independently selected from a benzene and a naphthalene;
$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;
$L_{11}$, $L_{12}$, and $L_{21}$ are each independently selected from Formulae 4-1 to 4-6 and 4-50 to 4-57;
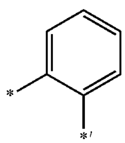
4-1
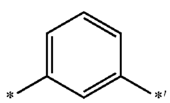
4-2
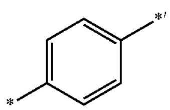
4-3
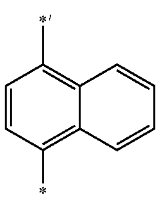
4-4
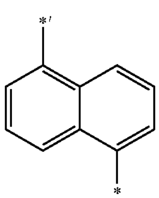
4-5
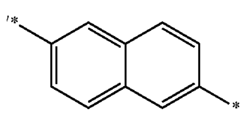
4-6
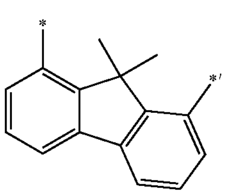
4-50
-continued
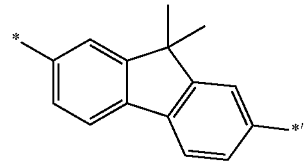
4-51
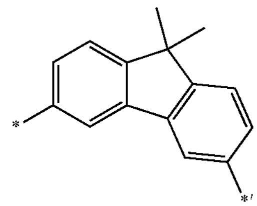
4-52
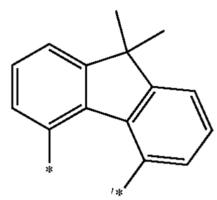
4-53
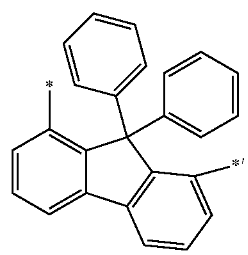
4-54
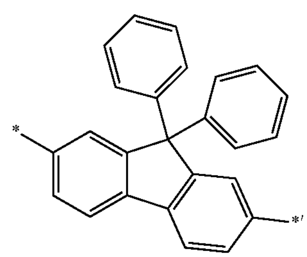
4-55
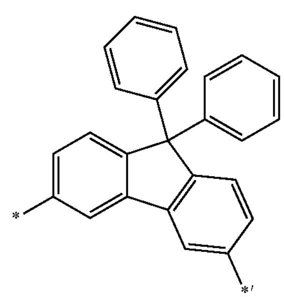
4-56

-continued 4-57

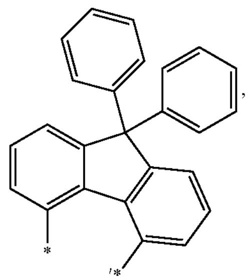

wherein, in Formulae 4-1 to 4-6 and 4-50 to 4-57, * and *' are each independently a binding site to a neighboring atom;

a11, a12, and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);

at least one of $R_{11}$ and $R_{12}$ is selected from Formulae 6-52 to 6-134; and $R_{21}$ is selected from Formulae 6-1 to 6-51 and 6-135 to 6-138:

6-1

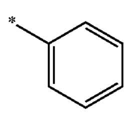

6-2

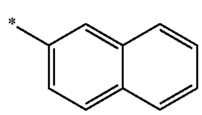

6-3

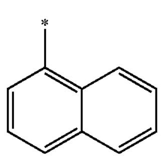

6-4

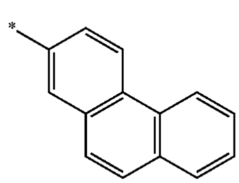

6-5

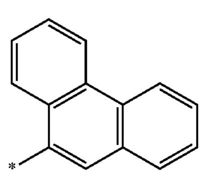

-continued 6-6

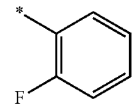

6-7

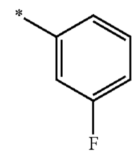

6-8

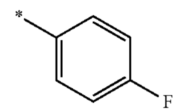

6-9

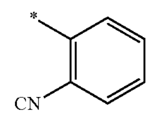

6-10

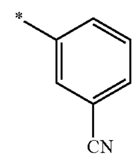

6-11

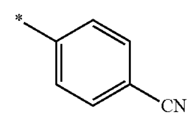

6-12

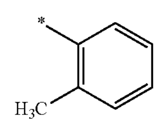

6-13

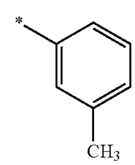

6-14

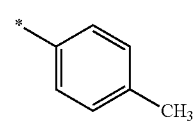

6-15

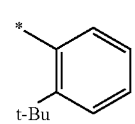

6-16

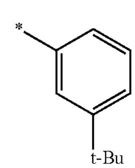

6-17

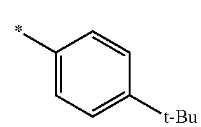

-continued
6-18
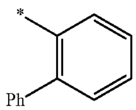
6-19
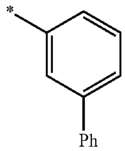
6-20
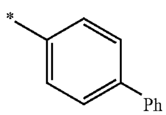
6-21
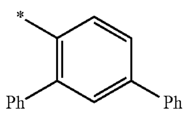
6-22
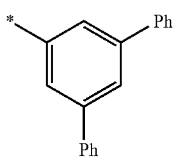
6-23
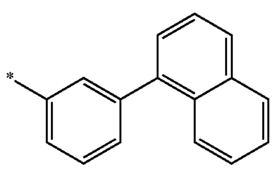
6-24
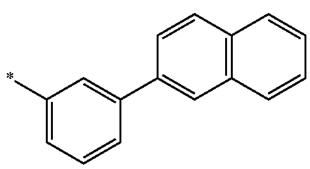
6-25
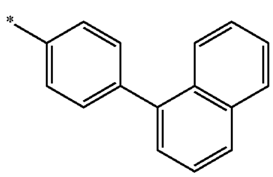
6-26
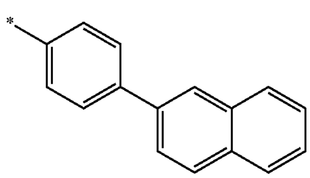
6-27
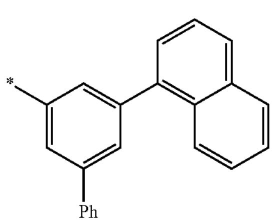
-continued
6-28
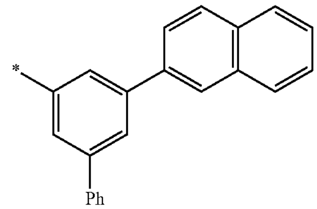
6-29
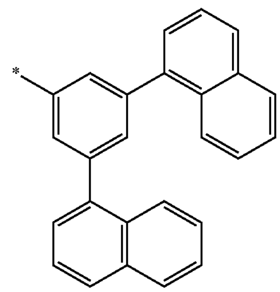
6-30
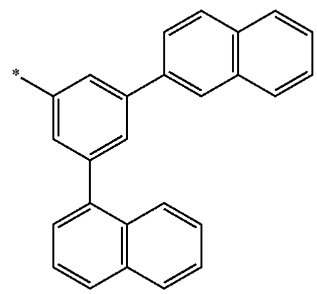
6-31
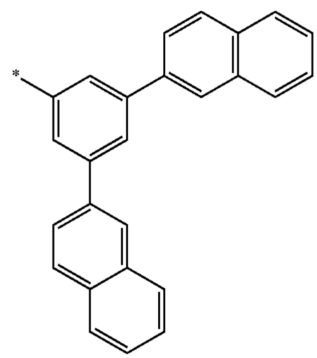
6-32
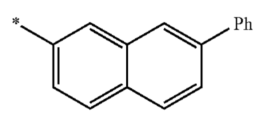
6-33
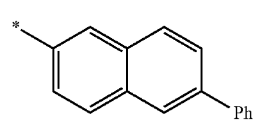
6-34
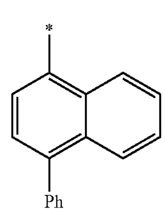

-continued
6-35
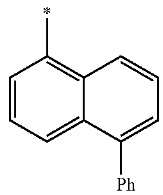
6-36
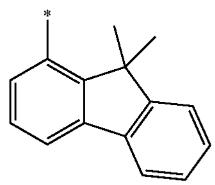
6-37
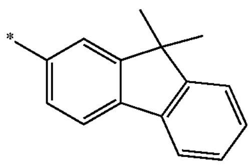
6-38
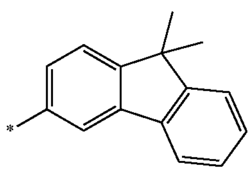
6-39
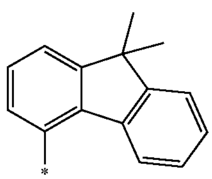
6-40
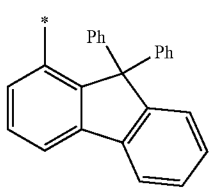
6-41
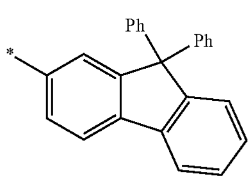
6-42
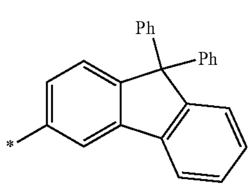
-continued
6-43
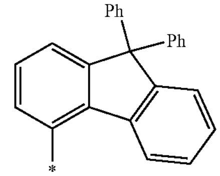
6-44
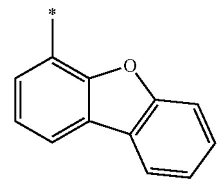
6-45
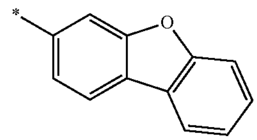
6-46
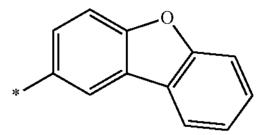
6-47
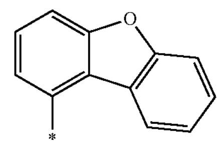
6-48
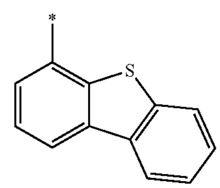
6-49
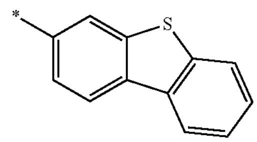
6-50
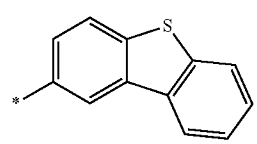
6-51
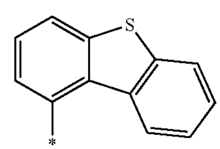
6-52
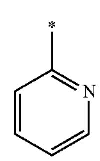

6-53
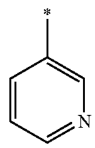
6-54
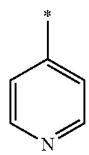
6-55
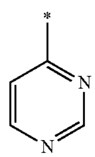
6-56
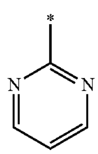
6-57
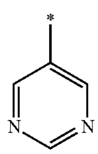
6-58
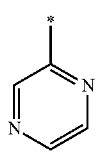
6-59
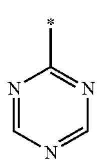
6-60
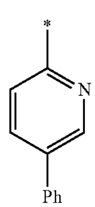
6-61
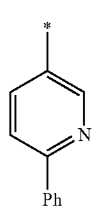
6-62
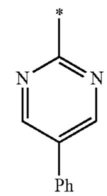
6-63
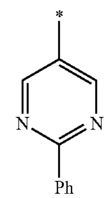
6-64
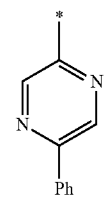
6-65
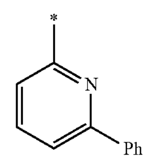
6-66
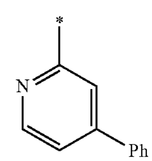
6-67
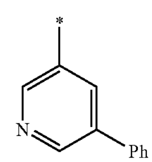
6-68
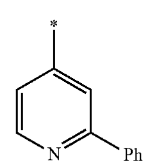
6-69
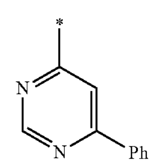
6-70
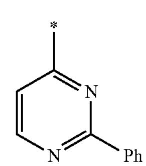

-continued
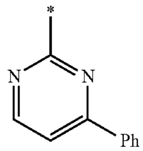
6-71
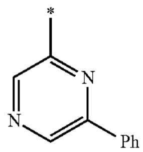
6-72
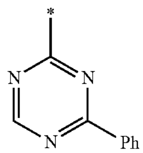
6-73
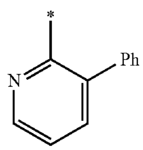
6-74
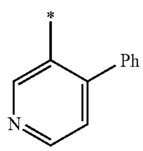
6-75
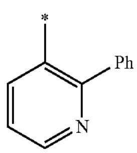
6-76
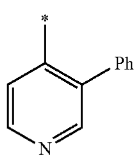
6-77
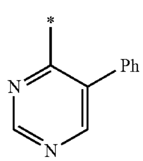
6-78
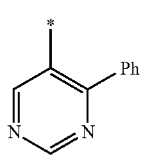
6-79
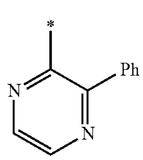
6-80
-continued
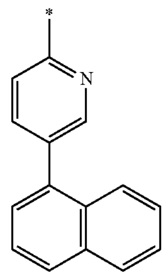
6-81
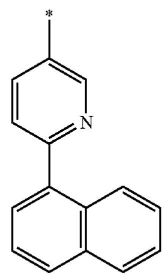
6-82
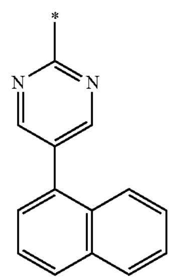
6-83
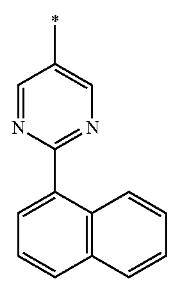
6-84
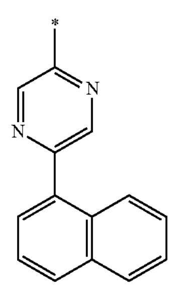
6-85
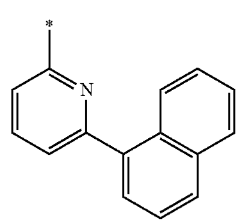
6-86

-continued
6-87
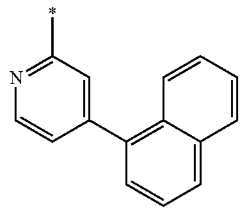
6-88
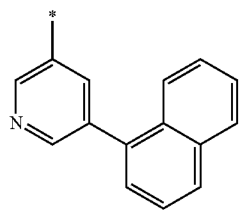
6-89
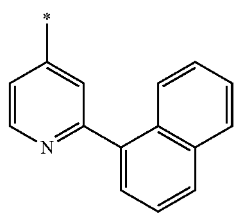
6-90
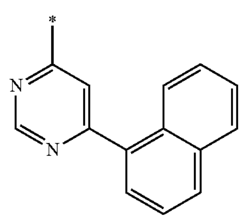
6-91
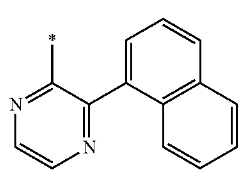
6-92
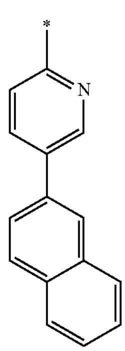
-continued
6-93
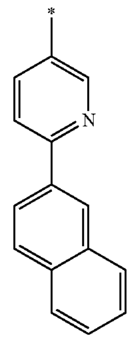
6-94
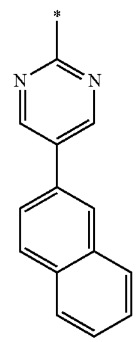
6-95
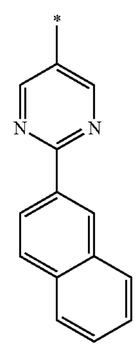
6-96
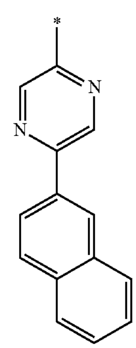
6-97
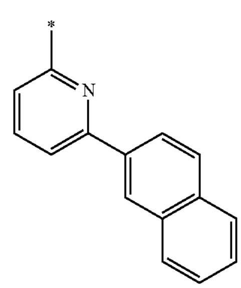

-continued
6-98
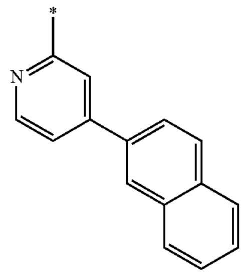
6-99
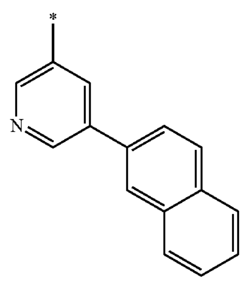
6-100
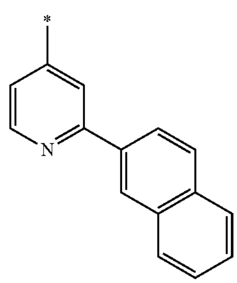
6-101
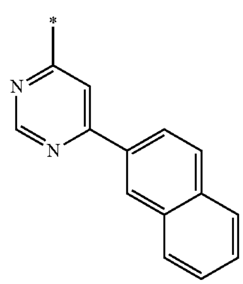
6-102
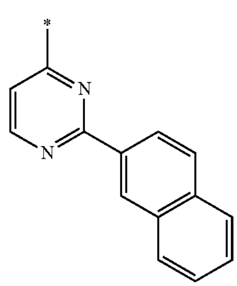
-continued
6-103
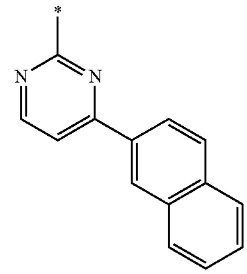
6-104
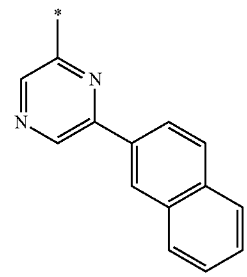
6-105
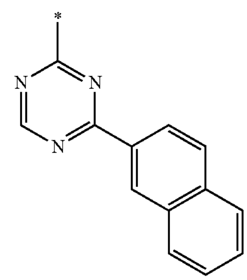
6-106
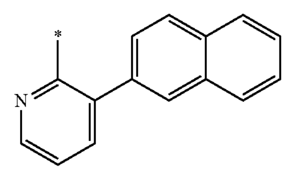
6-107
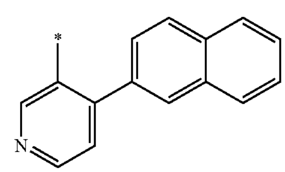
6-108
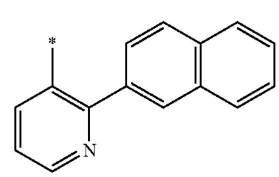
6-109
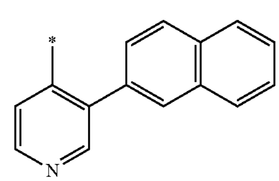

-continued
6-110
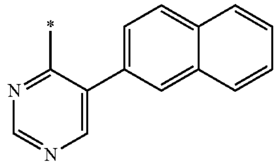
6-111
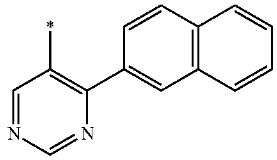
6-112
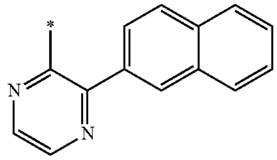
6-113
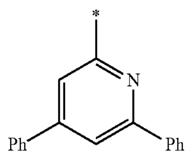
6-114
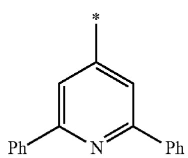
6-115
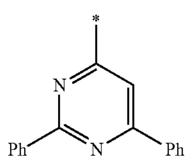
6-116
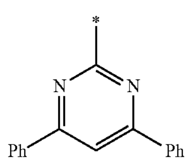
6-117
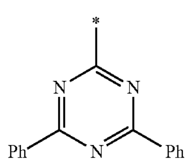
6-118
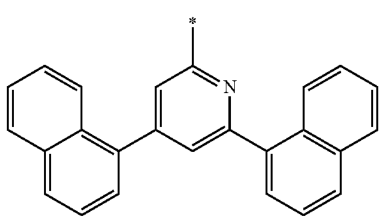
-continued
6-119
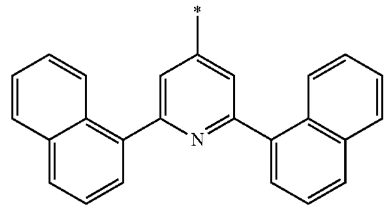
6-120
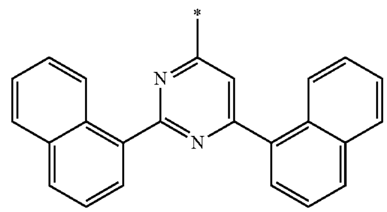
6-121
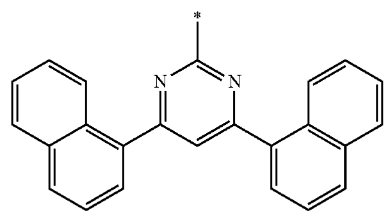
6-122
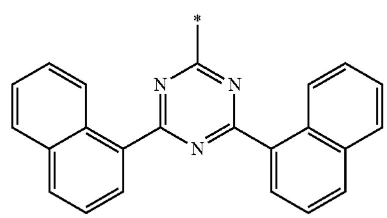
6-123
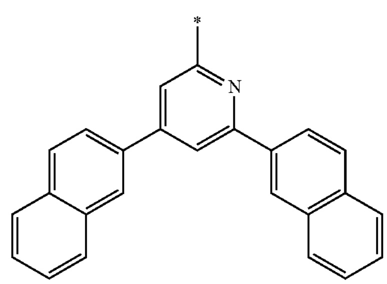
6-124
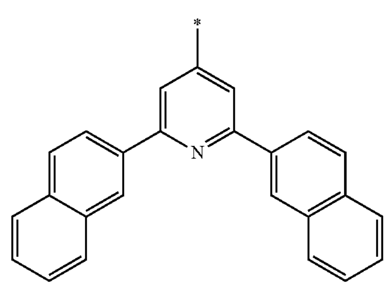

-continued
6-125
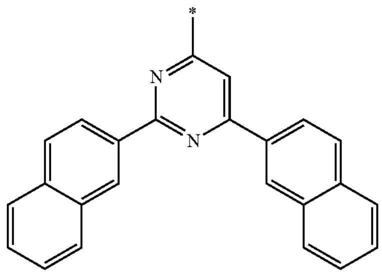
6-126
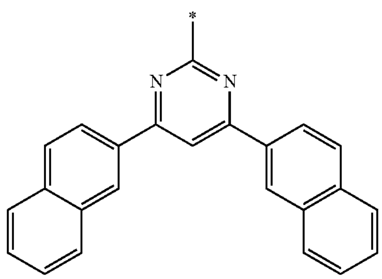
6-127
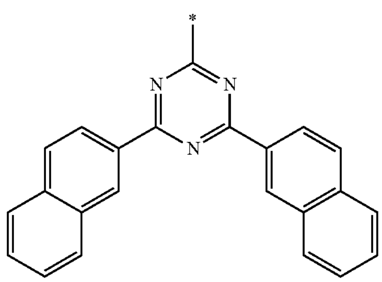
6-128
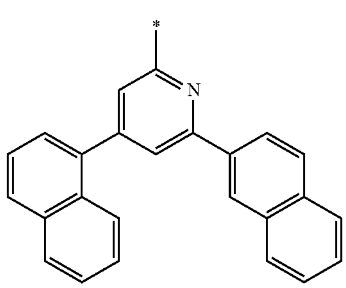
6-129
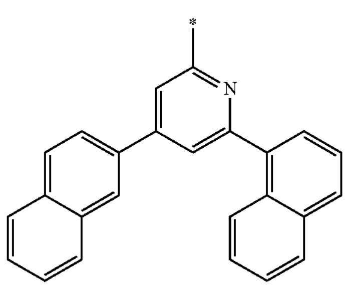
-continued
6-130
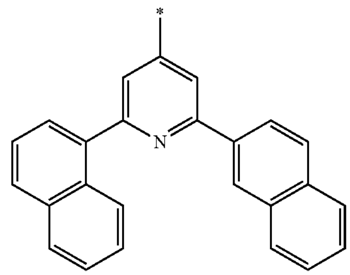
6-131
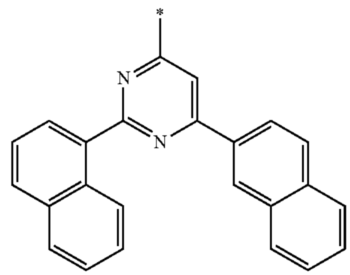
6-132
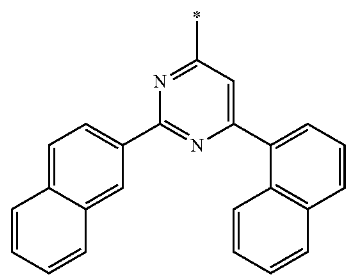
6-133
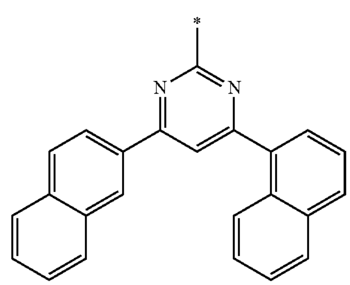
6-134
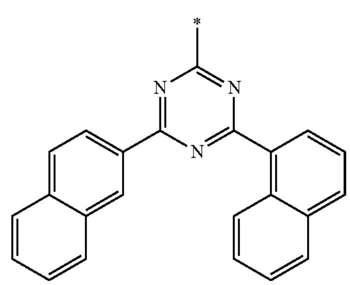
6-135
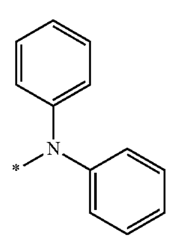

-continued 6-136

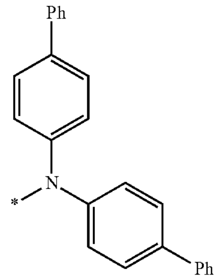

6-137

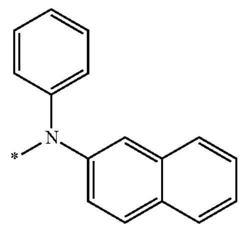

6-138

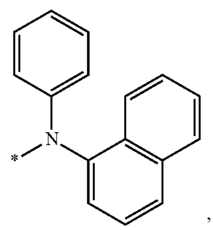

wherein, in Formulae 6-1 to 6-138, t-Bu denotes a tert-butyl group; Ph denotes a phenyl group; and * is a binding site to a neighboring atom;

b11, b12, and b21 are each independently selected from 1, 2, 3, and 4;

$R_{17}$ and $R_{18}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

wherein $Q_1$ to $Q_7$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

14. The organic light-emitting device of claim 1, wherein the first host is represented by one of Formulae 1-11 to 1-26; and the second host is represented by one of Formulae 2-11 and 2-12:

1-11

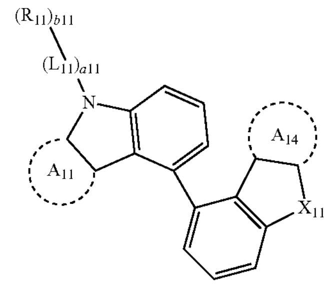

1-12

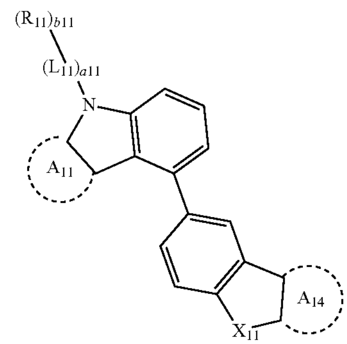

1-13

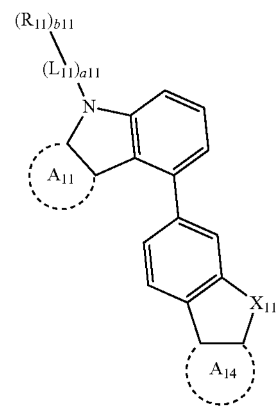

1-14

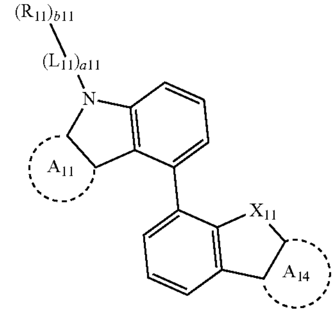

-continued
1-15
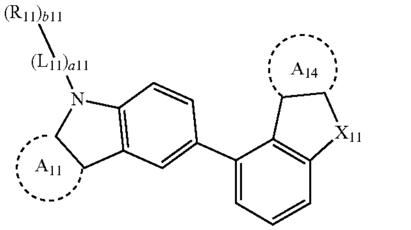
1-16
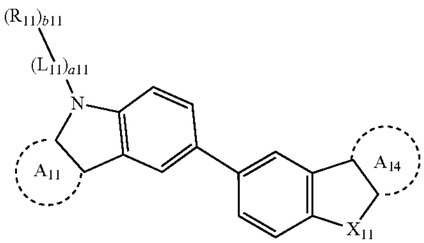
1-17
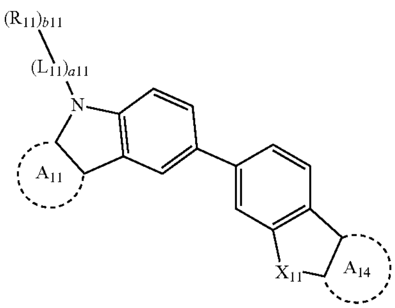
1-18
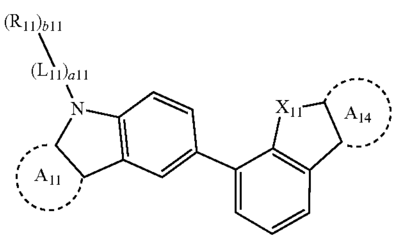
1-19
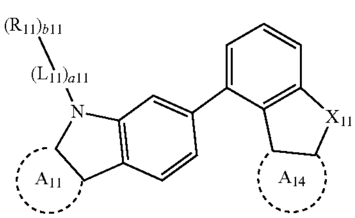
1-20
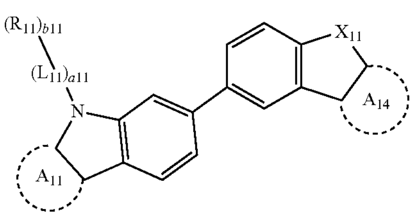
-continued
1-21
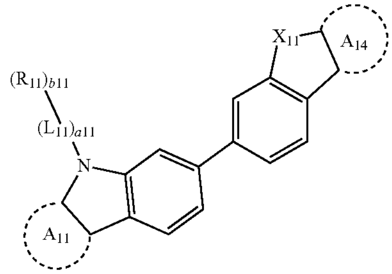
1-22
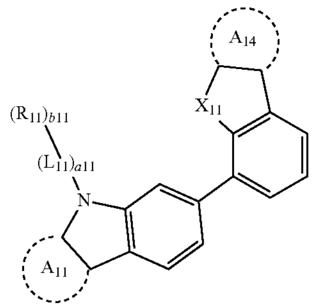
1-23
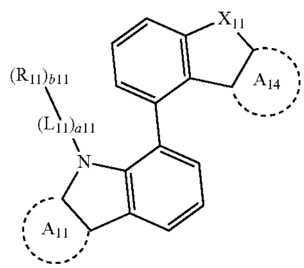
1-24
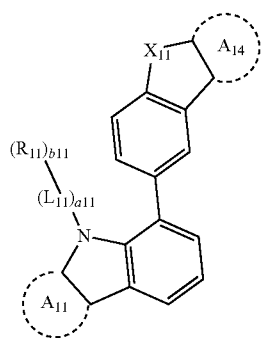
1-25
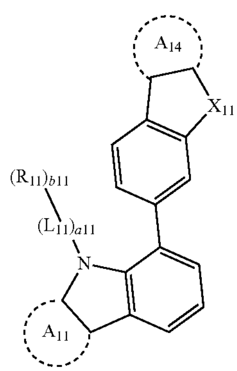

-continued
1-26
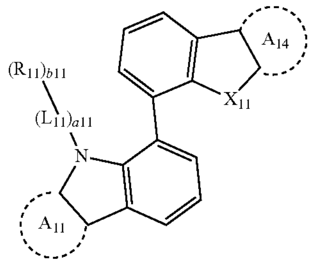
2-11
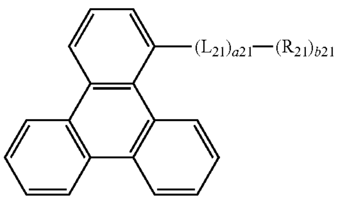
2-12
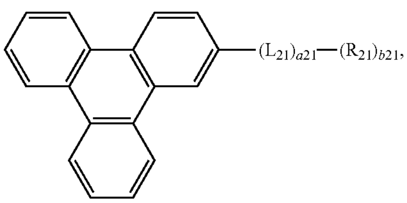
wherein, in Formulae 1-11 to 1-26, 2-11, and 2-12,
$A_{11}$ and $A_{14}$ are each independently selected from a benzene and a naphthalene;
$X_{11}$ is O, S, $C(R_{17})(R_{18})$, $Si(R_{17})(R_{18})$, $P(R_{17})$, $B(R_{17})$, $P(=O)(R_{17})$, or $N-[(L_{12})_{a12}-(R_{12})_{b12}]$;
$L_{11}$, $L_{12}$, and $L_{21}$ are each independently selected from Formulae 4-1 to 4-6 and 4-50 to 4-57;
4-1
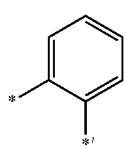
4-2
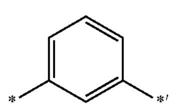
4-3
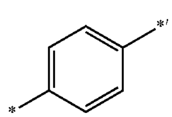
4-4
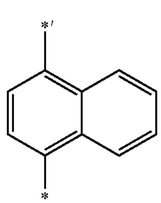
-continued
4-5
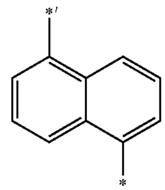
4-6
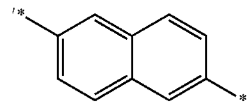
4-50
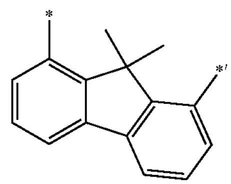
4-51
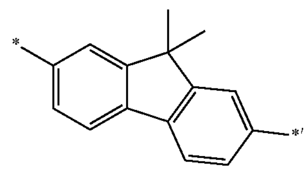
4-52
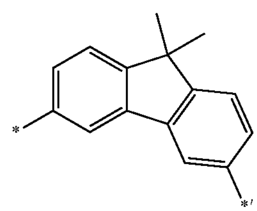
4-53
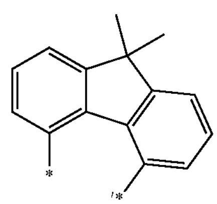
4-54
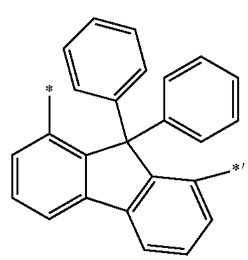
4-55
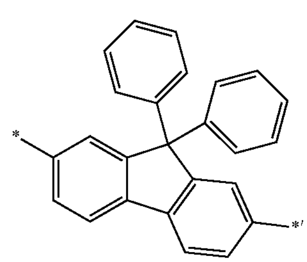

-continued

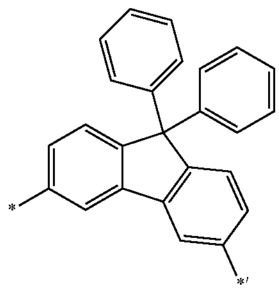

4-56

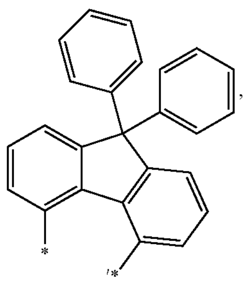

4-57 wherein, in Formulae 4-1 to 4-6 and 4-50 to 4-57, * and *' are each independently a binding site to a neighboring atom;

a11, a12, and a21 are each independently selected from 0, 1, 2, 3, 4, and 5;

$R_{11}$, $R_{12}$, and $R_{21}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein at least one of $R_{11}$ and $R_{12}$ is selected from Formulae 6-1 to 6-51 and 6-135 to 6-138, and $R_{21}$ is selected from Formulae 6-52 to 6-134;

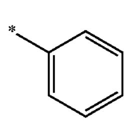

6-1

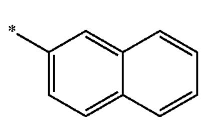

6-2

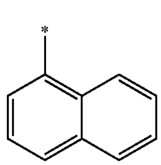

6-3

-continued

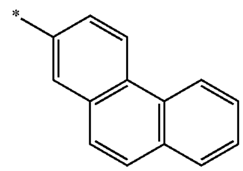

6-4

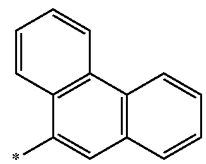

6-5

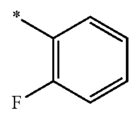

6-6

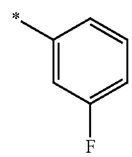

6-7

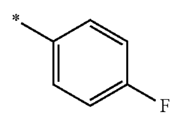

6-8

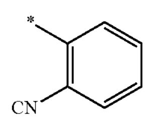

6-9

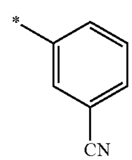

6-10

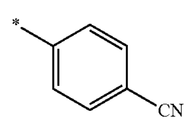

6-11

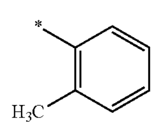

6-12

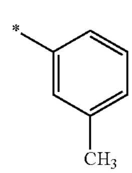

6-13

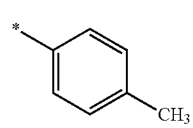

6-14

-continued
6-15
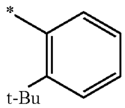
6-16
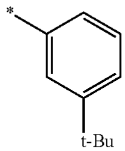
6-17
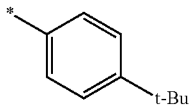
6-18
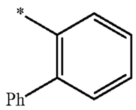
6-19
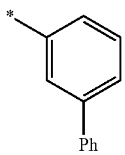
6-20
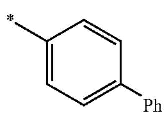
6-21
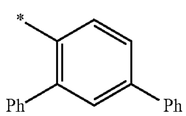
6-22
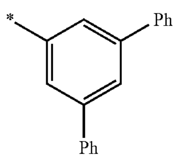
6-23
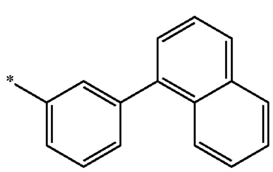
6-24
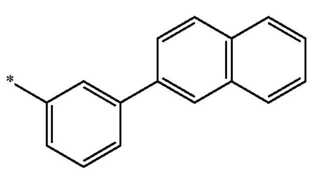
6-25
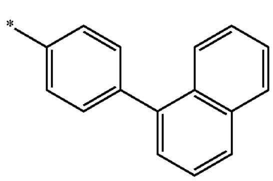
-continued
6-26
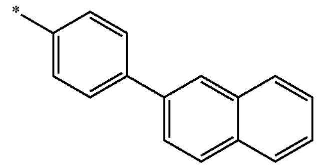
6-27
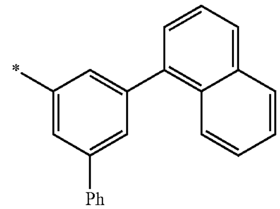
6-28
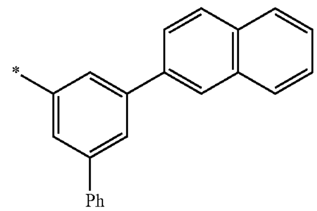
6-29
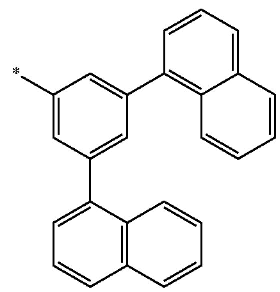
6-30
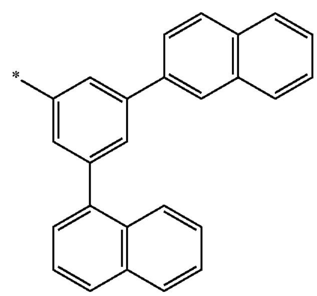
6-31
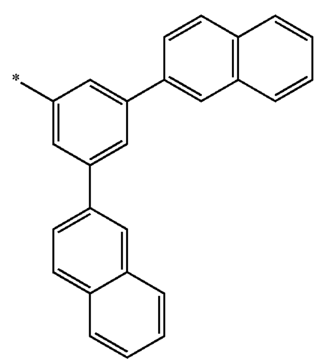

-continued
6-32
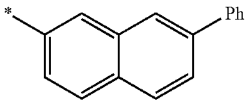
6-33
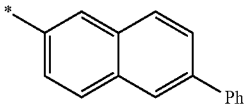
6-34
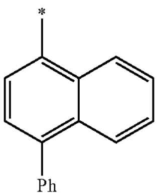
6-35
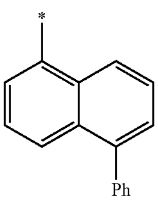
6-36
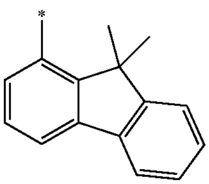
6-37
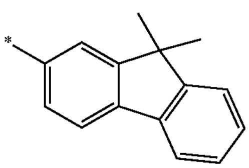
6-38
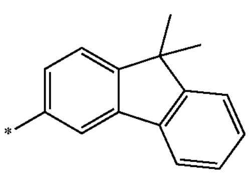
6-39
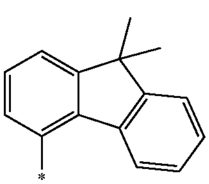
6-40
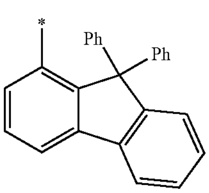
-continued
6-41
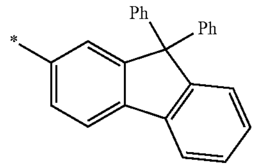
6-42
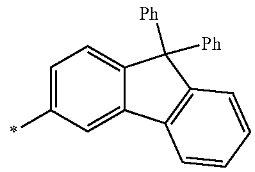
6-43
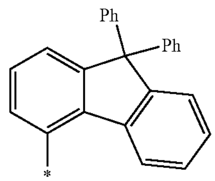
6-44
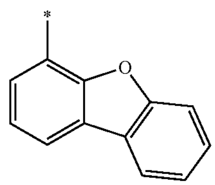
6-45
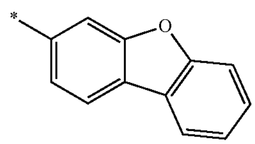
6-46
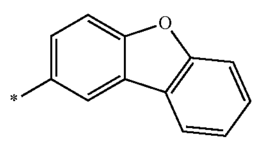
6-47
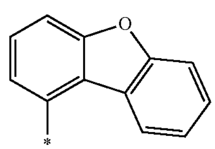
6-48
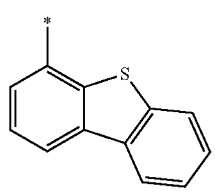
6-49
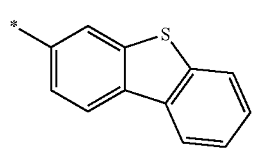

-continued
6-50
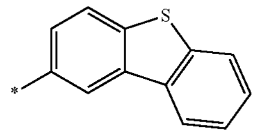
6-51
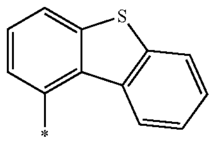
6-52
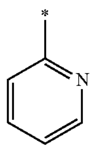
6-53
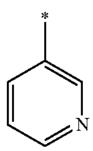
6-54
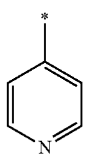
6-55
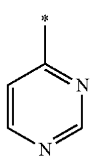
6-56
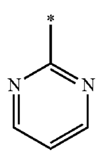
6-57
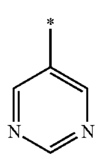
6-58
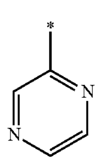
6-59
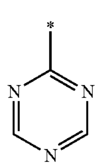
-continued
6-60
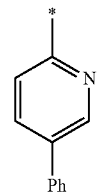
6-61
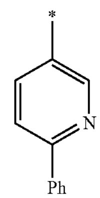
6-62
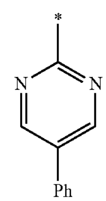
6-63
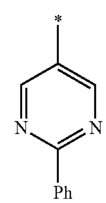
6-64
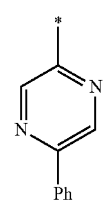
6-65
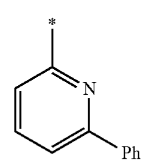
6-66
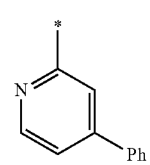
6-67
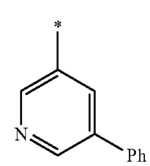

-continued
6-68
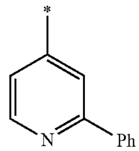
6-69
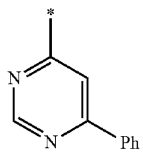
6-70
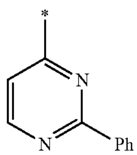
6-71
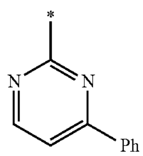
6-72
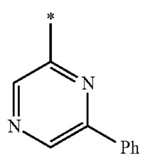
6-73
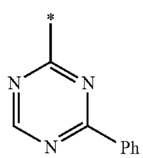
6-74
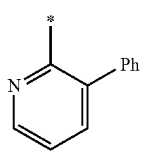
6-75
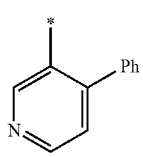
6-76
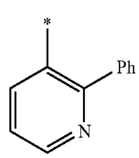
6-77
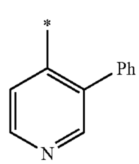
-continued
6-78
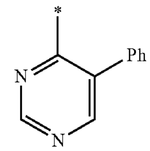
6-79
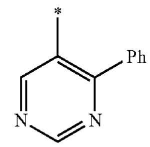
6-80
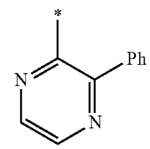
6-81
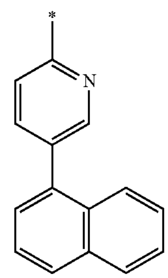
6-82
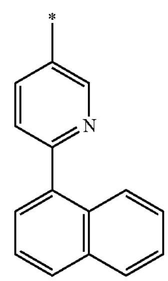
6-83
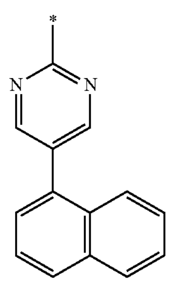
6-84
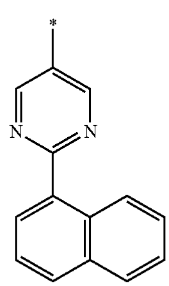

6-85
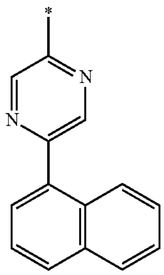
6-86
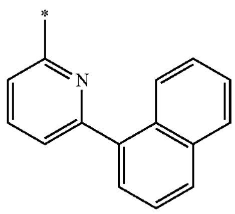
6-87
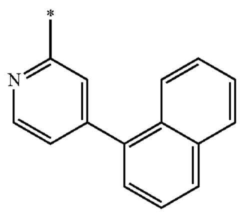
6-88
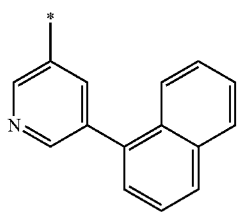
6-89
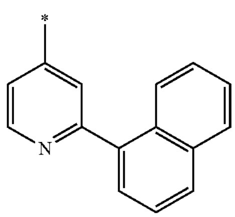
6-90
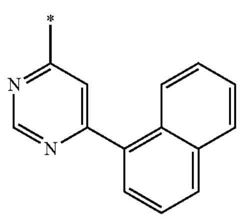
6-91
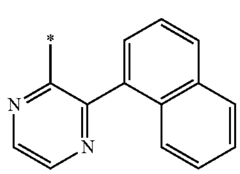
6-92
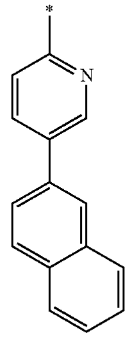
6-93
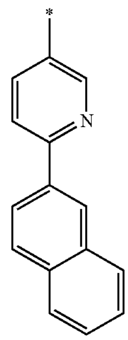
6-94
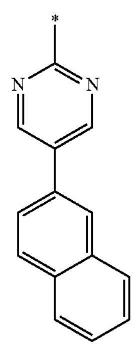
6-95
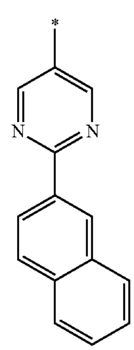

-continued
6-96
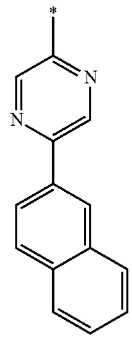
6-97
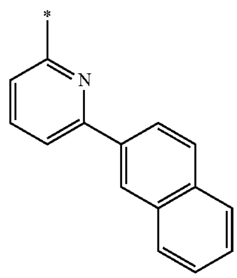
6-98
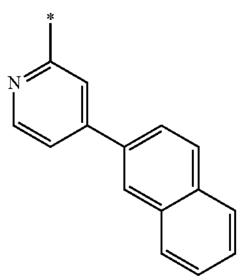
6-99
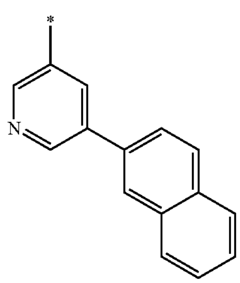
6-100
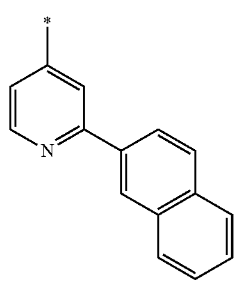
-continued
6-101
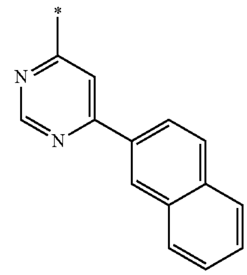
6-102
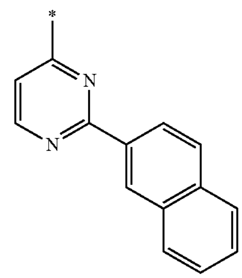
6-103
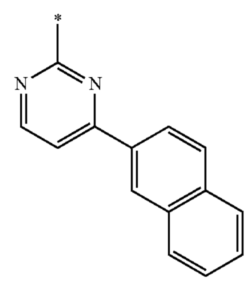
6-104
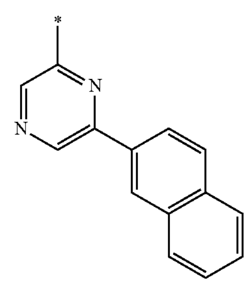
6-105
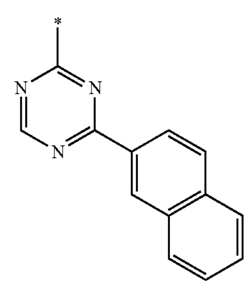
6-106
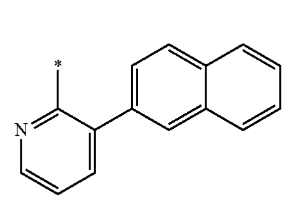

-continued
6-107
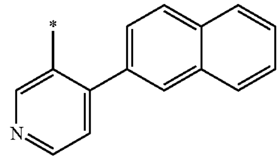
6-108
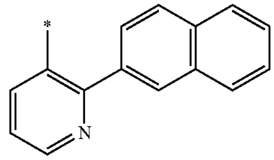
6-109
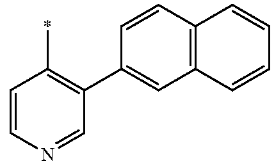
6-110
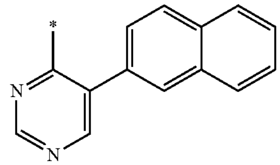
6-111
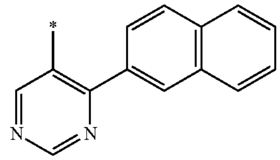
6-112
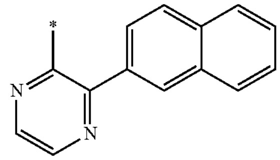
6-113
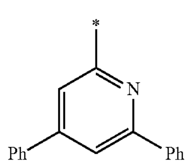
6-114
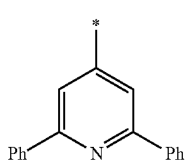
6-115
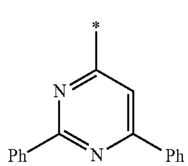
-continued
6-116
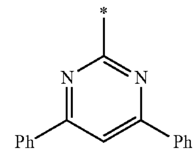
6-117
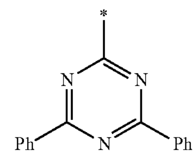
6-118
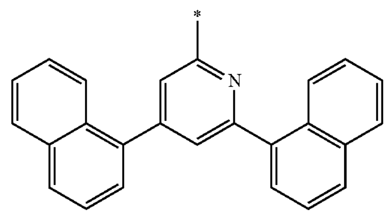
6-119
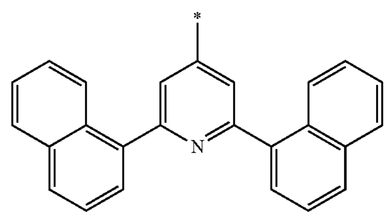
6-120
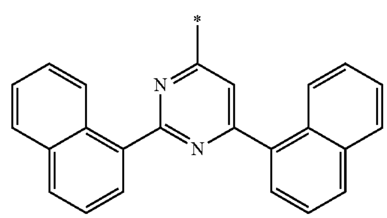
6-121
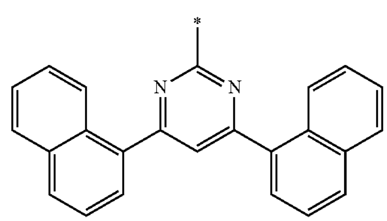
6-122
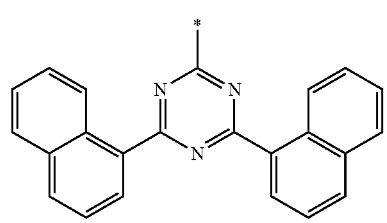

-continued
6-123
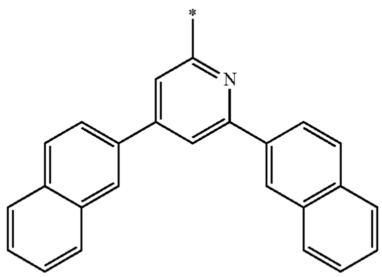
6-124
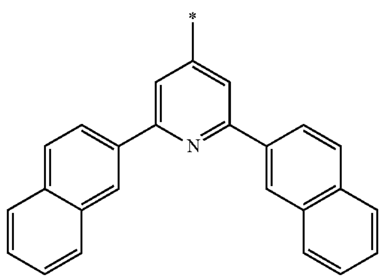
6-125
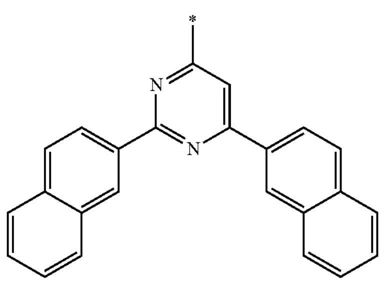
6-126
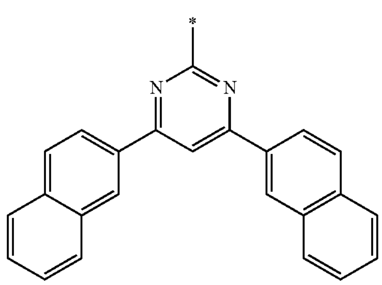
6-127
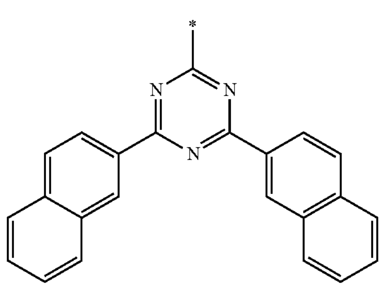
-continued
6-128
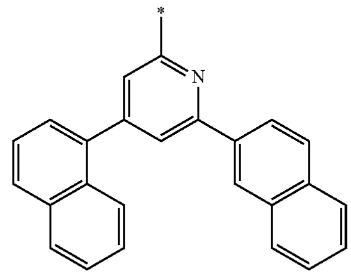
6-129
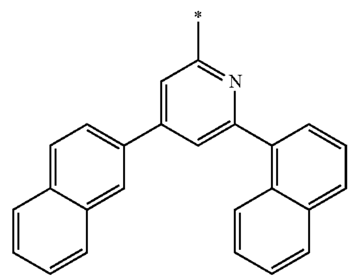
6-130
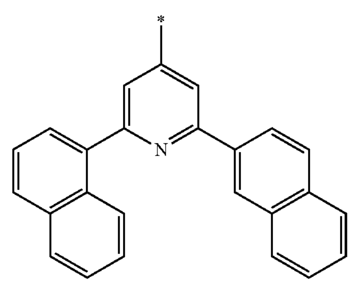
6-131
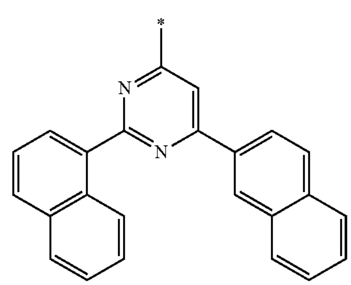
6-132
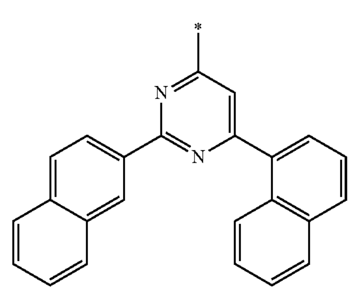

-continued 6-133

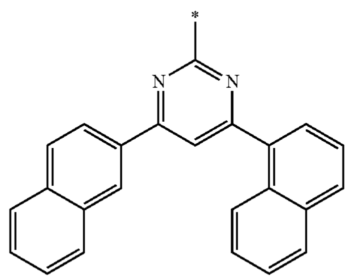

6-134

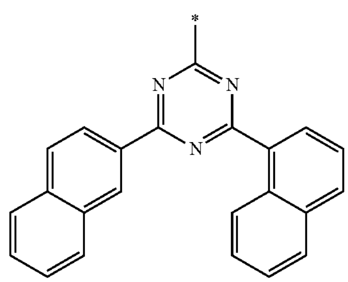

6-135

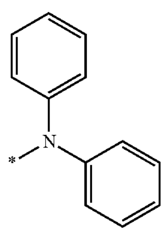

6-136

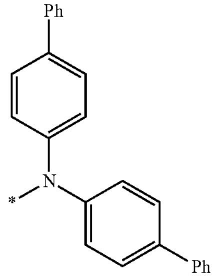

-continued 6-137

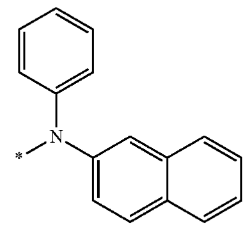

6-138

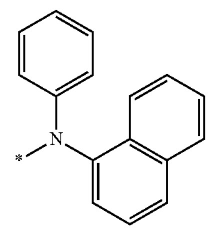

, wherein, in Formulae 6-1 to 6-138, t-Bu denotes a tert-butyl group; Ph denotes a phenyl group; and * is a binding site to a neighboring atom;

b11, b12, and b21 are each independently selected from 1, 2, 3, and 4;

$R_{17}$ and $R_{18}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

wherein $Q_1$ to $Q_7$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

15. The organic light-emitting device of claim 1, wherein the first host is selected from Compounds 101A to 135A, 141A to 146A, and 148A to 206A, and the second host is selected from Compounds 301A to 342A:

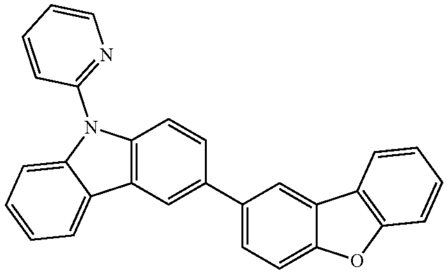
101A
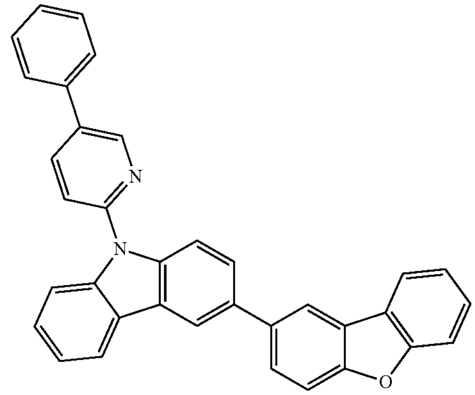
102A
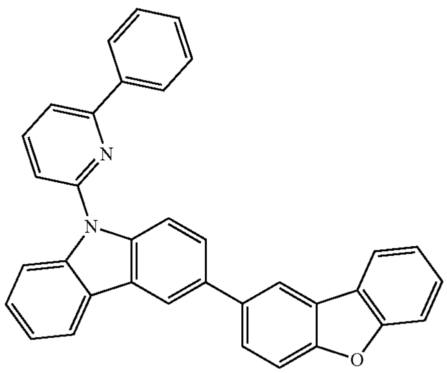
103A
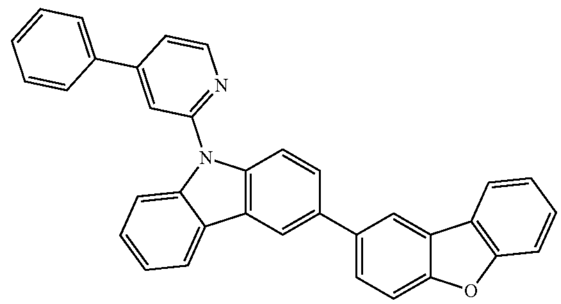
104A
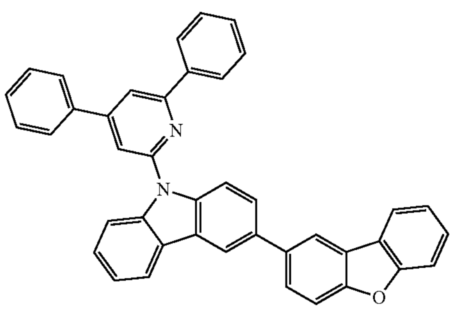
105A
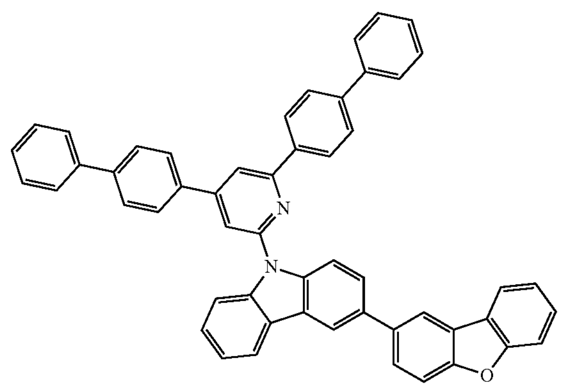
106A
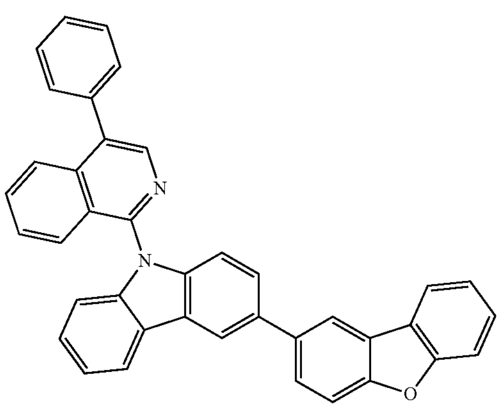
107A
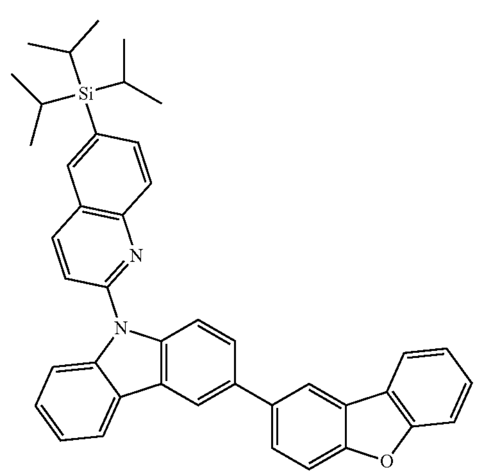
108A -continued
109A
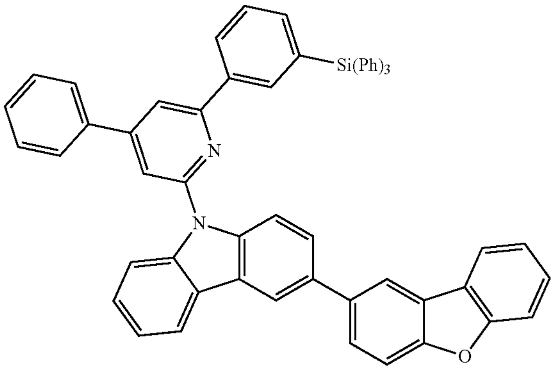
110A
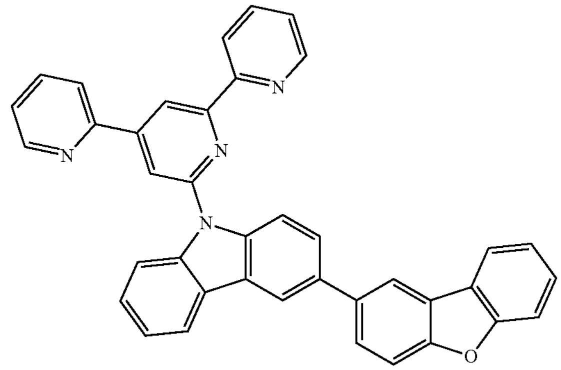
111A
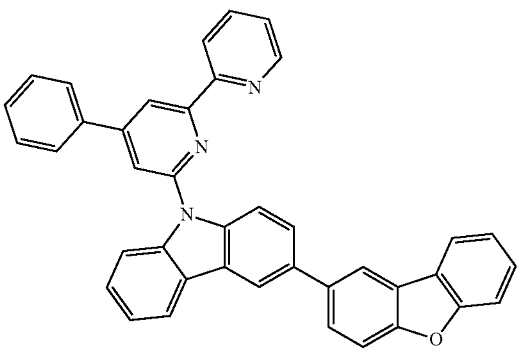
112A
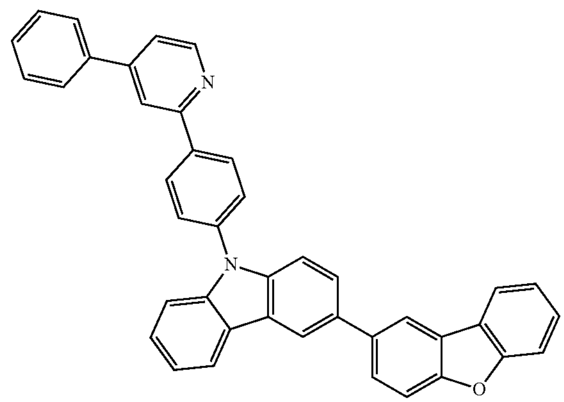
113A
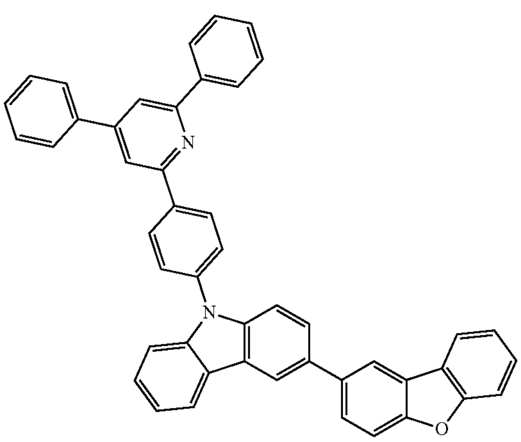
114A
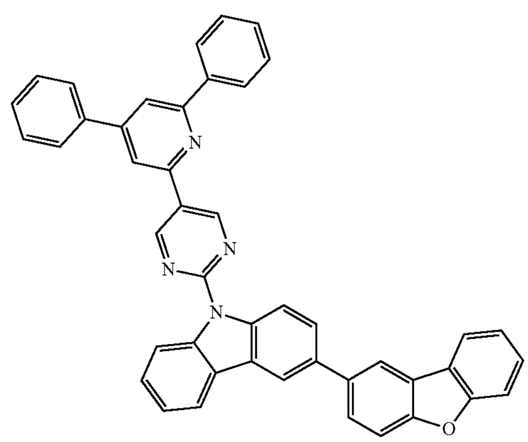
115A
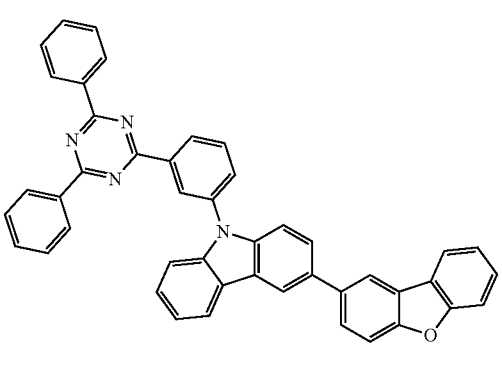
116A
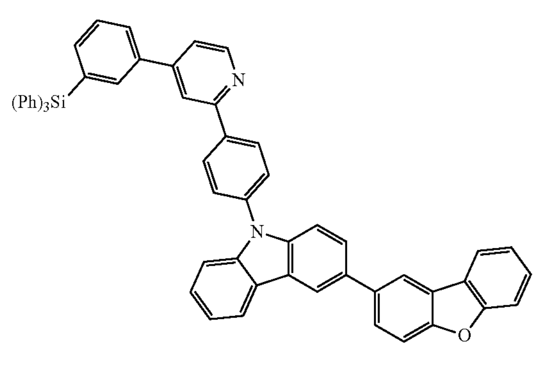

-continued
117A
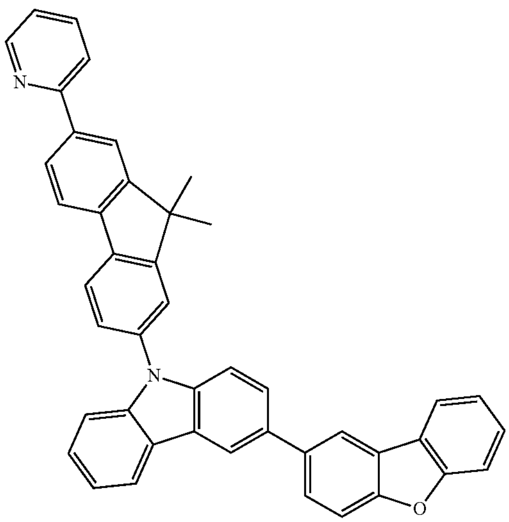
118A
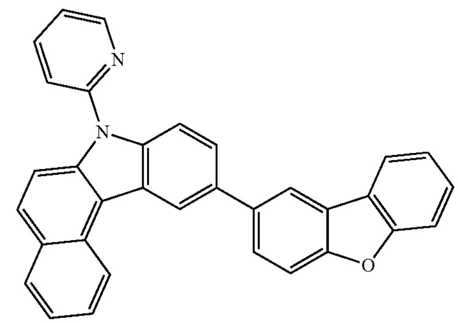
119A
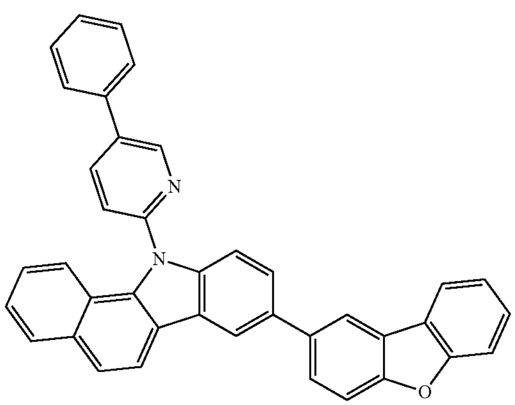
120A
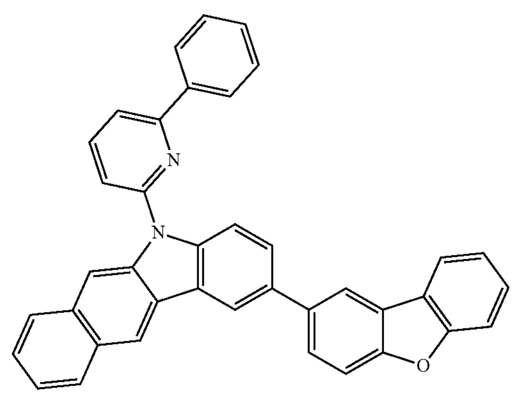
121A
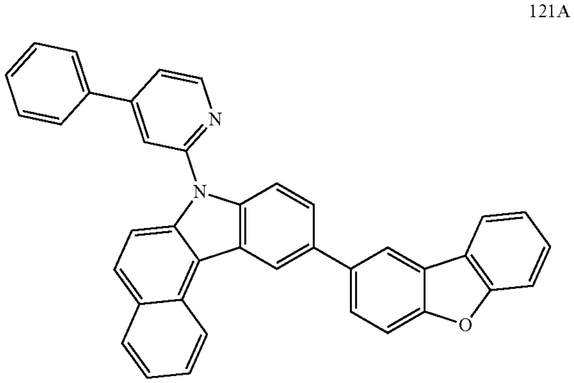
122A
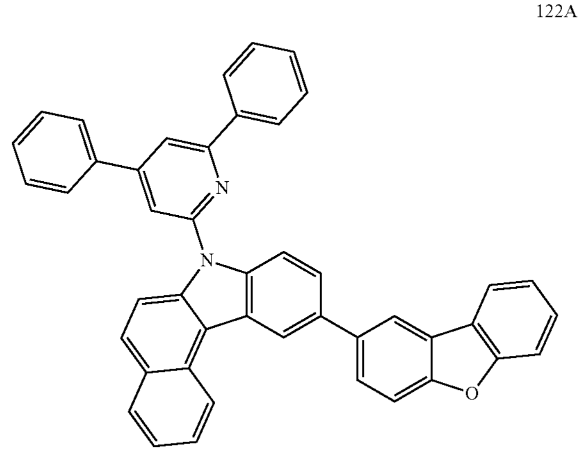

-continued
123A
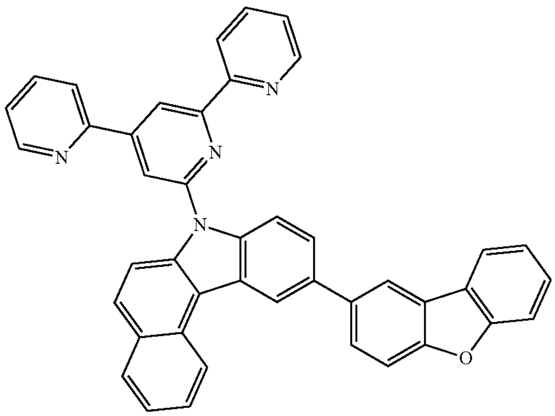
124A
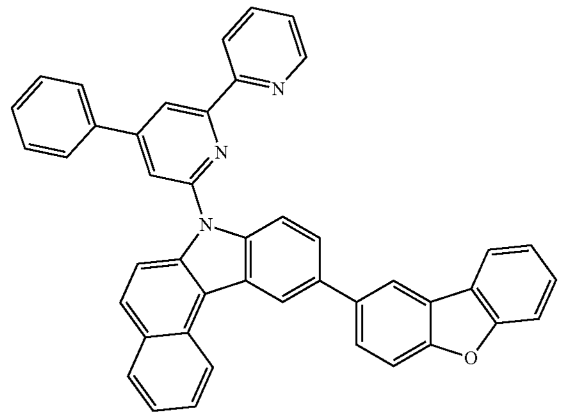
125A
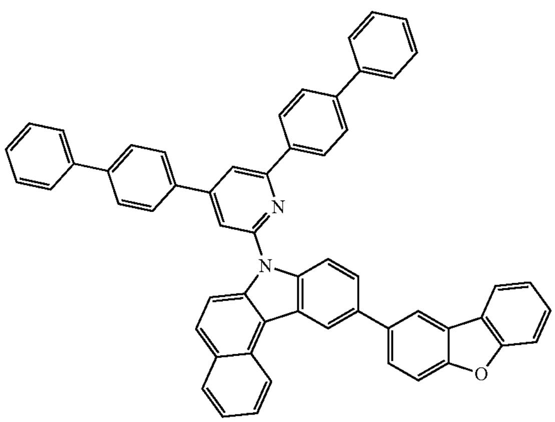
126A
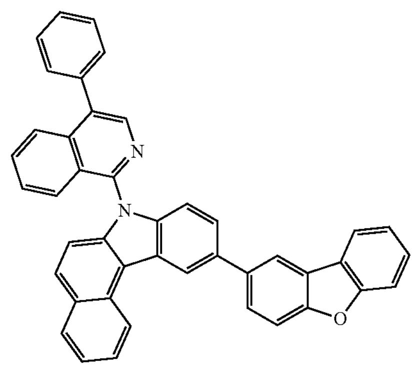
127A
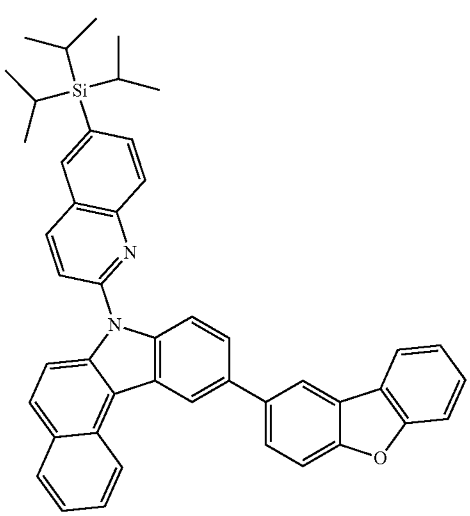
128A
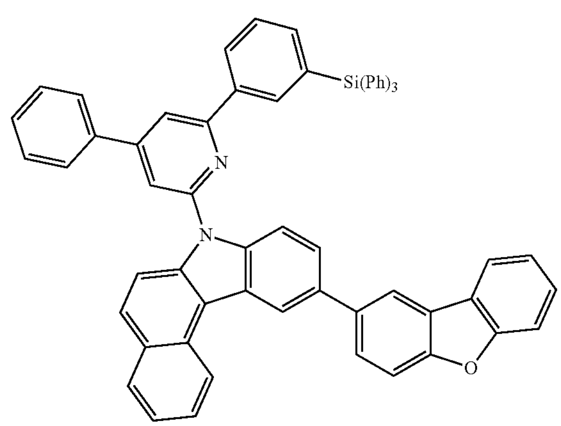

-continued
129A
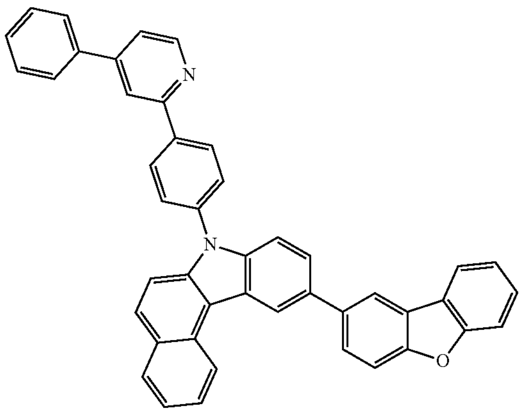
130A
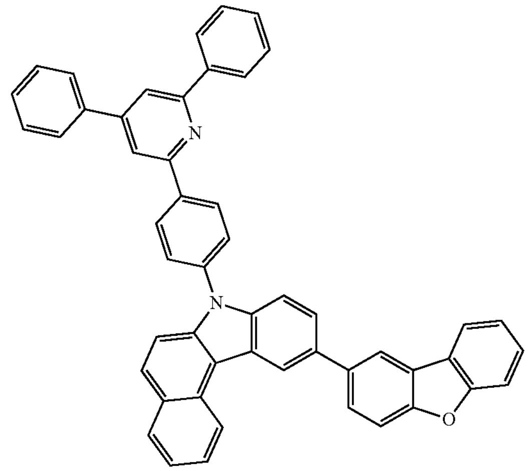
131A
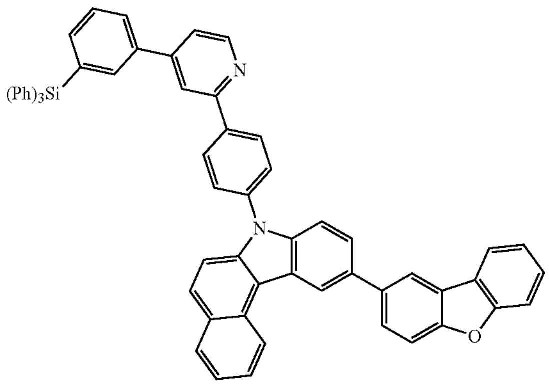
132A
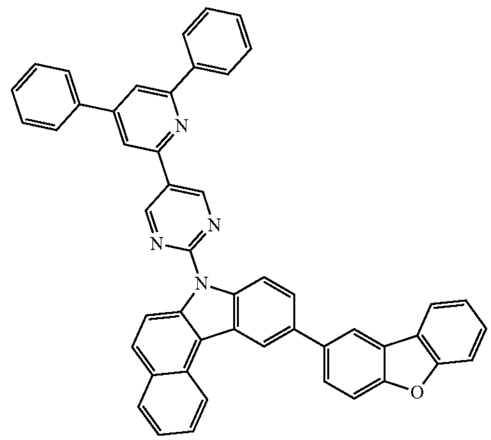
133A
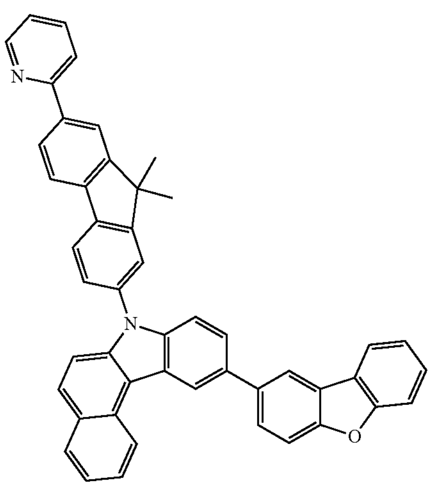
134A
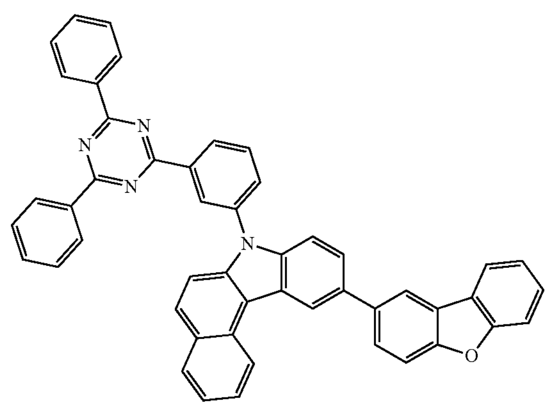

-continued
135A
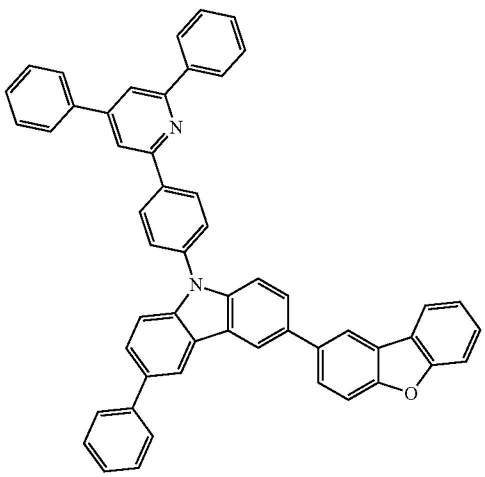
141A
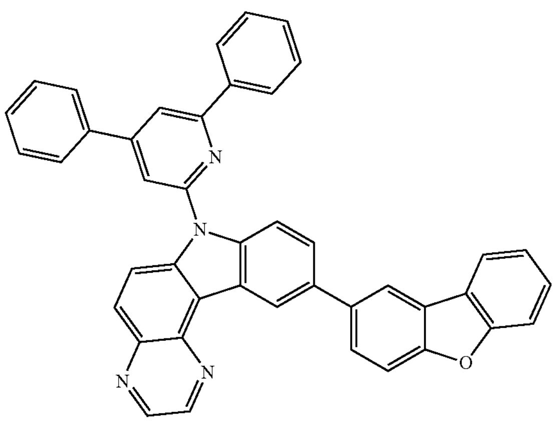
142A
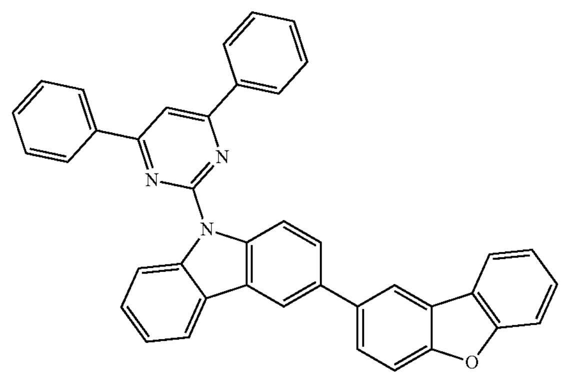
143A
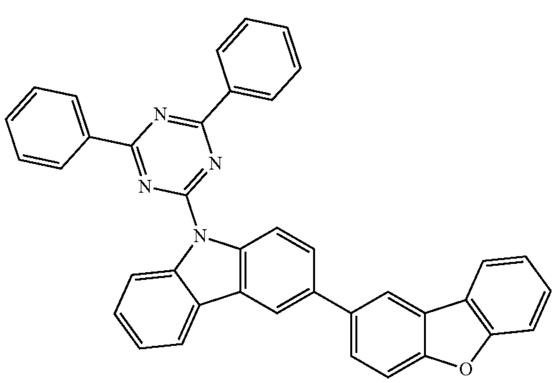
144A
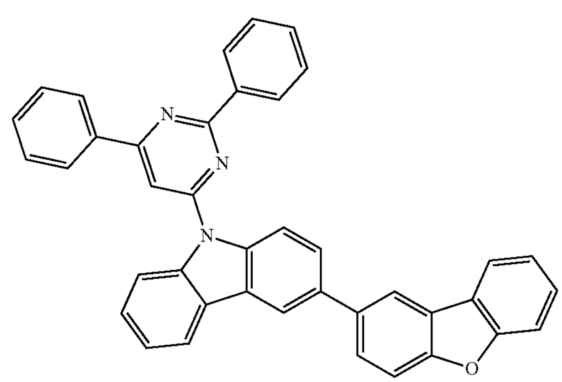

-continued
145A
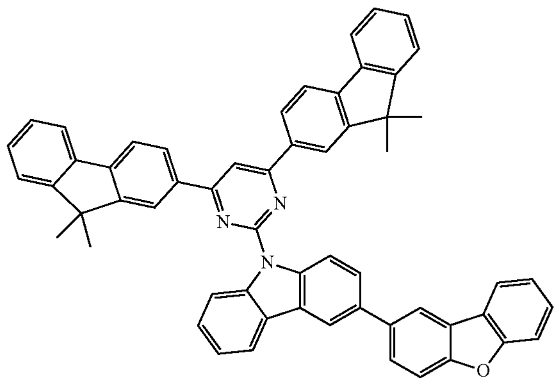
146A
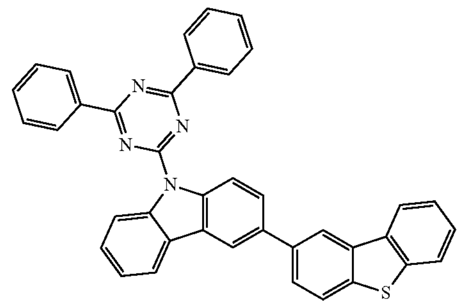
148A
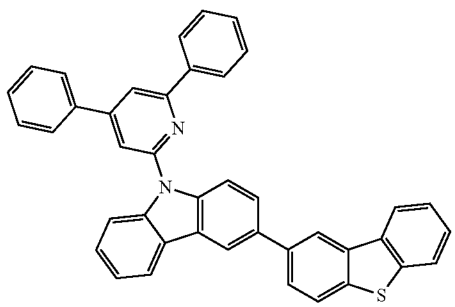
149A
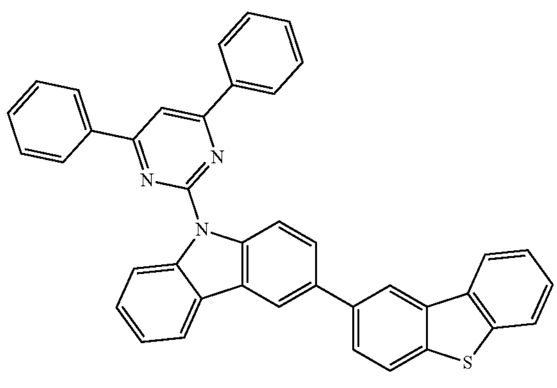
150A
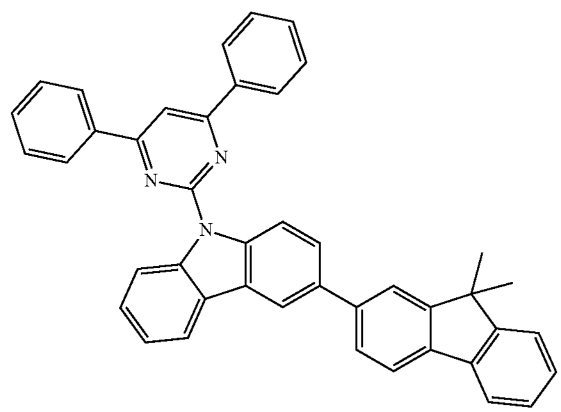
151A
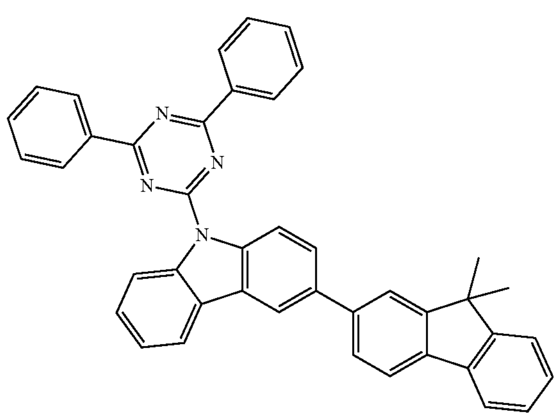
152A
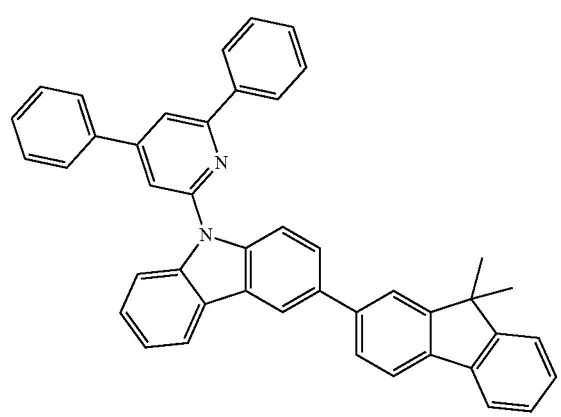

-continued
153A
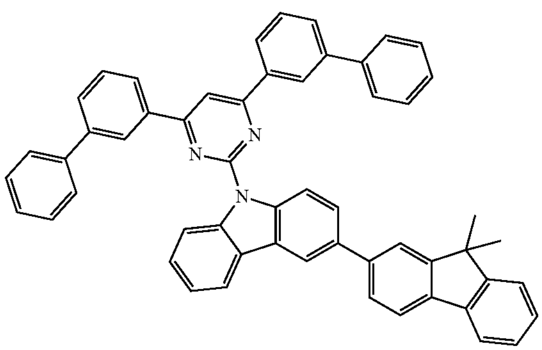
154A
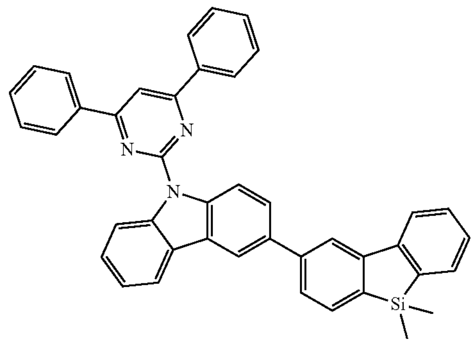
155A
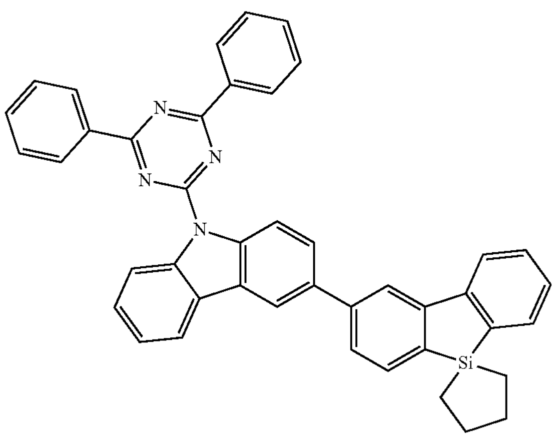
156A
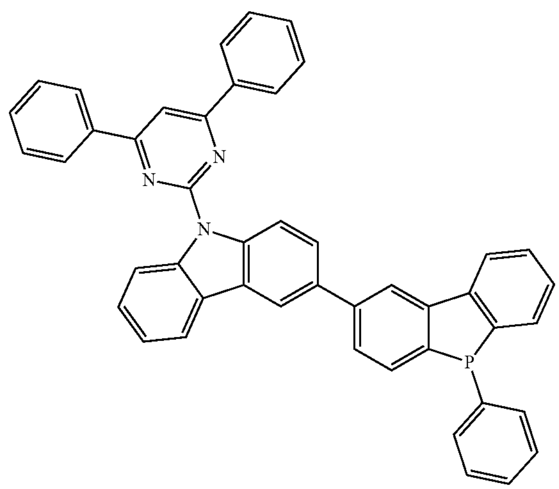
157A
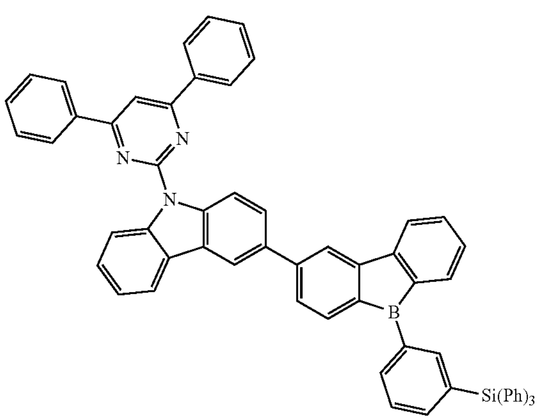
158A
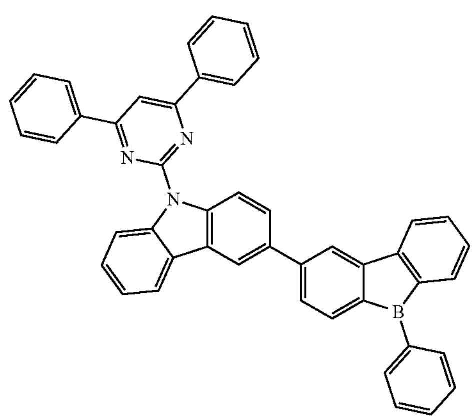

-continued
159A
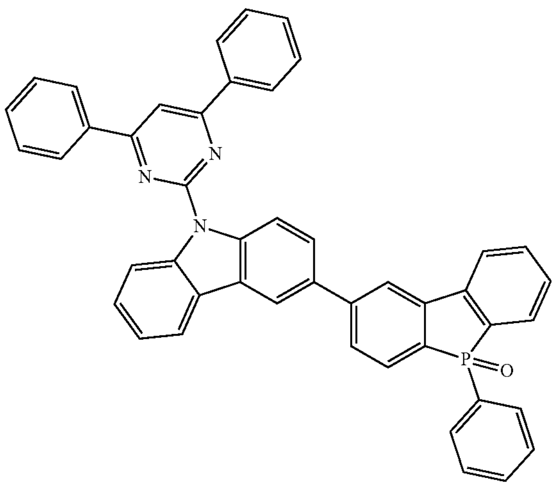
160A
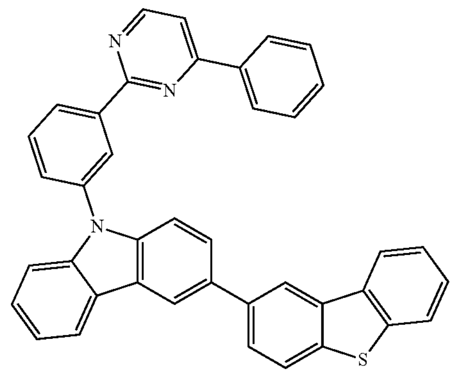
161A
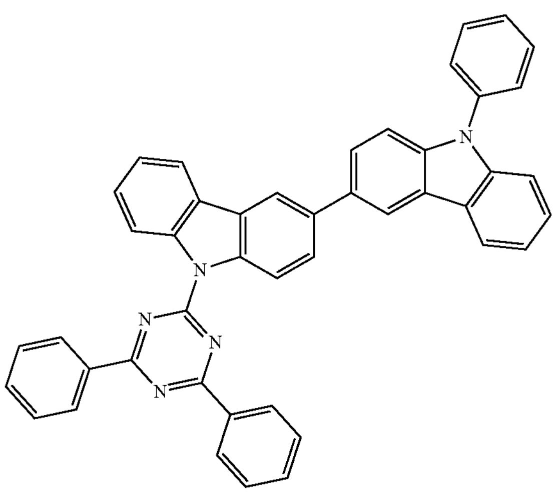
162A
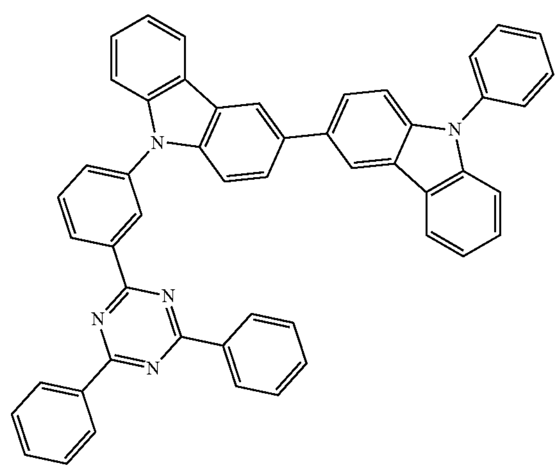
163A
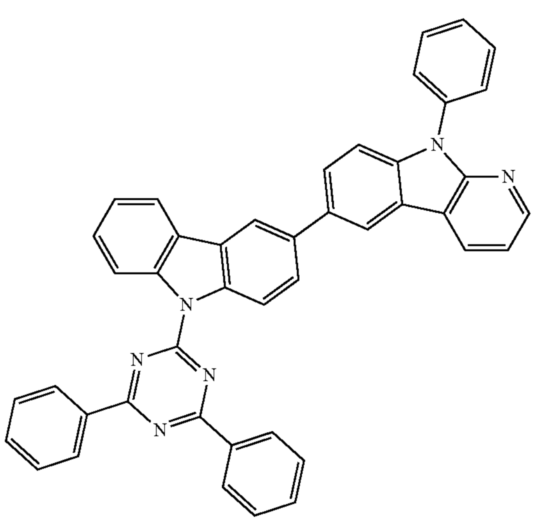
164A
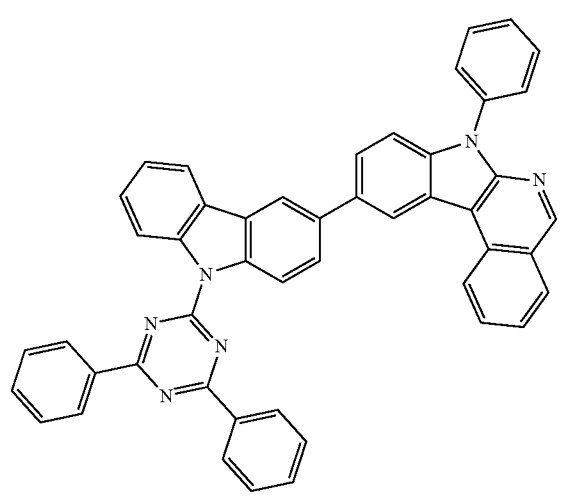

-continued
165A
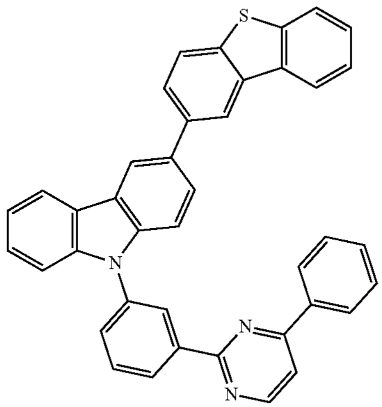
166A
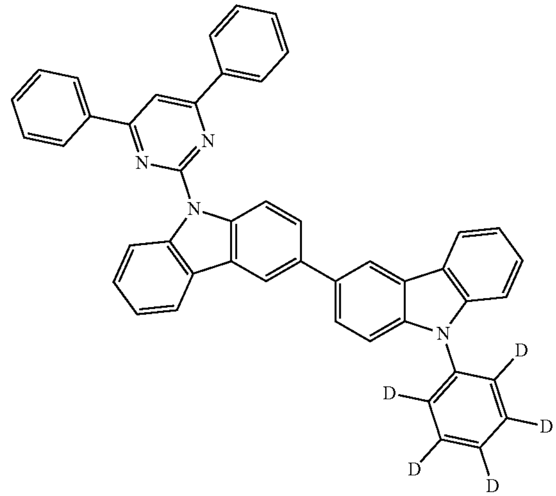
167A
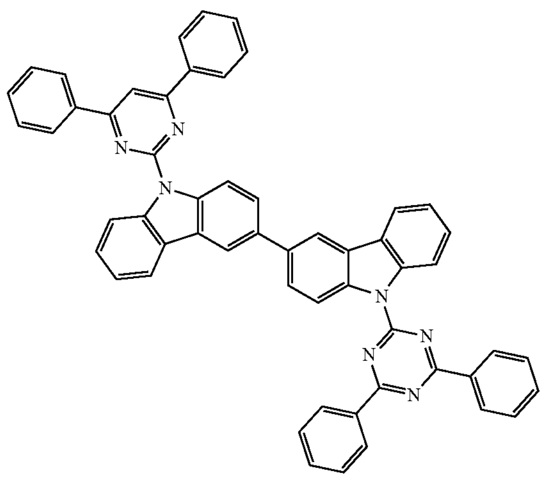
168A
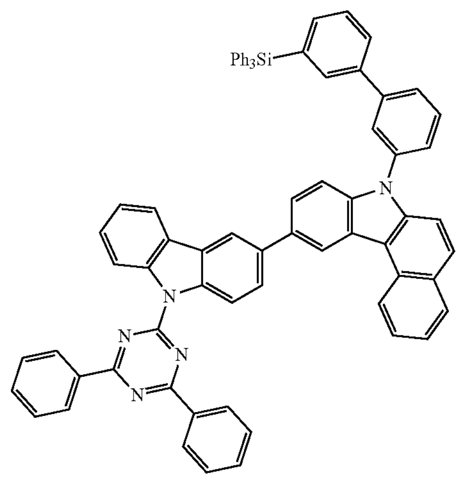
169A
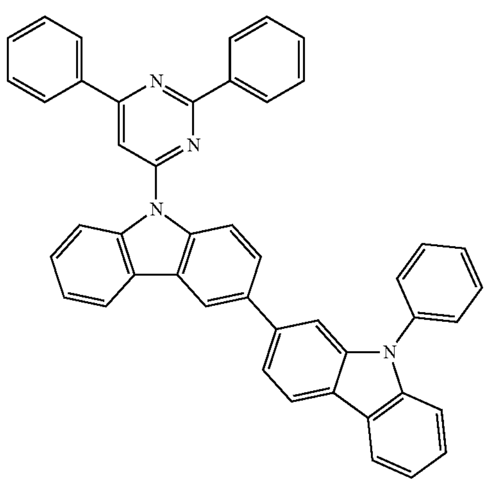
170A
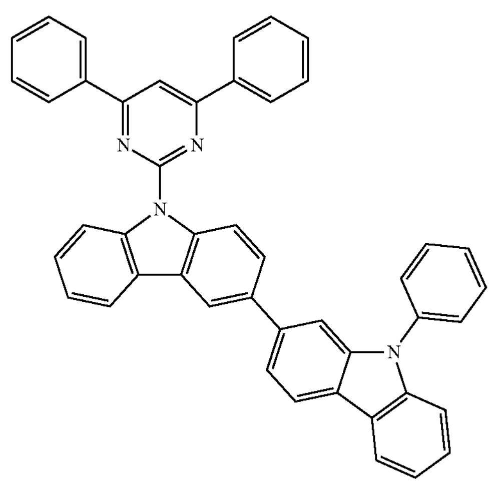

-continued
171A
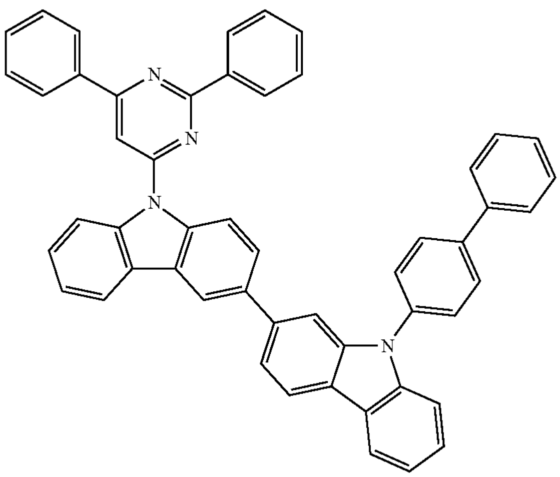
172A
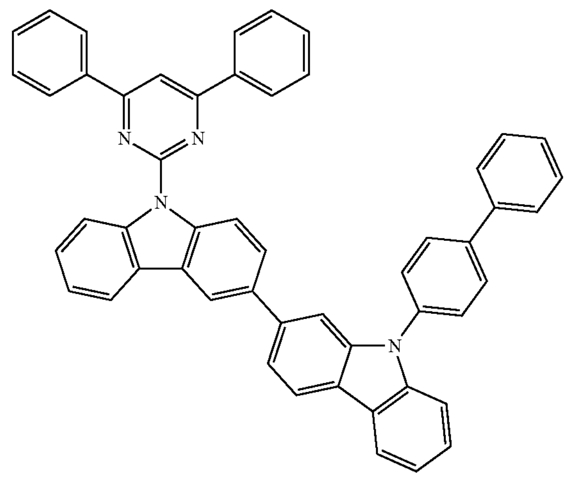
173A
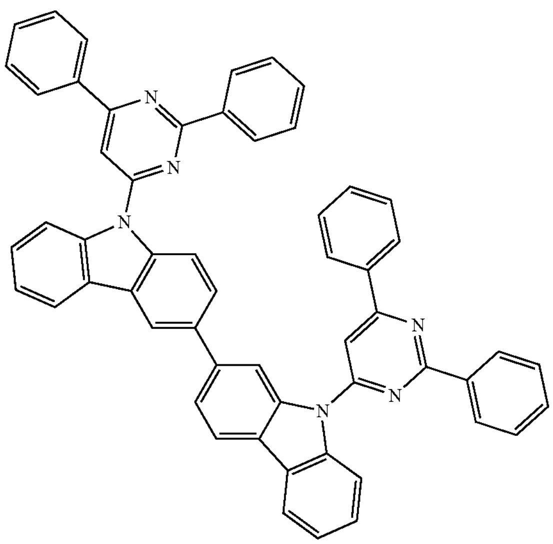
174A
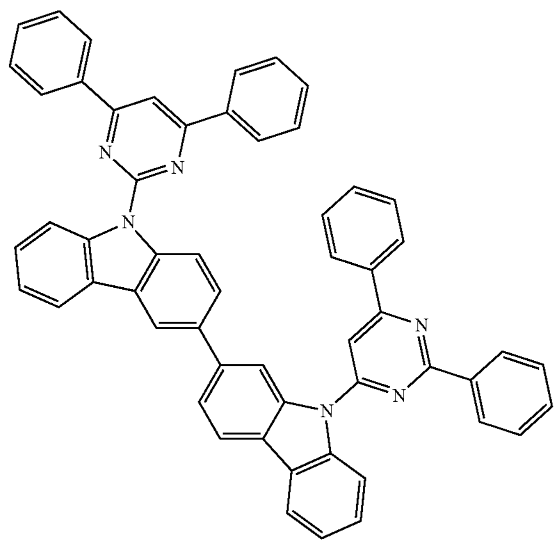
175A
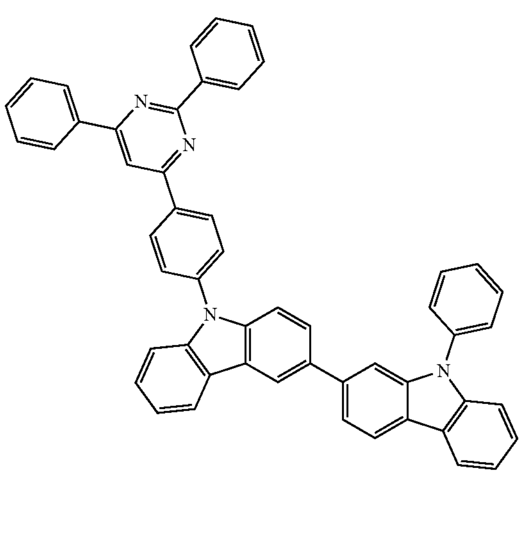
176A
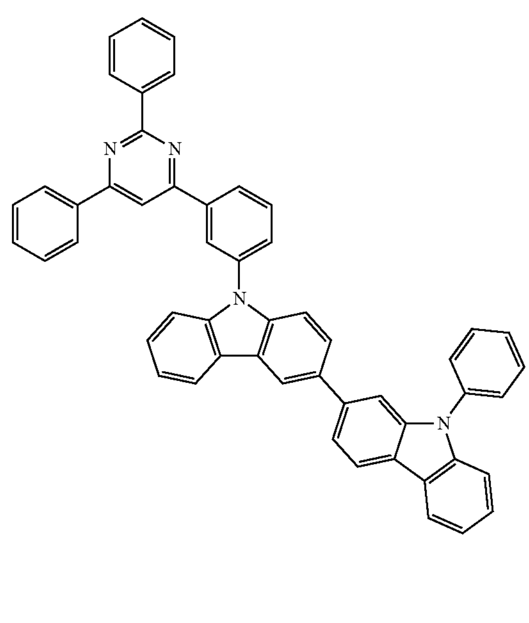

-continued
177A
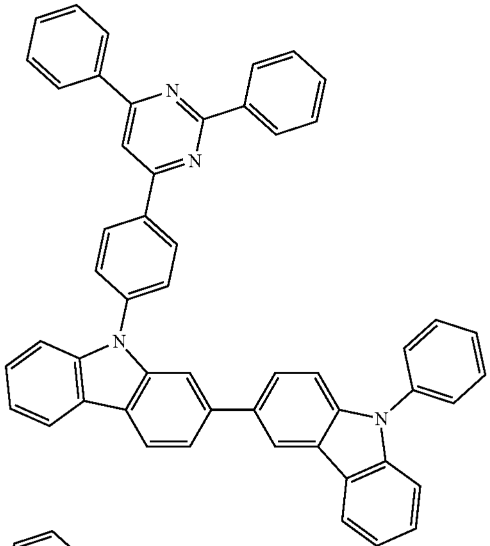
178A
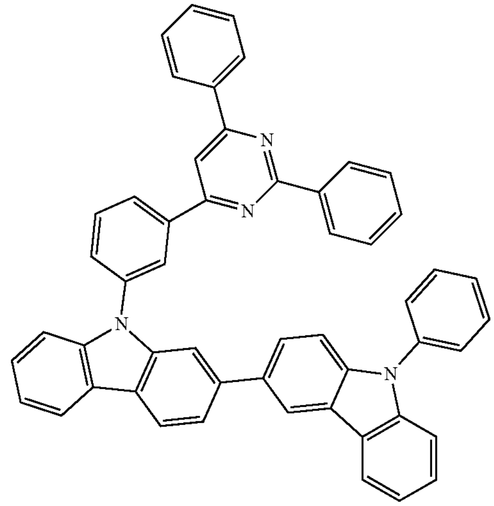
179A
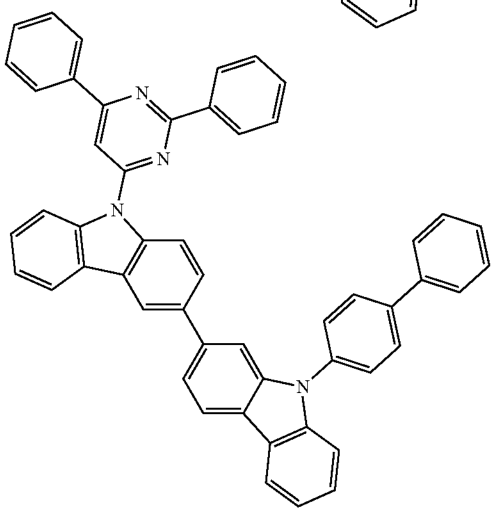
180A
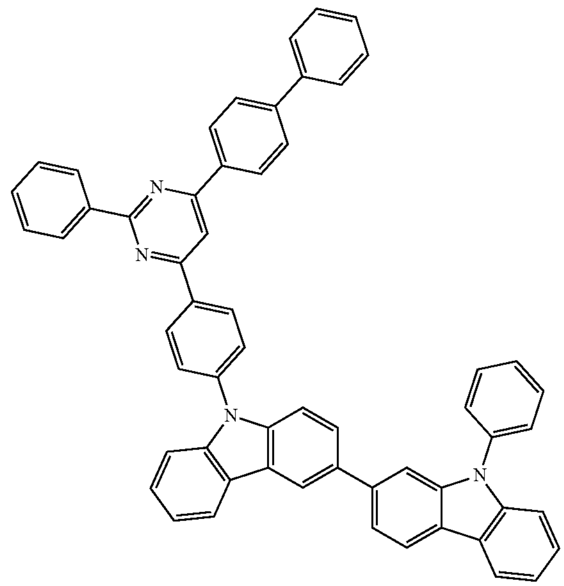
181A
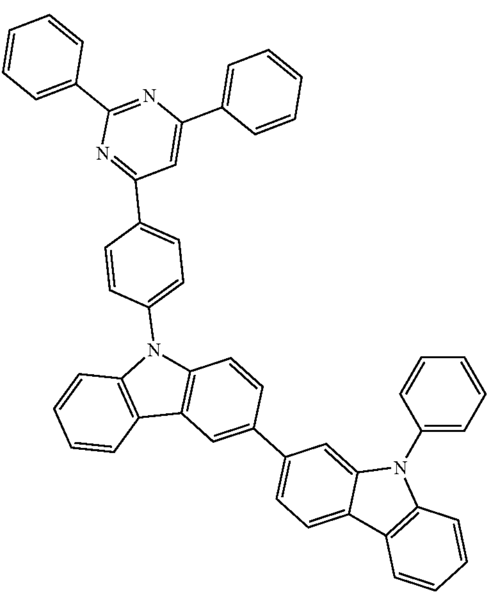
182A
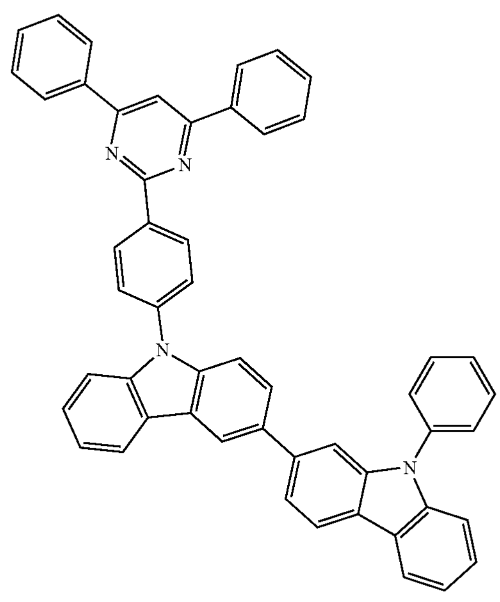

-continued
183A
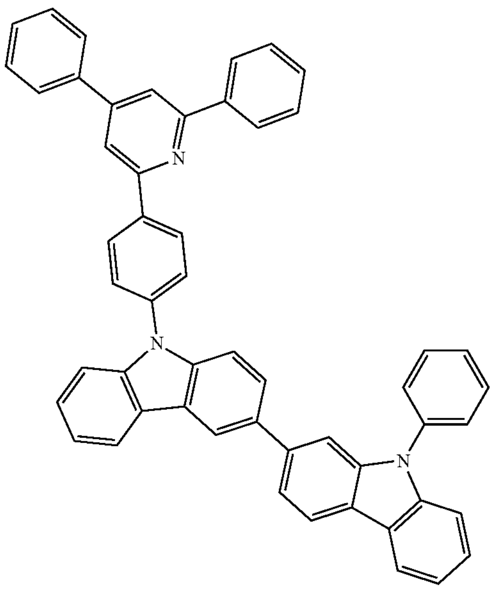
184A
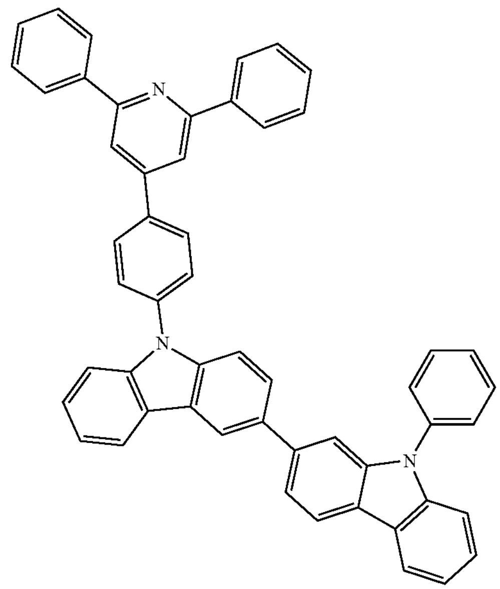
185A
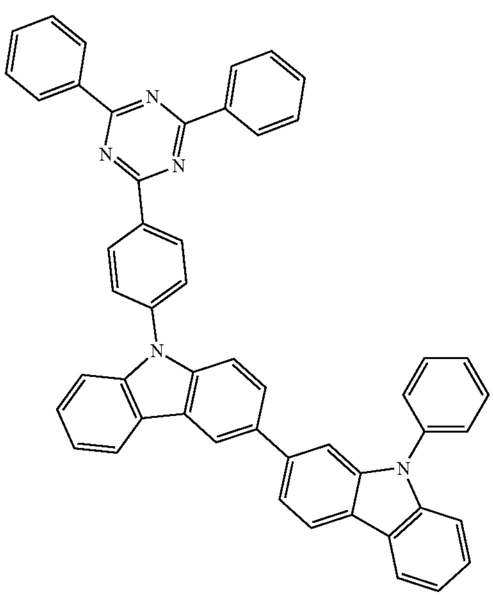
186A
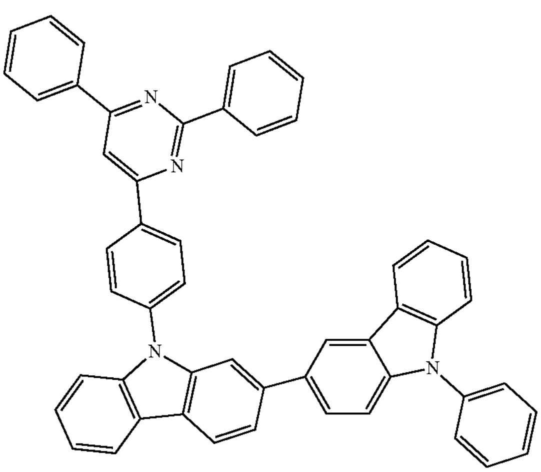

-continued
187A
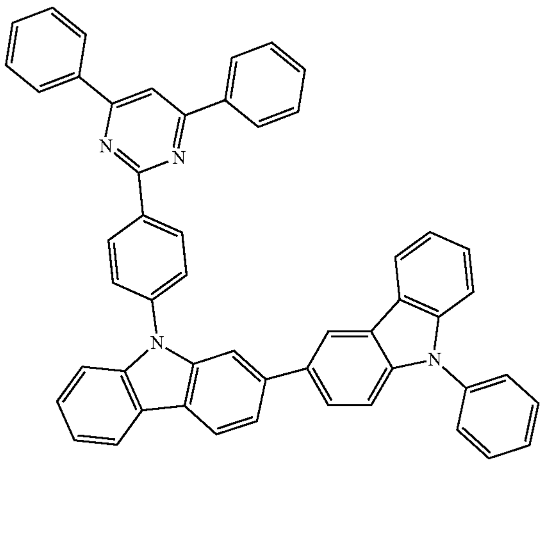
188A
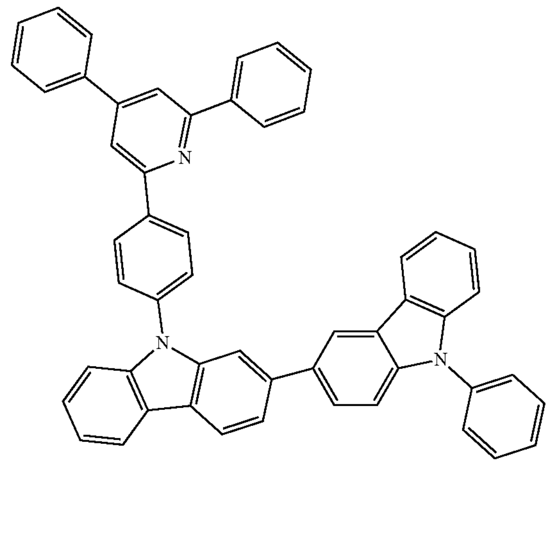
189A
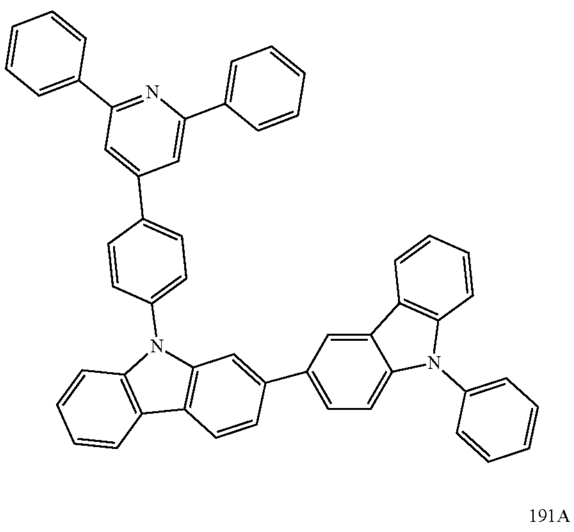
190A
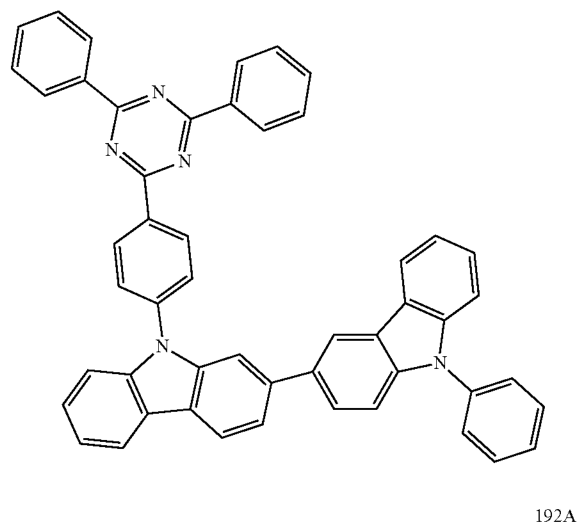
191A
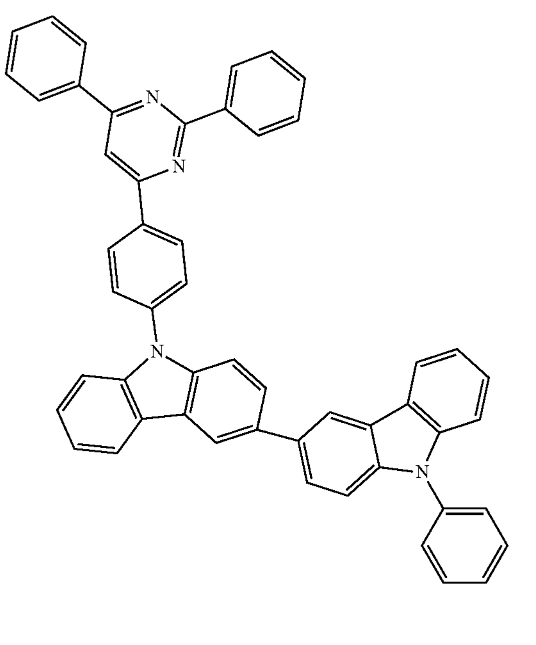
192A
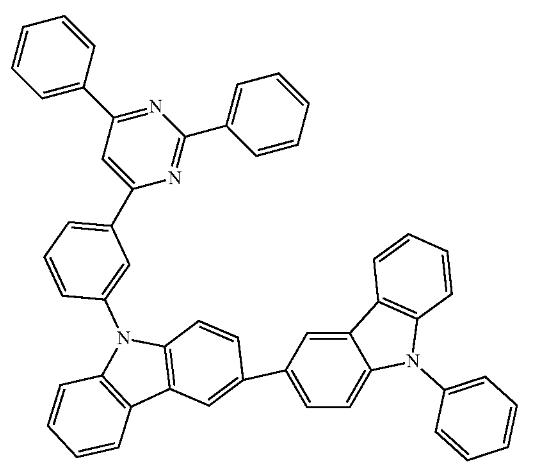

-continued
193A
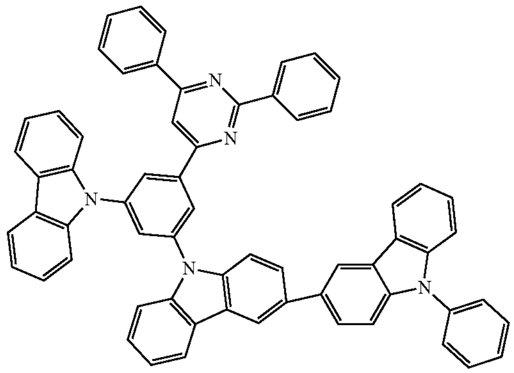
194A
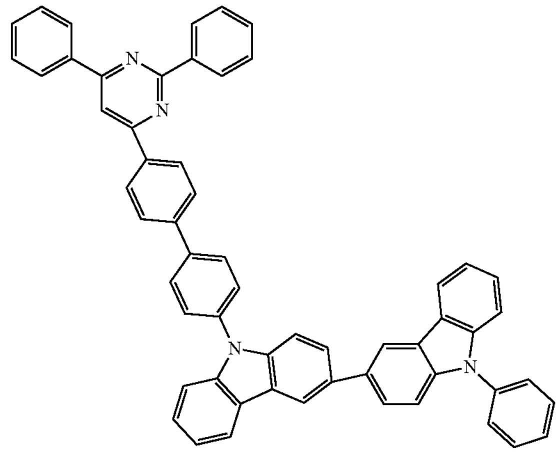
195A
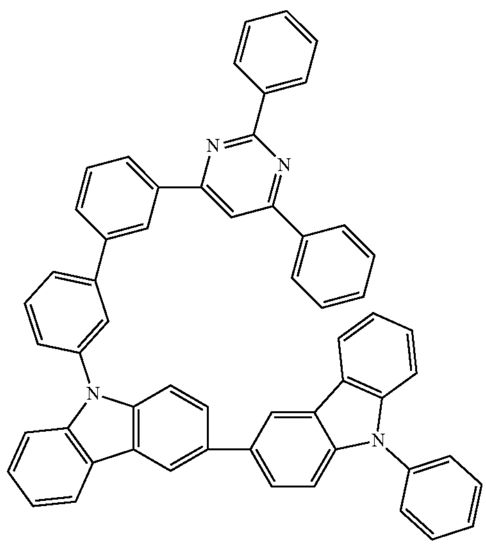
196A
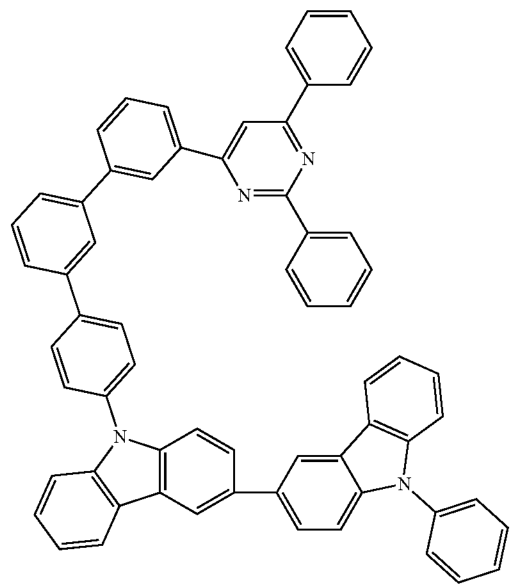
197A
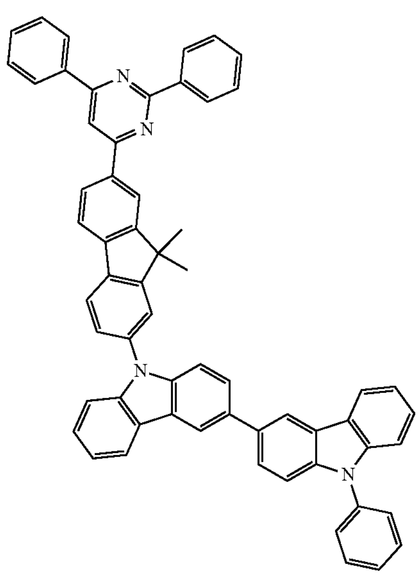
198A
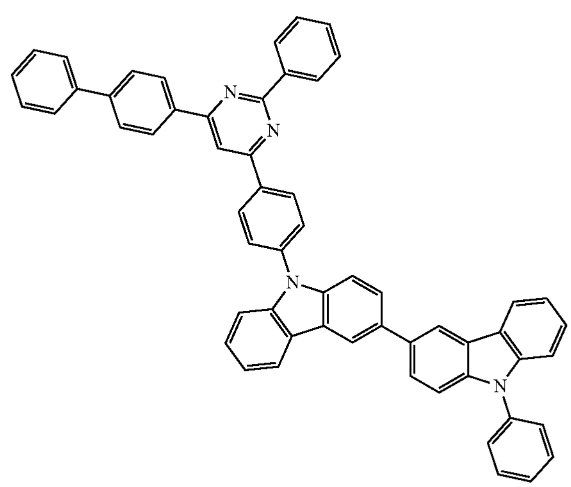

-continued
199A
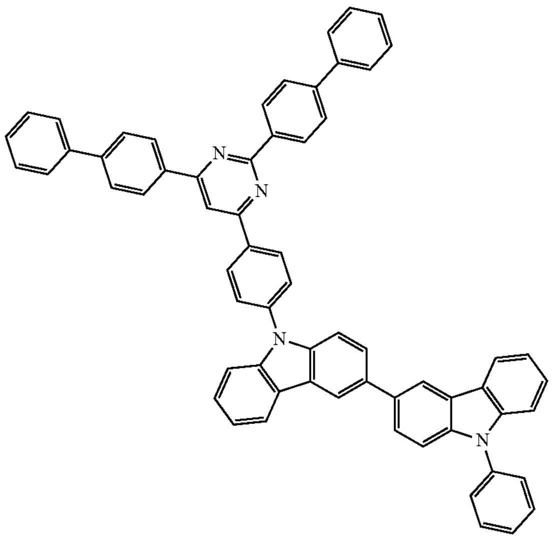
200A
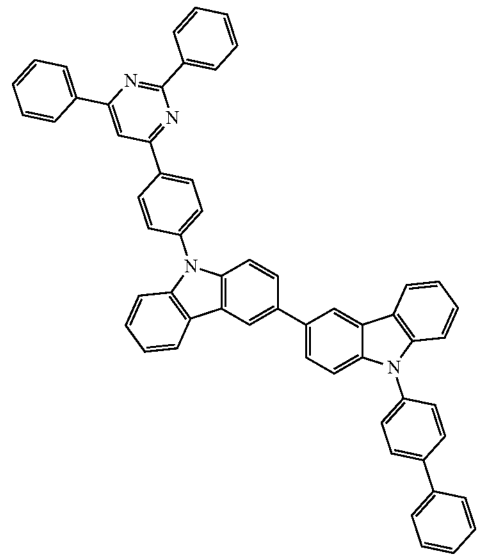
201A
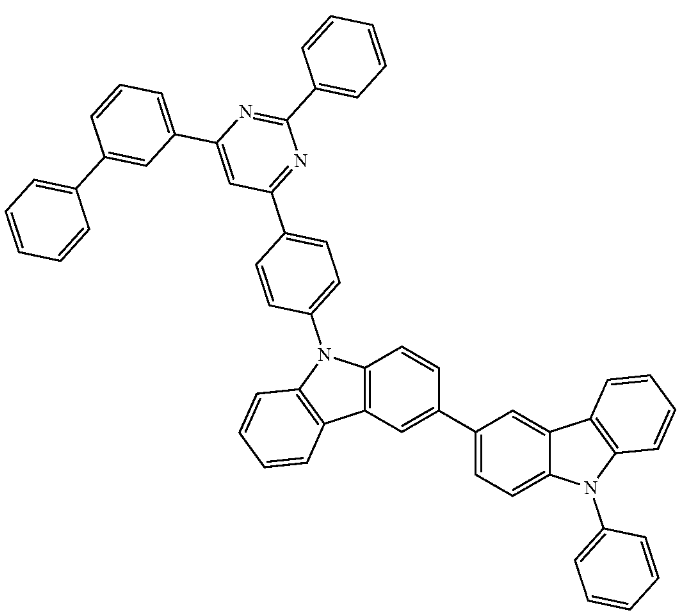

-continued
202A
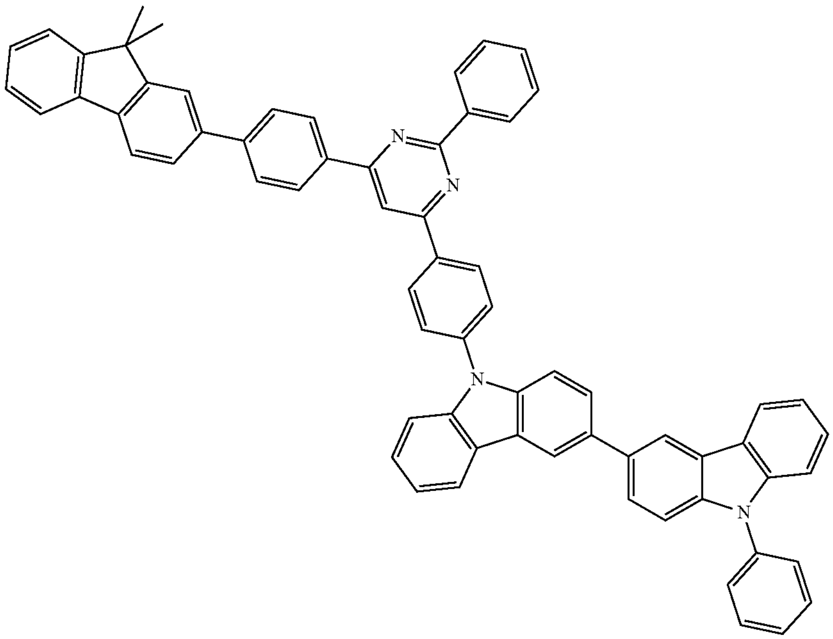
203A
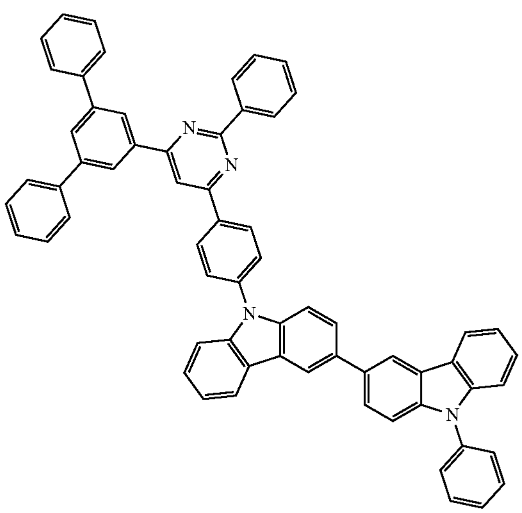
204A
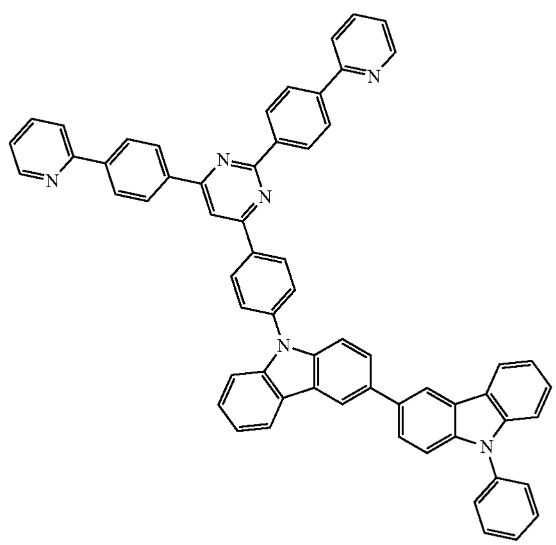

-continued
205A
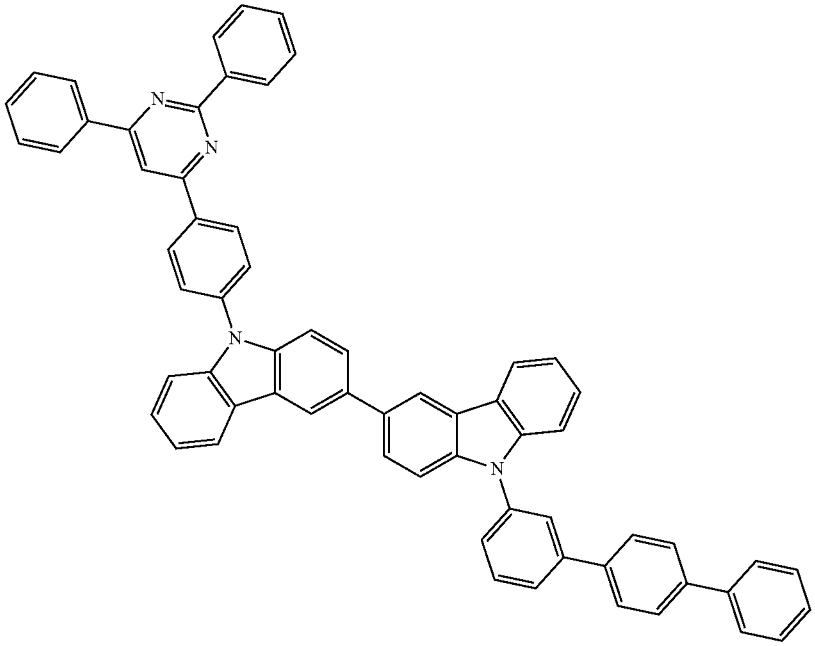
206A
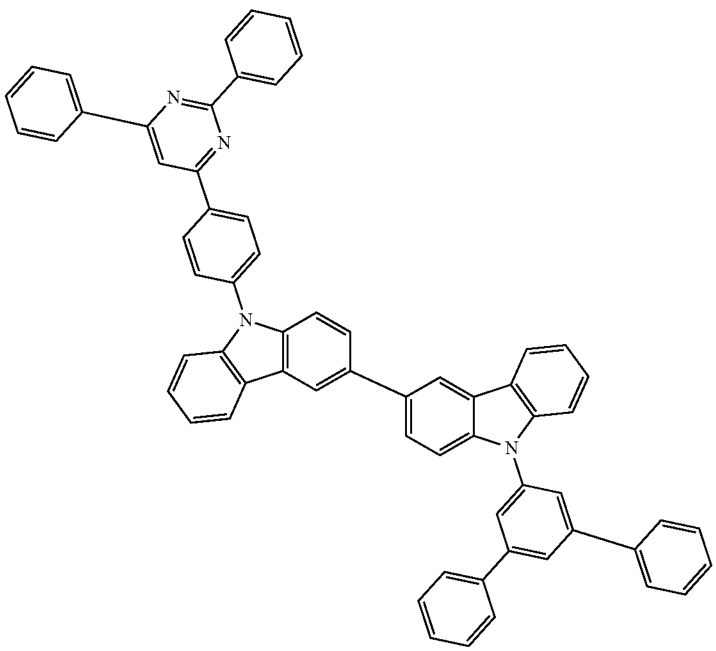
301A
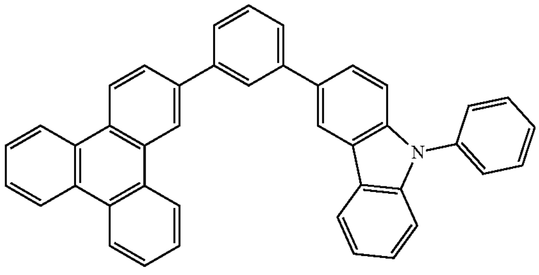
302A
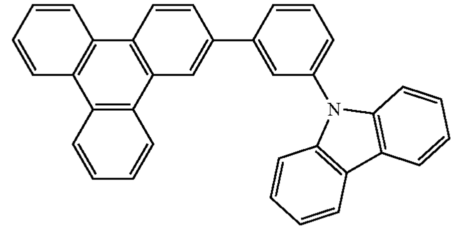

-continued
303A
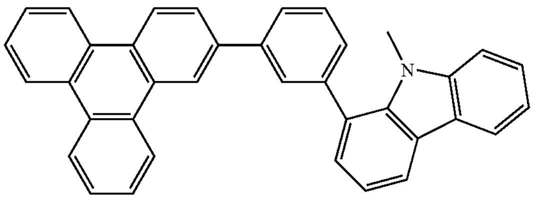
304A
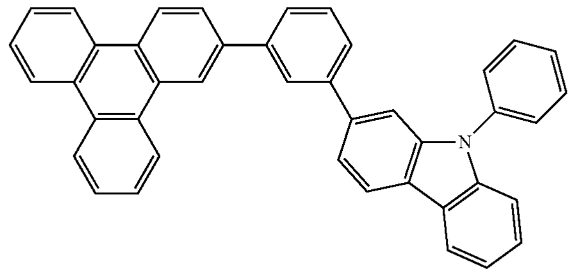
305A
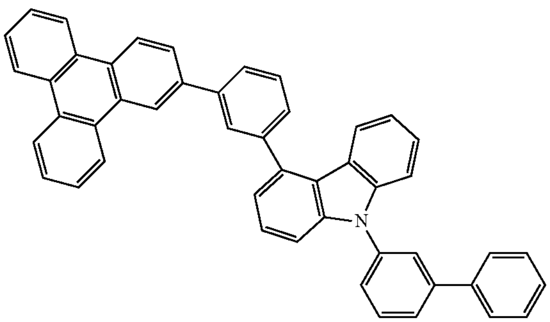
306A
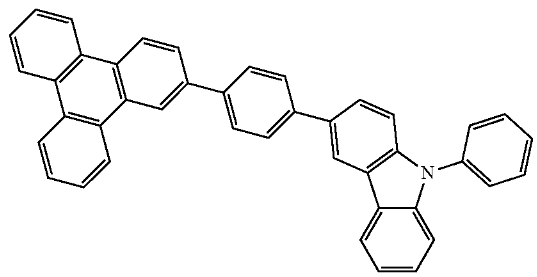
307A
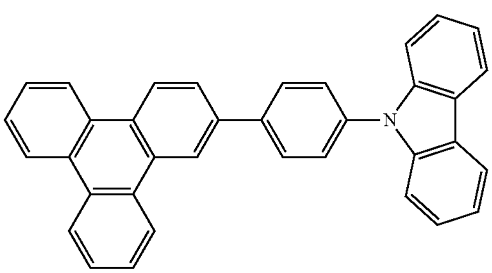
308A
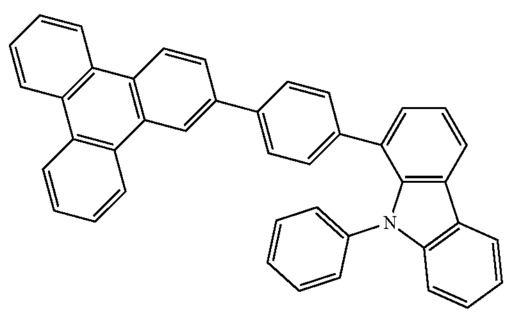
309A
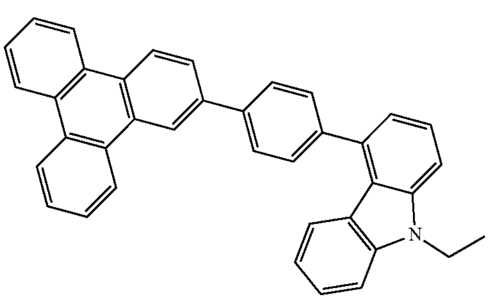
310A
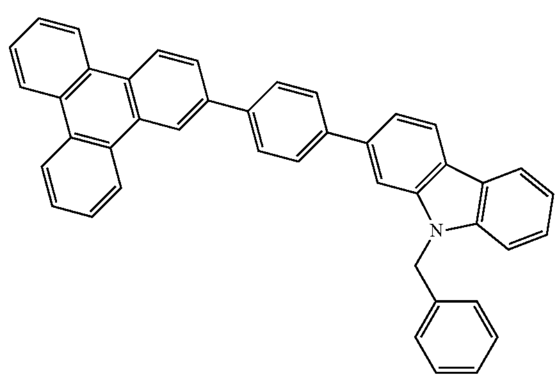

-continued
311A
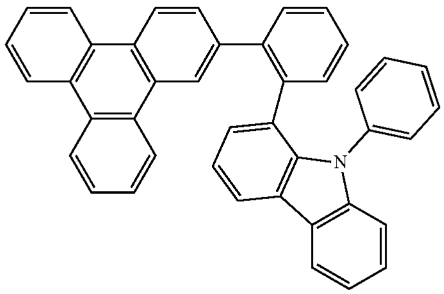
312A
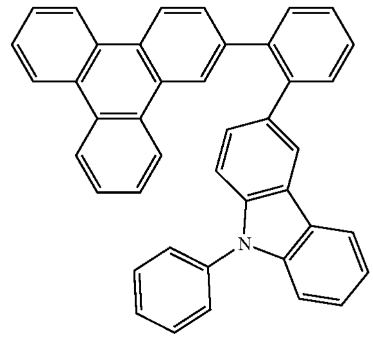
313A
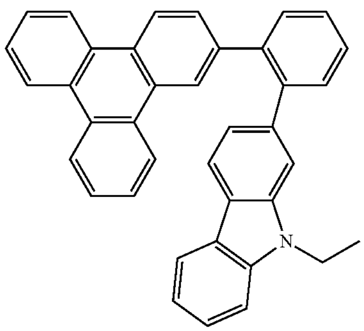
314A
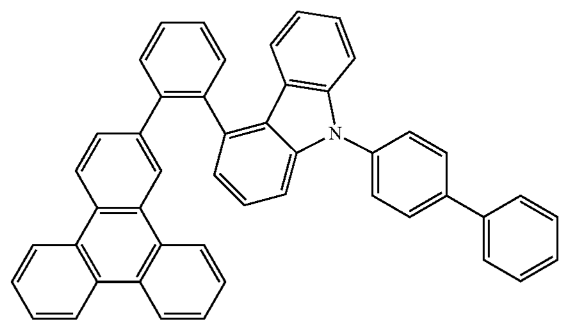
315A
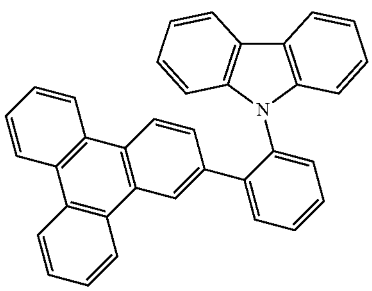
316A
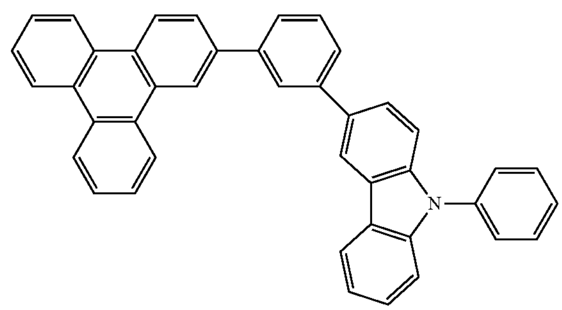
317A
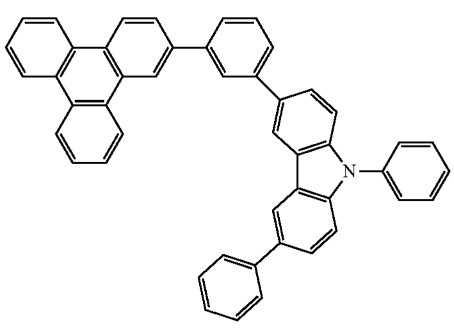
318A
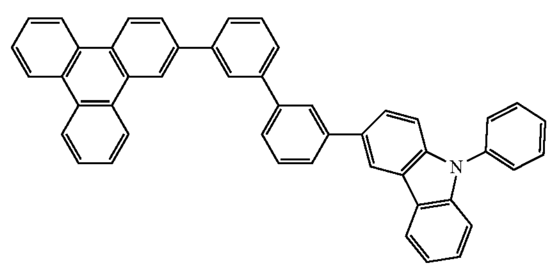

-continued
319A
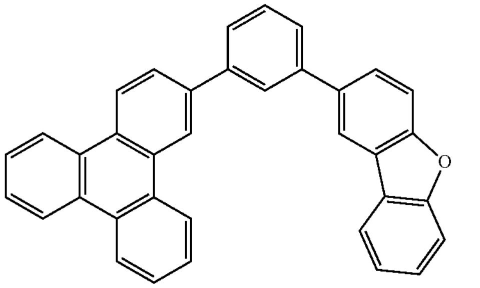
320A
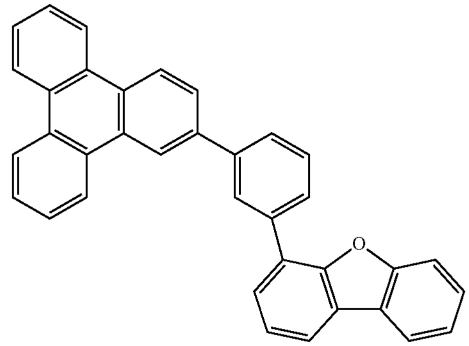
321A
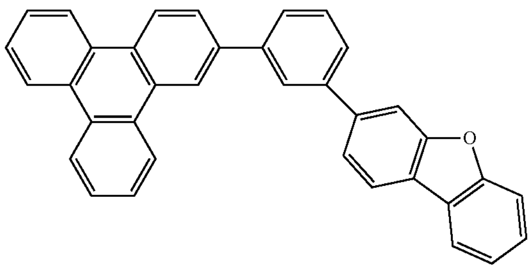
322A
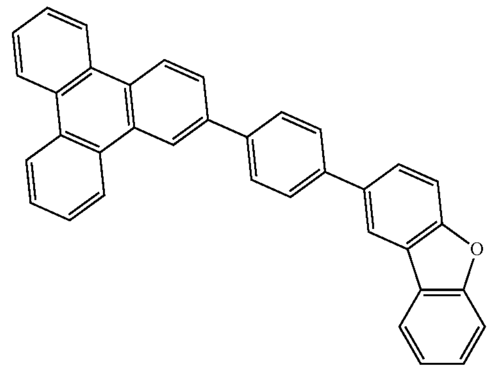
323A
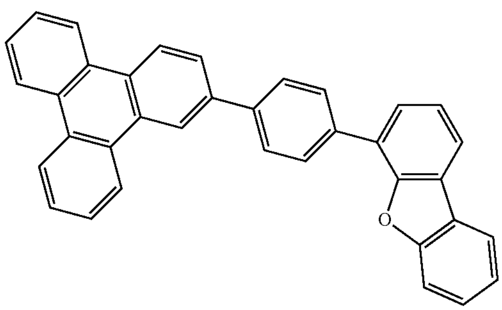
324A
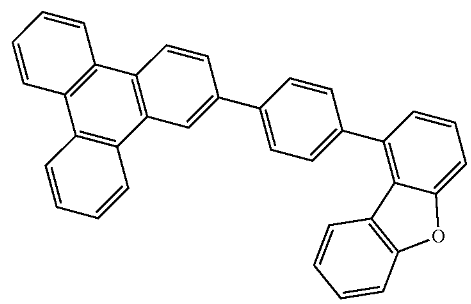
325A
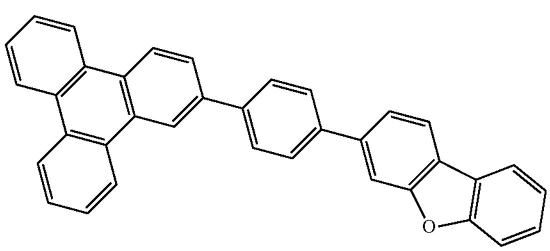
326A
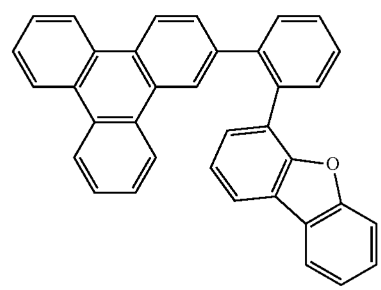

-continued
327A
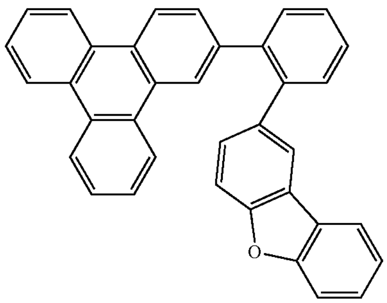
328A
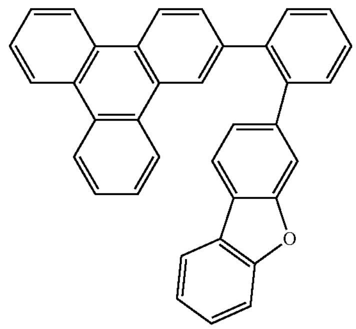
329A
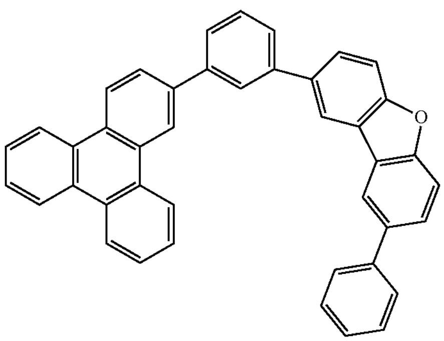
330A
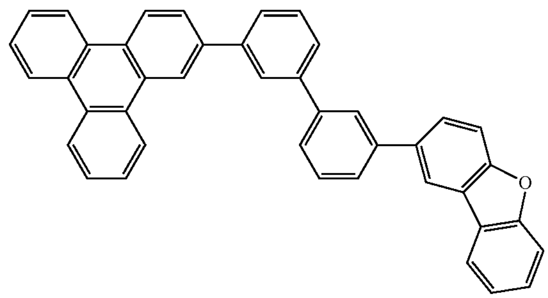
331A
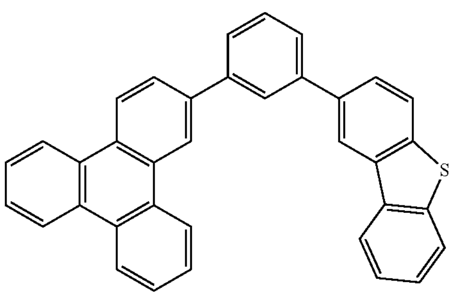
332A
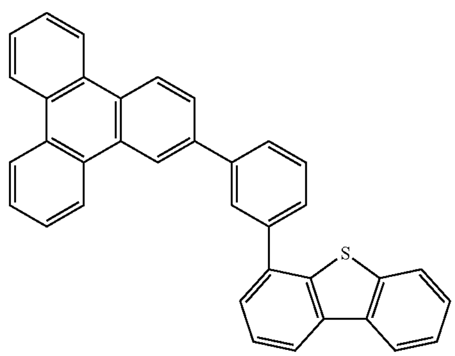
333A
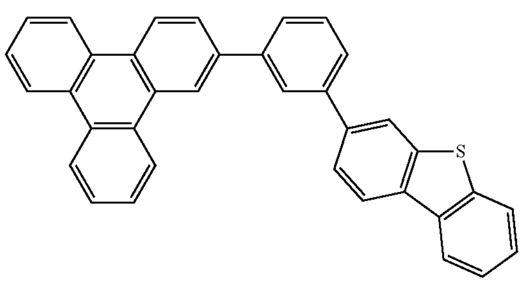
334A
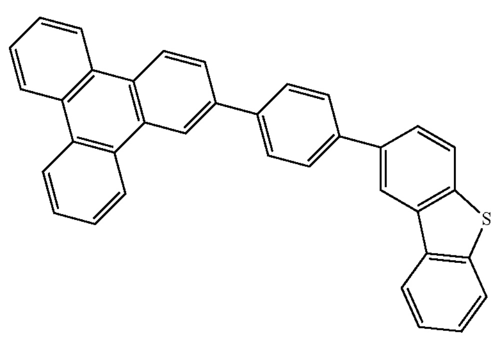

-continued
335A
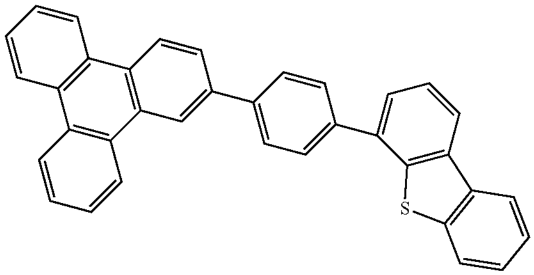
336A
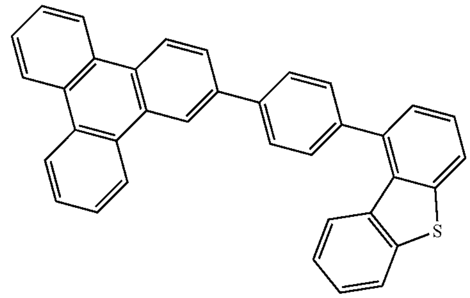
337A
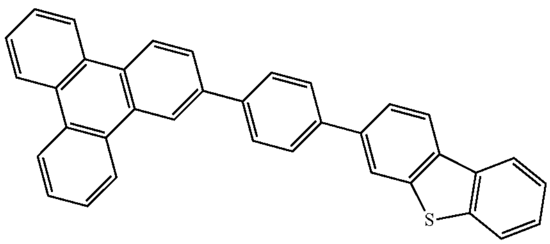
338A
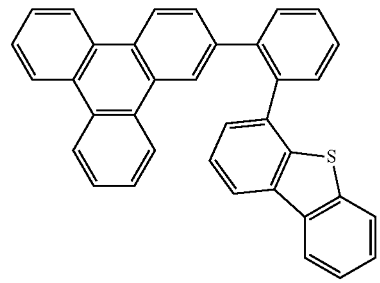
339A
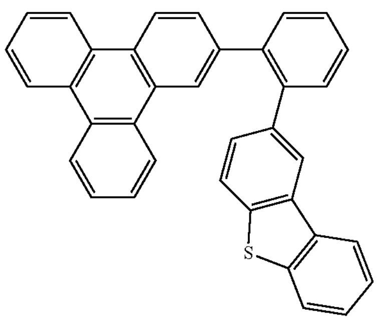
340A
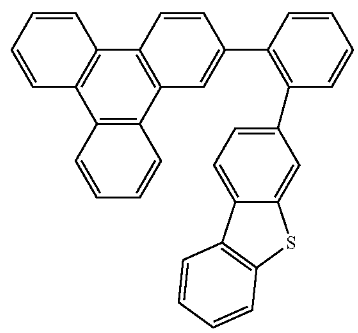
341A
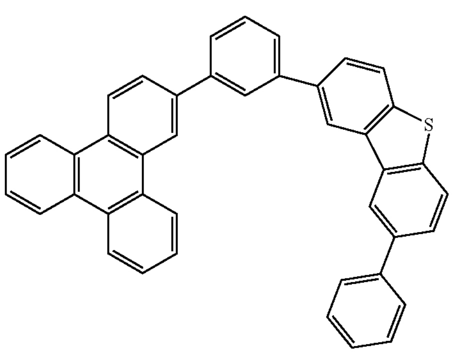
342A
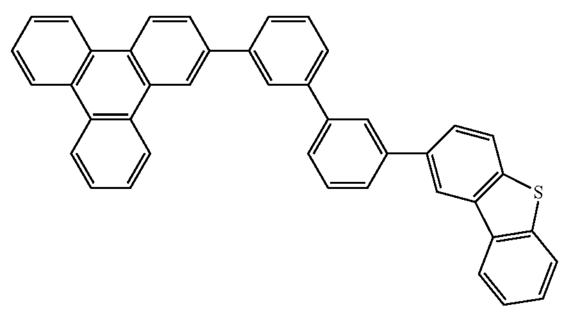

16. The organic light-emitting device of claim 1, wherein the first host is selected from Compounds 101B to 230B, and the second host is selected from Compounds 301B to 345B:
101B
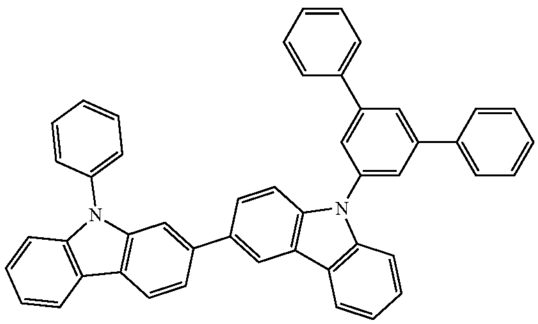
102B
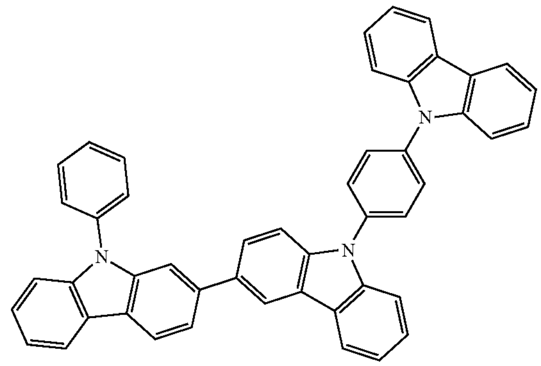
103B
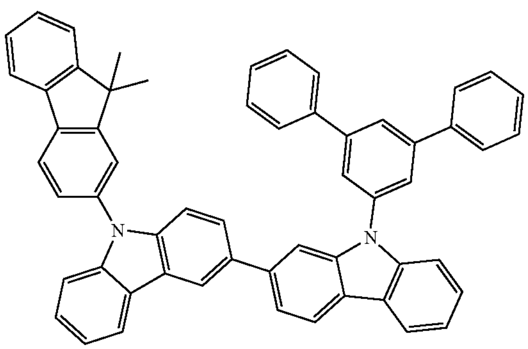
104B
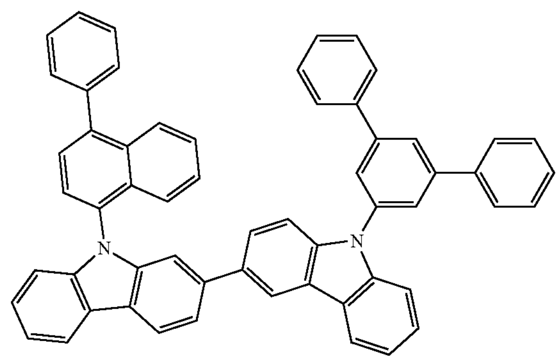
105B
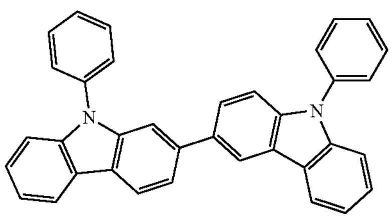
106B
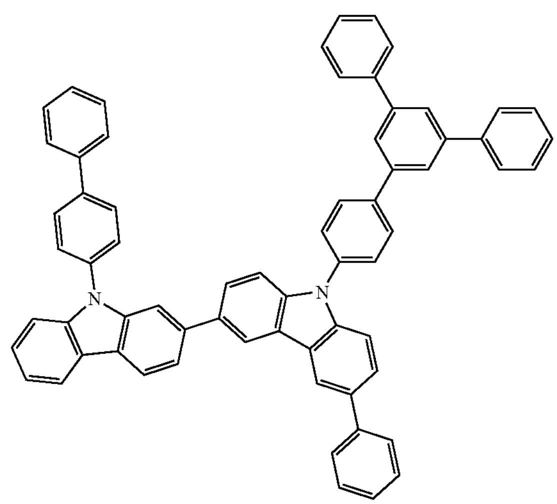

-continued
107B
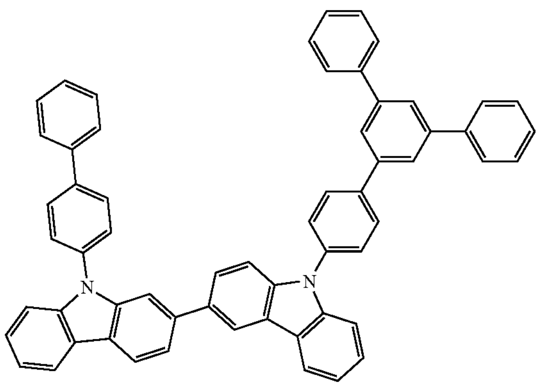
108B
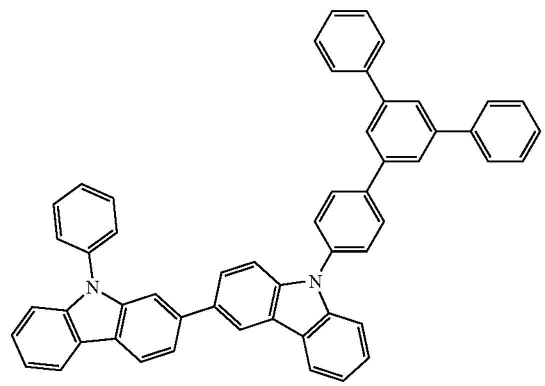
109B
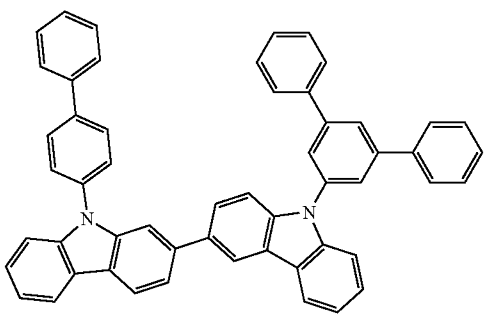
110B
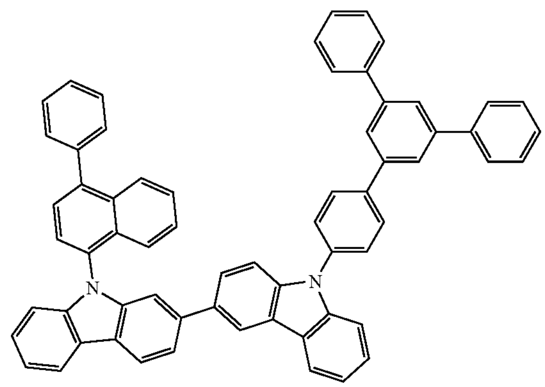
111B
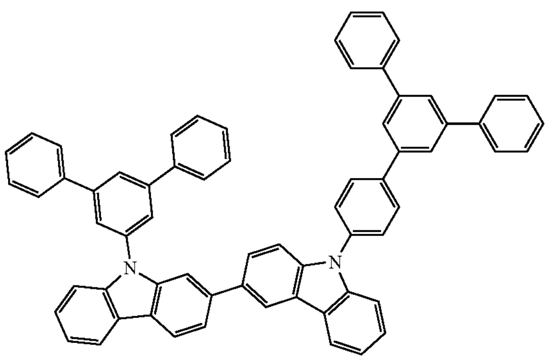
112B
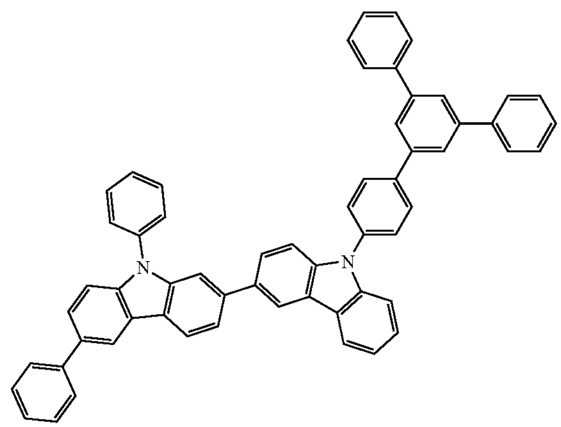
113B
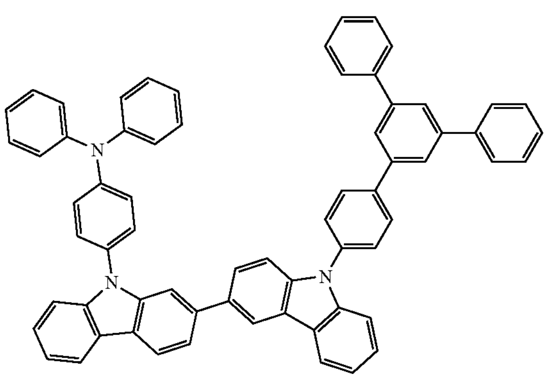
114B
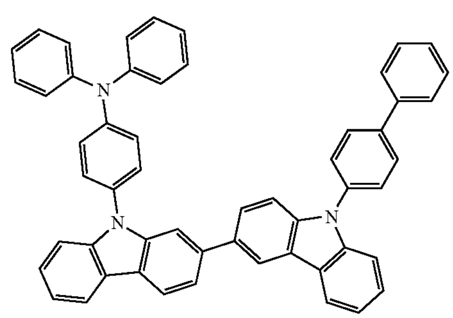

-continued
115B
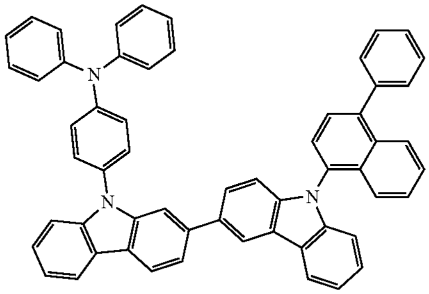
116B
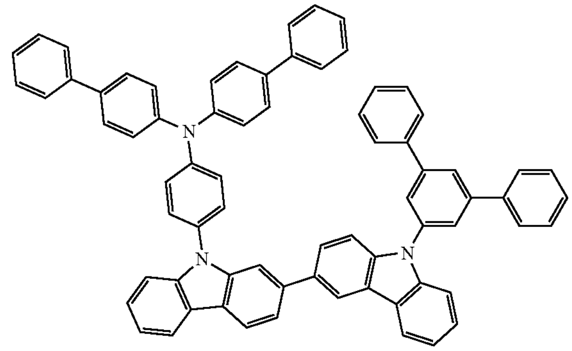
117B
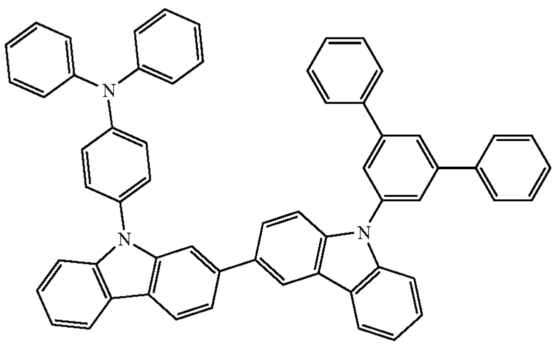
118B
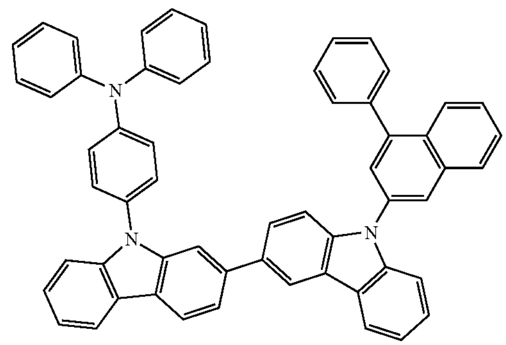
119B
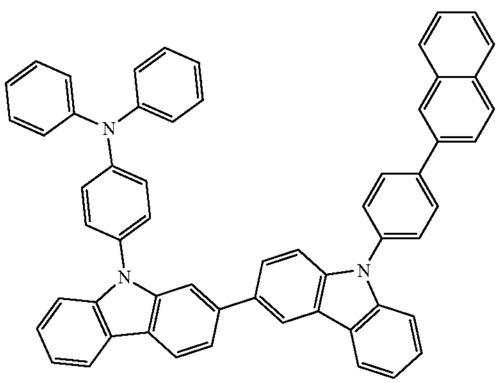
120B
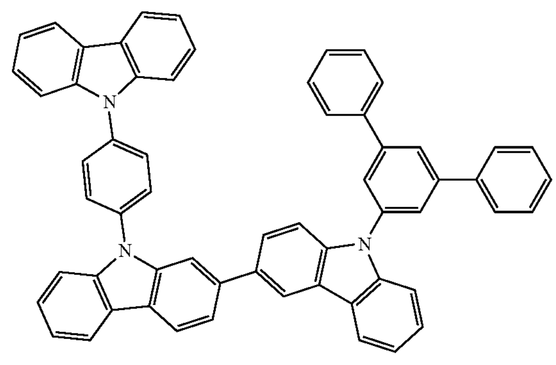
121B
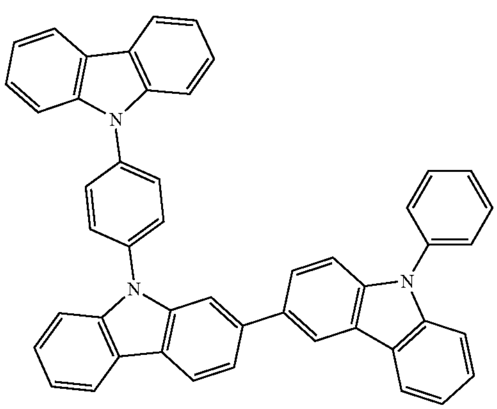
122B
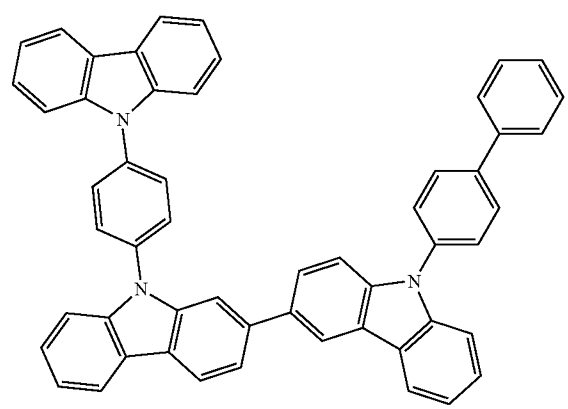

-continued
123B
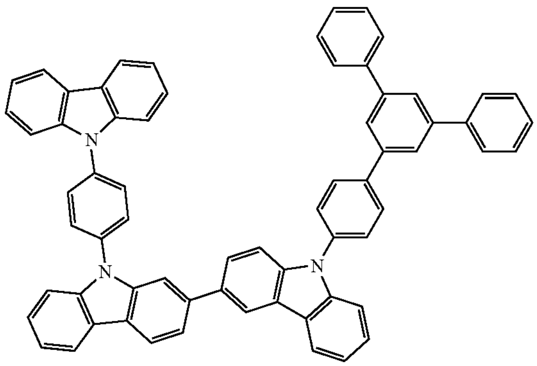
124B
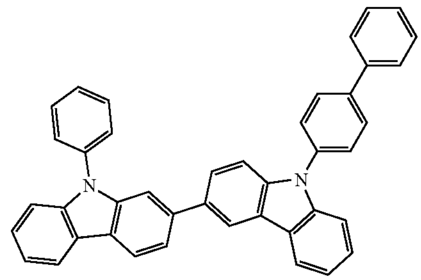
125B
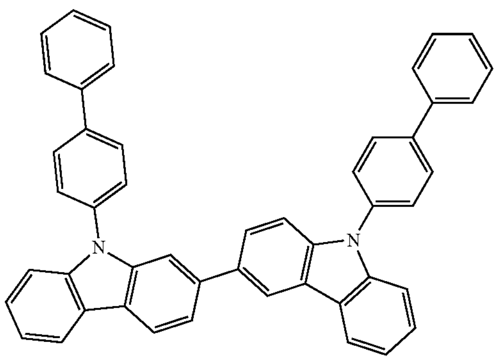
126B
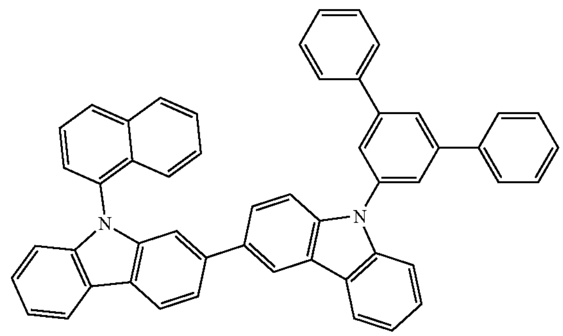
127B
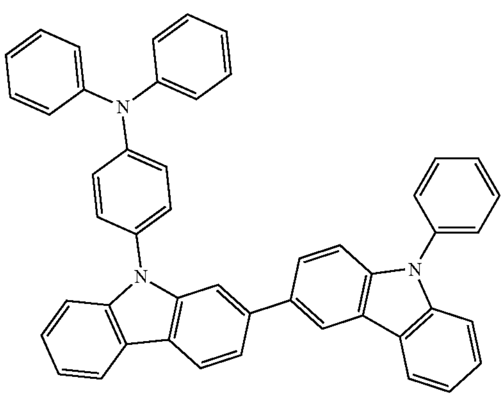
128B
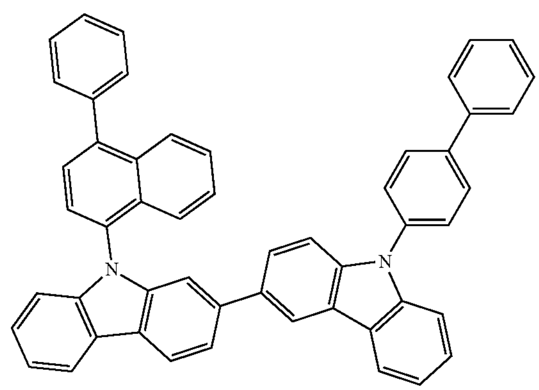
129B
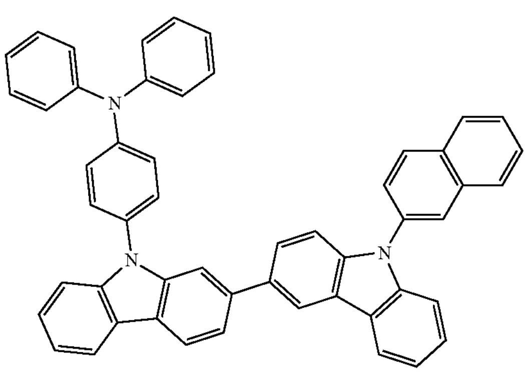
130B
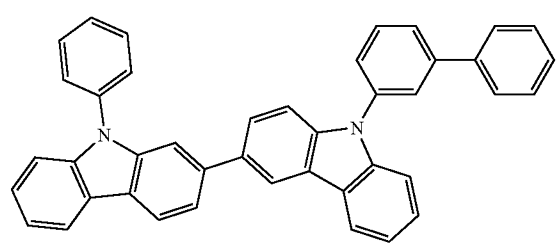

-continued
131B
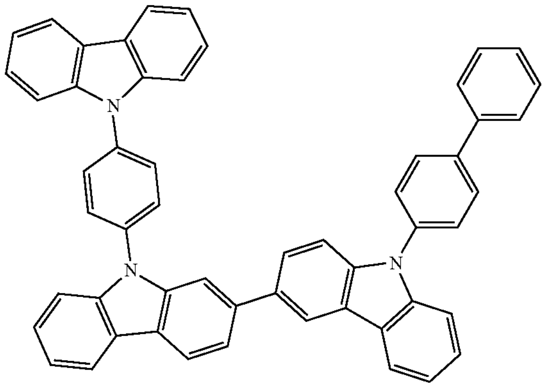
132B
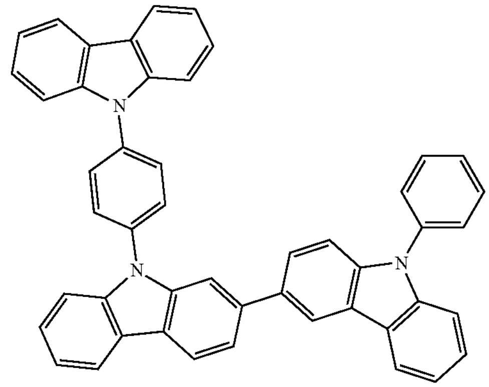
133B
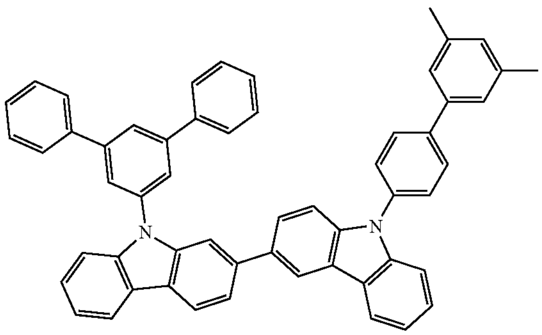
134B
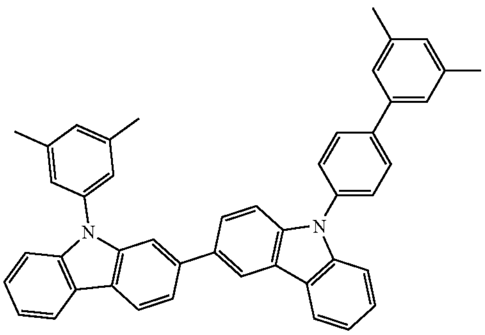
135B
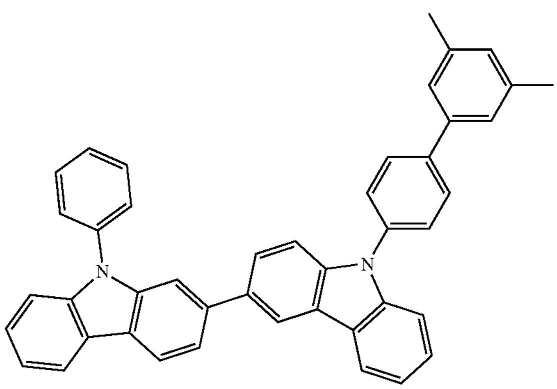
136B
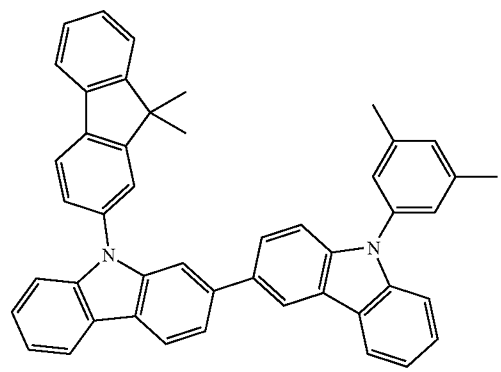
137B
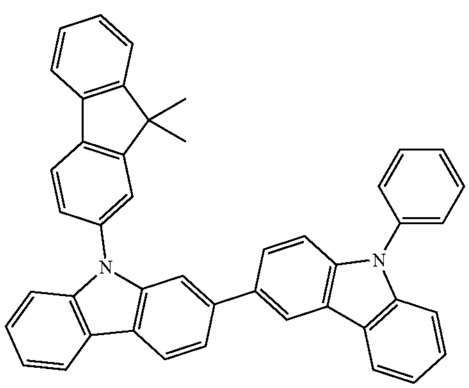
138B
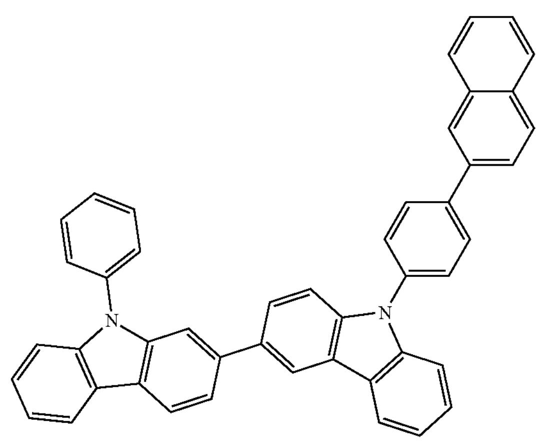

-continued
139B
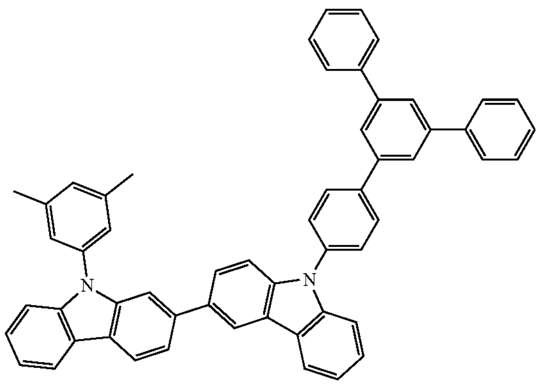
140B
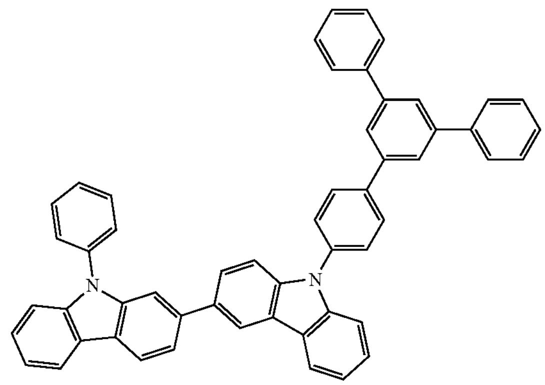
141B
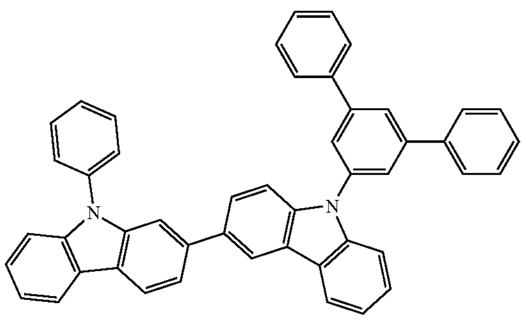
142B
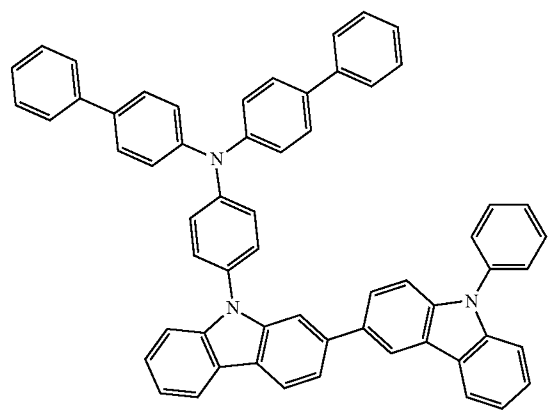
143B
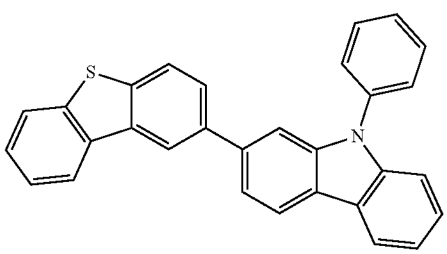
144B
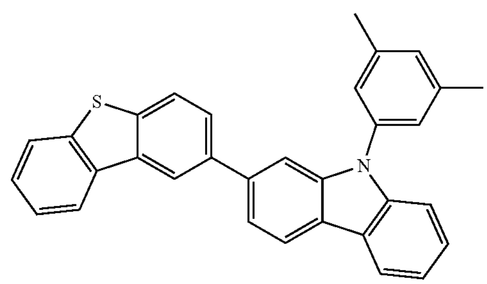
145B
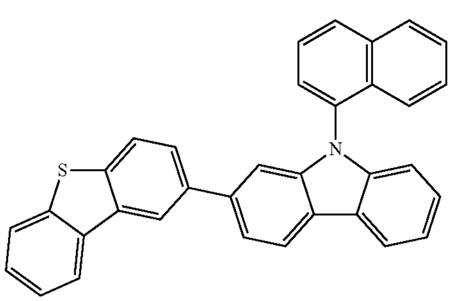
146B
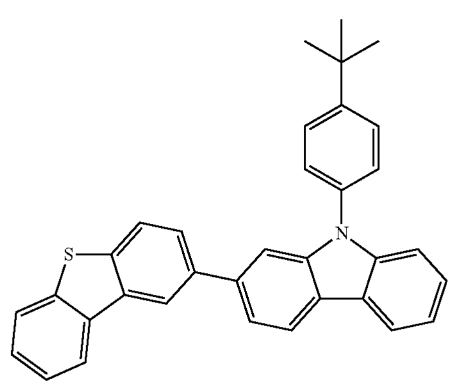

-continued
147B
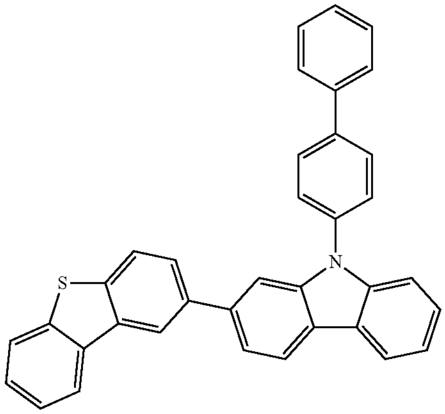
148B
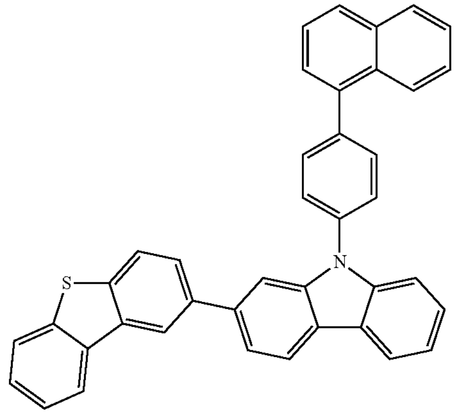
149B
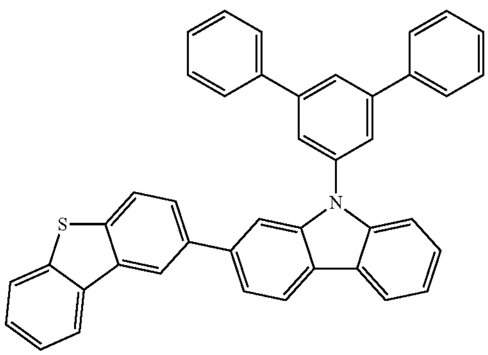
150B
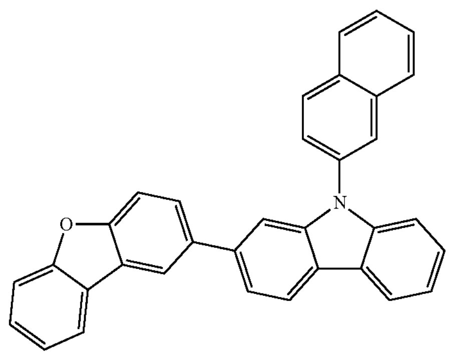
151B
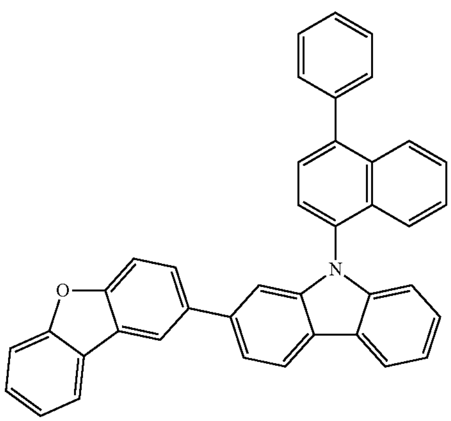
152B
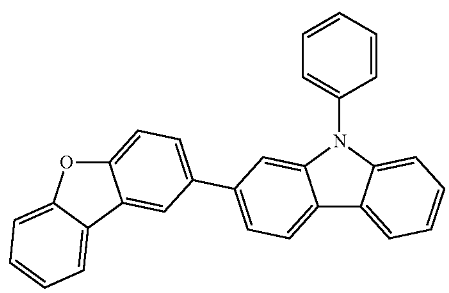
153B
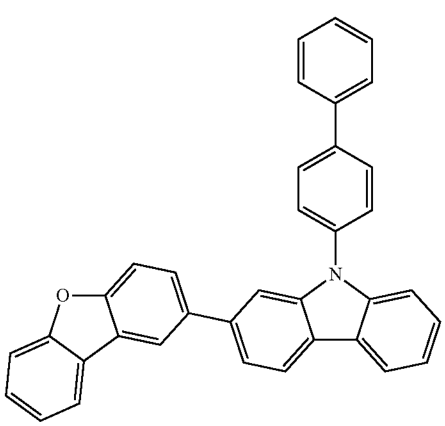
154B
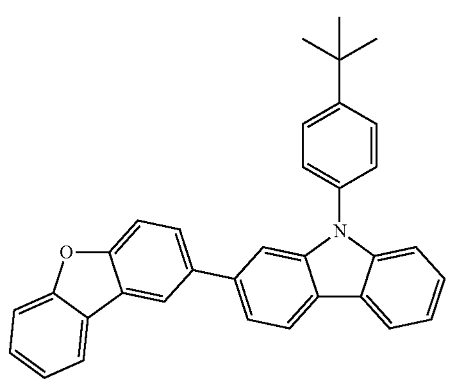

-continued
155B
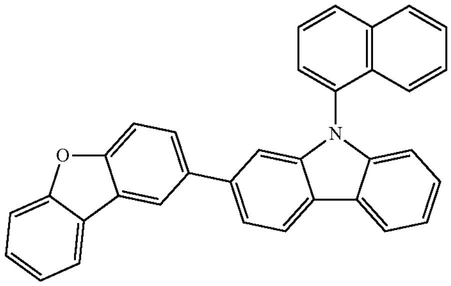
156B
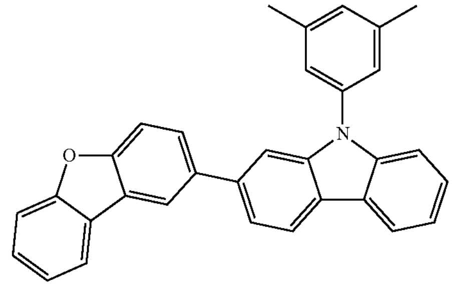
157B
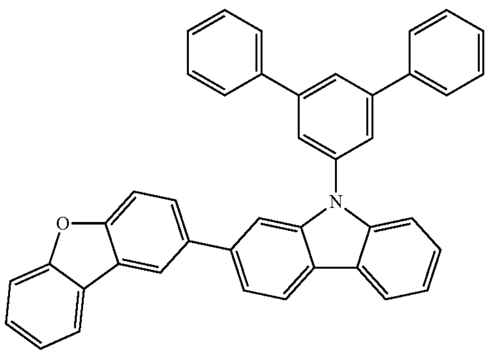
158B
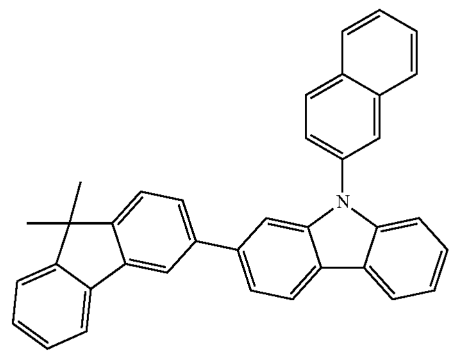
159B
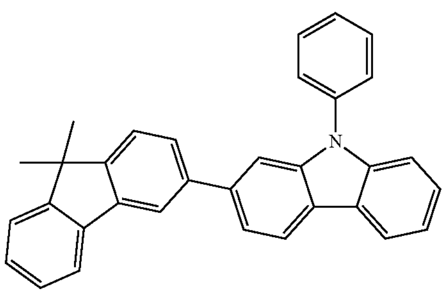
160B
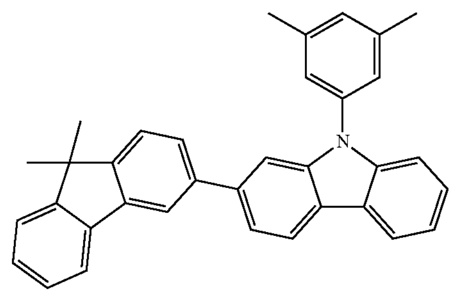
161B
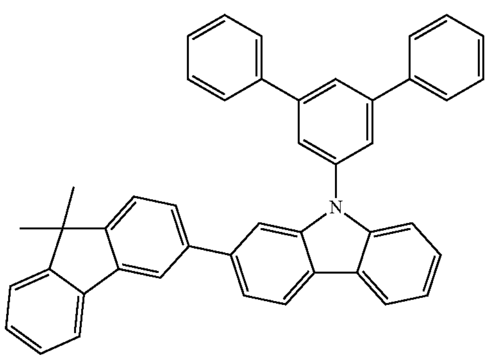
162B
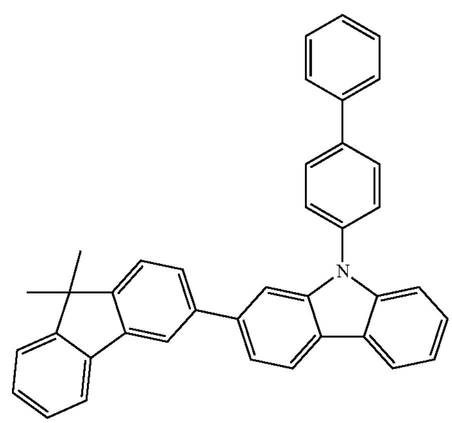

-continued
163B
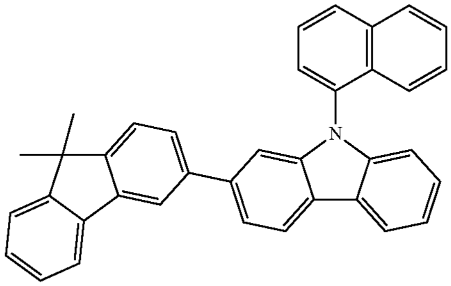
164B
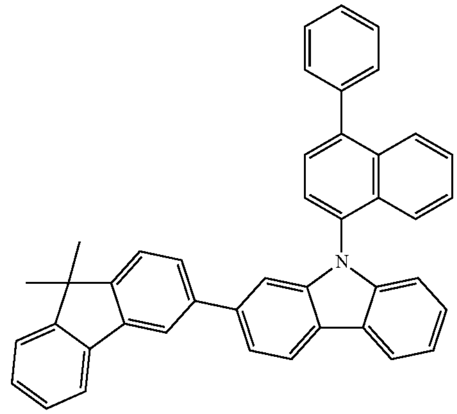
165B
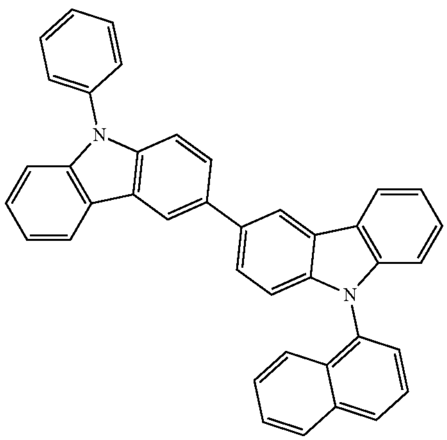
166B
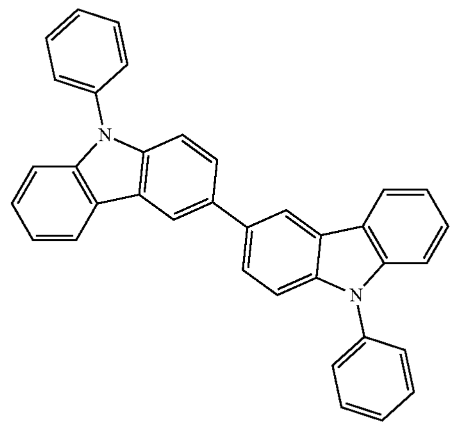
167B
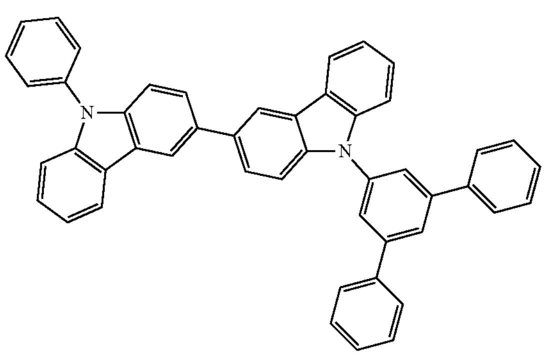
168B
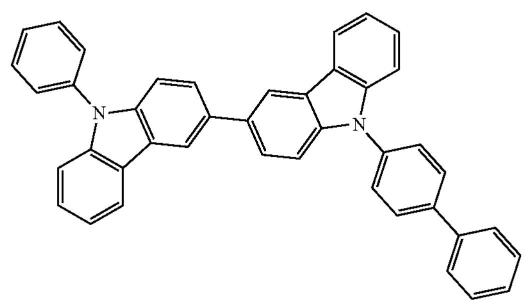
169B
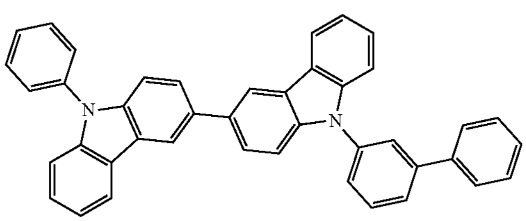
170B
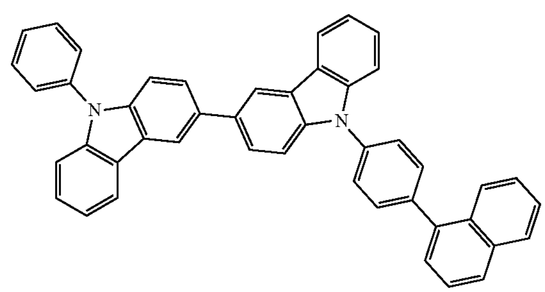

-continued
171B
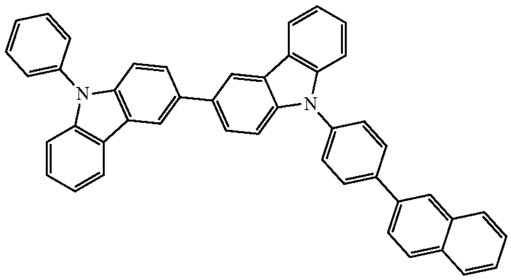
172B
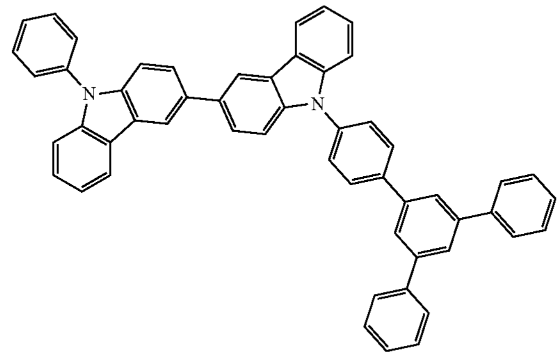
173B
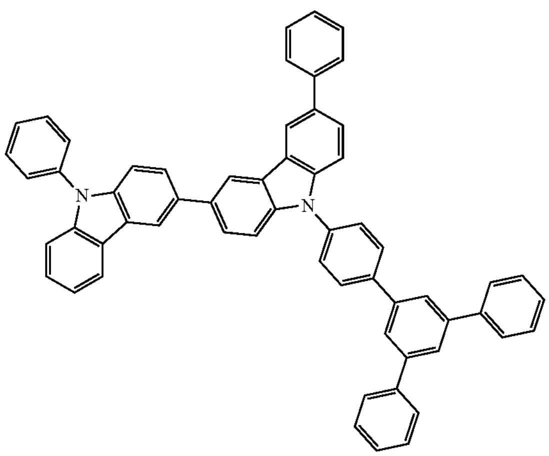
174B
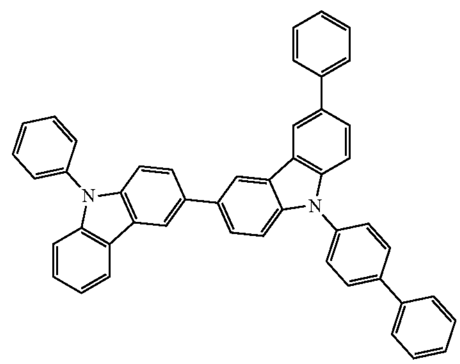
175B
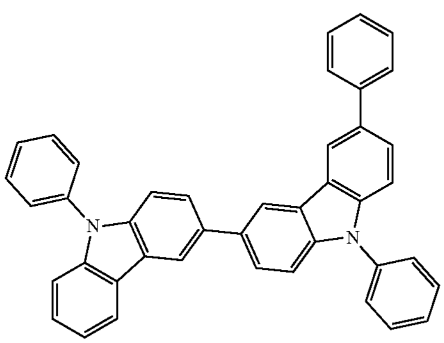
176B
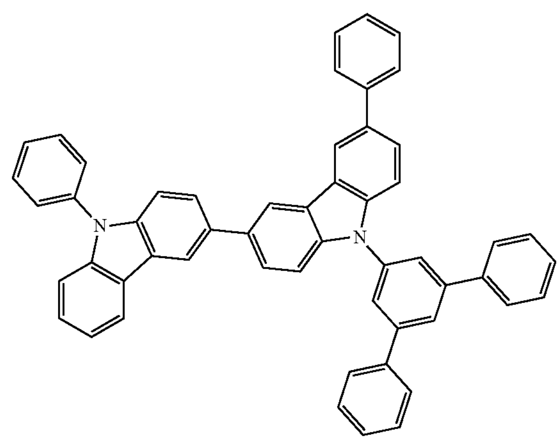

-continued
177B
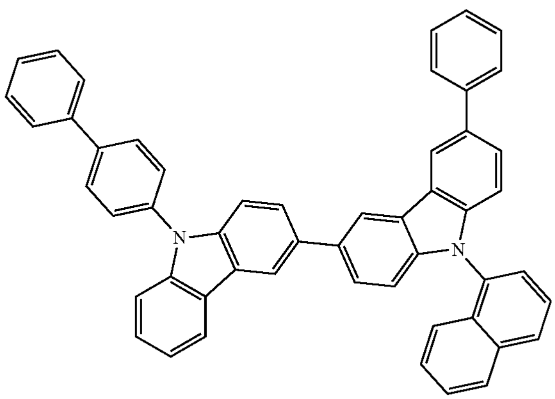
178B
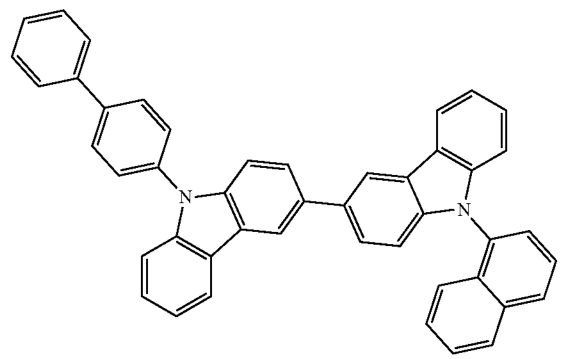
179B
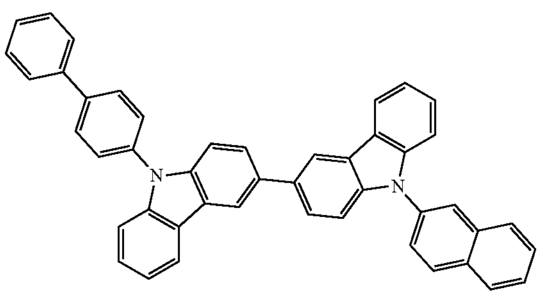
180B
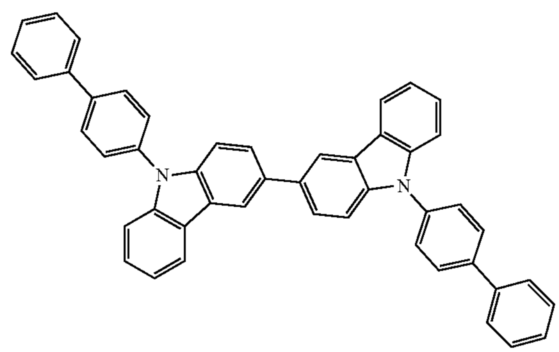
181B
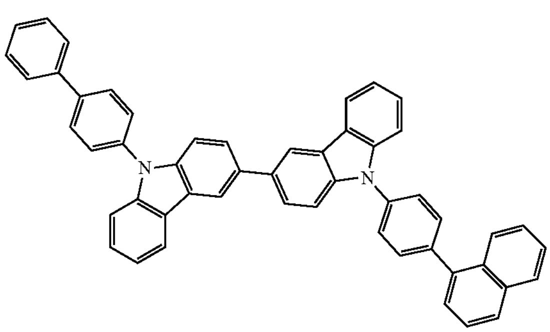
182B
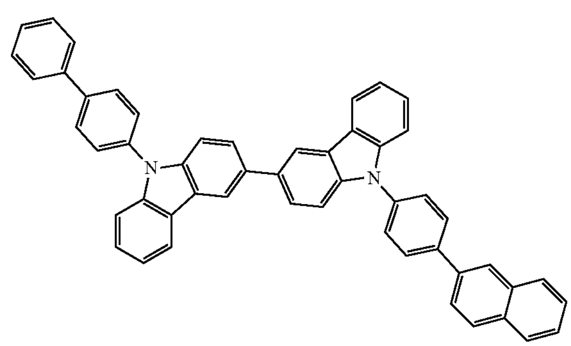

-continued
183B
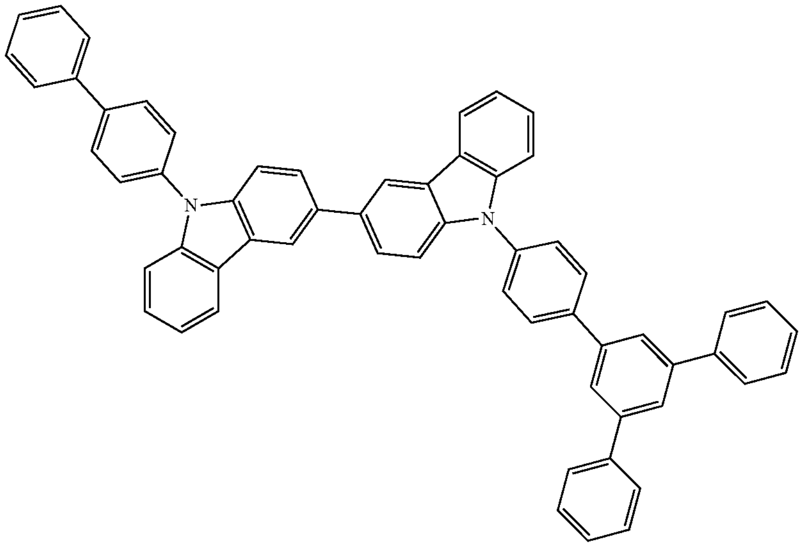
184B
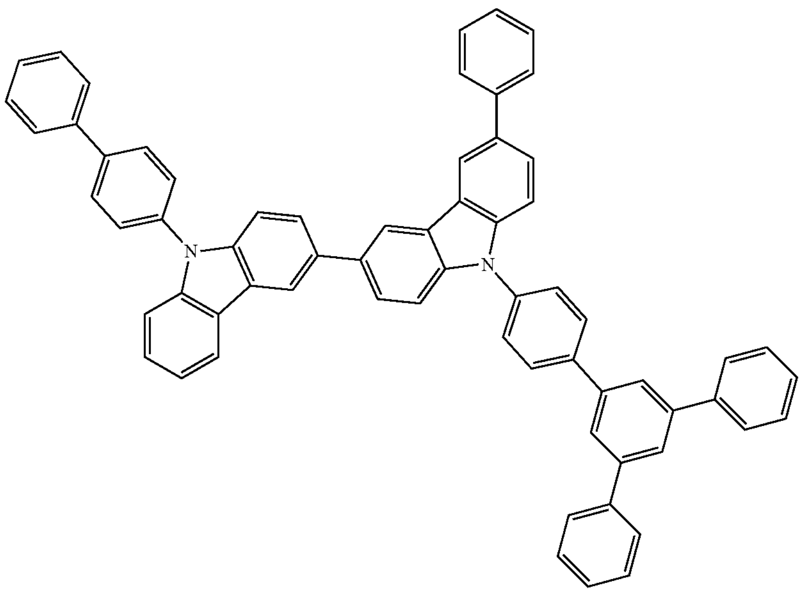
185B
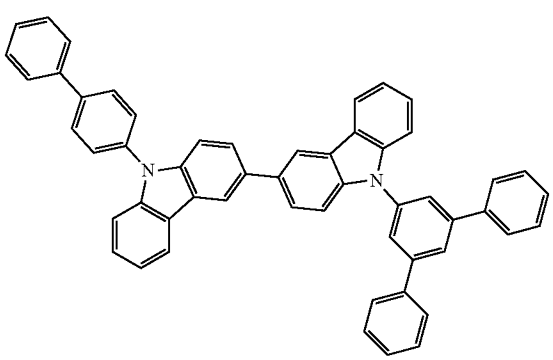
186B
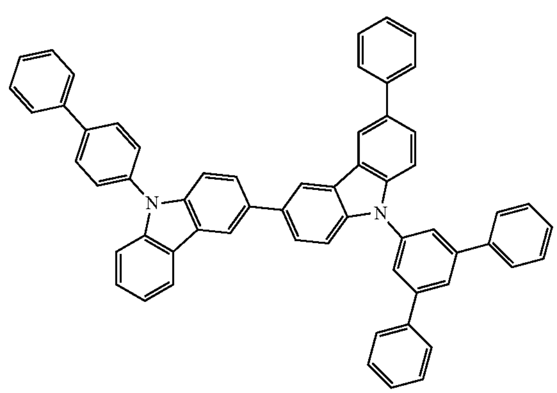

-continued
187B
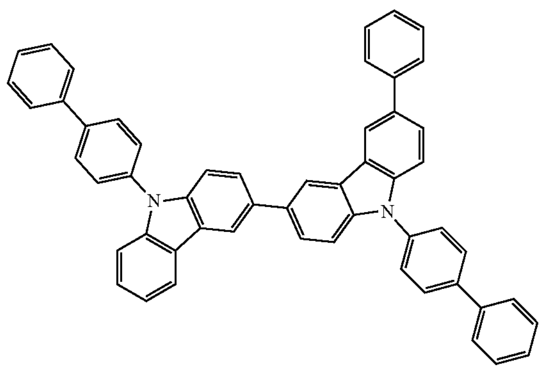
188B
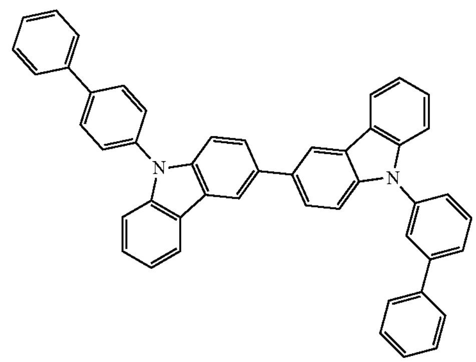
189B
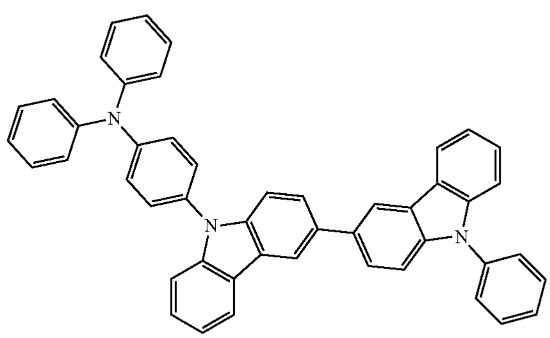
190B
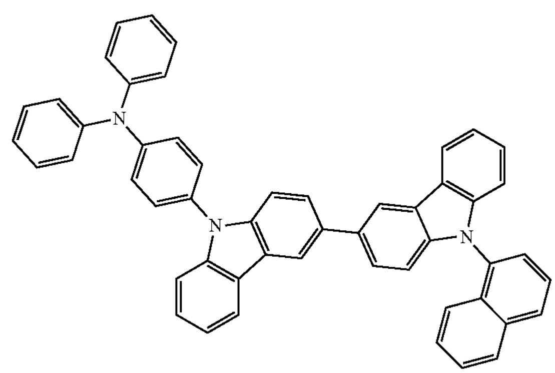
191B
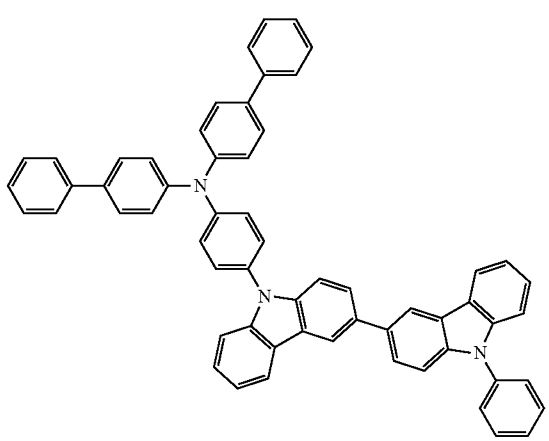
192B
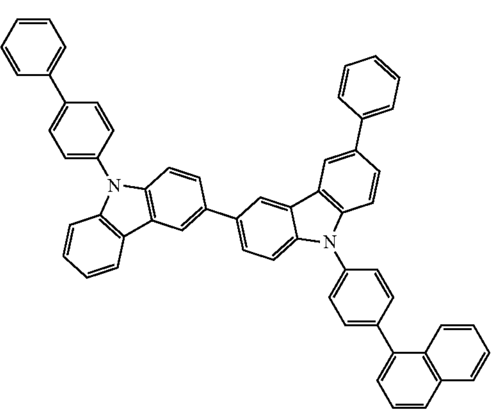

-continued
193B
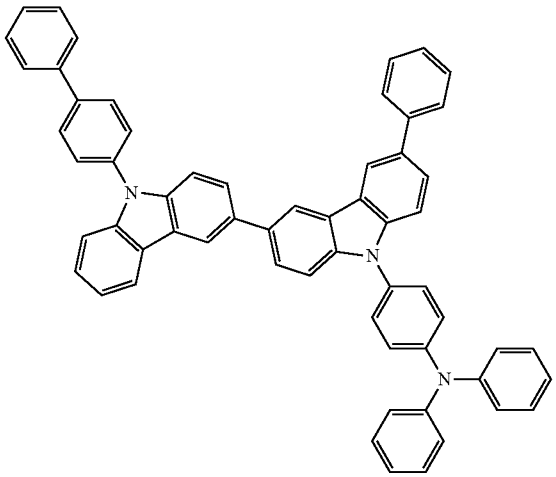
194B
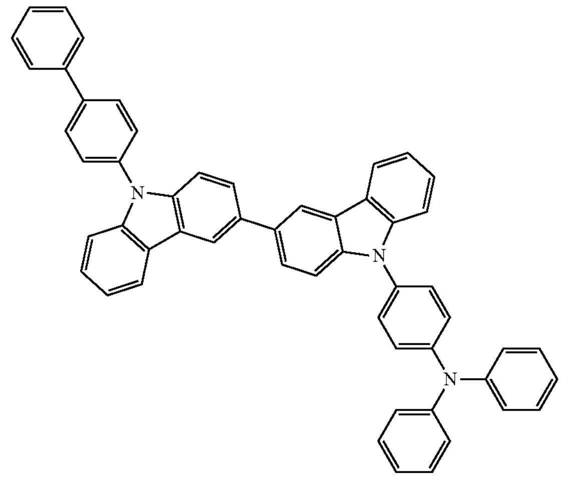
195B
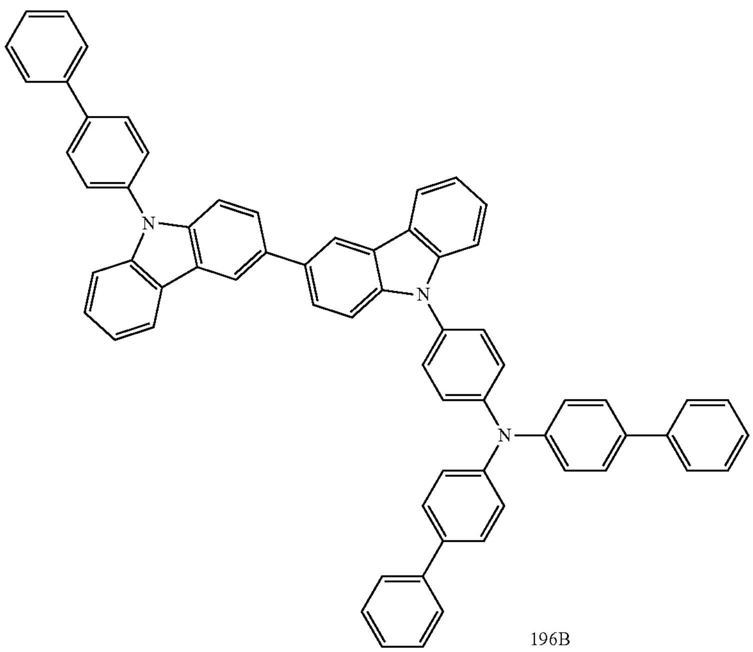
196B
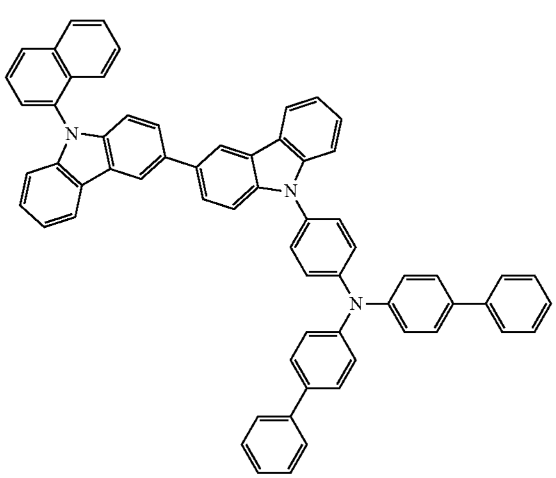
197B
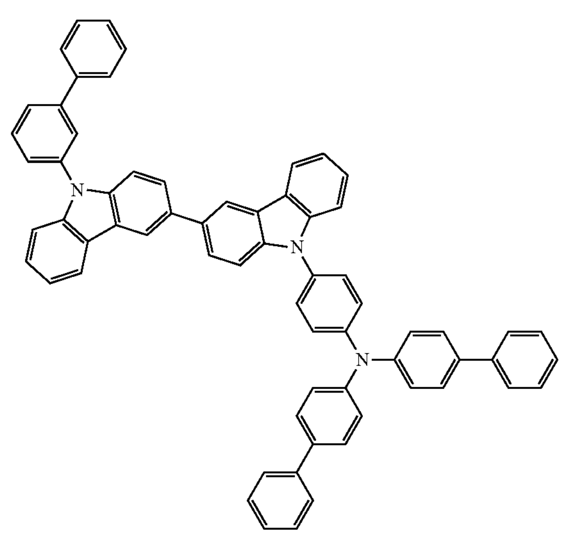

-continued
198B
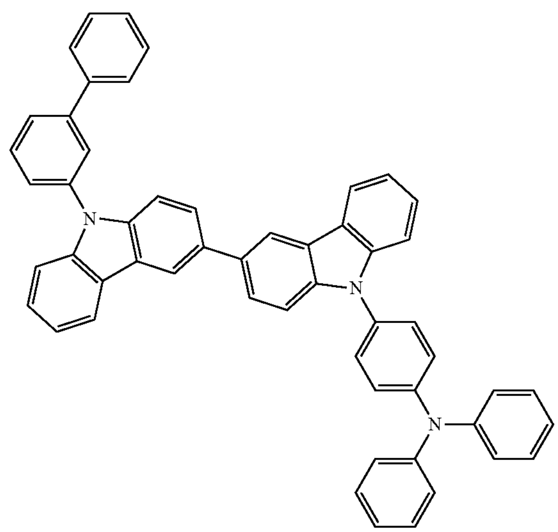
199B
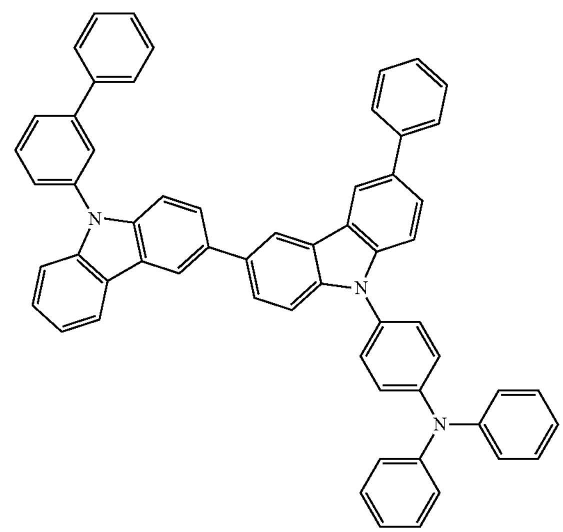
200B
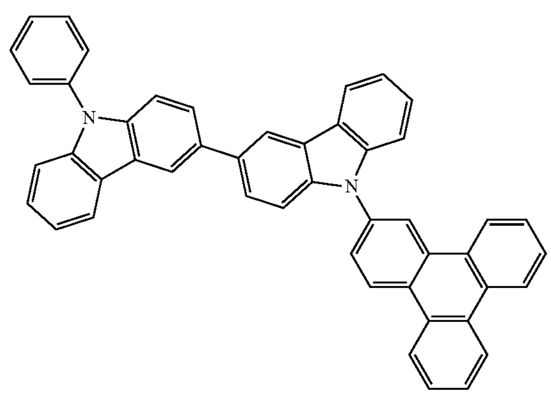
201B
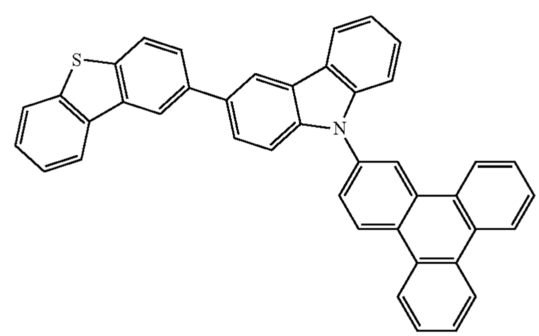
202B
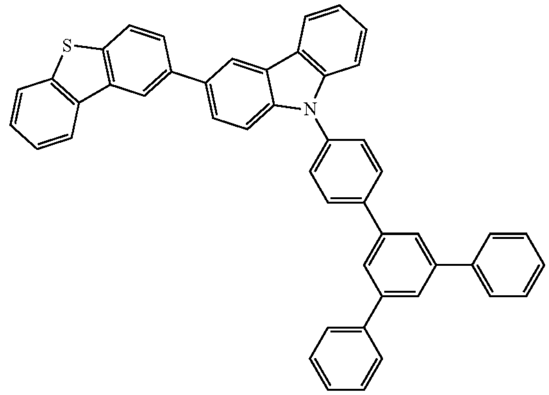
203B
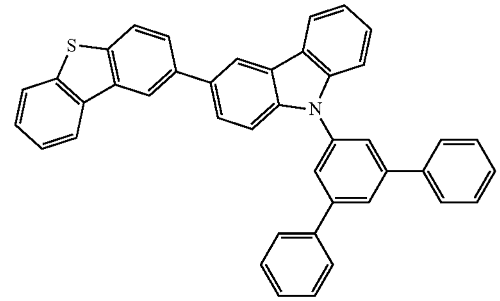

-continued
204B
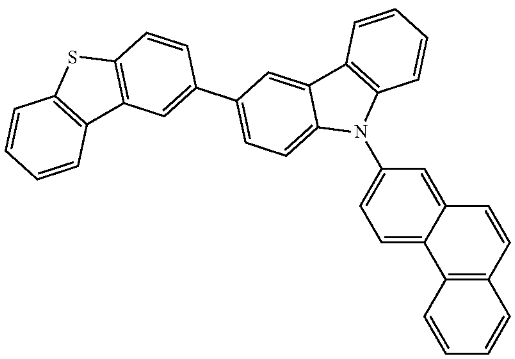
205B
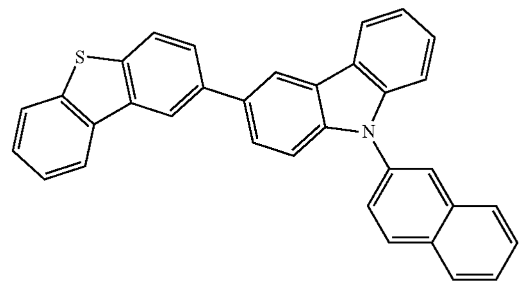
206B
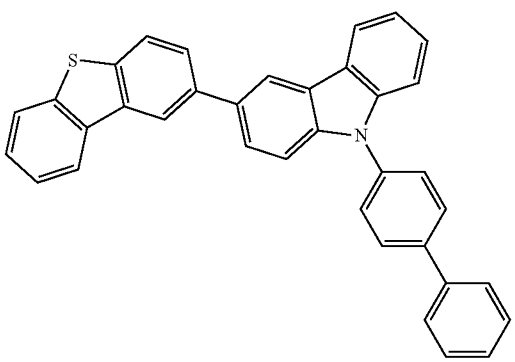
207B
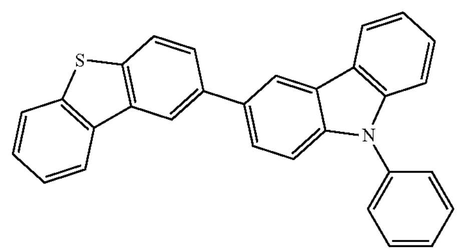
208B
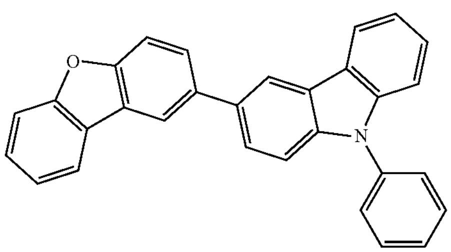
209B
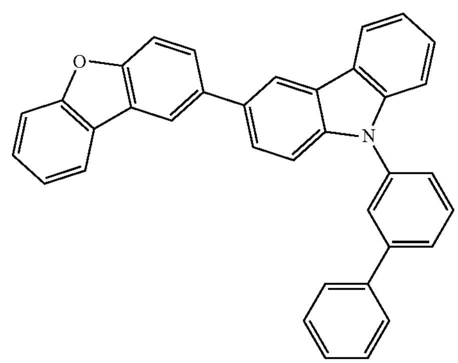
210B
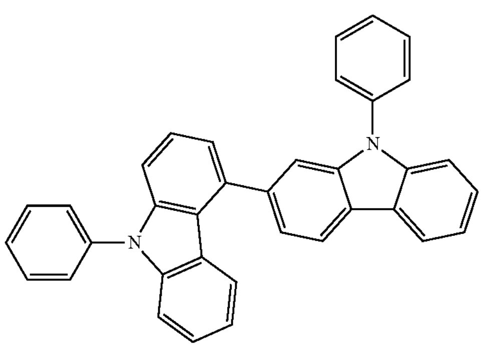
211B
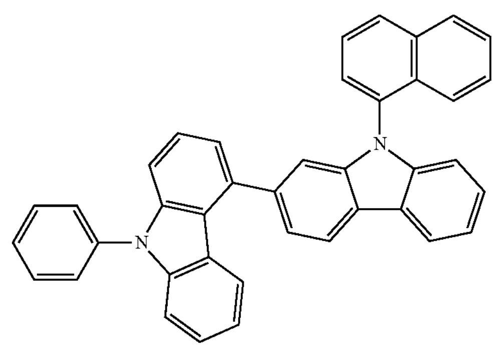

-continued
212B
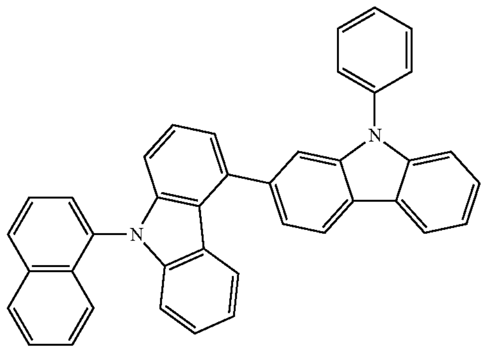
213B
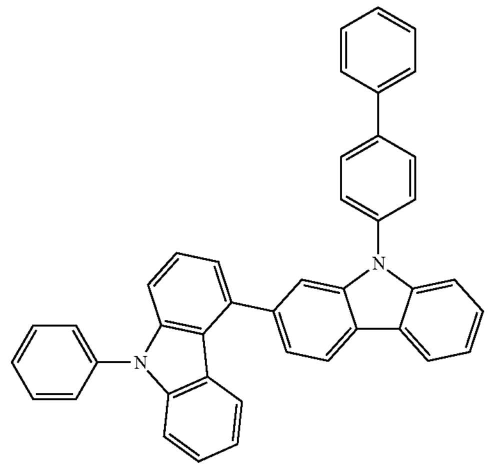
214B
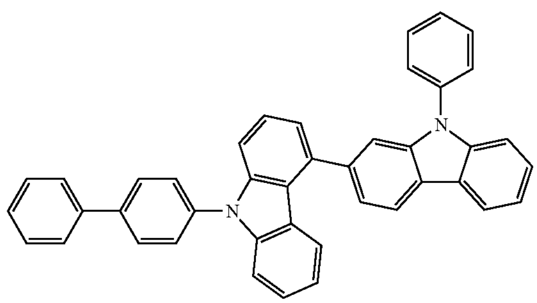
215B
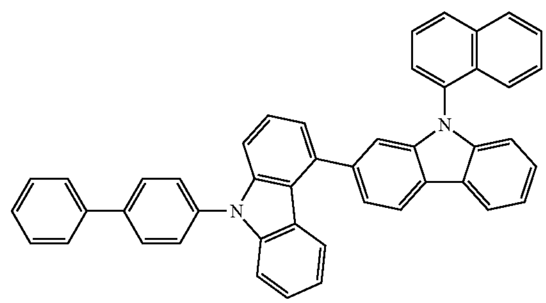
216B
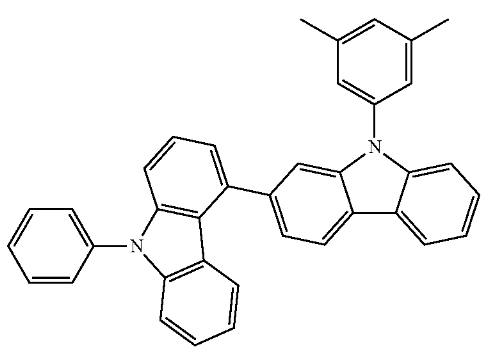
217B
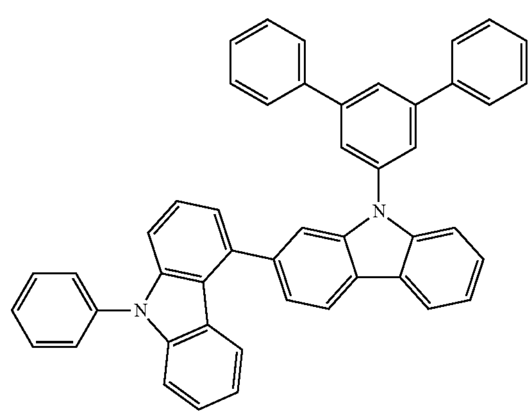

-continued
218B
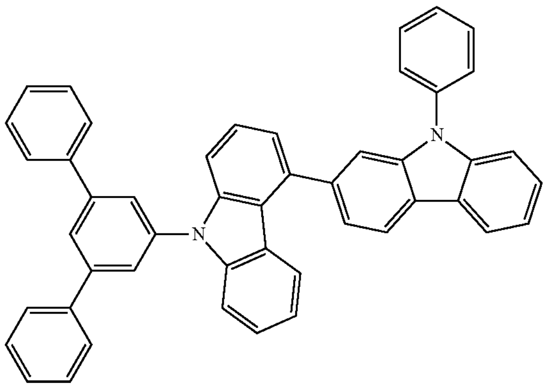
219B
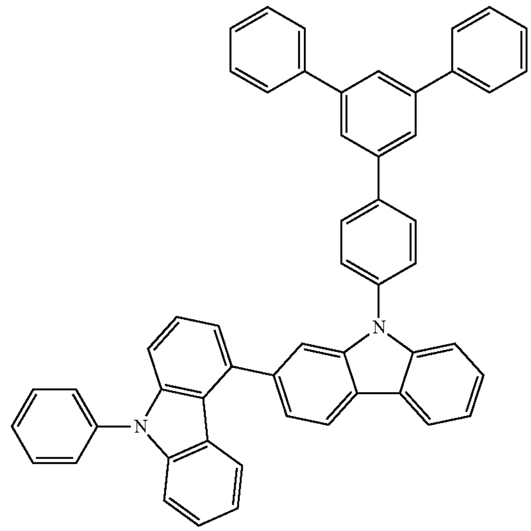
220B
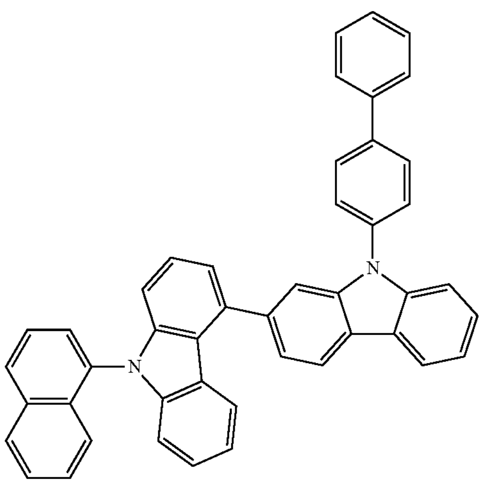
221B
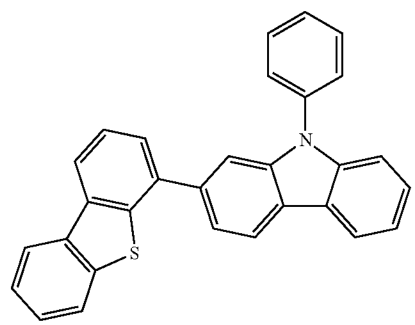
222B
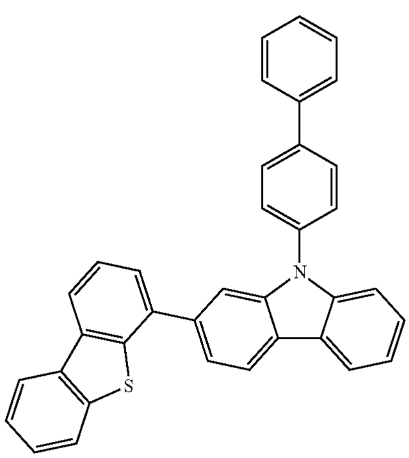
223B
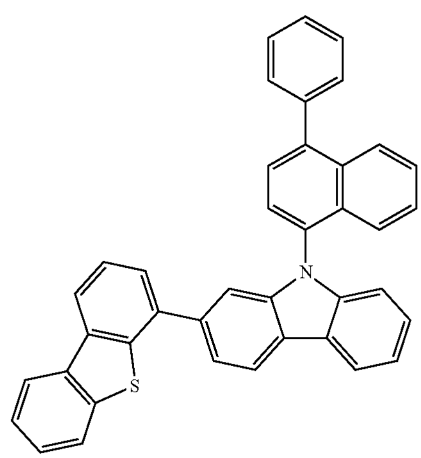

-continued
224B
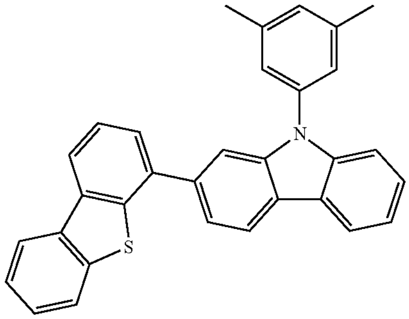
225B
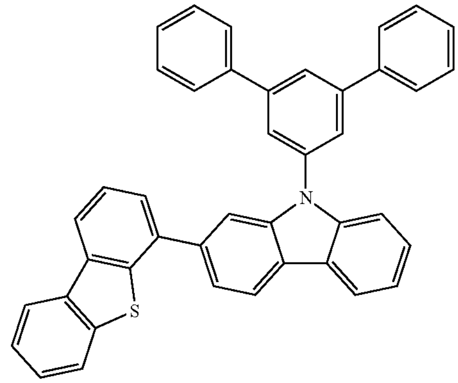
226B
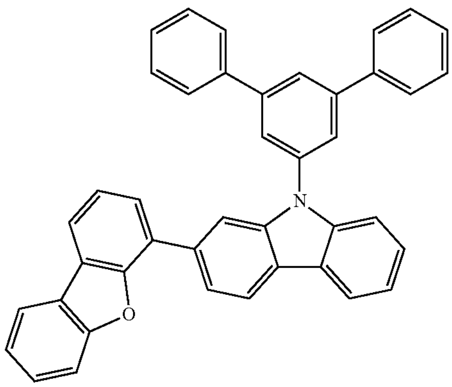
227B
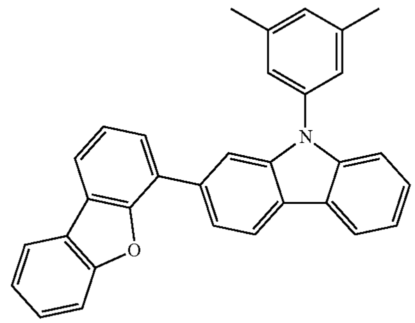
228B
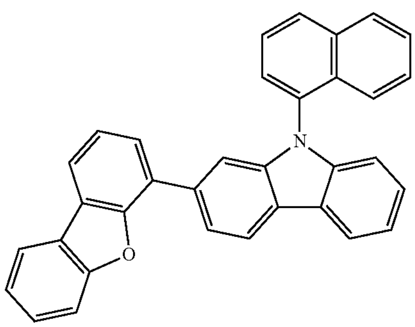
229B
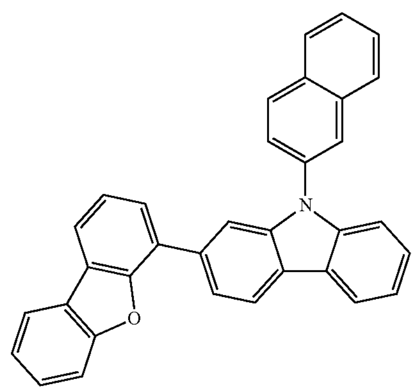
230B
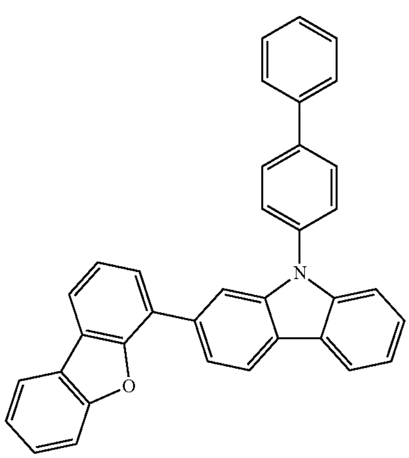
301B
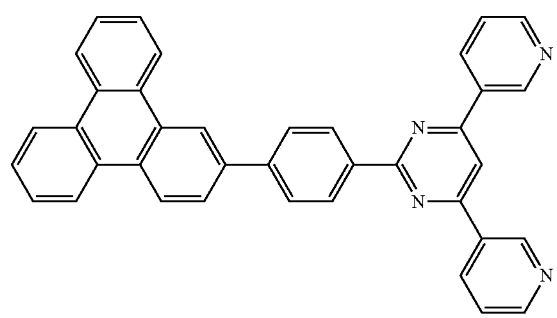

-continued
302B
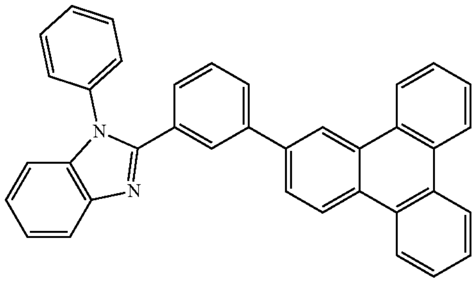
303B
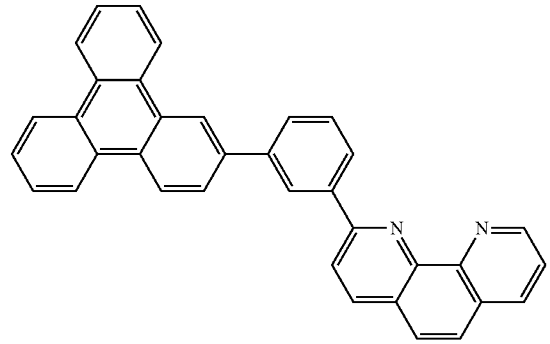
304B
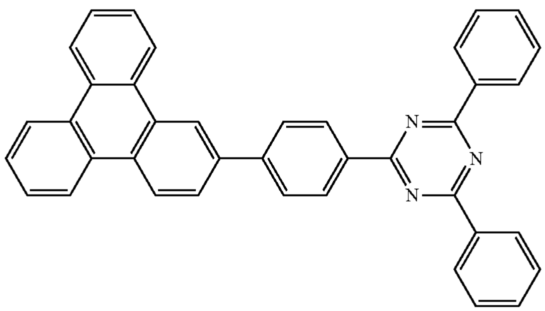
305B
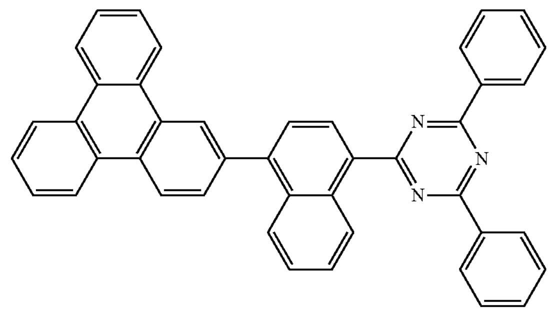
306B
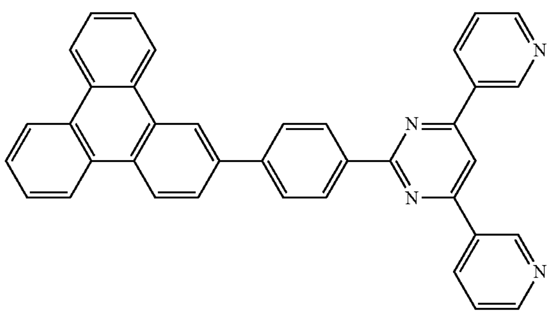
307B
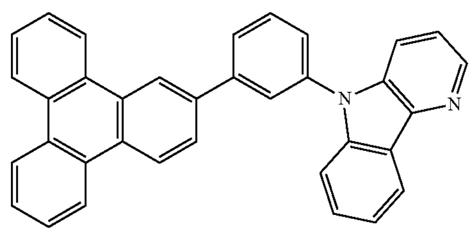
308B
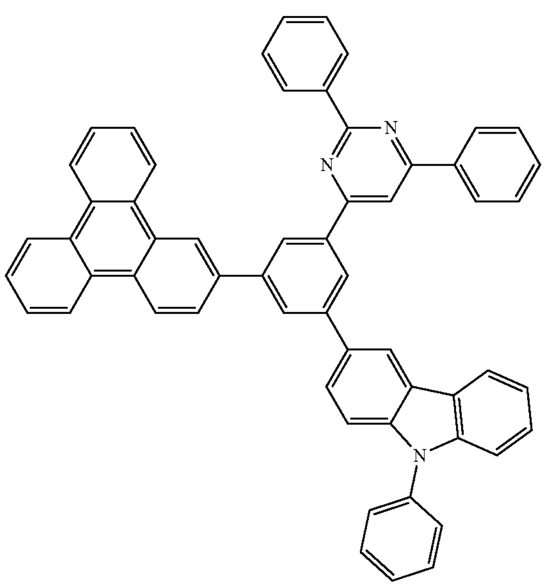
309B
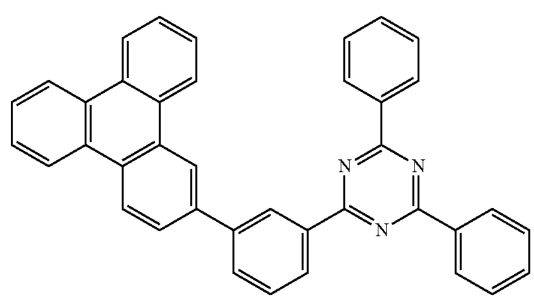

-continued
310B
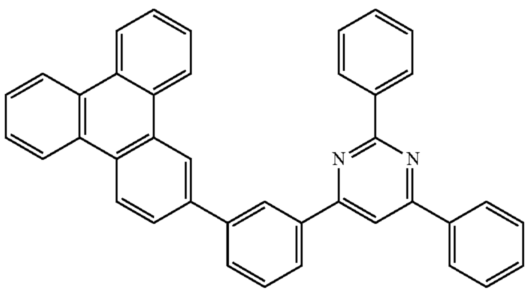
311B
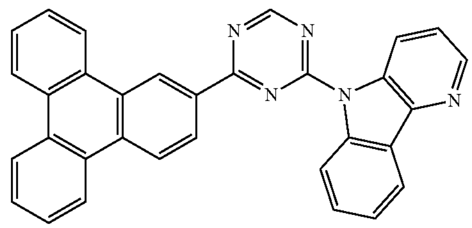
312B
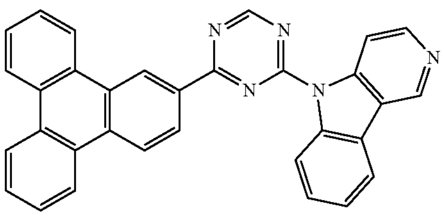
313B
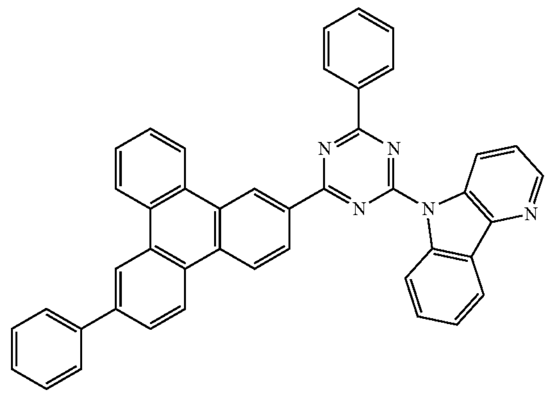
314B
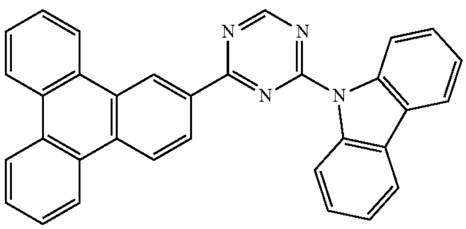
315B
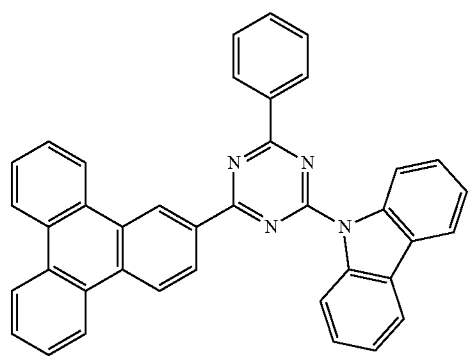
316B
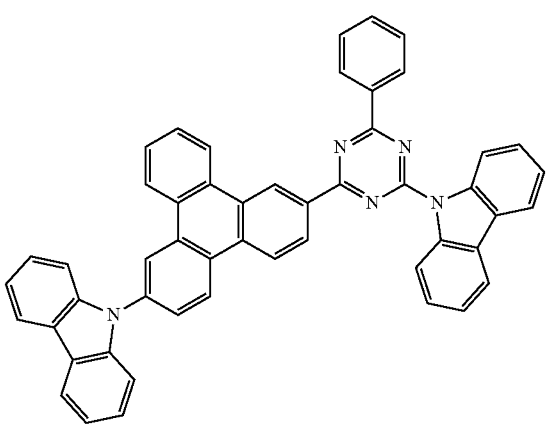
317B
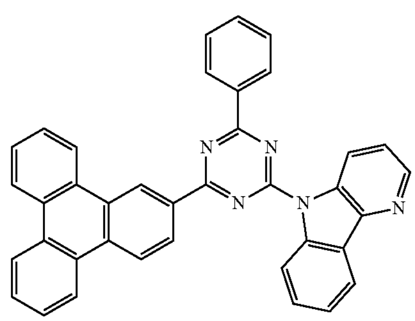

-continued
318B
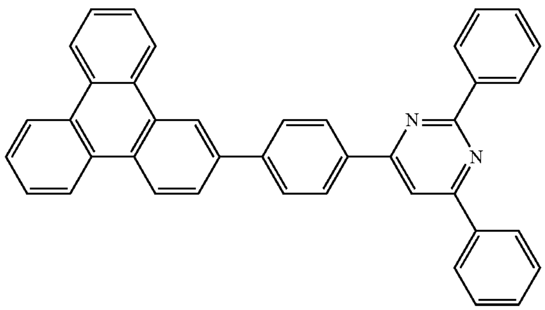
319B
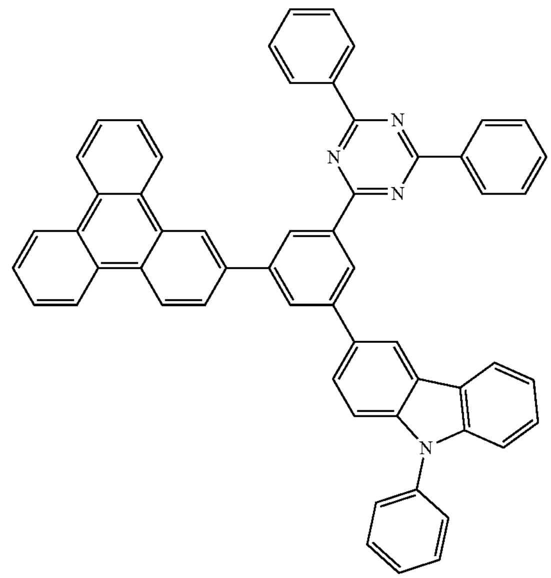
320B
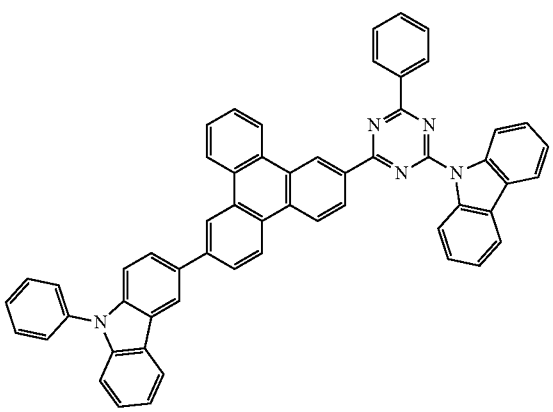
321B
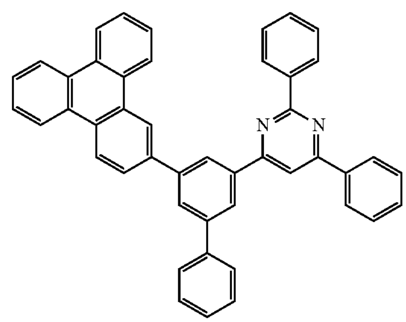
322B
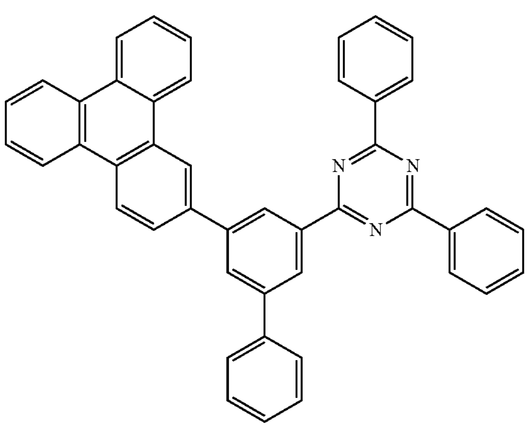
323B
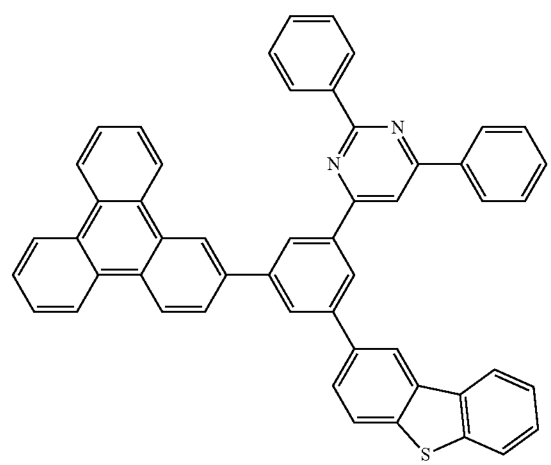

-continued
324B
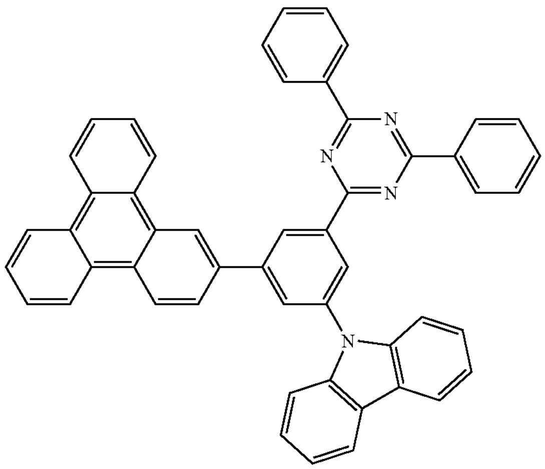
325B
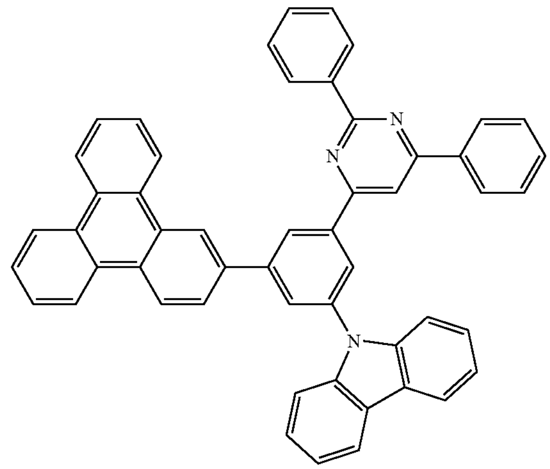
326B
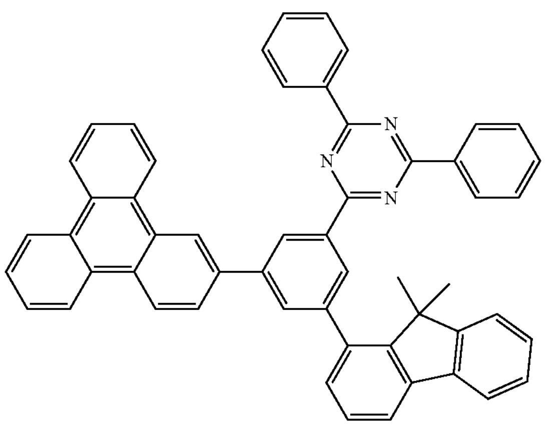
327B
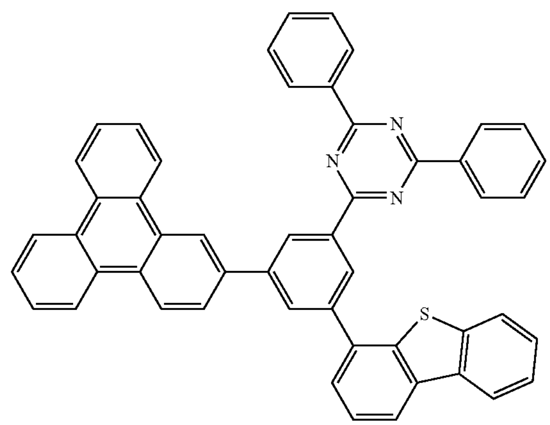
328B
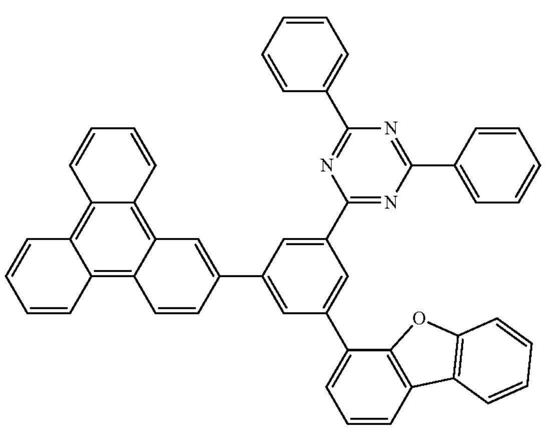
329B
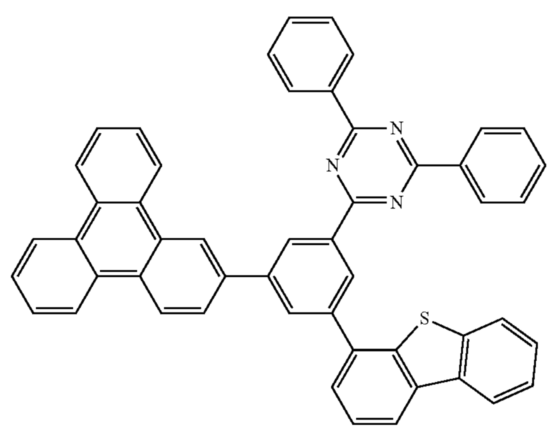

-continued
330B
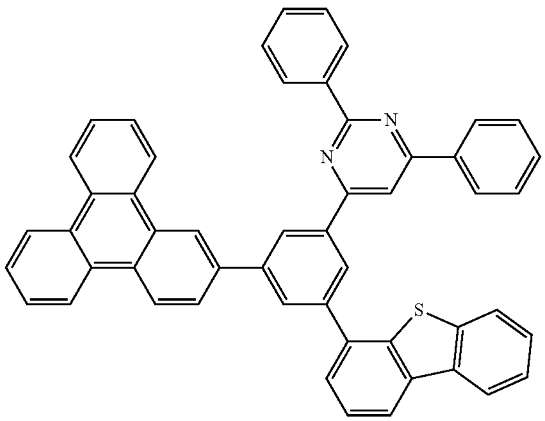
331B
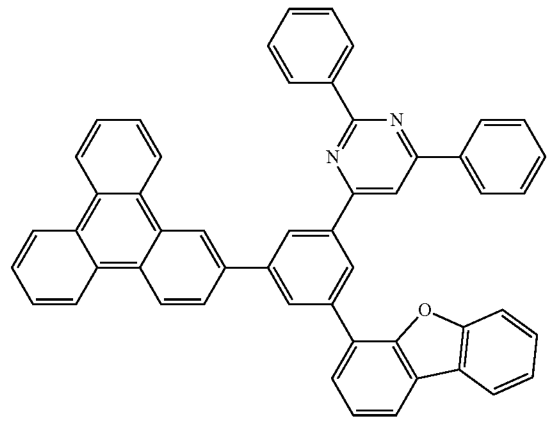
332B
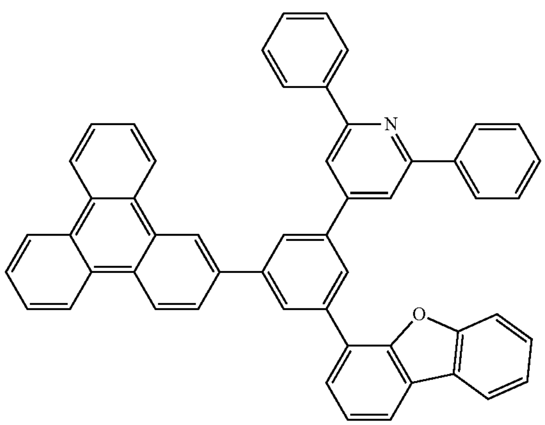
333B
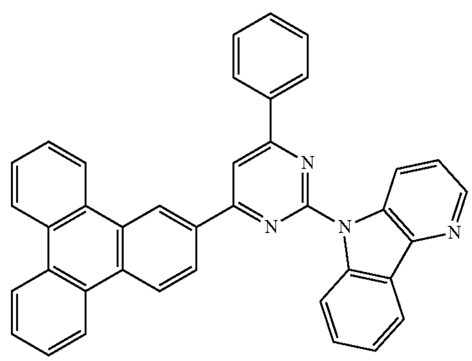
334B
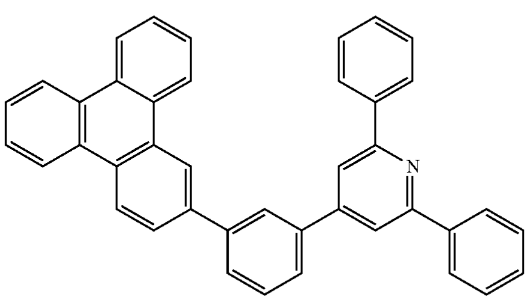
335B
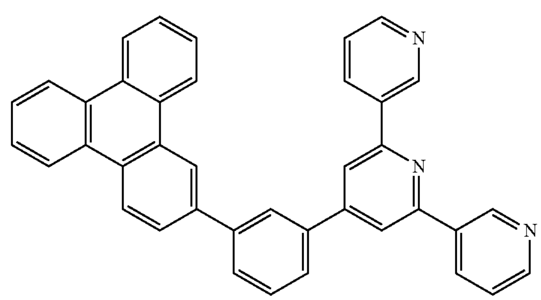
336B
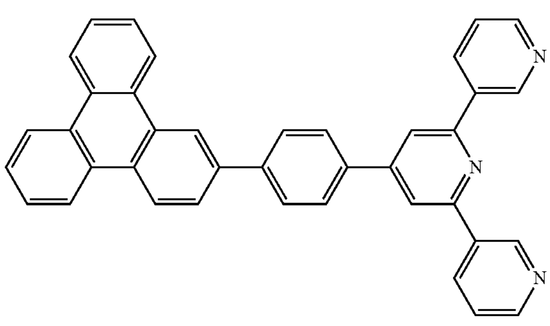
337B
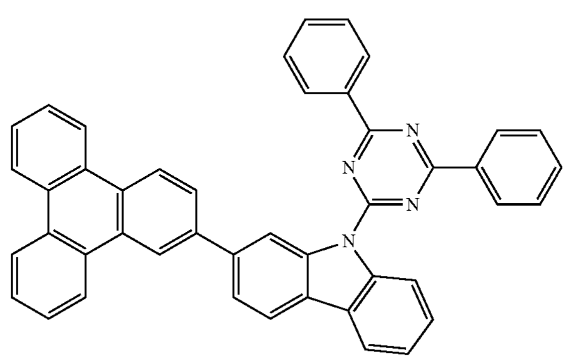

-continued
338B
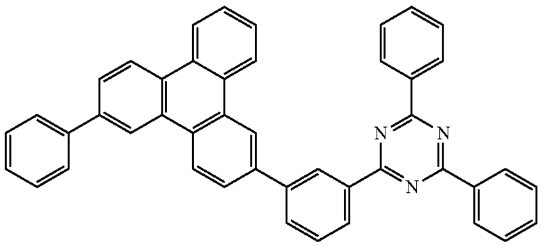
339B
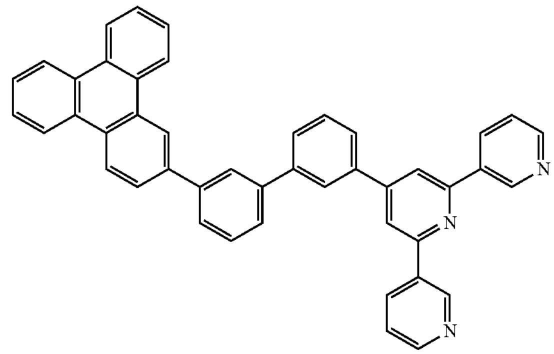
340B
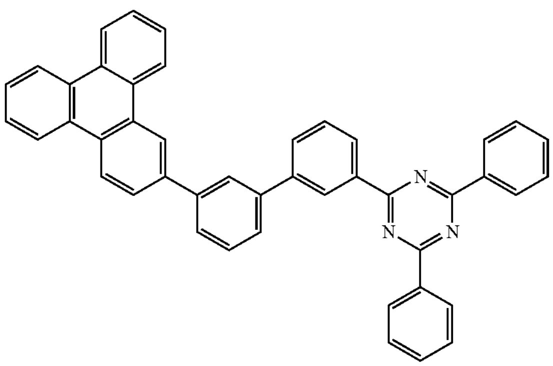
341B
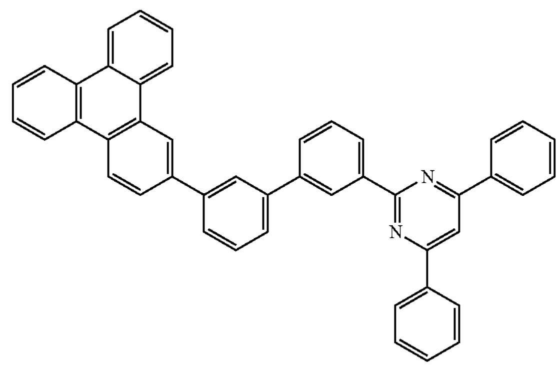
342B
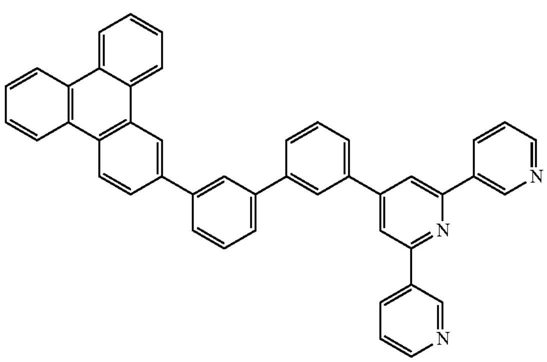
343B
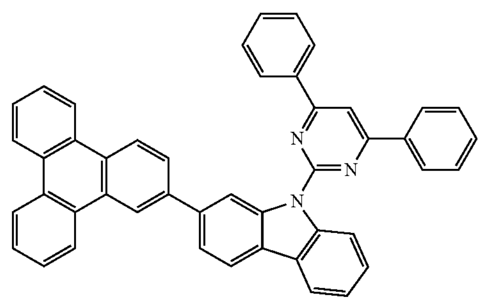
344B
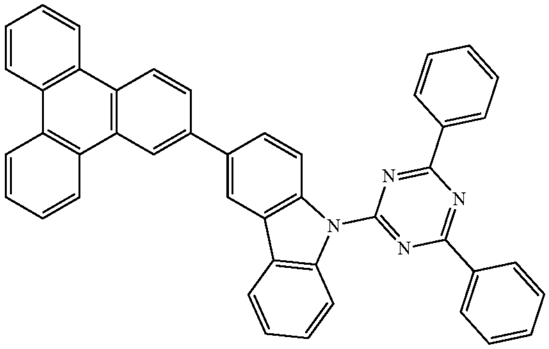
345B
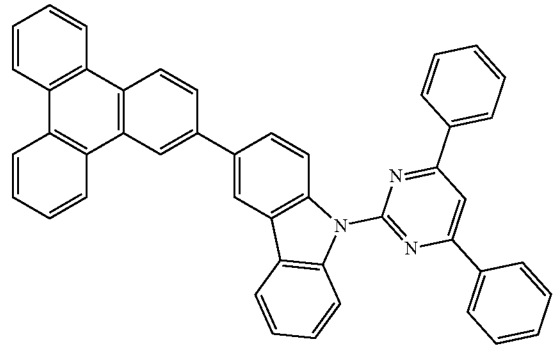

17. The organic light-emitting device of claim 1, wherein the emission layer comprises a phosphorescent dopant.

18. The organic light-emitting device of claim 17, wherein the phosphorescent dopant is a compound represented by Formula 401:

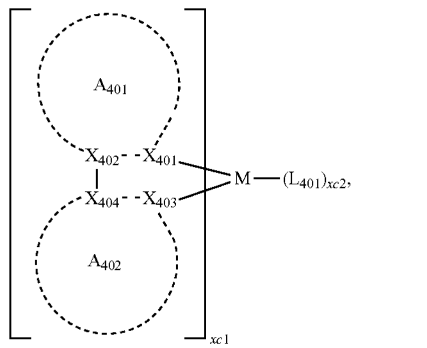

wherein, in Formula 401,

M is selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ are each independently a nitrogen atom or a carbon atom;

rings $A_{401}$ and $A_{402}$ are each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzooxazole, substituted isobenzooxazole, substituted triazole, substituted oxadiazole, substituted triazine, substituted dibenzofuran, and substituted dibenzothiophene is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ is an organic ligand;

xc1 is 1, 2, or 3;

xc2 is 0, 1, 2, or 3, wherein $Q_{401}$ to $Q_{407}$, $Q_{411}$ to $Q_{417}$, and $Q_{421}$ to $Q_{427}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.
19. The organic light-emitting device of claim 17, wherein the phosphorescent dopant is selected from Compounds PD1 to PD82:
PD1
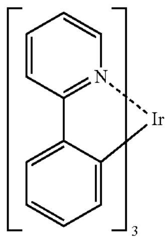
PD2
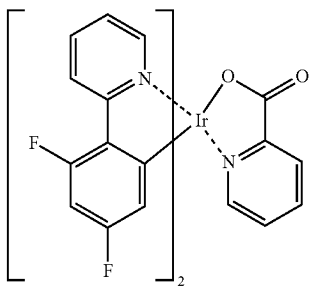
PD3
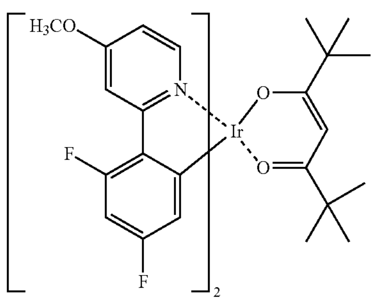
PD4
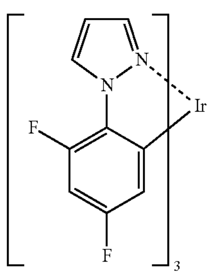
PD5
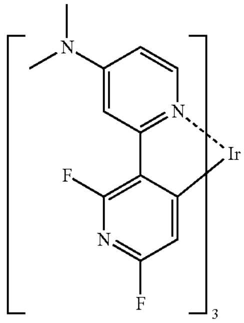
-continued
PD6
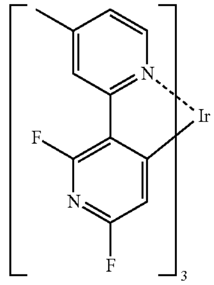
PD7
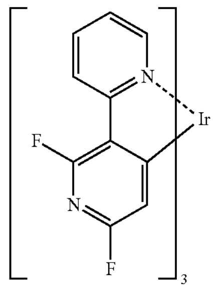
PD8
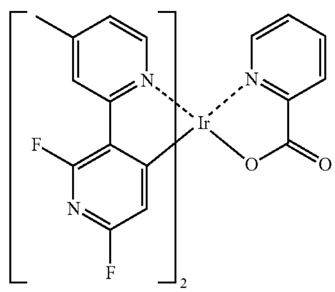
PD9
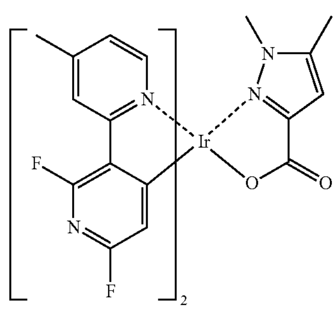
PD10
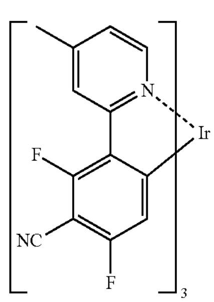

-continued
PD11
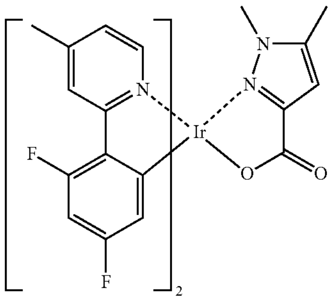
PD12
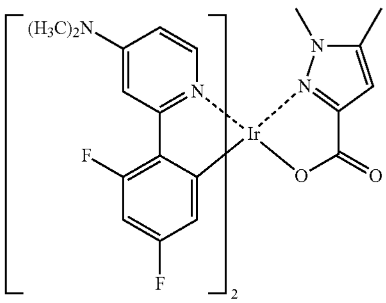
PD13
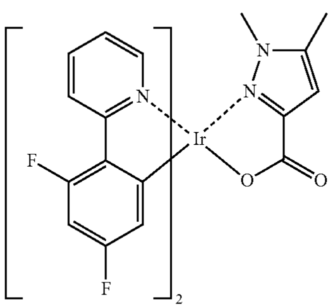
PD14
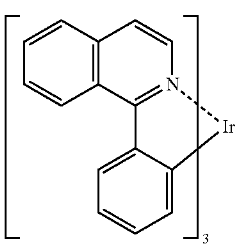
PD15
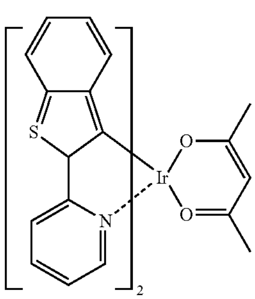
-continued
PD16
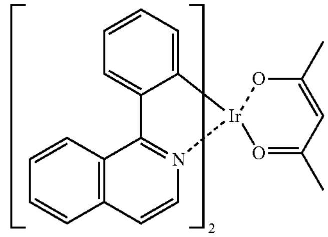
PD17
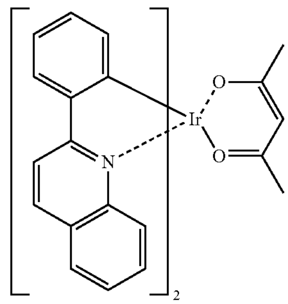
PD18
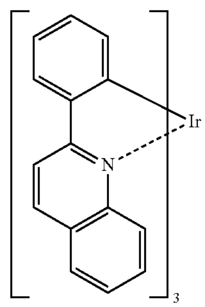
PD19
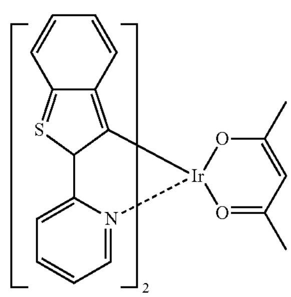
PD20
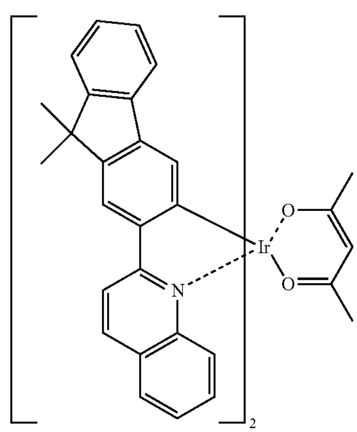

-continued
PD21
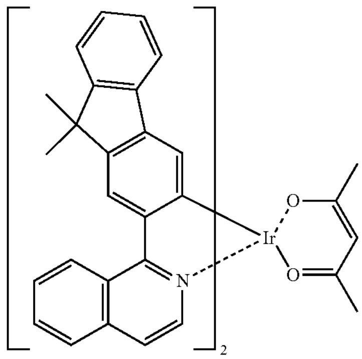
PD22
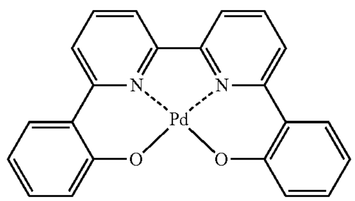
PD23
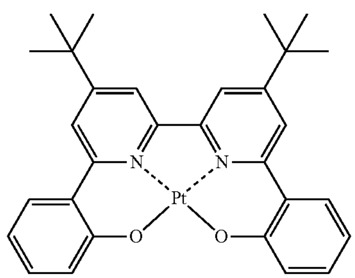
PD24
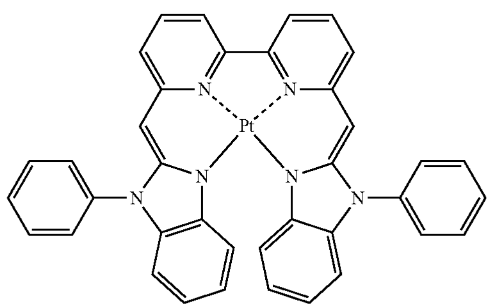
PD25
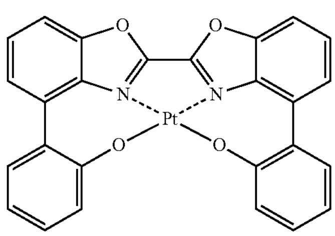
PD26
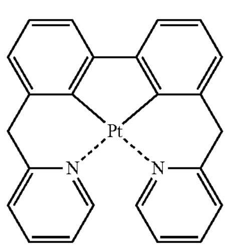
-continued
PD27
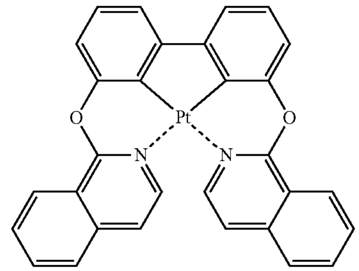
PD28
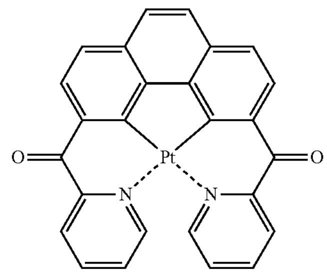
PD29
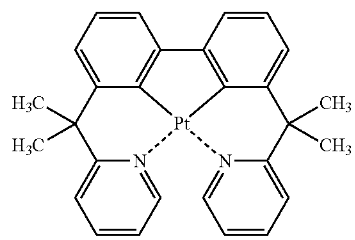
PD30
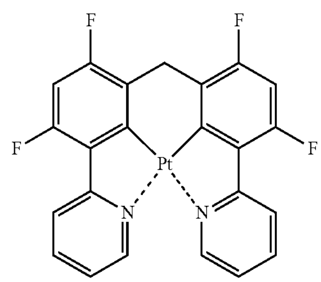
PD31
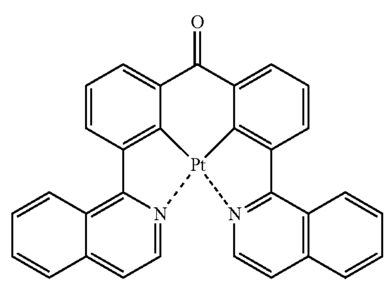
PD32
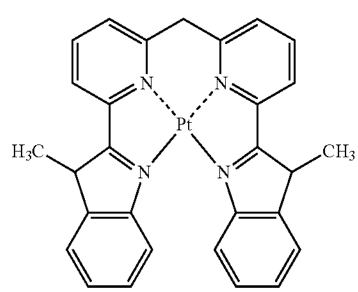

-continued
PD33
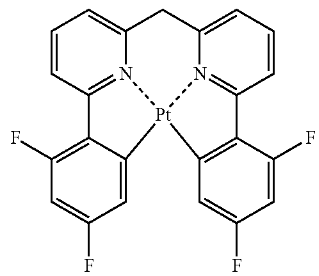
PD34
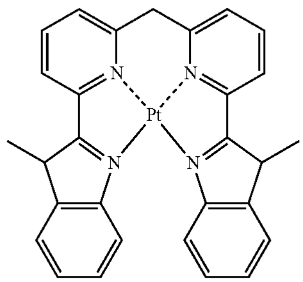
PD35
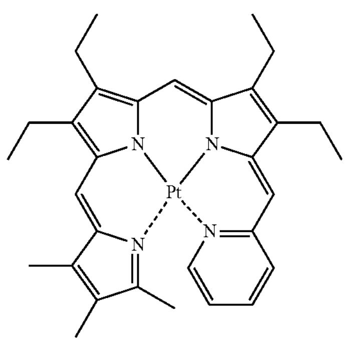
PD36
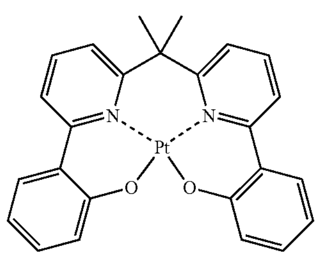
PD37
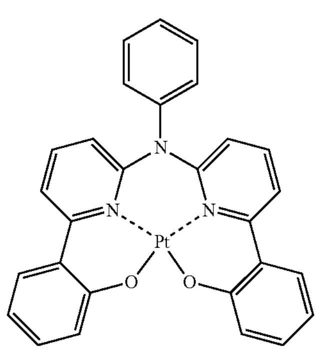
-continued
PD38
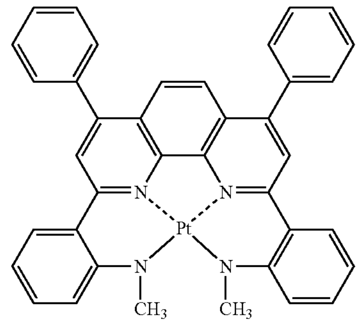
PD39
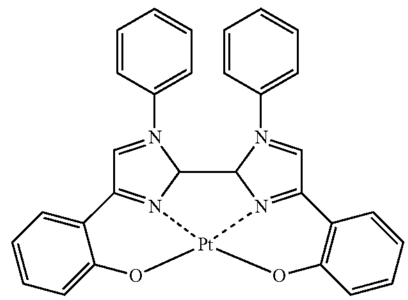
PD40
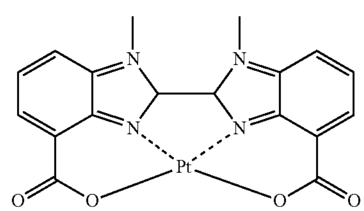
PD41
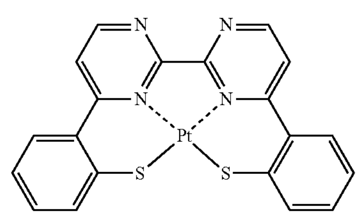
PD42
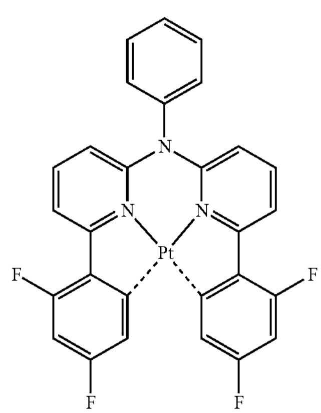

-continued
PD43
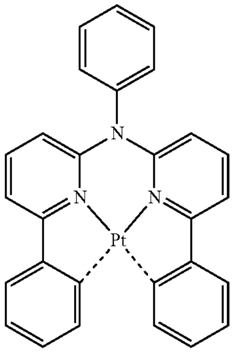
PD44
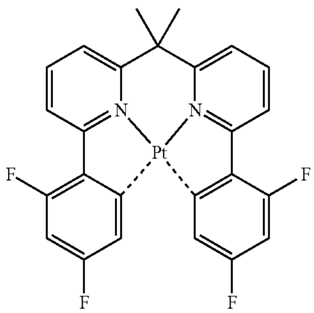
PD45
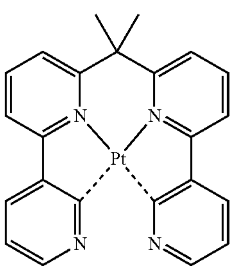
PD46
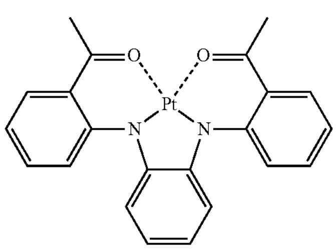
PD47
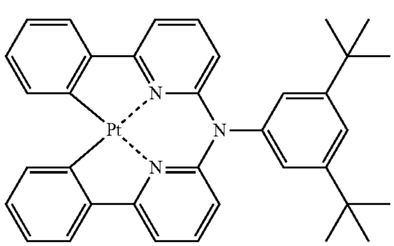
-continued
PD48
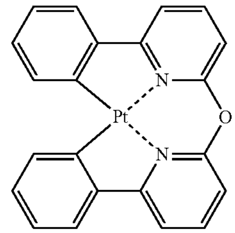
PD49
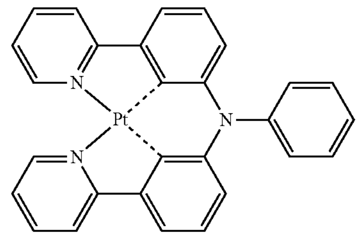
PD50
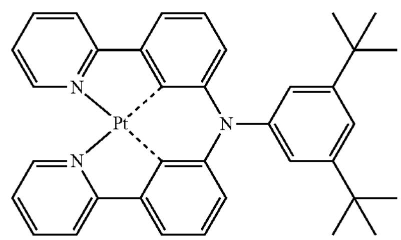
PD51
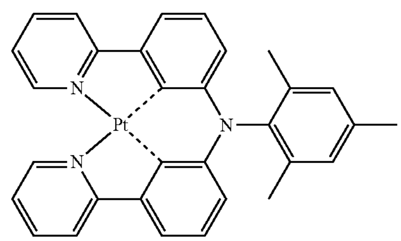
PD52
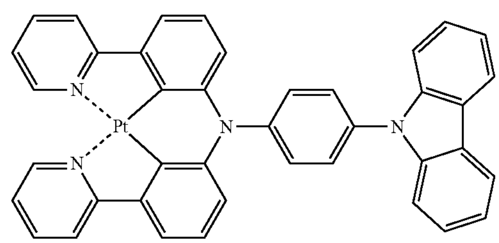
PD53
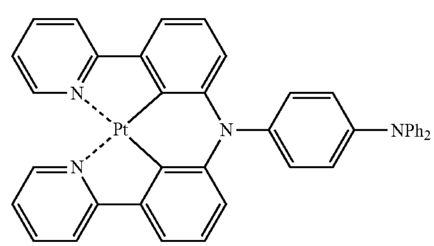

-continued
PD54
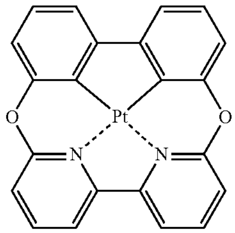
PD55
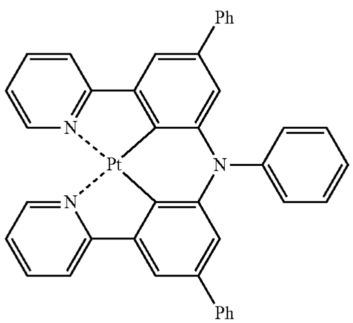
PD56
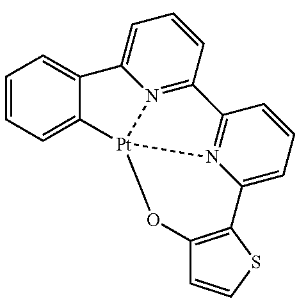
PD57
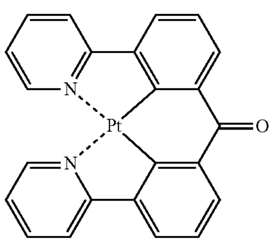
PD58
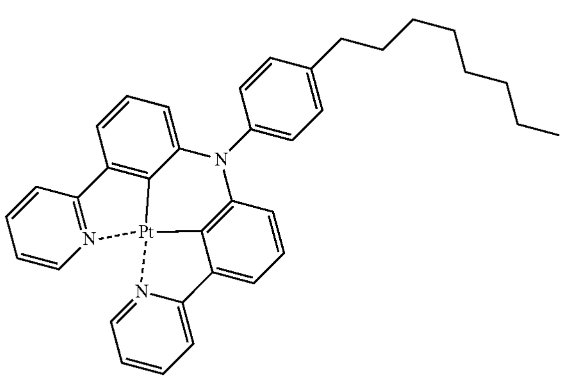
-continued
PD59
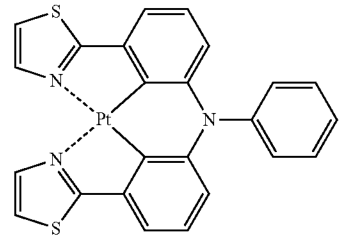
PD60
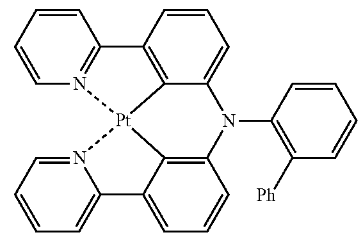
PD61
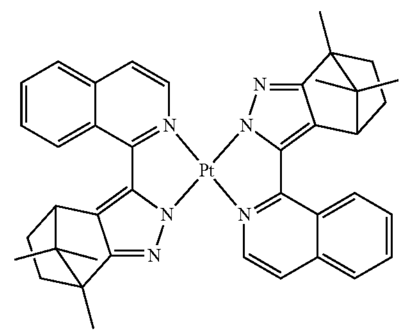
PD62
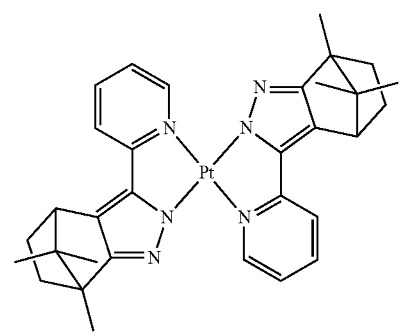
PD63
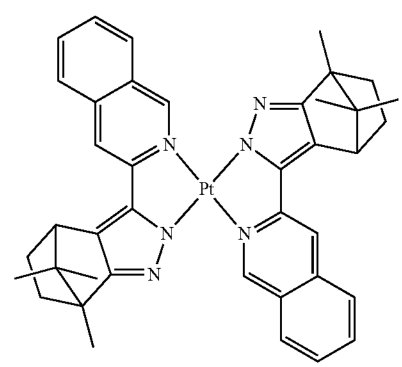

-continued
PD64
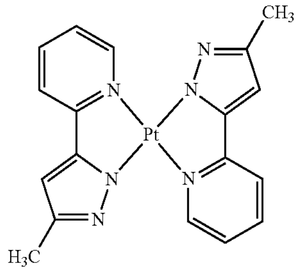
PD65
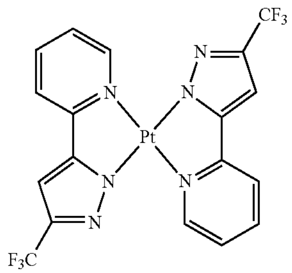
PD66
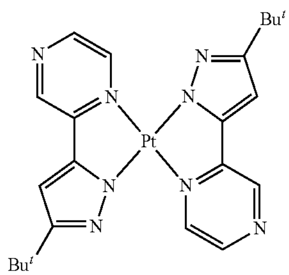
PD67
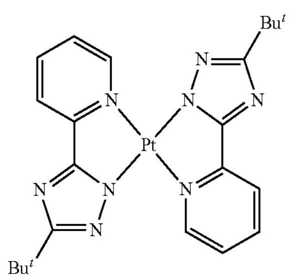
PD68
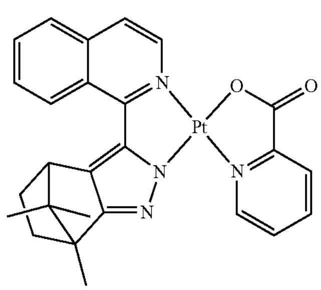
PD69
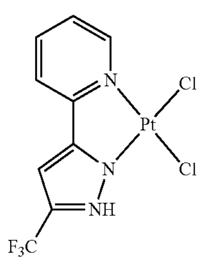
-continued
PD70
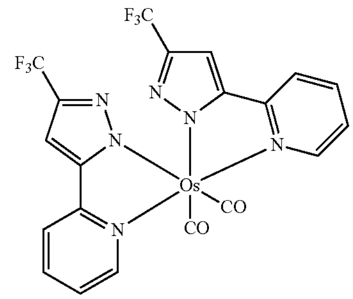
PD71
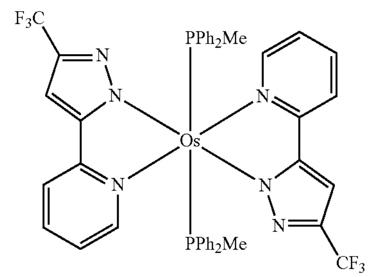
PD72
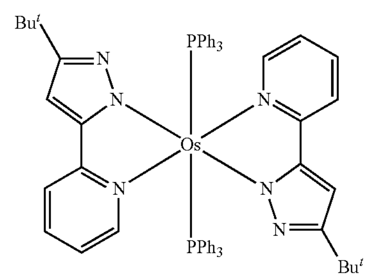
PD73
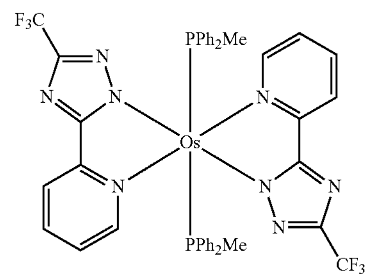
PD74
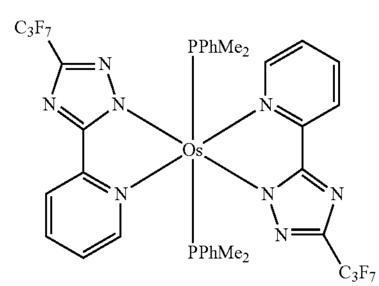

-continued
PD75
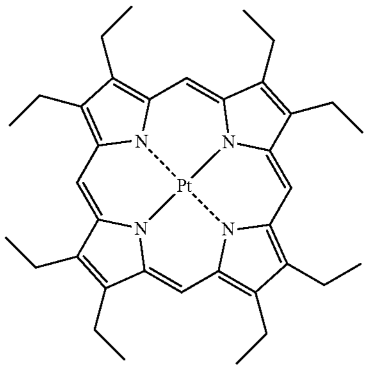
PD76
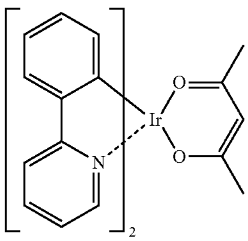
PD77
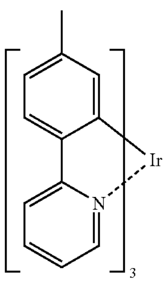
PD78
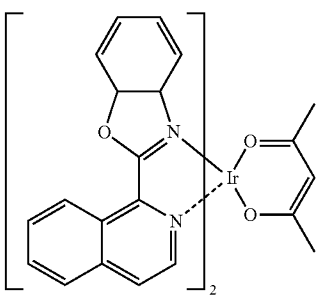
-continued
PD79
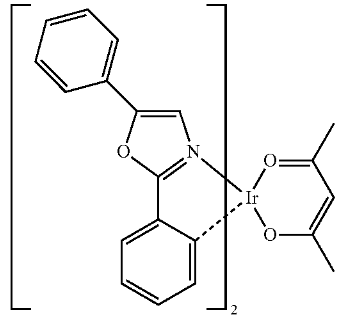
PD80
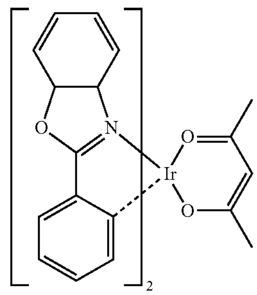
PD81
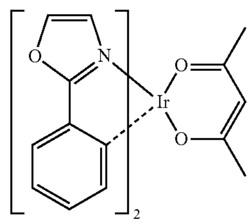
PD82
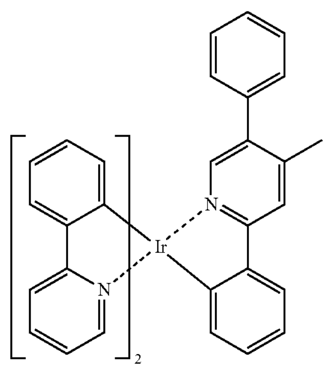
* * * * *